(12) United States Patent
Chang

(10) Patent No.: US 12,733,501 B2
(45) Date of Patent: Sep. 8, 2026

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wei-Hao Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 841 days.

(21) Appl. No.: 18/111,433

(22) Filed: Feb. 17, 2023

(65) Prior Publication Data

US 2024/0282715 A1 Aug. 22, 2024

(51) Int. Cl.

| | |
|---|---|
| ***H01L 23/00*** | (2006.01) |
| ***H01L 23/31*** | (2006.01) |
| ***H01L 23/538*** | (2006.01) |
| ***H01L 25/16*** | (2023.01) |
| ***H10W 42/00*** | (2026.01) |
| ***H10W 70/60*** | (2026.01) |
| ***H10W 70/63*** | (2026.01) |
| ***H10W 70/685*** | (2026.01) |
| ***H10W 74/10*** | (2026.01) |
| ***H10W 90/00*** | (2026.01) |

(52) U.S. Cl.

CPC ........ *H10W 42/121* (2026.01); *H10W 70/611* (2026.01); *H10W 70/635* (2026.01); *H10W 70/685* (2026.01); *H10W 74/117* (2026.01); *H10W 90/00* (2026.01); *H10W 90/401* (2026.01)

(58) Field of Classification Search

CPC ............. H10W 42/121; H10W 70/685; H10W 70/635; H10W 70/611; H10W 90/00; H10W 90/401; H10W 74/117

See application file for complete search history.

(56) References Cited

U.S. PATENT DOCUMENTS

| | | | |
|---|---|---|---|
| 7,687,315 B2 | 3/2010 | Carson | |
| 7,749,807 B2 | 7/2010 | Karnezos | |
| 7,977,780 B2 | 7/2011 | Tay et al. | |
| 8,198,735 B2 | 6/2012 | Chow et al. | |
| 8,389,329 B2 | 3/2013 | Cho et al. | |
| 8,541,872 B2 | 9/2013 | Cho et al. | |
| 9,831,148 B2 | 11/2017 | Yu et al. | |
| 10,388,637 B2 | 8/2019 | Kim et al. | |
| 10,510,674 B2 | 12/2019 | Lin et al. | |
| 10,985,760 B2 | 4/2021 | Lee et al. | |
| 11,616,046 B2 | 3/2023 | Lin et al. | |
| 2006/0172459 A1* | 8/2006 | Karnezos | H01L 25/03 257/E23.092 |

(Continued)

OTHER PUBLICATIONS

Non-Final Office Action for U.S. Appl. No. 17/525,833, issued Oct. 25, 2023, 9 pages.

(Continued)

*Primary Examiner* — Peniel M Gumedzoe

(74) *Attorney, Agent, or Firm* — Foley and Lardner LLP

(57) ABSTRACT

A semiconductor device package and a method of manufacturing the same are provided. The semiconductor device package includes a first carrier, a second carrier disposed over the first carrier, and a reinforcement connected to the second carrier and configured to prevent the second carrier from being recessed toward the first carrier.

12 Claims, 137 Drawing Sheets

(56) References Cited

U.S. PATENT DOCUMENTS

| | | | | |
|---|---|---|---|---|
| 2007/0257348 | A1 | 11/2007 | Yang | |
| 2008/0157325 | A1 | 7/2008 | Chow et al. | |
| 2008/0211084 | A1 | 9/2008 | Chow et al. | |
| 2009/0102037 | A1 | 4/2009 | Kim | |
| 2009/0166835 | A1 | 7/2009 | Yang et al. | |
| 2010/0320588 | A1 | 12/2010 | Dahilig et al. | |
| 2012/0146242 | A1 | 6/2012 | Fujishima et al. | |
| 2013/0214396 | A1 | 8/2013 | Kim | |
| 2014/0151891 | A1* | 6/2014 | Takano | H01L 23/36 257/773 |
| 2016/0293581 | A1* | 10/2016 | Lin | H01L 23/49811 |
| 2017/0062383 | A1 | 3/2017 | Yu et al. | |
| 2019/0238134 | A1 | 8/2019 | Lee et al. | |
| 2020/0083172 | A1 | 3/2020 | Hsieh et al. | |
| 2020/0402897 | A1 | 12/2020 | Yeh | |

OTHER PUBLICATIONS

Notice of Allowance for U.S. Appl. No. 17/525,833, issued Feb. 6, 2024, 9 pages.
U.S. Appl. No. 17/525,833, filed Nov. 12, 2021, Chang, Wei-Hao.
Non-Final Office Action for U.S. Appl. No. 17/525,833, issued Jul. 17, 2023, 8 pages.

* cited by examiner 15-23
15-2
15-235
15-231

15-21
15-2
15-23
15-213
15-211
15-231
15-215
15-235

19-11
19-1
19-101
19-100
19-113
19-111

19-11
19-1
19-101
19-100
19-113
19-111
19-3

19-11
19-1
19-113
19-111
19-3

19-13
19-1
19-11
19-3
19-131
19-111

19-4
19-113

19-2
19-201
19-200

19-23
19-2
19-201
19-200
19-235
19-231

SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same, and a semiconductor device package having a reinforcement layer.

2. Description of Related Art

In a three-dimensional (3D) stacked semiconductor device package, a coreless substrate, which has a relatively thin thickness, is used to support the electronic components and has the circuit for transmitting the electrical signal. Thus, the overall thickness of the semiconductor device package could be reduced.

However, the coreless substrate may not have the enough stiffness to support the electronic components mounted on the coreless substrate. Thus, the coreless substrate may collapse so that the electronic component mounted on the coreless substrate may collide with the electronic component mounted on the main substrate and/or fall off. Further, the coreless substrate may have a non-joint issue.

SUMMARY

According to one example embodiment of the instant disclosure, an electronic device includes a first carrier, a second carrier disposed over the first carrier; and a reinforcement connected to the second carrier and configured to prevent the second carrier from being recessed toward the first carrier.

According to another example embodiment of the instant disclosure, an electronic device includes a first electronic component, a support element adjacent to the first electronic component; and a unit supported by the support element. The unit includes a second electronic component disposed over the first electronic component and a reinforcement configured to space the second electronic component apart from the first electronic component.

According to another example embodiment of the instant disclosure, an electronic device includes a coreless substrate, at least one electronic component mounted on the coreless substrate, at least one support element configured to support the coreless substrate and a reinforcement connected to the coreless substrate and configured to prevent the coreless substrate from collapsing due to a weight of the at least one electronic component.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1A:
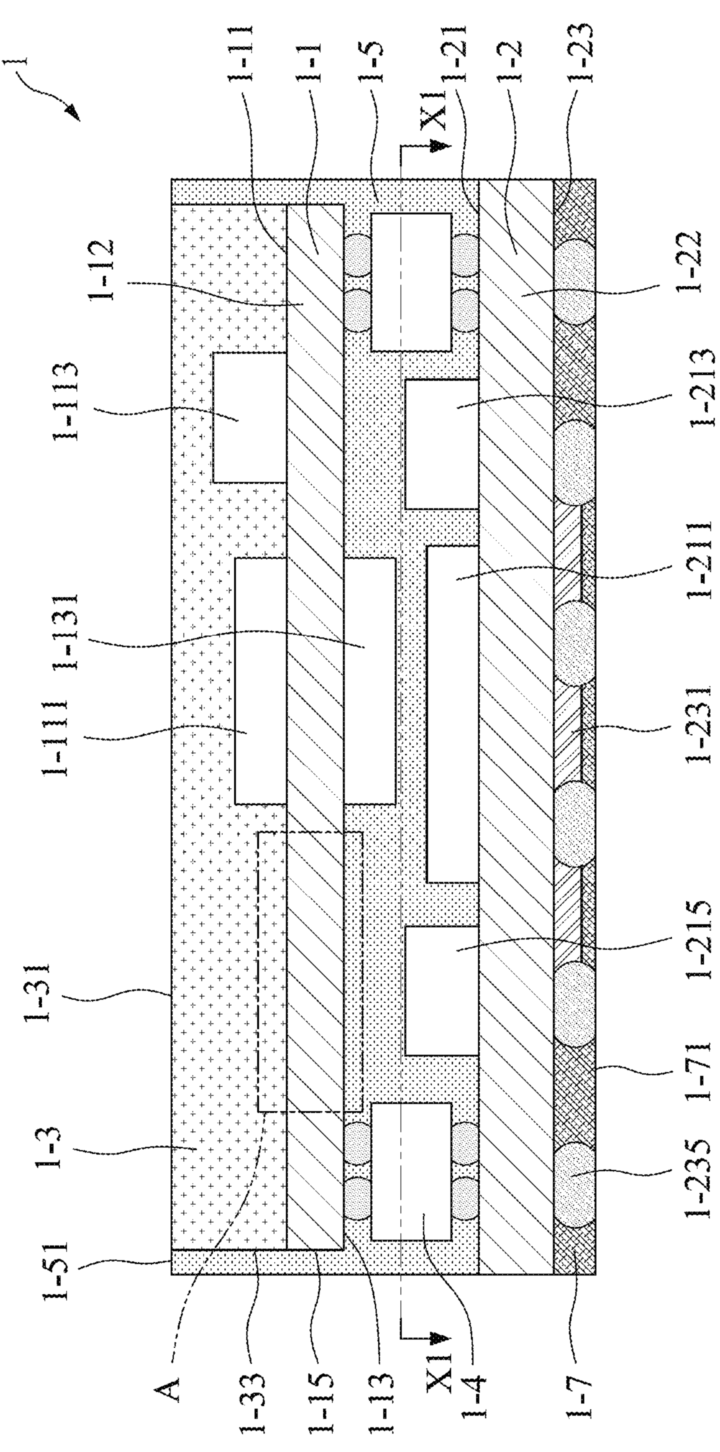
FIG. 1A is a cross-sectional view of a semiconductor device package in accordance with an embodiment of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package with a reinforcement structure. The reinforcement structure is connected to a top board stacked on a bottom board and configured to prevent the top board from being bended or recessed/recessed toward the bottom board.

FIG. 1A is a cross-sectional view of a semiconductor device package 1 in accordance with some embodiments of the present disclosure. As shown in FIG. 1A, the semiconductor device package 1 may be a three-dimensional (3D) stacked semiconductor device package. The semiconductor device package 1 may include substrates 1-1, 1-2, electronic components 1-111, 1-113, 1-131, 1-211, 1-213, 1-215 and 1-231, encapsulants 1-3, 1-5, 1-7, interposers 1-4 and electrical connections 1-235. The substrate 1-1 may be a coreless substrate and may traces, pads or interconnections for electrical connection. The substrate 1-2 may be a core substrate or a core-less substrate and may have include traces, pads or interconnections for electrical connection. Further, the substrate 1-1 may disposed over and/or above the substrate 1-2. In some embodiments of the present disclosure, a thickness of the substrate 1-2 is substantially greater than a thickness of the substrate 1-1. In some embodiments of the present disclosure, a thickness a dielectric layer 1-22 of the substrate 1-2 is substantially greater than a thickness of a dielectric layer 1-12 of the substrate 1-1. In some embodiments of the present disclosure, a hardness of the substrate 1-2 is substantially greater than a hardness of the substrate 1-1.

The core substrate may include a plurality of stacked dielectric layers and a plurality of circuit layers embedded in the dielectric layers on both sides of the core. In addition, each dielectric layer is relatively thick, and, thus, such core substrate is relatively thick.

The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers.

Referring to FIG. 1A, the substrate 1-1 has a surface 1-11 (e.g., an upper surface) and a surface 1-13 (e.g., a lower surface). The electronic components 1-111, 1-113 may be disposed or mounted on the surface 1-11 of the substrate 1-1. The electronic components 1-111, 1-113 may be a die, an active device, a passive device, and/or other electronic devices. In some embodiments of the present disclosure, the electronic components 1-111, 1-113 electrically connects the substrate 1-1 via electrical connections. In some embodiments of the present disclosure, the electronic component 1-111 may include a flash memory device. Further, the electronic component 1-131 may be disposed or mounted on the surface 1-13 of the substrate 1-1. The electronic component 1-131 may be a die, an active device, a passive device, and/or other electronic devices. In some embodiments of the present disclosure, the electronic component 1-131 electrically connects the substrate 1-1 via electrical connections. In some embodiments of the present disclosure, the electronic component 1-131 may include a flash memory device.

The substrate 1-2 has a surface 1-21 (e.g., an upper surface) and a surface 1-23 (e.g., a lower surface). The electronic components 1-211, 1-213, 1-215 may be disposed or mounted on the surface 1-21 of the substrate 1-2. The electronic components 1-211, 1-213, 1-215 may be a die, an active device, a passive device, and/or other electronic devices. In some embodiments of the present disclosure, the electronic components 1-211, 1-213, 1-215 electrically connects the substrate 1-2 via electrical connections. Further, the electronic component 1-231 may be disposed or mounted on the surface 1-23 of the substrate 1-2. The electronic component 1-231 may be a die, an active device, a passive device, and/or other electronic devices. In some embodiments of the present disclosure, the electronic component 1-231 electrically connects the substrate 1-2 via electrical connections. In some embodiments of the present disclosure, a thickness of the electronic components 1-231 is the thinnest among other components in the semiconductor device package 1. Moreover, a plurality of the electrical connections 1-235 are disposed or mounted on the surface 1-23 of the substrate 1-2. In some embodiments of the present disclosure, the electrical connection 1-235 includes a reflowable material. In some embodiments of the present disclosure, the electrical connection 1-235 includes solder material. The electrical connection 1-235 may include a solder ball. The electrical connection 1-235 may include a conductive pillar, post, or substrate interposer.

The interposers 1-4 may be disposed or mounted on the surface 1-13 of the substrate 1-1 and the surface 1-21 of the substrate 1-2. That is, the interposer 1-4 may be arranged between the substrate 1-1 and the substrate 1-2, and thus the interposer 1-4 may define a space between the substrate 1-1 and 1-2. In some embodiments of the present disclosure, an amount of the electronic components within the space between the substrate 1-1 and the substrate 1-2 and/or defined by the interposer 1-4, such as the electronic components, 1-131, 1-211, 1-213, 1-215, is greater than an amount of the electronic components outside of the space between the substrate 1-1 and the substrate 1-2 and/or defined by the interposer 1-4, such as the electronic components, 1-111, 1-113, 1-231. In some embodiments of the present disclosure, a distance between the adjacent electronic components within the space between the substrate 1-1 and the substrate 1-2 and/or defined by the interposer 1-4, such as the electronic components, 1-131, 1-211, 1-213, 1-215, is smaller than a distance between the adjacent electronic components outside of the space between the substrate 1-1 and the substrate 1-2 and/or defined by the interposer 1-4, such as the electronic components, 1-111, 1-113, 1-231. In some embodiments of the present disclosure, a density of the electronic components within the space between the substrate 1-1 and the substrate 1-2 and/or defined by the interposer 1-4, such as the electronic components, 1-131, 1-211, 1-213, 1-215, is greater than a density of the electronic components outside of the space between the substrate 1-1 and the substrate 1-2 and/or defined by the interposer 1-4, such as the electronic components, 1-111, 1-113, 1-231. Moreover, the interposer 1-4 may electrically connect the substrate 1-1 and the substrate 1-2 via electrical connections. In some embodiments of the present disclosure, such electrical connection includes a solder material. In some embodiments of the present disclosure, the interposer 1-4 includes a substrate interposer with redistribution layers and/or conductive vias.

The encapsulant 1-3 is disposed on the surface 1-11 of the substrate 1-1. The encapsulant 1-3 may cover the surface 1-11 of the substrate 1-1 and the electronic components 1-111 and 1-113 disposed on the surface 1-11 of the substrate 1-1. The encapsulant 1-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-3 may include a molding underfill (MUF) or a capillary underfill (CUF).

As above-mentioned, the substrate 1-1 may be a core-less substrate, and thus the substrate 1-1 may have a relatively thin thickness and/or a relatively weak stiffness. Therefore, when the electronic components, such as the electronic components, 1-111, 1-113, 1-131, are mounted on the substrate 1-1, the total weight of the electronic components may cause the substrate 1-1 to collapse. That is, the substrate 1-1 may be bended or recessed toward the substrate 1-2 due to the weights of the electronic components 1-111, 1-113, 1-131, and the electronic component 1-131 on the surface 1-13 of the substrate 1-1 may collide with the electronic component 1-211 on the surface of the substrate 1-2 and under the electronic component 1-131. The encapsulant 1-3 may be a reinforcement structure which is configured to improve the strength of the substrate 1-1 such that the substrate 1-1 is strong enough to support the electronic components 1-111, 1-113, 1-131 mounted thereon. Given the above, the encapsulant 1-3 may be configured to prevent the substrate 1-1 from collapsing and being bended or recessed toward the substrate 1-2. That is, the encapsulant 1-3 is configured to define a space between the electronic component 1-131 on the surface 1-13 of the substrate 1-1 and the electronic component 1-211 on the surface 1-21 of the substrate 1-2, and thus the electronic component 1-131 and the electronic component 1-211 may be maintained to be spaced apart from each other by a distance. In some embodiments of the present disclosure, the encapsulant 1-3 is a warpage-resistant layer configured to prevent the warpage of the substrate 1-1.

The encapsulant 1-5 is disposed on the surface 1-21 of the substrate 1-2. The encapsulant 1-5 may cover the surface

1-21 of the substrate 1-2, the electronic components 1-211, 1-213, 1-215 disposed on the surface 1-21 of the substrate 1-2, the surface 1-13 of the substrate 1-1, the electronic component 1-131 disposed on the surface 1-13 of the substrate 1-1 and the interposers 1-4. The encapsulant 1-5 may cover a lateral surface 1-15 of the substrate 1-1 and a lateral surface 1-33 of the encapsulant 1-3. In some embodiments of the present disclosure, an upper surface 1-51 of the encapsulant 1-5 is coplanar with an upper surface 1-31 of the encapsulant 1-3. In some embodiments of the present disclosure, the encapsulant 1-5 exposes the upper surface 1-31 of the encapsulant 1-3. The encapsulant 1-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-5 may include a molding underfill (MUF) or a capillary underfill (CUF).

The encapsulant 1-7 is disposed on the surface 1-23 of the substrate 1-2. The encapsulant 1-7 may cover the surface 1-23 of the substrate 1-2 and the electronic component 1-231 and the electrical connections 1-235 disposed on the surface 1-23 of the substrate 1-2. The encapsulant 1-7 may have a lower surface 1-71 covering the electronic component 1-231. In some embodiments of the present disclosure, a lower surface of the electronic component 1-231 is exposed from the lower surface 1-71 of the encapsulant 1-7. The electrical connections 1-235 may be exposed from the lower surface 1-71 of the encapsulant 1-7. The encapsulant 1-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-7 may include a molding underfill (MUF) or a capillary underfill (CUF). In some embodiments of the present disclosure, a thickness of the encapsulant 1-7 is the thinnest among other encapsulants 1-3, 1-5 in the semiconductor device package 1.

In some embodiments of the present disclosure, the material of the encapsulant 1-3 is substantially identical to the material of the encapsulant 1-5, and/or the material of the encapsulant 1-5 is substantially identical to the material of the encapsulant 1-7, and/or the material of the encapsulant 1-3 is substantially identical to the material of the encapsulant 1-7. In some embodiments of the present disclosure, the material of the encapsulant 1-3 is different from the material of the encapsulant 1-5, and/or the material of the encapsulant 1-5 is different from the material of the encapsulant 1-7, and/or the material of the encapsulant 1-3 is different from the material of the encapsulant 1-7. In some embodiments of the present disclosure, the CTE (coefficient of thermal expansion) of the substrate 1-1 is substantially equal to the CTE of the encapsulant 1-3. In some embodiments of the present disclosure, the CTE of the encapsulant 1-5 is substantially equal to or smaller than the CTE of the encapsulant 1-7. In some embodiments of the present disclosure, the difference between the CTE of substrate 1-1 and the CTE of the encapsulant 1-7 is less than the difference between the CTE of substrate 1-1 and the CTE of the encapsulant 1-5 or the difference between the CTE of encapsulant 1-5 and the CTE of the encapsulant 1-7.

In some embodiments of the present disclosure, a side surface of the substrate 1-2 may be covered by the encapsulant 1-5 or 1-7.

Figure 1B:
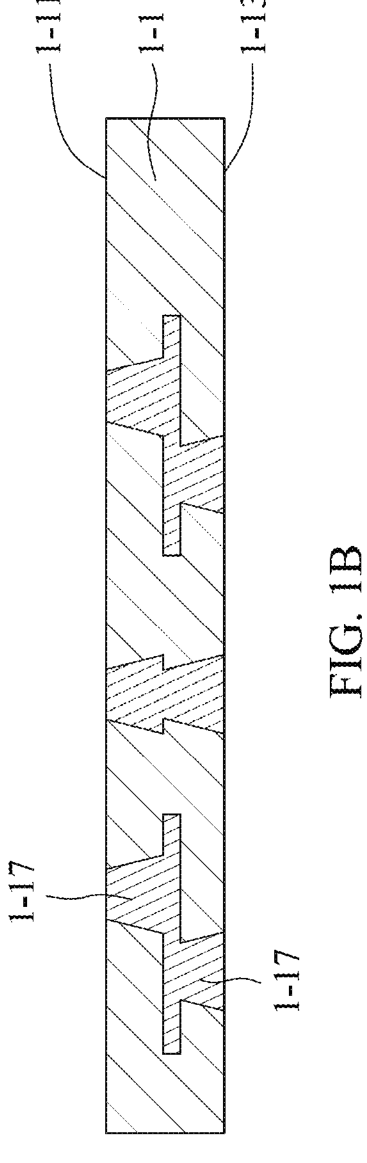
FIG. 1B is an enlarged view of portion "A" illustrated in FIG. 1A, which illustrates an embodiment of an intermediate structure.

FIG. 1B is an enlarged view of portion "A" illustrated in FIG. 1A, which illustrates an embodiment of an intermediate structure. Referring to FIG. 1B, the substrate 1-1 may include an interconnection. As above-mentioned, the interconnection may be used for electrical connection. In some embodiments of the present disclosure, the interconnection of the substrate 1-1 includes a plurality of conductive vias 1-17. The conductive via 1-17 may be tapered from the surface 1-11 toward the surface 1-13.

Figure 1C:
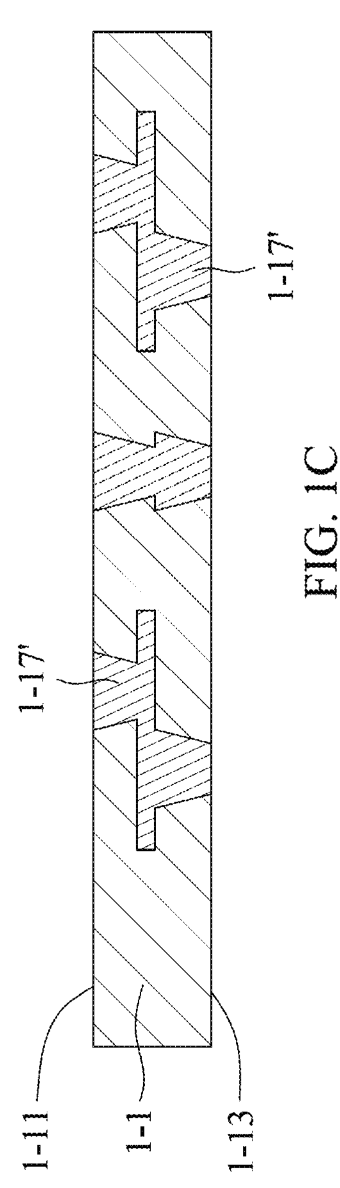
FIG. 1C is an enlarged view of portion "A" illustrated in FIG. 1A, which illustrates another embodiment of an intermediate structure.

FIG. 1C is an enlarged view of portion "A" illustrated in FIG. 1A, which illustrates an embodiment of another intermediate structure. Referring to FIG. 1C, the substrate 1-1 may include an interconnection. As above-mentioned, the interconnection may be used for electrical connection. In some embodiments of the present disclosure, the interconnection of the substrate 1-1 includes a plurality of conductive vias 1-17'. The conductive via 1-17' may be tapered from the surface 1-13 toward the surface 1-11.

Figure 1D:
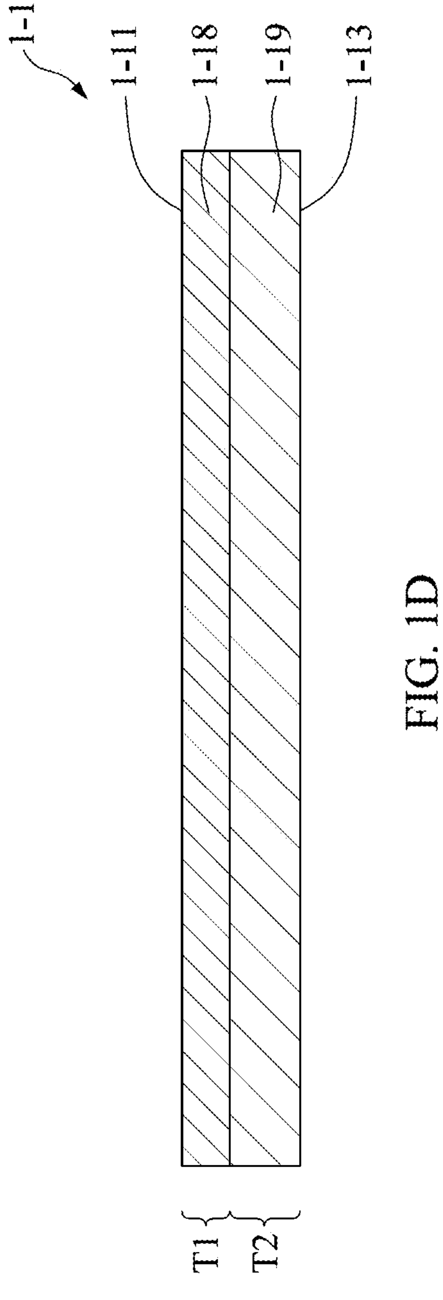
FIG. 1D is an enlarged view of portion "A" illustrated in FIG. 1A, which illustrates another embodiment of an intermediate structure.

FIG. 1D is an enlarged view of portion "A" illustrated in FIG. 1A, which illustrates an embodiment of another intermediate structure. Referring to FIG. 1D, the substrate 1-1 may include a plurality of dielectric layers 1-18, 1-19. The dielectric layer 1-18 is closer to the surface 1-11 of the substrate 1-1 than the dielectric layer 1-19. The dielectric layer 1-19 is closer to the surface 1-13 of the substrate than the dielectric layer 1-18. In some embodiments of the present disclosure, the CTE of the dielectric layer 1-18 is substantially equal to the CTE of the dielectric layer 1-19, and a thickness T2 of the dielectric layer 1-19 is substantially greater than a thickness T1 of the dielectric layer 1-18. In some embodiments of the present disclosure, the thickness T1 of the dielectric layer 1-18 is substantially equal to the thickness T2 of the dielectric layer 1-19, and the CTE of the dielectric layer 1-18 is substantially greater than the CTE of the dielectric layer 1-19.

Figure 1E:
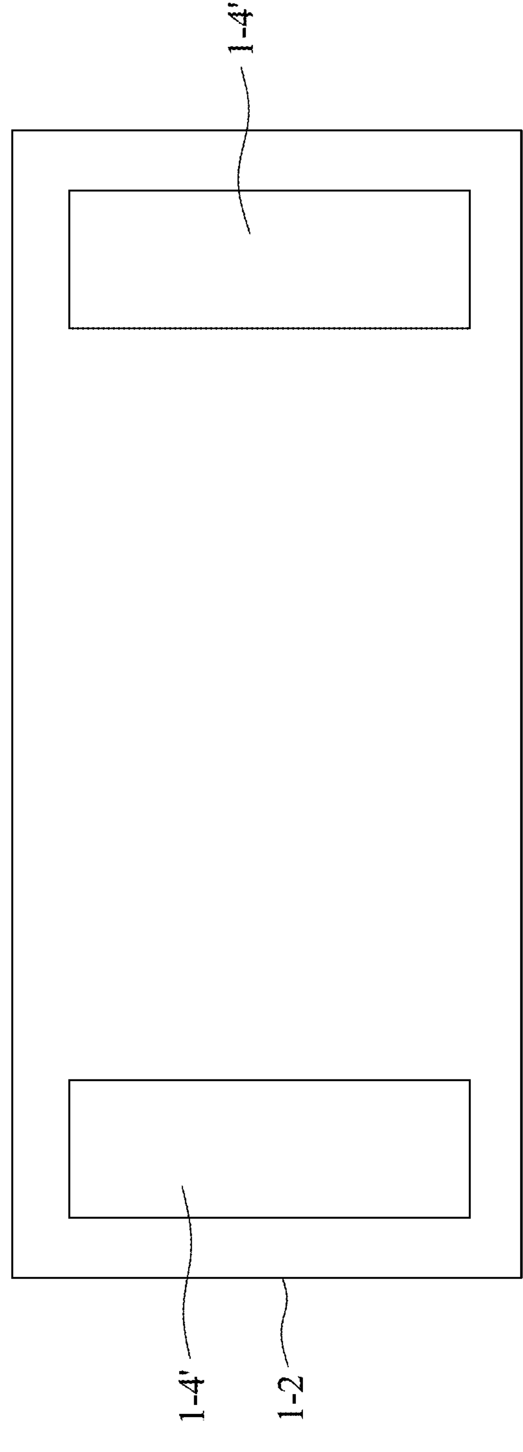
FIG. 1E is a cross-sectional view along line X1-X1 in FIG. 1A, which illustrates an embodiment of the substrate and the interposer.

FIG. 1E is a cross-sectional view along line X1-X1 in FIG. 1A. In some embodiments of the present disclosure, the interposer 1-4 includes a pair of interposers 1-4' disposed on the substrate 1-2.

Figure 1F:
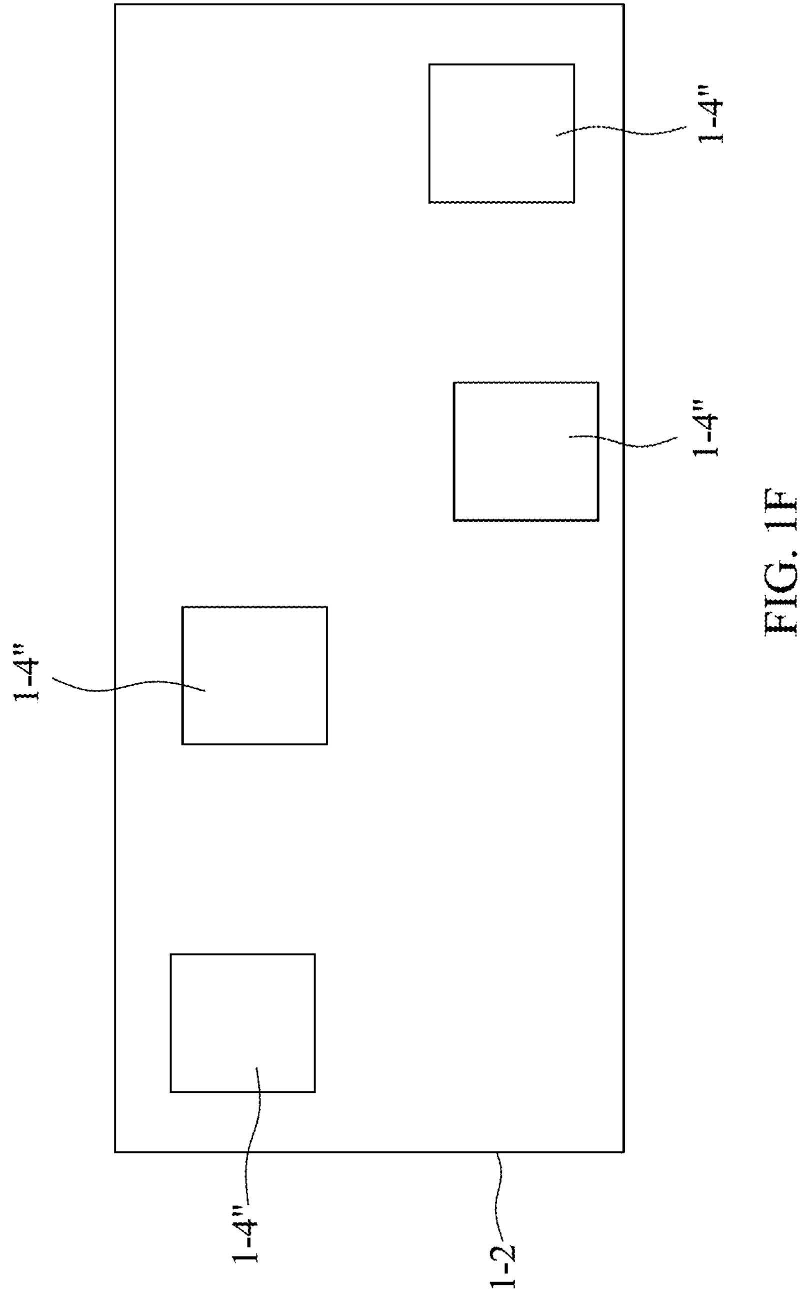
FIG. 1F is a cross-sectional view along line X1-X1 in FIG. 1A, which illustrates an embodiment of the substrate and the interposer.

FIG. 1F is a cross-sectional view along line X1-X1 in FIG. 1A. In some embodiments of the present disclosure, the interposer 1-4 includes a plurality of interposers 1-4" disposed on the substrate 1-2.

Figure 1G:
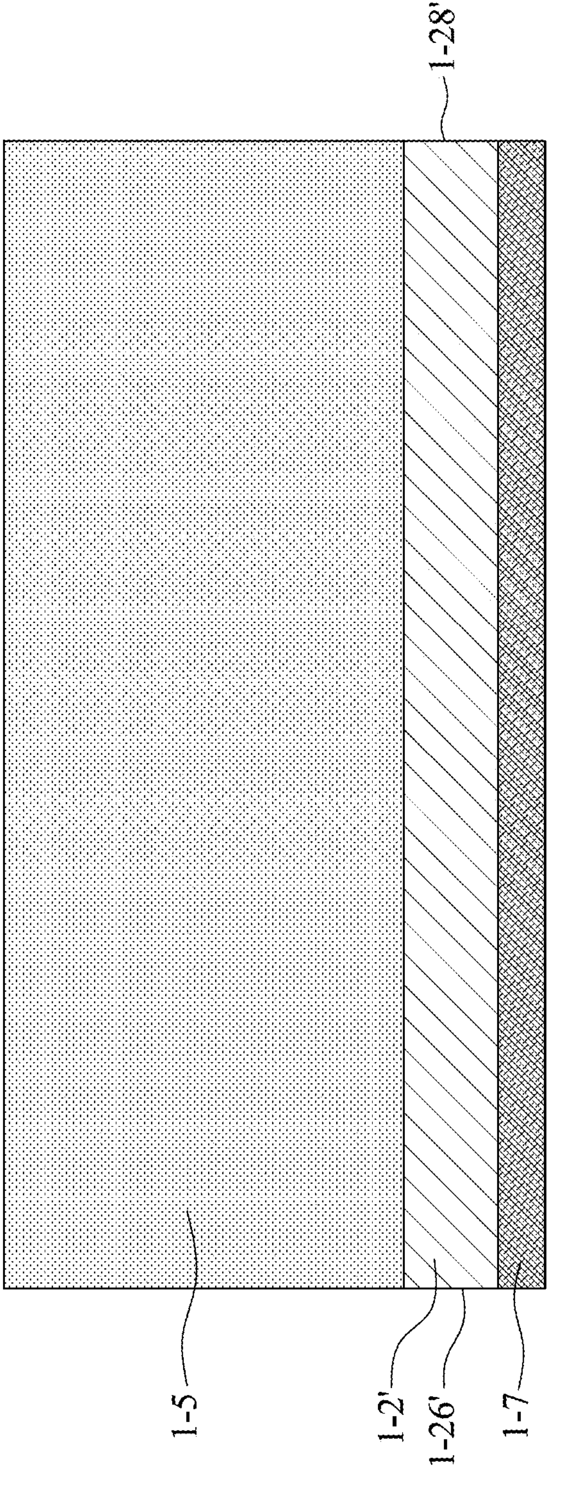
FIG. 1G is a side view of a semiconductor device package in accordance with an embodiment of the instant disclosure.

FIG. 1G is a side view of a semiconductor device package 1 in accordance with an embodiment of the instant disclosure. As shown in FIG. 1G, the substrate 1-2 may include a substrate 1-2'. The substrate 1-2' may have side surfaces 1-26' and 1-28' which are not covered by the encapsulants 1-7 and/or 1-5.

Figure 1H:
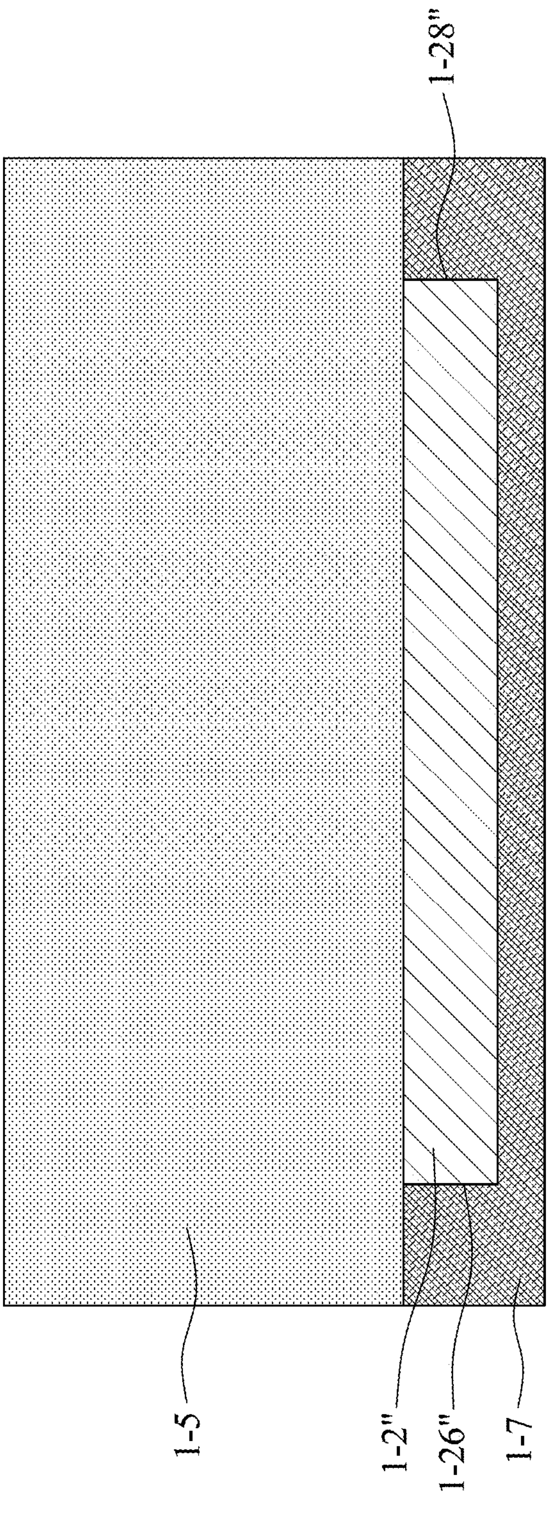
FIG. 1H is a side view of a semiconductor device package in accordance with another embodiment of the instant disclosure.

FIG. 1H is a side view of a semiconductor device package 1 in accordance with an embodiment of the instant disclosure. As shown in FIG. 1H, the substrate 1-2 may include a substrate 1-2". The substrate 1-2" may have side surfaces 1-26" and 1-28" which are covered by the encapsulant 1-7.

FIG. 2A, FIG. 2B, FIG. 2C, FIG. 2D, FIG. 2E, FIG. 2F, FIG. 2G, FIG. 2H, FIG. 2I, FIG. 2J and FIG. 2K illustrate a method of manufacturing a semiconductor device package 1 in accordance with another embodiment of the instant disclosure.

Figure 2A:
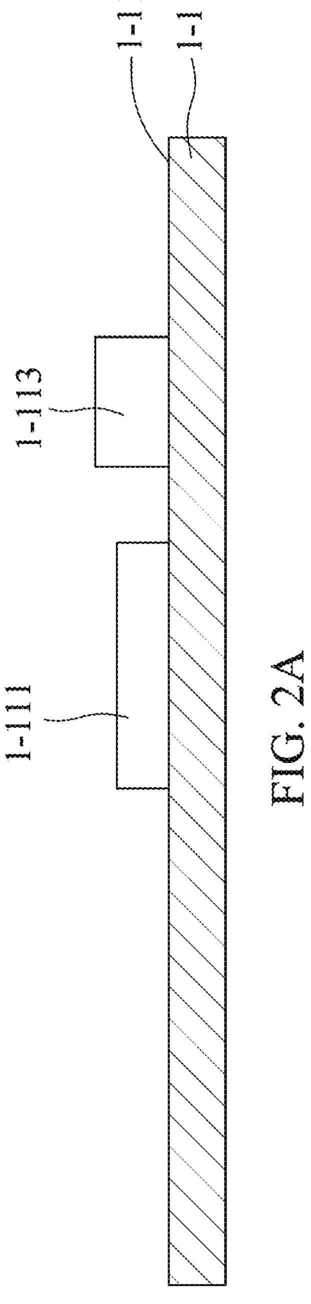
FIG. 2A, FIG. 2B, FIG. 2C, FIG. 2D, FIG. 2E, FIG. 2F, FIG. 2G, FIG. 2H, FIG. 2I, FIG. 2J and FIG. 2K illustrate a method of manufacturing a semiconductor device package in accordance with another embodiment of the instant disclosure.

Referring to FIG. 2A, the substrate 1-1 with the electronic components 1-111, 1-113 is provided. The electronic elements 1-111 and 1-113 may be disposed or mounted on the surface 1-11 of the substrate 1-1 and electrically connected to the interconnection of the substrate 1-1 through a solder material.

Figures 2B, 2C:
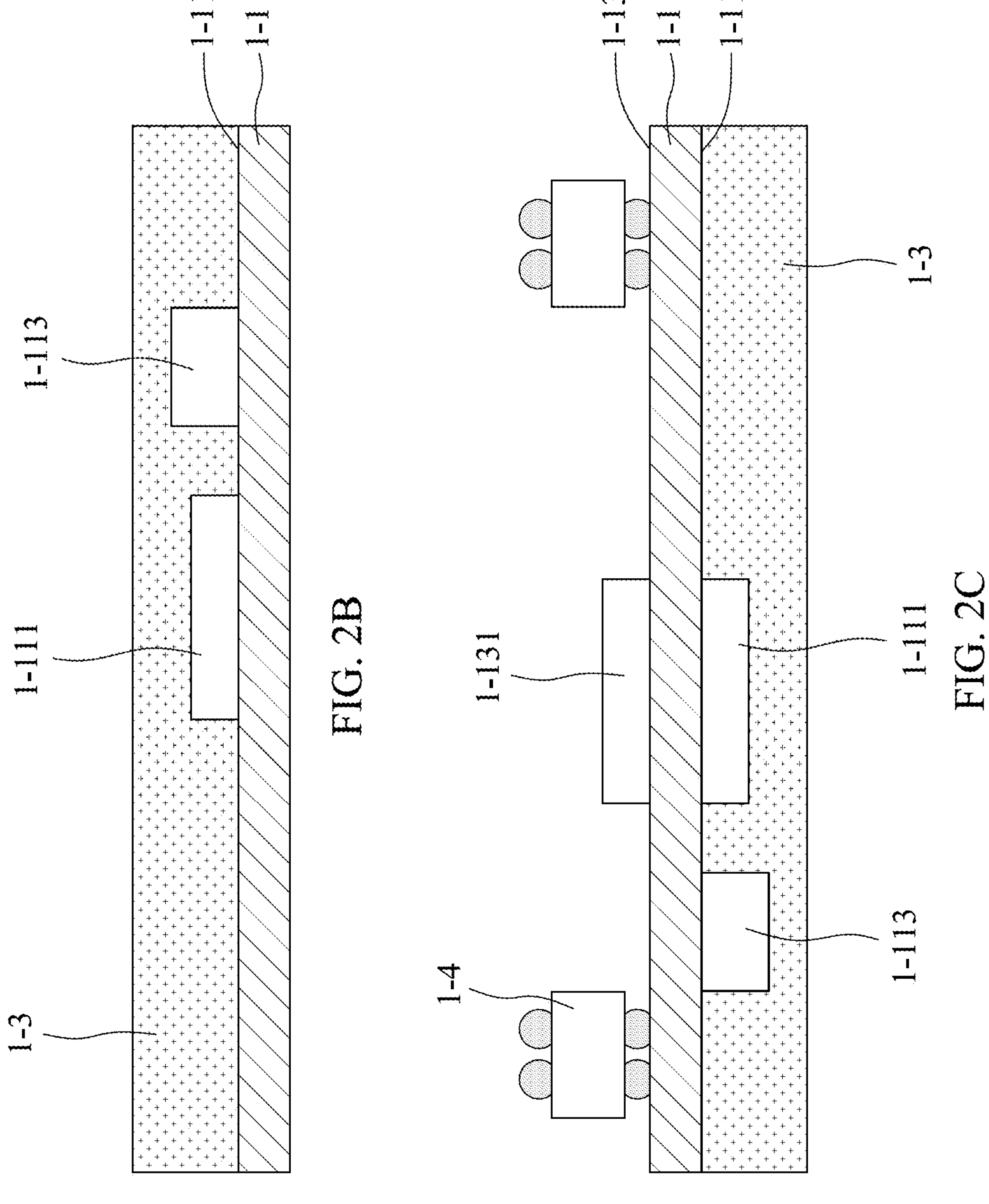

Referring to FIG. 2B, the encapsulant 1-3 is provided. The encapsulant 1-3 may be formed on the surface 1-11 of the substrate 1-1. The encapsulant 1-3 may cover the surface 1-11 of the substrate 1-1 and the electronic components 1-111, 1-113. In some embodiments of the present disclosure, the encapsulant 1-3 may be disposed between the substrate 1-1 and the electronic components 1-113 and/or the substrate 1-1 and the electronic components 1-111.

Referring to FIG. 2C, the structure obtained from FIG. 2B may be reversed upside down. The interposers 1-4 and the electronic component 1-131 may be disposed or mounted on the surface 1-13 of the substrate 1-1 and electrically connected to the interconnection of the substrate 1-1.

Figures 2D, 2E:
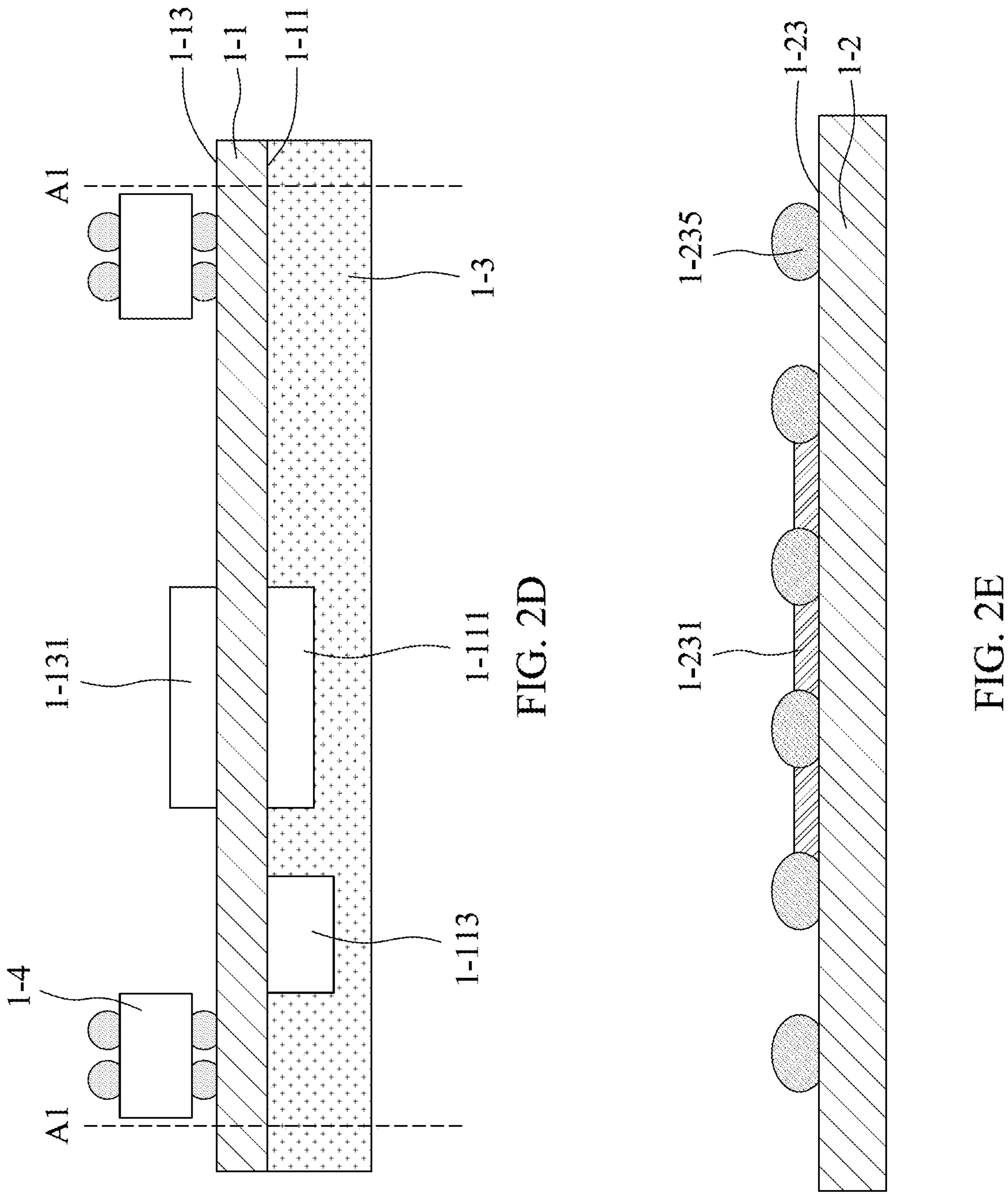

Referring to FIG. 2D, a singulation process is conducted to cut along the imaginary line "A1" through the substrate 1-1 and the encapsulant 1-3.

Referring to FIG. 2E, the substrate 1-2 with the electronic component 1-231 and electrical connections 1-235 is provided. The electronic element 1-231 and the electrical connections 1-235 may be disposed or mounted on the surface 1-23 of the substrate 1-2 and electrically connected to the interconnection of the substrate 1-2.

Figure 2F:
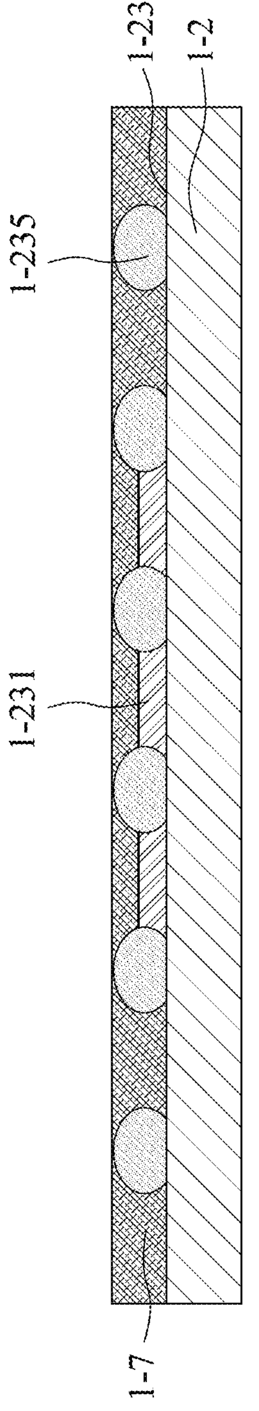
Figure 2F:

Referring to FIG. 2F, the encapsulant 1-7 is provided. The encapsulant 1-7 may be formed on the surface 1-23 of the substrate 1-2. The encapsulant 1-7 may cover the surface 1-23 of the substrate 1-2, the electronic component 1-231 and the electrical connections 1-235.

Figure 2G:
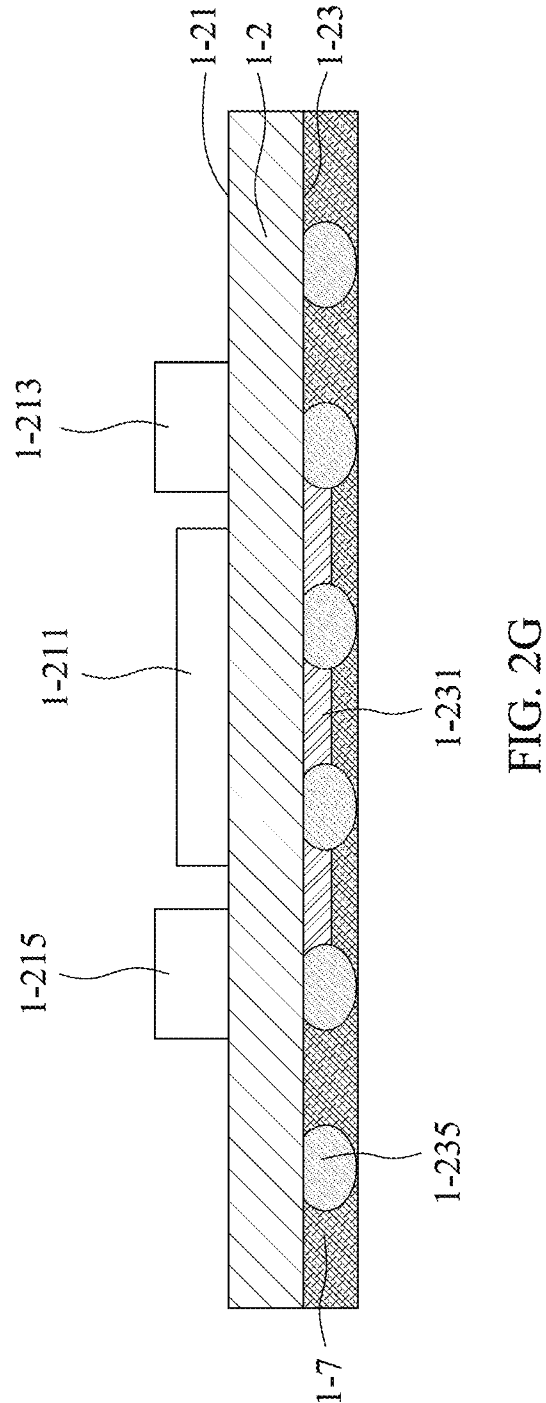

Referring to FIG. 2G, the structure obtained from FIG. 2F may be reversed upside down. The electronic elements 1-211, 1-213 and 1-215 may be disposed or mounted on the surface 1-21 of the substrate 1-2 and electrically connected to the interconnection of the substrate 1-2.

Figure 2H:
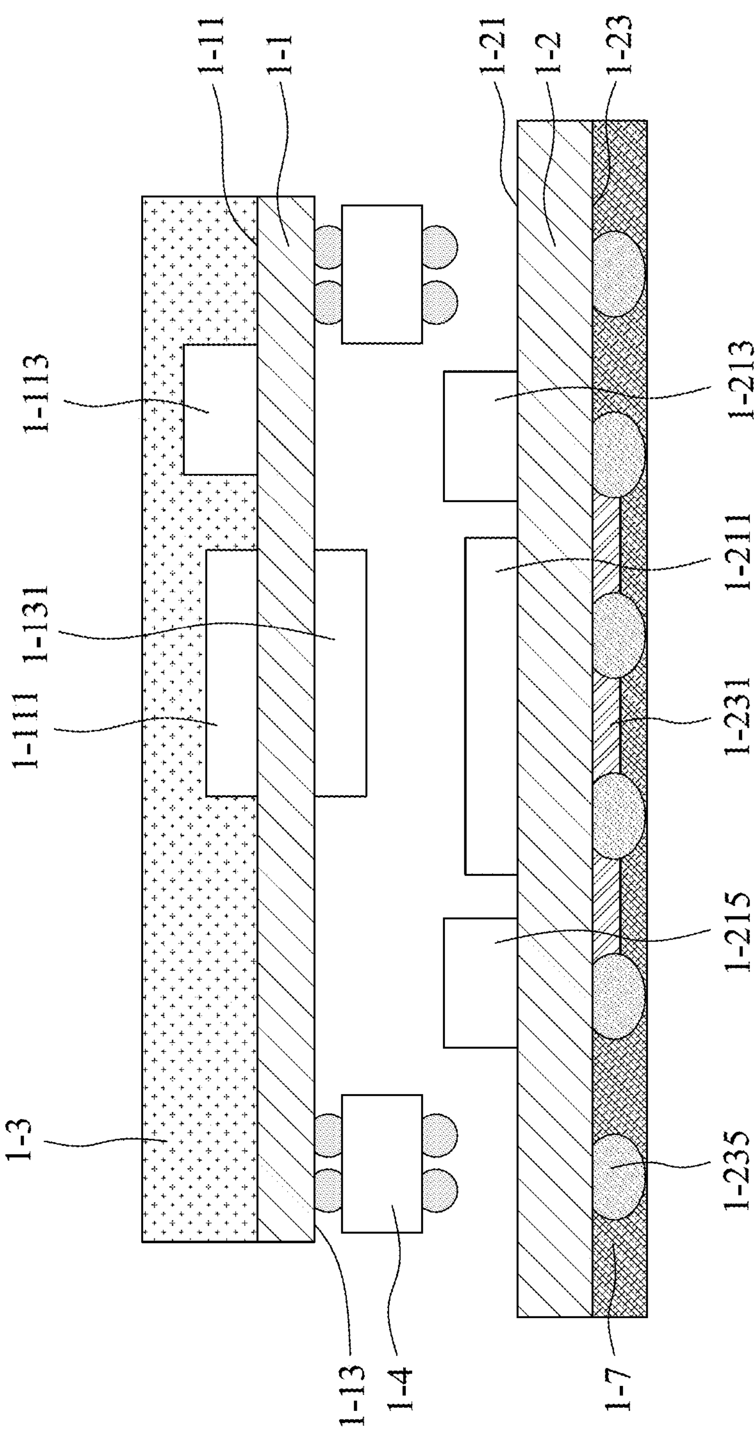

Referring to FIG. 2H, the structure obtained from FIG. 2D may be staked on the structure obtained from FIG. 2G. That is, the substrate 1-1 may be disposed over the substrate 1-2. The surface 1-13 of the substrate 1-1 may face the surface 1-21 of the substrate 1-2. The interposer 1-4 may be arranged between the substrate 1-1 and the substrate 1-2. The substrate 1-1 may be electrically connected to the substrate 1-2 through the interposer 1-4. Since the interposer 1-4 may be disposed on the substrate 1-2 and support the substrate 1-1, the electronic component 1-131 disposed on the surface 1-13 of the substrate 1-1 and the electronic component 1-211 disposed on the surface 1-21 of the substrate 1-2 may be spaced apart from by a distance.

Figure 2I:
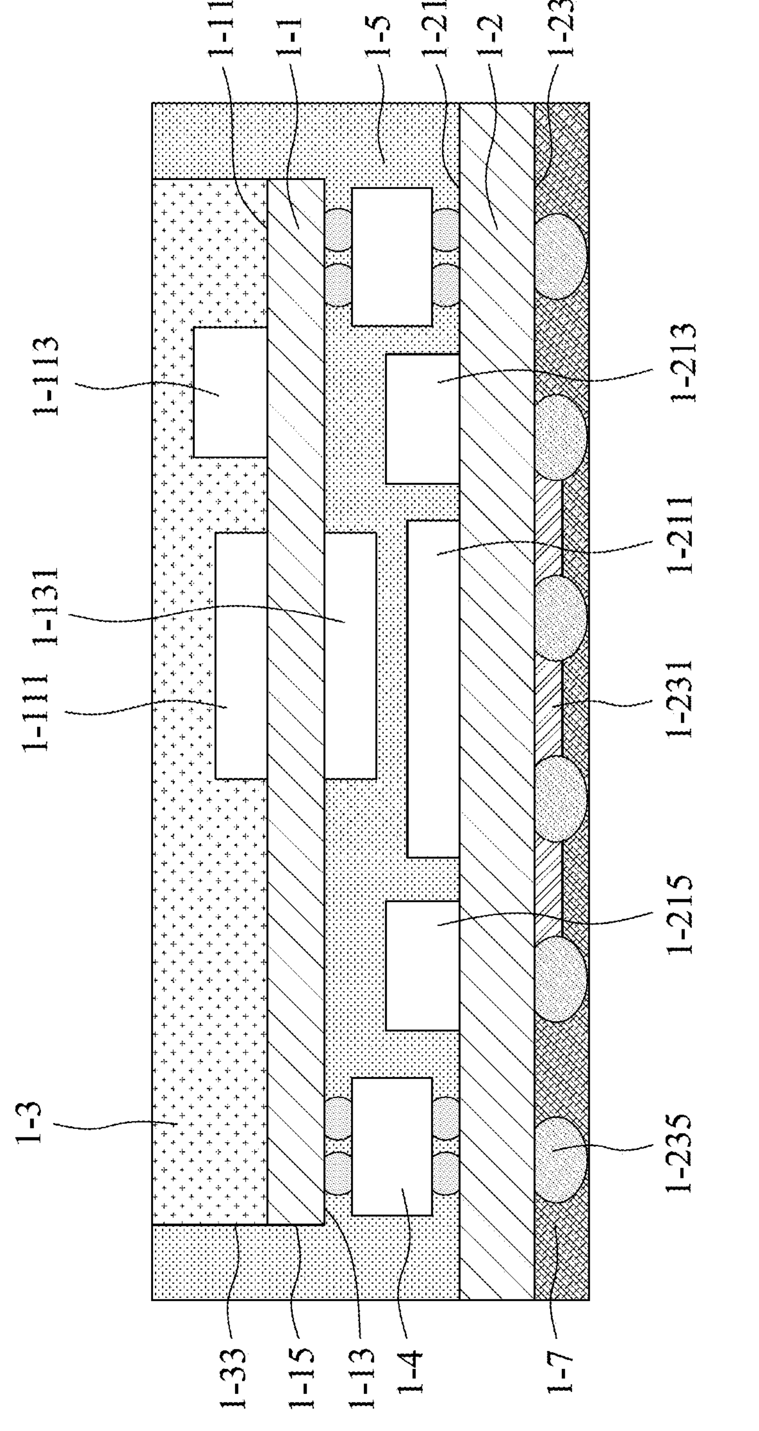

Referring to FIG. 2I, the encapsulant 1-5 is provided. The encapsulant 1-5 may be formed on the surface 1-21 of the substrate 1-2. The encapsulant 1-5 may cover the surface 1-21 of the substrate 1-2, the surface 1-13 of the substrate 1-1, the electronic component 1-131, the electronic components 1-211, 1-213, 1-215 and the interposers 1-4. The encapsulant 1-5 may cover the lateral surface 1-15 of the substrate 1-1. The encapsulant 1-5 may cover the lateral surface 1-33 of the encapsulant 1-3. In some embodiments of the present disclosure, the encapsulant 1-5 may be disposed between the substrate 1-1 and the electronic components 1-133 and/or the substrate 1-2 and the electronic components 1-211 and/or the substrate 1-2 and the electronic components 1-213 and/or substrate 1-2 and the electronic components 1-215.

Figure 2J:
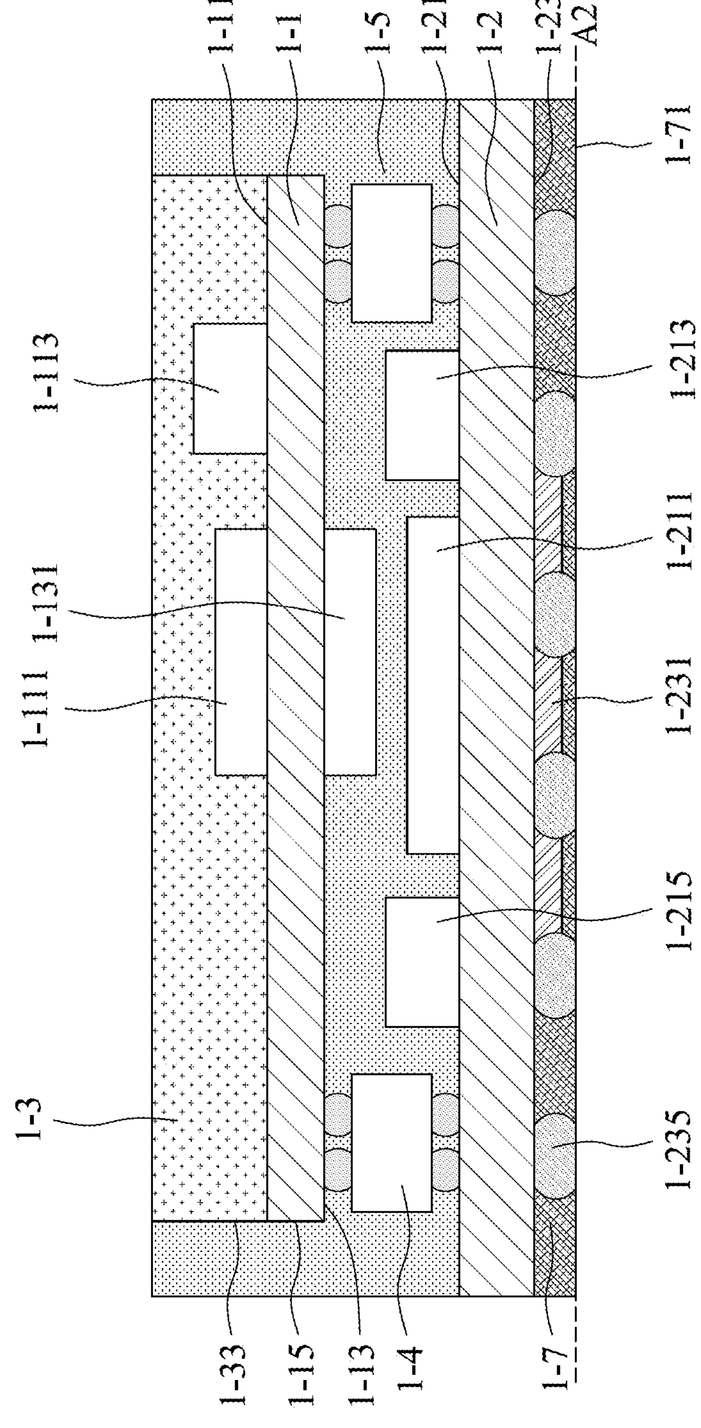

Referring to FIG. 2J, a grinding process is conducted to cut along the imaginary line "A2" through the encapsulant 1-7 and the electrical connections 1-235. After the grinding process, the electrical connections 1-235 may be exposed from the lower surface 1-71 of the encapsulant 1-7. In some embodiments of the present disclosure, the encapsulant 1-7 may be disposed between the substrate 1-2 and the electronic components 1-231.

Figure 2K:
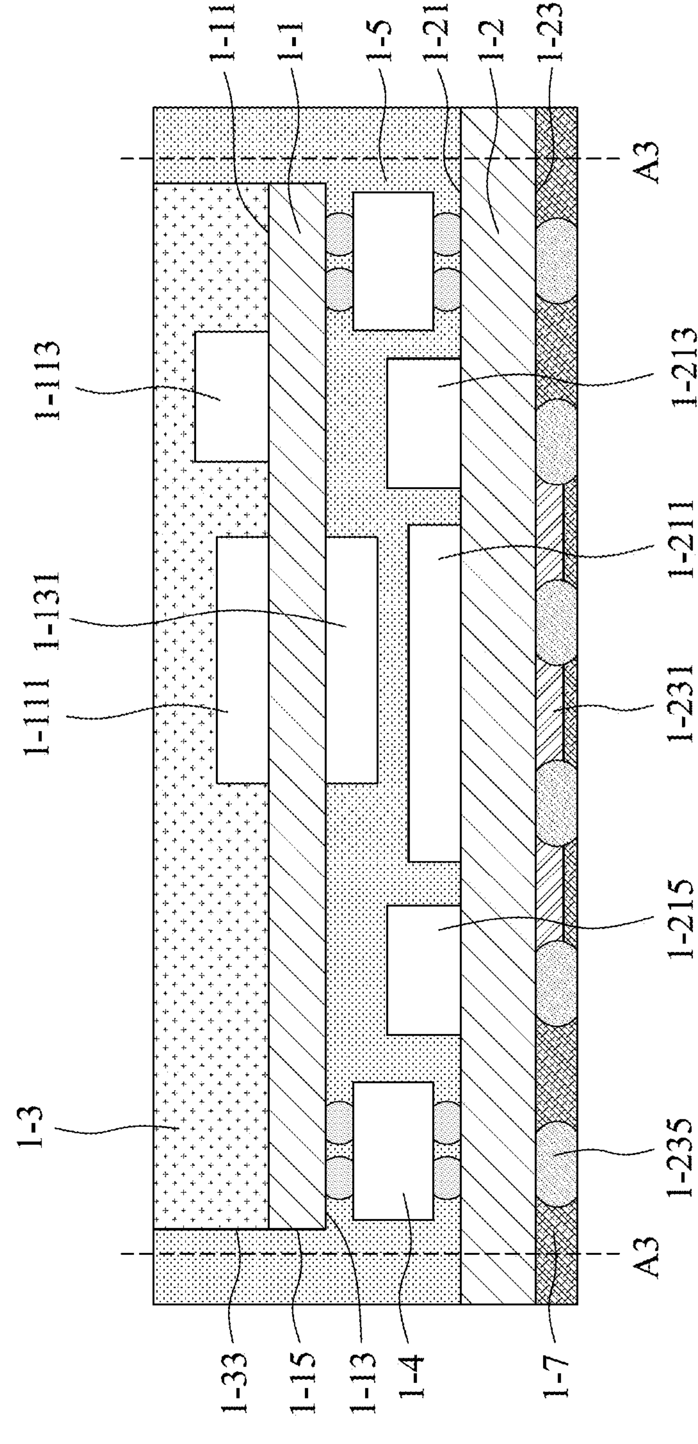

Referring to FIG. 2K, a singulation process is conducted to cut along the imaginary line "A3" through the substrate 1-2 and the encapsulants 1-5 and 1-7, and thus forming the semiconductor device package structure 1 as shown in FIG. 1A.

Figure 3:
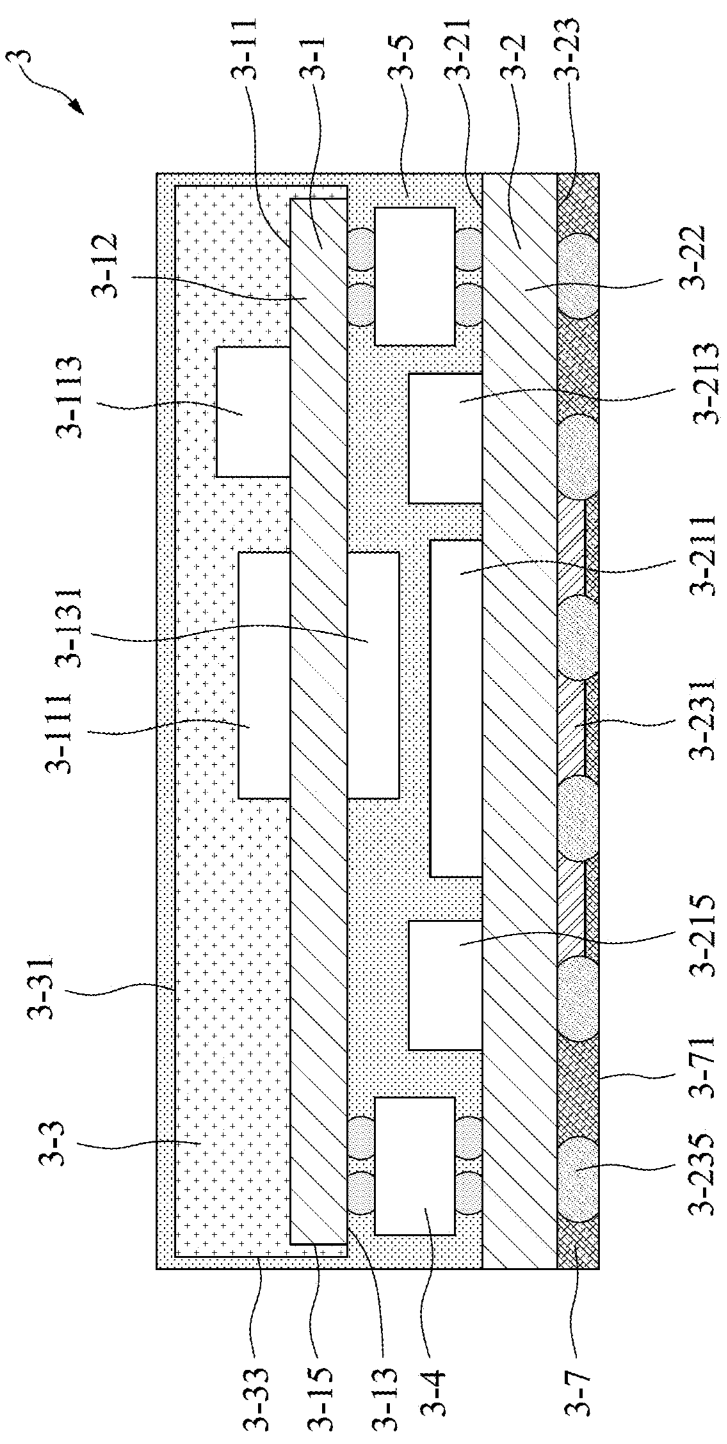
FIG. 3 is a cross-sectional view of a semiconductor device package in accordance with an embodiment of the instant disclosure.

FIG. 3 is a cross-sectional view of a semiconductor device package 3 in accordance with some embodiments of the present disclosure. As shown in FIG. 3, the semiconductor device package 3 may be a three-dimensional (3D) stacked semiconductor device package. The semiconductor device package 3 may include substrates 3-1, 3-2, electronic components 3-111, 3-113, 3-131, 3-211, 3-213, 3-215 and 3-231, encapsulants 3-3, 3-5, 3-7, interposers 3-4 and electrical connections 3-235. The substrate 3-1 may be a coreless substrate and may include traces, pads or interconnections for electrical connection. The substrate 3-2 may be a core substrate or a core-less substrate and may include traces, pads or interconnections for electrical connection. Further, the substrate 3-1 may disposed over and/or above the substrate 3-2.

Referring to FIG. 3, the substrate 3-1 has a surface 3-11 (e.g., an upper surface) and a surface 3-13 (e.g., a lower surface). In some embodiments of the present disclosure, the surface 3-13 is coplanar with a lower surface of the encapsulant 3-3. The electronic components 3-111, 3-113 may be disposed or mounted on the surface 3-11 of the substrate 3-1. The electronic components 3-111, 3-113 may be a die, an active device, a passive device, and/or other electronic devices. In some embodiments of the present disclosure, the electronic components 3-111, 3-113 electrically connects the substrate 3-1 via electrical connections. In some embodiments of the present disclosure, the electronic component 3-111 may include a flash memory device. Further, the electronic component 3-131 may be disposed or mounted on the surface 3-13 of the substrate 3-1. The electronic component 3-131 may be a die, an active device, a passive device, and/or other electronic devices. In some embodiments of the present disclosure, the electronic component 3-131 electrically connects the substrate 3-1 via electrical connections. In some embodiments of the present disclosure, the electronic component 3-131 may include a flash memory device. In some embodiments of the present disclosure, a thickness of the substrate 3-2 is substantially greater than a thickness of the substrate 3-1. In some embodiments of the present disclosure, a thickness a dielectric layer 3-22 of the substrate 3-2 is substantially greater than a thickness of a dielectric layer 3-12 of the substrate 3-1. In some embodiments of the present disclosure, a hardness of the substrate 3-2 is substantially greater than a hardness of the substrate 3-1.

The substrate 3-2 has a surface 3-21 (e.g., an upper surface) and a surface 3-23 (e.g., a lower surface). The electronic components 3-211, 3-213, 3-215 may be disposed or mounted on the surface 3-21 of the substrate 3-2. The electronic components 3-211, 3-213, 3-215 may be a die, an active device, a passive device, and/or other electronic devices. In some embodiments of the present disclosure, the electronic components 3-211, 3-213, 3-215 electrically connects the substrate 3-2 via electrical connections. Further, the electronic component 3-231 may be disposed or mounted on the surface 3-23 of the substrate 3-2. The electronic component 3-231 may be a die, an active device, a passive device, and/or other electronic devices. In some embodiments of the present disclosure, the electronic component 3-231 electrically connects the substrate 3-2 via electrical connections. In some embodiments of the present disclosure, a thickness of the electronic components 3-231 is the thinnest among other components in the semiconductor device package 3. Moreover, a plurality of the electrical connections 3-235 are disposed or mounted on the surface 3-23 of the substrate 3-2. In some embodiments of the present disclosure, the electrical connection 3-235 includes a reflowable material. In some embodiments of the present disclosure, the electrical connection 3-235 includes solder material. The electrical connection 3-235 may include a solder ball. The electrical connection 3-235 may include a conductive pillar, post, or substrate interposer.

The interposers 3-4 may be disposed or mounted on the surface 3-13 of the substrate 3-1 and the surface 3-21 of the substrate 3-2. That is, the interposer 3-4 may be arranged between the substrate 3-1 and the substrate 3-2, and thus the interposer 3-4 may define a space between the substrate 3-1 and 3-2. In some embodiments of the present disclosure, an amount of the electronic components within the space between the substrate 3-1 and the substrate 3-2 and/or defined by the interposer 3-4, such as the electronic components, 3-131, 3-211, 3-213, 3-215, is greater than an amount of the electronic components outside of the space between the substrate 3-1 and the substrate 3-2 and/or defined by the interposer 3-4, such as the electronic components, 3-111, 3-113, 3-231. In some embodiments of the present disclosure, a distance between the adjacent electronic components within the space between the substrate 3-1 and the substrate 3-2 and/or defined by the interposer 3-4, such as the electronic components, 3-131, 3-211, 3-213, 3-215, is smaller than a distance between the adjacent electronic components outside of the space between the substrate 3-1 and the substrate 3-2 and/or defined by the interposer 3-4, such as the electronic components, 3-111, 3-113, 3-231. In some embodiments of the present disclosure, a density of the electronic components within the space between the substrate 3-1 and the substrate 3-2 and/or defined by the interposer 3-4, such as the electronic components, 3-131, 3-211, 3-213, 3-215, is greater than a density of the electronic components outside of the space between the substrate 3-1 and the substrate 3-2 and/or defined by the interposer 3-4, such as the electronic components, 3-111, 3-113, 3-231. Moreover, the interposer 3-4 may electrically connect the substrate 3-1 and the substrate 3-2 via electrical connections. In some embodiments of the present disclosure, such electrical connection includes a solder material. In some embodiments of the present disclosure, the interposer 3-4 includes a substrate interposer with redistribution layers and/or conductive vias.

The encapsulant 3-3 is disposed on the surface 3-11 of the substrate 3-1. The encapsulant 3-3 may cover the surface 3-11 of the substrate 3-1 and the electronic components 3-111 and 3-113 disposed on the surface 3-11 of the substrate 3-1. Further, the encapsulant 3-3 may cover a lateral surface 3-15 of the substrate 3-1, and thus functions as a mold lock. The encapsulant 3-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 3-3 may include a molding underfill (MUF) or a capillary underfill (CUF).

As above-mentioned, the substrate 3-1 may be a core-less substrate, and thus the substrate 3-1 may have a relatively thin thickness and/or a relatively weak stiffness. Therefore, when the electronic components, such as the electronic components, 3-111, 3-113, 3-131, are mounted on the substrate 3-1, the total weight of the electronic components may cause the substrate 3-1 to collapse. That is, the substrate 3-1 may be bended or recessed toward the substrate 3-2 due to the weights of the electronic components 3-111, 3-113, 3-131, and the electronic component 3-131 on the surface 3-13 of the substrate 3-1 may collide with the electronic component 3-211 on the surface of the substrate 3-2 and under the electronic component 3-131. The encapsulant 3-3 may be a reinforcement structure which is configured to improve the strength of the substrate 3-1 such that the substrate 3-1 is strong enough to support the electronic components 3-111, 3-113, 3-131 mounted thereon. Given the above, the encapsulant 3-3 may be configured to prevent the substrate 3-1 from collapsing and being bended or recessed toward the substrate 3-2. That is, the encapsulant 3-3 is configured to define a space between the electronic component 3-131 on the surface 3-13 of the substrate 3-1 and the electronic component 3-211 on the surface 3-21 of the substrate 3-2, and thus the electronic component 3-131 and the electronic component 3-211 may be maintained to be spaced apart from each other by a distance. In some embodiments of the present disclosure, the encapsulant 3-3 is a warpage-resistant layer configured to prevent the warpage of the substrate 3-1.

The encapsulant 3-5 is disposed on the surface 3-21 of the substrate 3-2. The encapsulant 3-5 may cover the surface 3-21 of the substrate 3-2, the electronic components 3-211, 3-213, 3-215 disposed on the surface 3-21 of the substrate 3-2, the surface 3-13 of the substrate 3-1, the electronic component 3-131 disposed on the surface 3-13 of the substrate 3-1 and the interposers 3-4. The encapsulant 3-5 may cover an upper surface 3-31 and a lateral surface 3-33 of the encapsulant 3-3. The encapsulant 3-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 3-5 may include a molding underfill (MUF) or a capillary underfill (CUF).

The encapsulant 3-7 is disposed on the surface 3-23 of the substrate 3-2. The encapsulant 3-7 may cover the surface 3-23 of the substrate 3-2 and the electronic component 3-231 and the electrical connections 3-235 disposed on the surface 3-23 of the substrate 3-2. The encapsulant 3-7 may have a lower surface 3-71 covering the electronic component 3-231. In some embodiments of the present disclosure, a lower surface of the electronic component 3-231 is exposed from the lower surface 3-71 of the encapsulant 3-7. The electrical connections 3-235 may be exposed from the lower surface 3-71 of the encapsulant 3-7. The encapsulant 3-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 3-7 may include a molding underfill (MUF) or a capillary underfill (CUF). In some embodiments of the present disclosure, a thickness of the encapsulant 3-7 is the thinnest among other encapsulants 3-3, 3-5 in the semiconductor device package 3.

In some embodiments of the present disclosure, the material of the encapsulant 3-3 is substantially identical to the material of the encapsulant 3-5, and/or the material of the encapsulant 3-5 is substantially identical to the material of the encapsulant 3-7, and/or the material of the encapsulant 3-3 is substantially identical to the material of the encapsulant 3-7. In some embodiments of the present disclosure, the material of the encapsulant 3-3 is different from the material of the encapsulant 3-5, and/or the material of the encapsulant 3-5 is different from the material of the encapsulant 3-7, and/or the material of the encapsulant 3-3 is different from the material of the encapsulant 3-7. In some embodiments of the present disclosure, the CTE (coefficient of thermal expansion) of the substrate 3-1 is substantially equal to the CTE of the encapsulant 3-3. In some embodiments of the present disclosure, the CTE of the encapsulant 3-5 is substantially equal to or smaller than the CTE of the encapsulant 3-7. In some embodiments of the present disclosure, the difference between the CTE of substrate 3-1 and the CTE of the encapsulant 3-7 is less than the difference between the CTE of substrate 3-1 and the CTE of the encapsulant 3-5 or the difference between the CTE of encapsulant 3-5 and the CTE of the encapsulant 3-7.

In some embodiments of the present disclosure, a side surface of the substrate 3-2 may be covered by the encapsulant 3-5 or 3-7.

In some embodiments of the present disclosure, the substrate 3-1 is the same as, or similar to, the substrate 1-1 as shown in FIGS. 1B and 1C. That is, the substrate 3-1 may include the interconnection which may have the via tapered from the surface 3-11 toward the surface 3-13 or tapered from the surface 3-13 toward the surface 3-11. In some embodiments of the present disclosure, the substrate 3-1 is the same as, or similar to, the substrate 1-1 as shown in FIG. 1D. That is, the substrate 3-1 may include dielectric layers as shown in FIG. 1D.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate a method of manufacturing a semiconductor device package 3 in accordance with another embodiment of the instant disclosure.

Figure 4A:
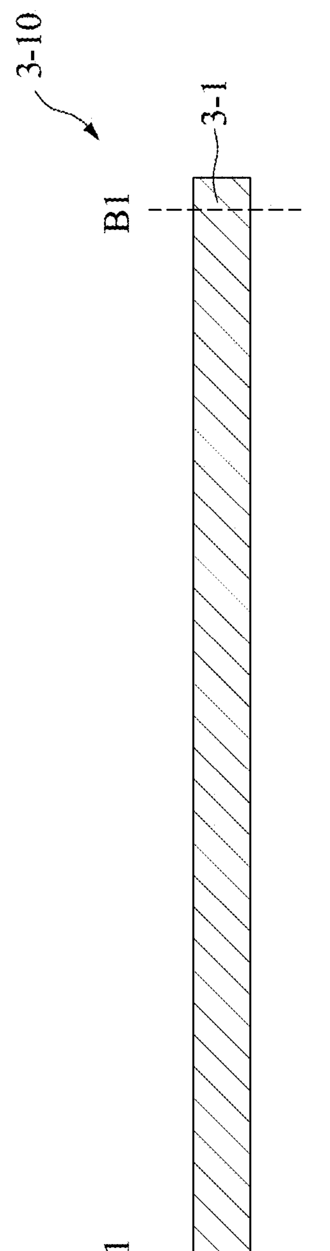
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate a method of manufacturing a semiconductor device package in accordance with another embodiment of the instant disclosure.

Referring to FIG. 4A, a strip 3-10 is provided and a singulation process is conducted to cut along the imaginary line "B1" through the strip 3-10, and thus forming the substrate 3-1 as shown in FIG. 3.

Figure 4B:
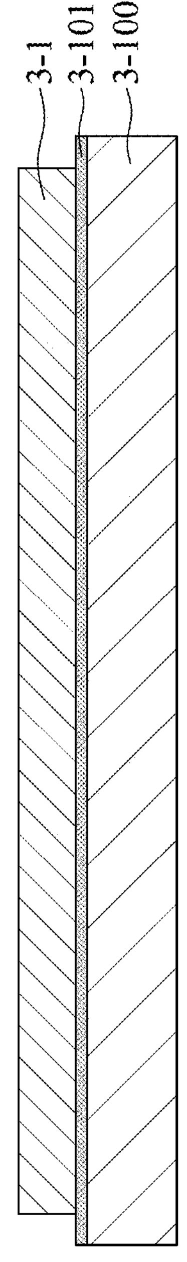

Referring to FIG. 4B, the substrate 3-1 may be arranged on a carrier 3-100 through a tape 3-101. That is, the tape 3-101 may be between the substrate 3-1 and the carrier 3-100.

Figures 4C, 4D:
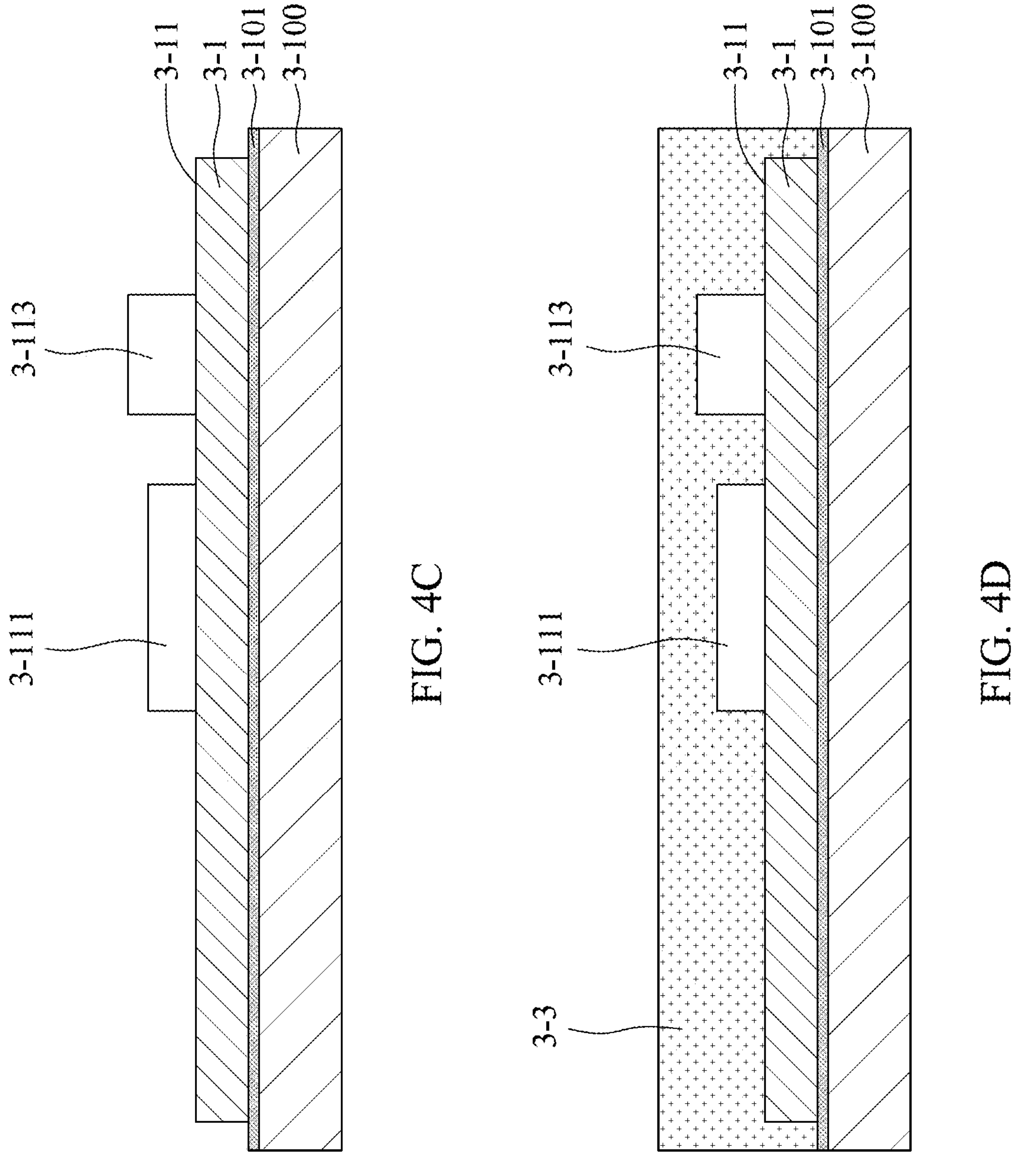

Referring to FIG. 4C, the electronic components 3-111, 3-113 may be disposed or mounted on the surface 3-11 of the substrate 3-1 and electrically connected to the interconnection of the substrate 3-1.

Referring to FIG. 4D, the encapsulant 3-3 is provided. The encapsulant 3-3 may be formed on the surface 3-11 of the substrate 3-1 and the tape 3-101 on the carrier 3-100. The encapsulant 3-3 may cover the surface 3-11 of the substrate 3-1, the electronic components 3-111, 3-113 and the tape 3-101.

Figures 4E, 4F:
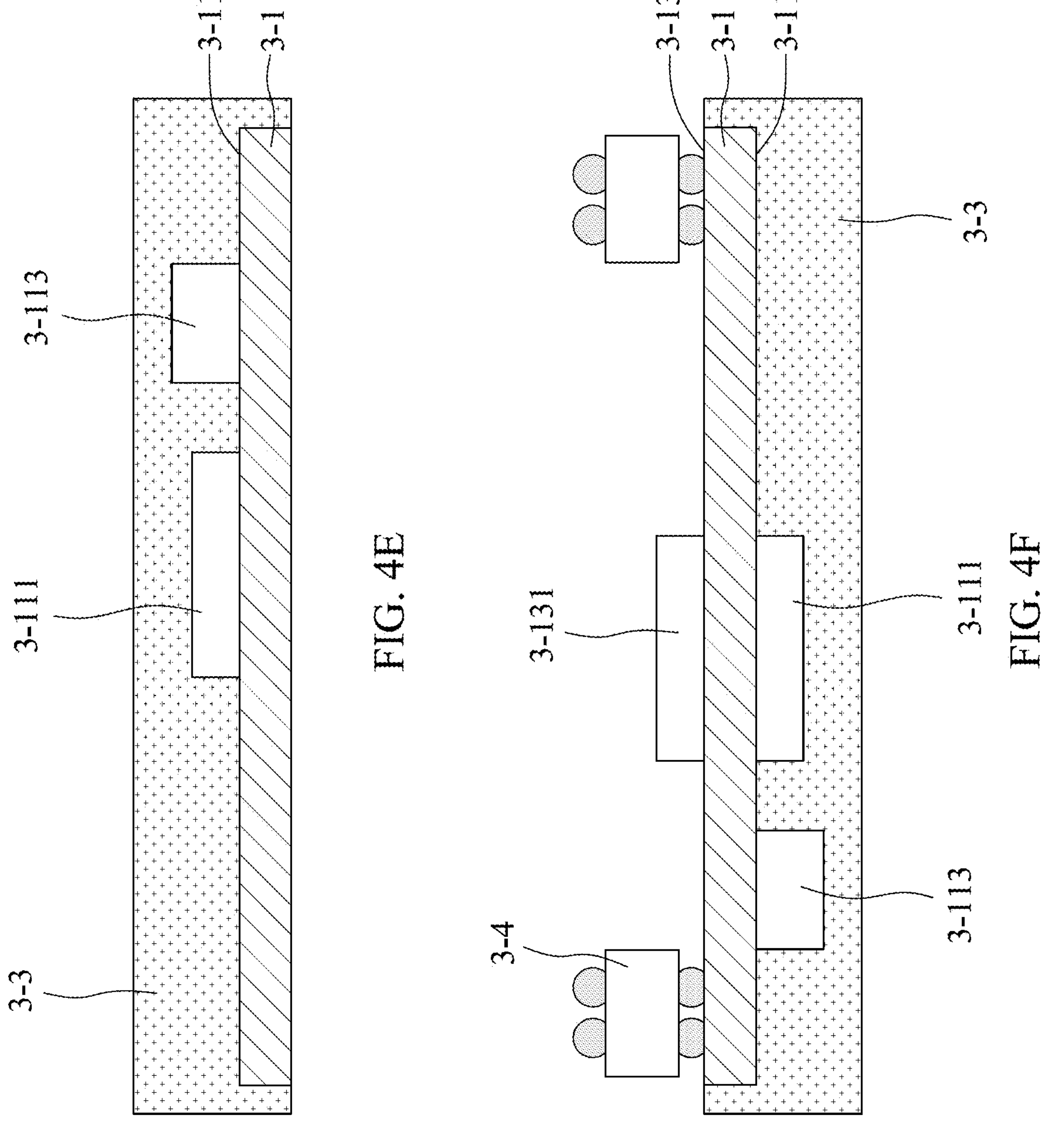

Referring to FIG. 4E, the carrier 3-100 and the tape 3-101 are removed (i.e., de-carrier).

Referring to FIG. 4F, the structure obtained from FIG. 4E may be reversed upside down. The interposers 3-4 and the electronic component 3-131 may be disposed or mounted on the surface 3-13 of the substrate 3-1 and electrically connected to the interconnection of the substrate 3-1.

Figures 4G, 4H:
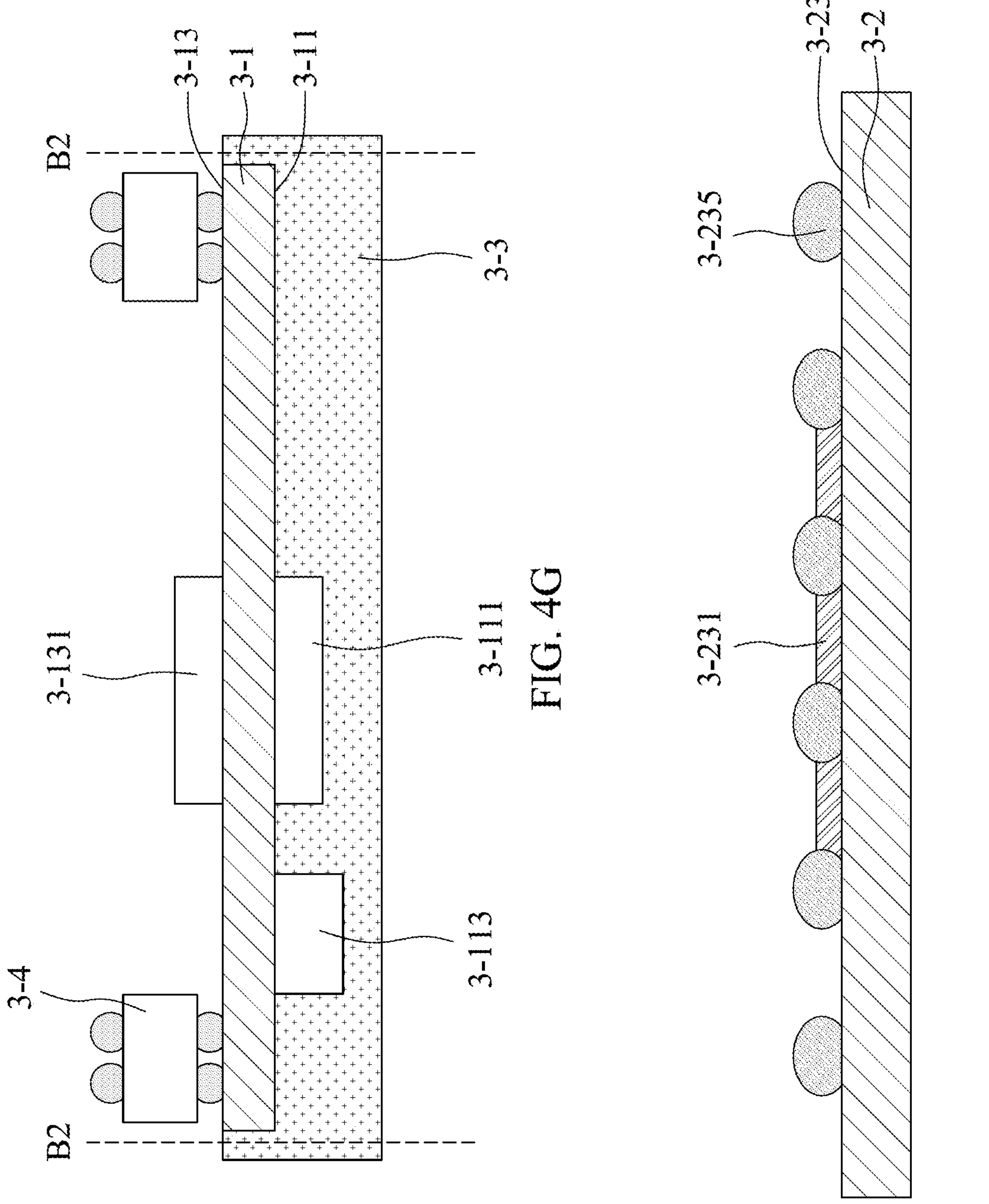

Referring to FIG. 4G, a singulation process is conducted to cut along the imaginary line "B2" through the encapsulant 3-3.

Referring to FIG. 4H, the substrate 3-2 with the electronic component 3-231 and electrical connections 3-235 is provided. The electronic element 3-231 and the electrical connections 3-235 may be disposed or mounted on the surface 3-23 of the substrate 3-2 and electrically connected to the interconnection of the substrate 3-2.

Figures 4I, 4J:
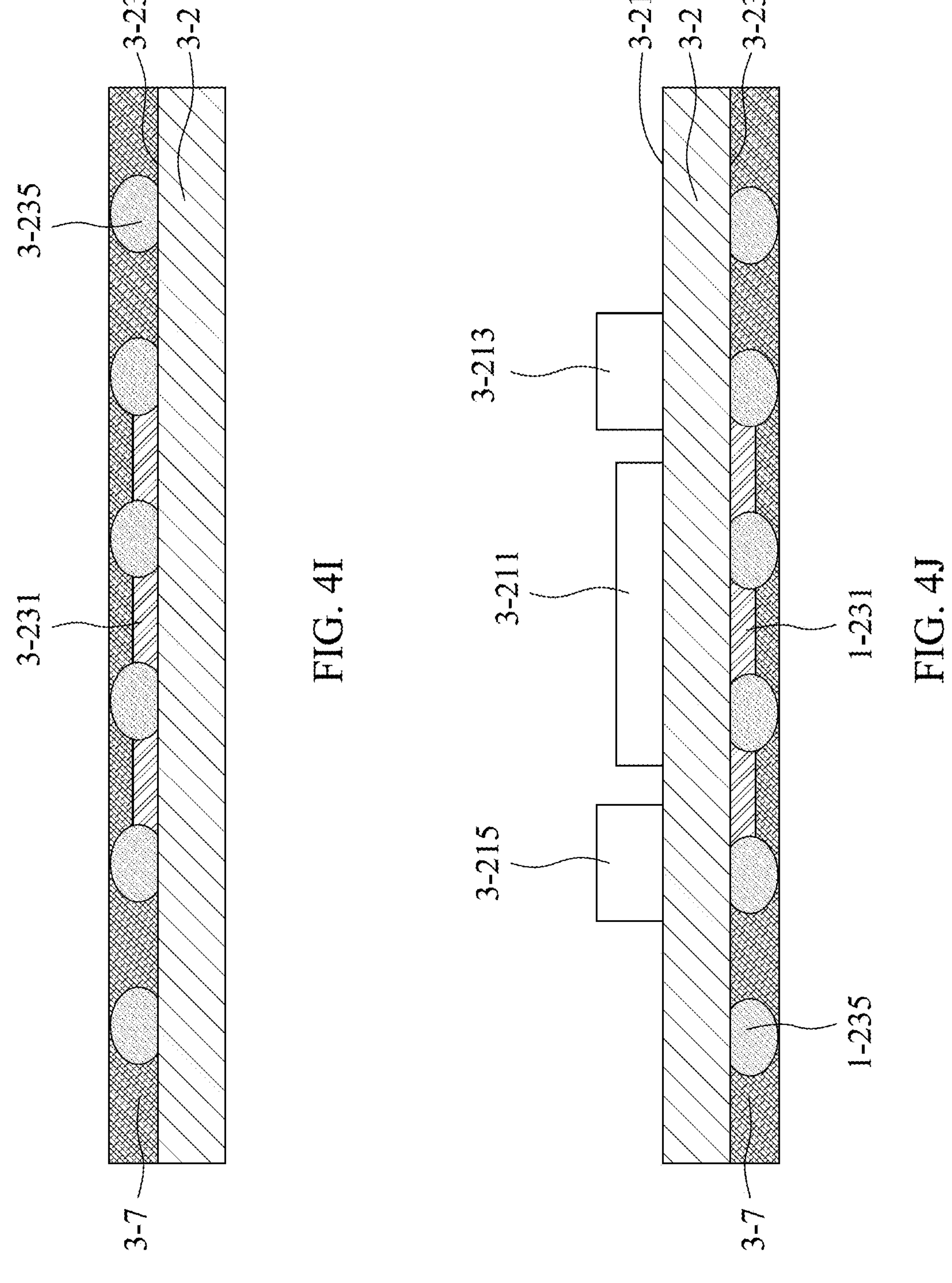

Referring to FIG. 4I, the encapsulant 3-7 is provided. The encapsulant 3-7 may be formed on the surface 3-23 of the substrate 3-2. The encapsulant 3-7 may cover the surface 3-23 of the substrate 3-2, the electronic component 3-231 and the electrical connections 3-235.

Referring to FIG. 4J, the structure obtained from FIG. 4I may be reversed upside down. The electronic elements 3-211, 3-213 and 3-215 may be disposed or mounted on the surface 3-21 of the substrate 3-2 and electrically connected to the interconnection of the substrate 3-2.

Figure 4K:
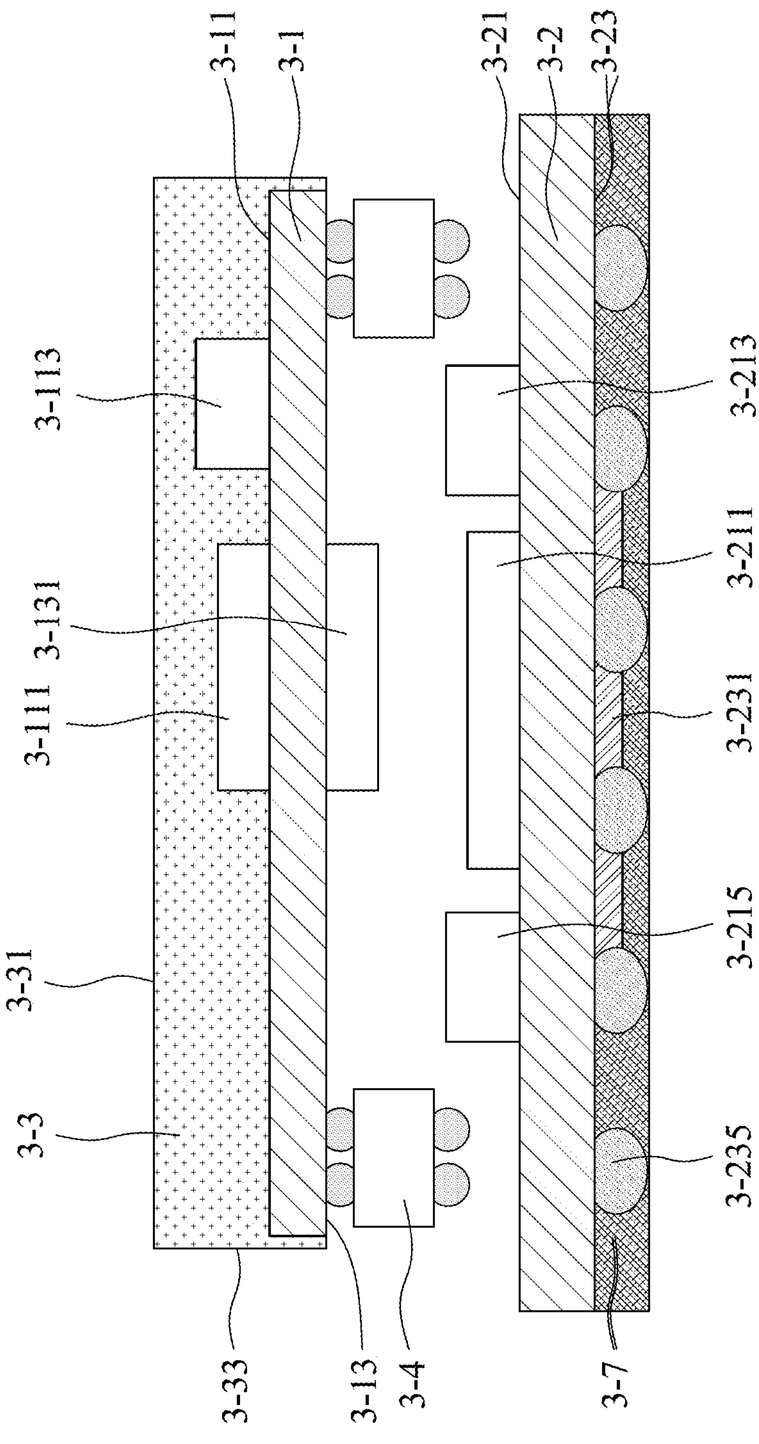

Referring to FIG. 4K, the structure obtained from FIG. 4G may be staked on the structure obtained from FIG. 4J. That is, the substrate 3-1 may be disposed over the substrate 3-2. The surface 3-13 of the substrate 3-1 may face the surface 3-21 of the substrate 3-2. The interposer 3-4 may be arranged between the substrate 3-1 and the substrate 3-2. The substrate 3-1 may be electrically connected to the substrate 3-2 through the interposer 3-4. Since the interposer 3-4 may be disposed on the substrate 3-2 and support the substrate 3-1, the electronic component 3-131 disposed on the surface 3-13 of the substrate 3-1 and the electronic component 3-211 disposed on the surface 3-21 of the substrate 3-2 may be spaced apart from by a distance.

Figure 4L:
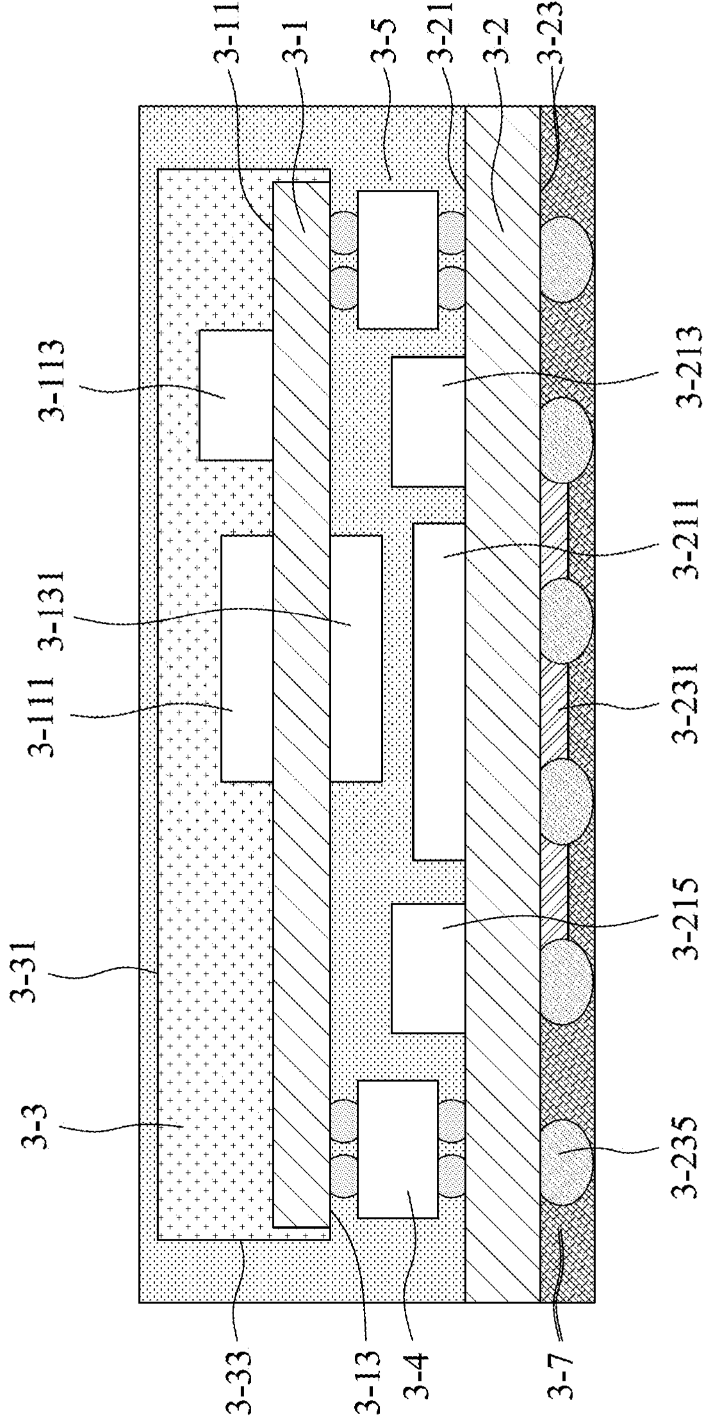

Referring to FIG. 4L, the encapsulant 3-5 is provided. The encapsulant 3-5 may be formed on the surface 3-21 of the substrate 3-2. The encapsulant 3-5 may cover the surface 3-21 of the substrate 3-2, the electronic components 3-211, 3-213, 3-215, the surface 3-13 of the substrate 3-1, the electronic component 3-131 and the interposers 3-4. The encapsulant 3-5 may cover the upper surface 3-31 and the lateral surface 3-35 of the encapsulant 3-3.

Figure 4M:
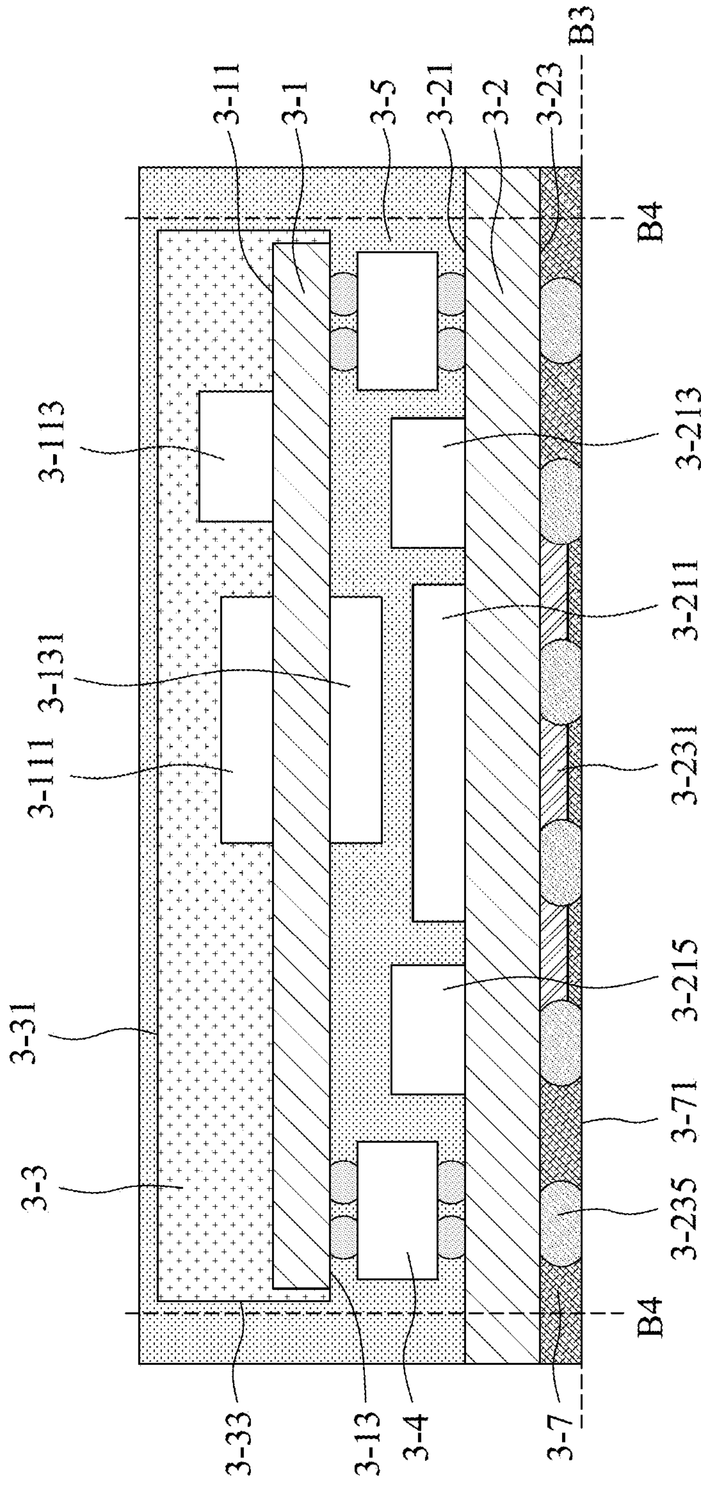

Referring to FIG. 4M, a grinding process is conducted to cut along the imaginary line "B3" through the encapsulant 3-7 and the electrical connections 3-235. After the grinding process, the electrical connections 3-235 may be exposed from the lower surface 3-71 of the encapsulant 3-7. Moreover, another singulation process is conducted to cut along the imaginary line "B4" through the substrate 3-2 and the encapsulants 3-5 and 3-7. After the singulation process, the semiconductor device package structure 3 as shown in FIG. 3 is formed.

Figure 5:
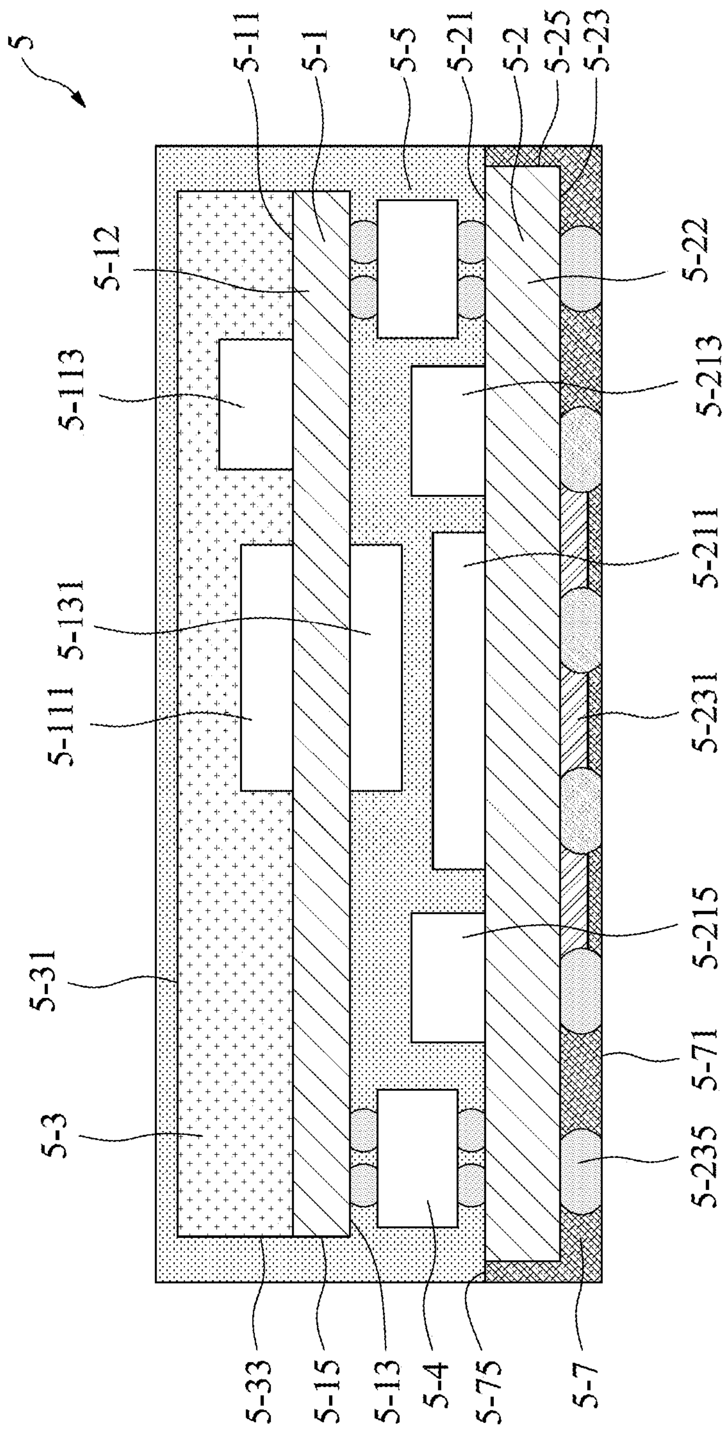
FIG. 5 is a cross-sectional view of a semiconductor device package in accordance with an embodiment of the instant disclosure.

FIG. 5 is a cross-sectional view of a semiconductor device package 5 in accordance with some embodiments of the present disclosure. As shown in FIG. 5, the semiconductor device package 5 may be a three-dimensional (3D) stacked semiconductor device package. The semiconductor device package 5 may include substrates 5-1, 5-2, electronic components 5-111, 5-113, 5-131, 5-211, 5-213, 5-215 and 5-231, encapsulants 5-3, 5-5, 5-7, interposers 5-4 and electrical connections 5-235. The substrate 5-1 may be a coreless substrate and may include traces, pads or interconnections for electrical connection. The substrate 5-2 may be a core substrate or a core-less substrate and may include traces, pads or interconnections for electrical connection. Further, the substrate 5-1 may disposed over and/or above the substrate 5-2.

Referring to FIG. 5, the substrate 5-1 has a surface 5-11 (e.g., an upper surface) and a surface 5-13 (e.g., a lower surface). The electronic components 5-111, 5-113 may be disposed or mounted on the surface 5-11 of the substrate 5-1. The electronic components 5-111, 5-113 may be a die, an active device, a passive device, and/or other electronic devices. In some embodiments of the present disclosure, the electronic components 5-111, 5-113 electrically connects the substrate 5-1 via electrical connections. In some embodiments of the present disclosure, the electronic component 5-111 may include a flash memory device. Further, the electronic component 5-131 may be disposed or mounted on the surface 5-13 of the substrate 5-1. The electronic component 5-131 may be a die, an active device, a passive device, and/or other electronic devices. In some embodiments of the present disclosure, the electronic component

5-131 electrically connects the substrate 5-1 via electrical connections. In some embodiments of the present disclosure, the electronic component 5-131 may include a flash memory device. In some embodiments of the present disclosure, a thickness of the substrate 5-2 is substantially greater than a thickness of the substrate 5-1. In some embodiments of the present disclosure, a thickness a dielectric layer 5-22 of the substrate 5-2 is substantially greater than a thickness of a dielectric layer 5-12 of the substrate 5-1. In some embodiments of the present disclosure, a hardness of the substrate 5-2 is substantially greater than a hardness of the substrate 5-1.

The substrate 5-2 has a surface 5-21 (e.g., an upper surface) and a surface 5-23 (e.g., a lower surface). The electronic components 5-211, 5-213, 5-215 may be disposed or mounted on the surface 5-21 of the substrate 5-2. The electronic components 5-211, 5-213, 5-215 may be a die, an active device, a passive device, and/or other electronic devices. In some embodiments of the present disclosure, the electronic components 5-211, 5-213, 5-215 electrically connects the substrate 5-2 via electrical connections. Further, the electronic component 5-231 may be disposed or mounted on the surface 5-23 of the substrate 5-2. The electronic component 5-231 may be a die, an active device, a passive device, and/or other electronic devices. In some embodiments of the present disclosure, the electronic component 5-231 electrically connects the substrate 5-2 via electrical connections. In some embodiments of the present disclosure, a thickness of the electronic components 5-231 is the thinnest among other components in the semiconductor device package 5. Moreover, a plurality of the electrical connections 5-235 are disposed or mounted on the surface 5-23 of the substrate 5-2. In some embodiments of the present disclosure, the electrical connection 5-235 includes a reflowable material. In some embodiments of the present disclosure, the electrical connection 5-235 includes solder material. The electrical connection 5-235 may include a solder ball. The electrical connection 5-235 may include a conductive pillar, post, or substrate interposer.

The interposers 5-4 may be disposed or mounted on the surface 5-13 of the substrate 5-1 and the surface 5-21 of the substrate 5-2. That is, the interposer 5-4 may be arranged between the substrate 5-1 and the substrate 5-2, and thus the interposer 5-4 may define a space between the substrate 5-1 and 5-2. In some embodiments of the present disclosure, an amount of the electronic components within the space between the substrate 5-1 and the substrate 5-2 and/or defined by the interposer 5-4, such as the electronic components, 5-131, 5-211, 5-213, 5-215, is greater than an amount of the electronic components outside of the space between the substrate 5-1 and the substrate 5-2 and/or defined by the interposer 5-4, such as the electronic components, 5-111, 5-113, 5-231. In some embodiments of the present disclosure, a distance between the adjacent electronic components within the space between the substrate 5-1 and the substrate 5-2 and/or defined by the interposer 5-4, such as the electronic components, 5-131, 5-211, 5-213, 5-215, is smaller than a distance between the adjacent electronic components outside of the space between the substrate 5-1 and the substrate 5-2 and/or defined by the interposer 5-4, such as the electronic components, 5-111, 5-113, 5-231. In some embodiments of the present disclosure, a density of the electronic components within the space between the substrate 5-1 and the substrate 5-2 and/or defined by the interposer 5-4, such as the electronic components, 5-131, 5-211, 5-213, 5-215, is greater than a density of the electronic components outside of the space between the substrate 5-1 and the substrate 5-2 and/or defined by the interposer 5-4, such as the electronic components, 5-111, 5-113, 5-231. Moreover, the interposer 5-4 may electrically connect the substrate 5-1 and the substrate 5-2 via electrical connections. In some embodiments of the present disclosure, such electrical connection includes a solder material. In some embodiments of the present disclosure, the interposer 5-4 includes a substrate interposer with redistribution layers and/or conductive vias.

The encapsulant 5-3 is disposed on the surface 5-11 of the substrate 5-1. The encapsulant 5-3 may cover the surface 5-11 of the substrate 5-1 and the electronic components 5-111 and 5-113 disposed on the surface 5-11 of the substrate 5-1. The encapsulant 5-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 5-3 may include a molding underfill (MUF) or a capillary underfill (CUF).

As above-mentioned, the substrate 5-1 may be a core-less substrate, and thus the substrate 5-1 may have a relatively thin thickness and/or a relatively weak stiffness. Therefore, when the electronic components, such as the electronic components, 5-111, 5-113, 5-131, are mounted on the substrate 5-1, the total weight of the electronic components may cause the substrate 5-1 to collapse. That is, the substrate 5-1 may be bended or recessed toward the substrate 5-2 due to the weights of the electronic components 5-111, 5-113, 5-131, and the electronic component 5-131 on the surface 5-13 of the substrate 5-1 may collide with the electronic component 5-211 on the surface of the substrate 5-2 and under the electronic component 5-131. The encapsulant 5-3 may be a reinforcement structure which is configured to improve the strength of the substrate 5-1 such that the substrate 5-1 is strong enough to support the electronic components 5-111, 5-113, 5-131 mounted thereon. Given the above, the encapsulant 5-3 may be configured to prevent the substrate 5-1 from collapsing and being bended or recessed toward the substrate 5-2. That is, the encapsulant 5-3 is configured to define a space between the electronic component 5-131 on the surface 5-13 of the substrate 5-1 and the electronic component 5-211 on the surface 5-21 of the substrate 5-2, and thus the electronic component 5-131 and the electronic component 5-211 may be maintained to be spaced apart from each other by a distance. In some embodiments of the present disclosure, the encapsulant 5-3 is a warpage-resistant layer configured to prevent the warpage of the substrate 5-1.

The encapsulant 5-5 is disposed on the surface 5-21 of the substrate 5-2. The encapsulant 5-5 may cover the surface 5-21 of the substrate 5-2, the electronic components 5-211, 5-213, 5-215 disposed on the surface 5-21 of the substrate 5-2, the surface 5-13 of the substrate 5-1, the electronic component 5-131 disposed on the surface 5-13 of the substrate 5-1 and the interposers 5-4. The encapsulant 5-5 may cover an upper surface 5-31 and a lateral surface 5-33 of the encapsulant 5-3 and a lateral surface 5-15 of the substrate 5-1. The encapsulant 5-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 5-5 may include a molding underfill (MUF) or a capillary underfill (CUF).

The encapsulant 5-7 is disposed on the surface 5-23 of the substrate 5-2. The encapsulant 5-7 may cover the surface 5-23 of the substrate 5-2 and the electronic component 5-231 and the electrical connections 5-235 disposed on the surface 5-23 of the substrate 5-2. In addition, the encapsulant 5-7 may cover a lateral surface 5-25 of the substrate 5-2, and thus functions as a mold lock. The encapsulant 5-7 may have a lower surface 5-71 covering the electronic component 5-231. In some embodiments of the present disclosure, a lower surface of the electronic component 5-231 is exposed from the lower surface 5-71 of the encapsulant 5-7. The electrical connections 5-235 may be exposed from the lower surface 5-71 of the encapsulant 5-7. The encapsulant 5-7 may have an upper surface 5-75 which is covered by the encapsulant 5-5. The encapsulant 5-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 5-7 may include a molding underfill (MUF) or a capillary underfill (CUF). In some embodiments of the present disclosure, a thickness of the encapsulant 5-7 is the thinnest among other encapsulants 5-3, 5-5 in the semiconductor device package 5.

In some embodiments of the present disclosure, the material of the encapsulant 5-3 is substantially identical to the material of the encapsulant 5-5, and/or the material of the encapsulant 5-5 is substantially identical to the material of the encapsulant 5-7, and/or the material of the encapsulant 5-3 is substantially identical to the material of the encapsulant 5-7. In some embodiments of the present disclosure, the material of the encapsulant 5-3 is different from the material of the encapsulant 5-5, and/or the material of the encapsulant 5-5 is different from the material of the encapsulant 5-7, and/or the material of the encapsulant 5-3 is different from the material of the encapsulant 5-7. In some embodiments of the present disclosure, the CTE (coefficient of thermal expansion) of the substrate 5-1 is substantially equal to the CTE of the encapsulant 5-3. In some embodiments of the present disclosure, the CTE of the encapsulant 5-5 is substantially equal to or smaller than the CTE of the encapsulant 5-7. In some embodiments of the present disclosure, the difference between the CTE of substrate 5-1 and the CTE of the encapsulant 5-7 is less than the difference between the CTE of substrate 5-1 and the CTE of the encapsulant 5-5 or the difference between the CTE of encapsulant 5-5 and the CTE of the encapsulant 5-7.

In some embodiments of the present disclosure, the substrate 5-1 is the same as, or similar to, the substrate 1-1 as shown in FIGS. 1B and 1C. That is, the substrate 5-1 may include the interconnection which may have the via tapered from the surface 5-11 toward the surface 5-13 or tapered from the surface 5-13 toward the surface 5-11. In some embodiments of the present disclosure, the substrate 5-1 is the same as, or similar to, the substrate 1-1 as shown in FIG. 1D. That is, the substrate 5-1 may include dielectric layers as shown in FIG. 1D.

FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L and FIG. 6M illustrate a method of manufacturing a semiconductor device package in accordance with another embodiment of the instant disclosure.

Figure 6A:
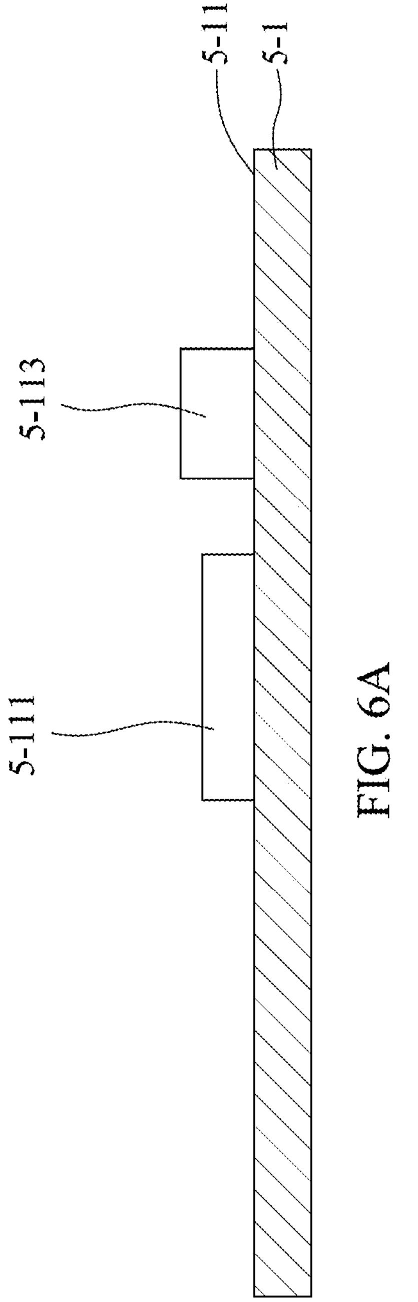
FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L and FIG. 6M illustrate a method of manufacturing a semiconductor device package in accordance with another embodiment of the instant disclosure.

Referring to FIG. 6A, the substrate 5-1 with the electronic components 5-111, 5-113 is provided. The electronic elements 5-111 and 5-113 may be disposed or mounted on the surface 5-11 of the substrate 5-1 and electrically connected to the interconnection of the substrate 5-1.

Figure 6B:
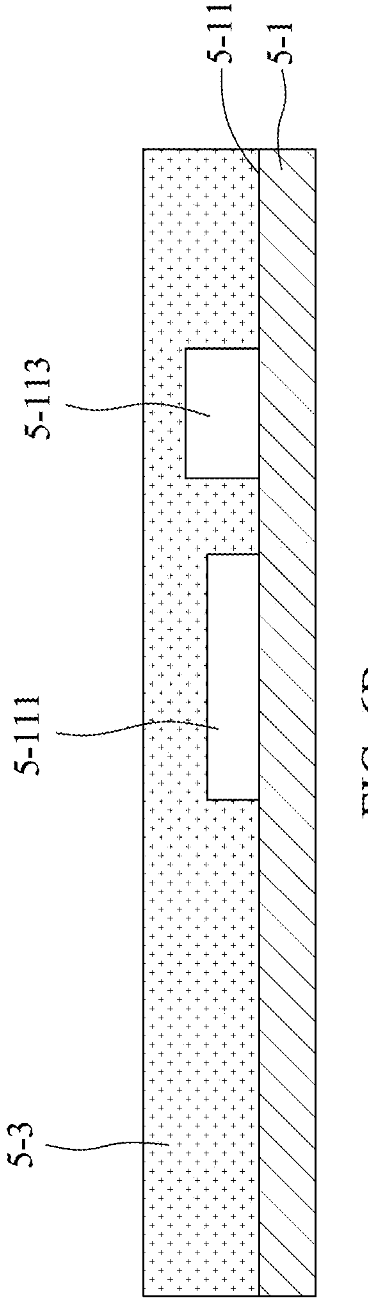

Referring to FIG. 6B, the encapsulant 5-3 is provided. The encapsulant 5-3 may be formed on the surface 5-11 of the substrate 5-1. The encapsulant 5-3 may cover the surface 5-11 of the substrate 5-1 and the electronic components 5-111, 5-113.

Figures 6C, 6D:
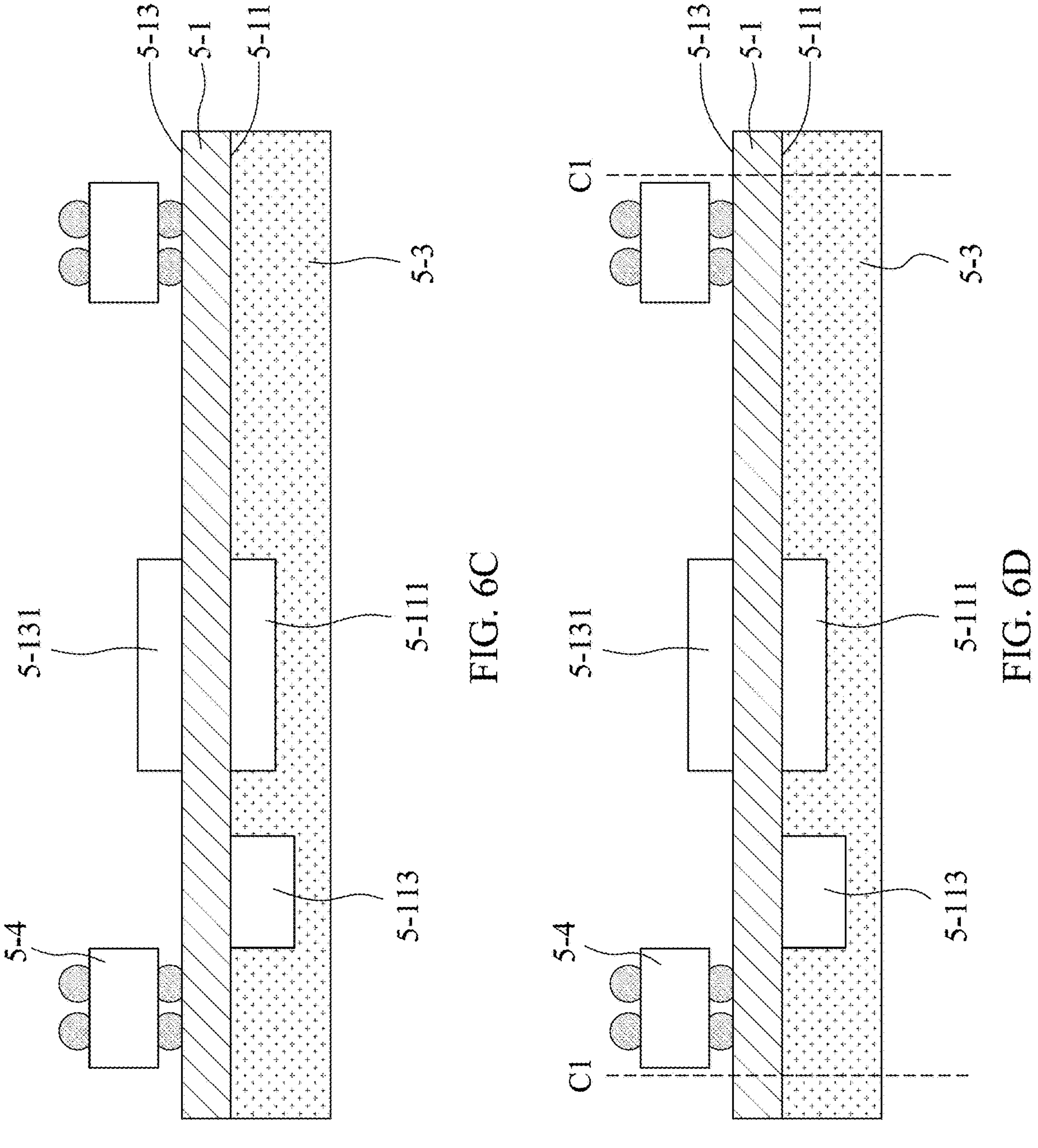

Referring to FIG. 6C, the structure obtained from FIG. 2B may be reversed upside down. The interposers 5-4 and the electronic component 5-131 may be disposed or mounted on the surface 5-13 of the substrate 5-1 and electrically connected to the interconnection of the substrate 5-1.

Referring to FIG. 6D, a singulation process is conducted to cut along the imaginary line "C1" through the substrate 5-1 and the encapsulant 5-3.

Figure 6E:
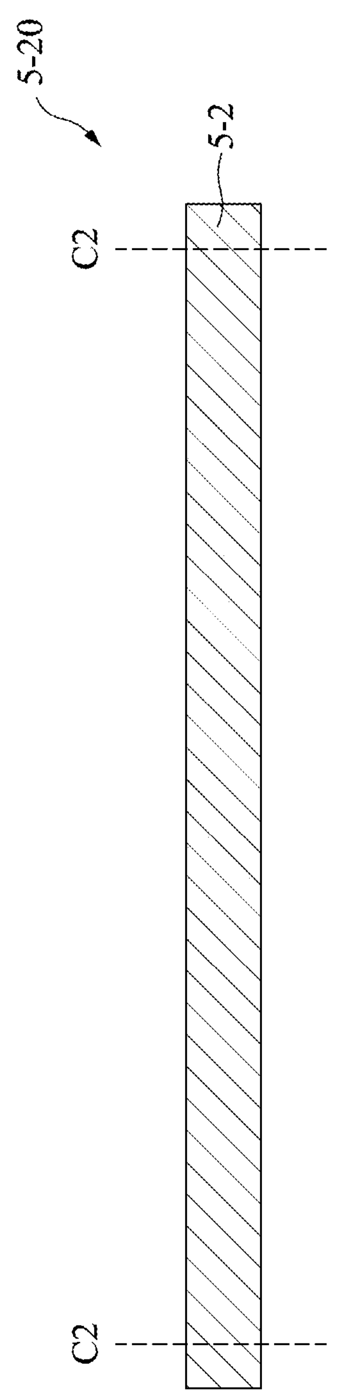

Referring to FIG. 6E, a strip 5-20 is provided and a singulation process is conducted to cut along the imaginary line "C2" through the strip 5-20, and thus forming the substrate 5-2 as shown in FIG. 5.

Figure 6F:
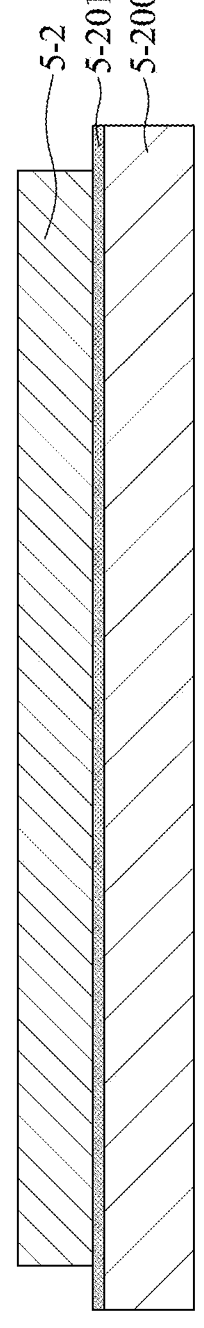

Referring to FIG. 6F, the substrate 5-2 may be arranged on a carrier 5-200 through a tape 5-201. That is, the tape 5-201 may be between the substrate 5-2 and the carrier 5-200.

Figure 6G:
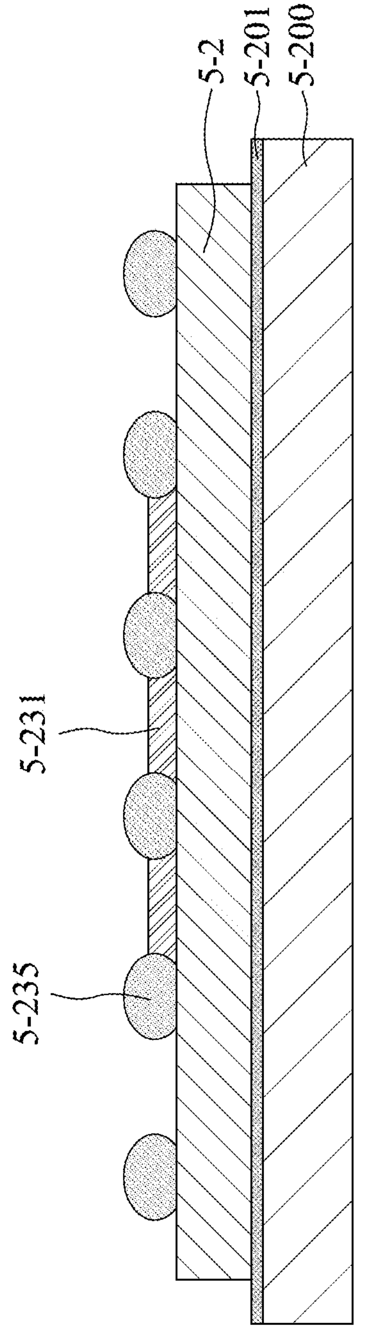
Figure 6G:

Referring to FIG. 6G, the electronic component 5-231 and the electrical connections 5-235 may be disposed or mounted on the surface 5-23 of the substrate 5-2 and electrically connected to the interconnection of the substrate 5-2.

Figure 6H:
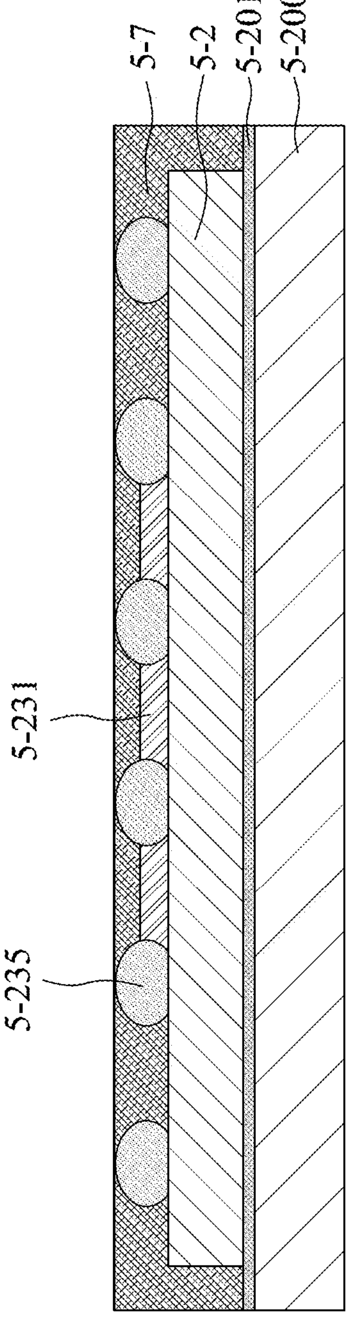

Referring to FIG. 6H, the encapsulant 5-7 is provided. The encapsulant 5-7 may be formed on the surface 5-23 of the substrate 5-2 and the tape 5-201 on the carrier 5-200. The encapsulant 5-7 may cover the surface 5-23 of the substrate 5-2, the electronic component 5-231, the electrical connections 5-235 and the tape 5-201.

Figures 6I, 6J:
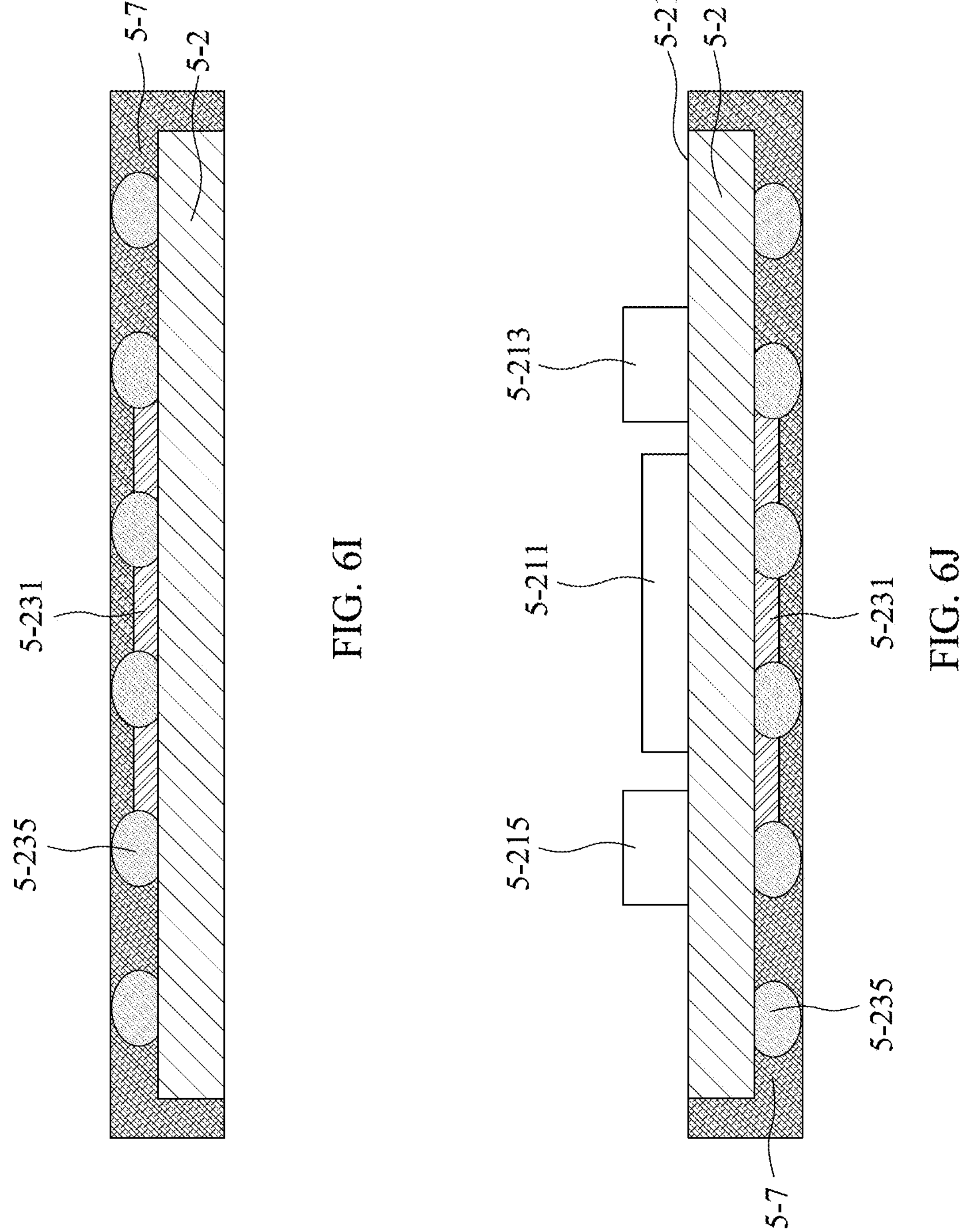

Referring to FIG. 6I, the carrier 5-200 and the tape 5-201 are removed (i.e., de-carrier).

Referring to FIG. 6J, the structure obtained from FIG. 6I may be reversed upside down. The electronic components 5-211, 5-213, 5-215 may be disposed or mounted on the surface 5-21 of the substrate 5-2 and electrically connected to the interconnection of the substrate 5-2.

Figure 6K:
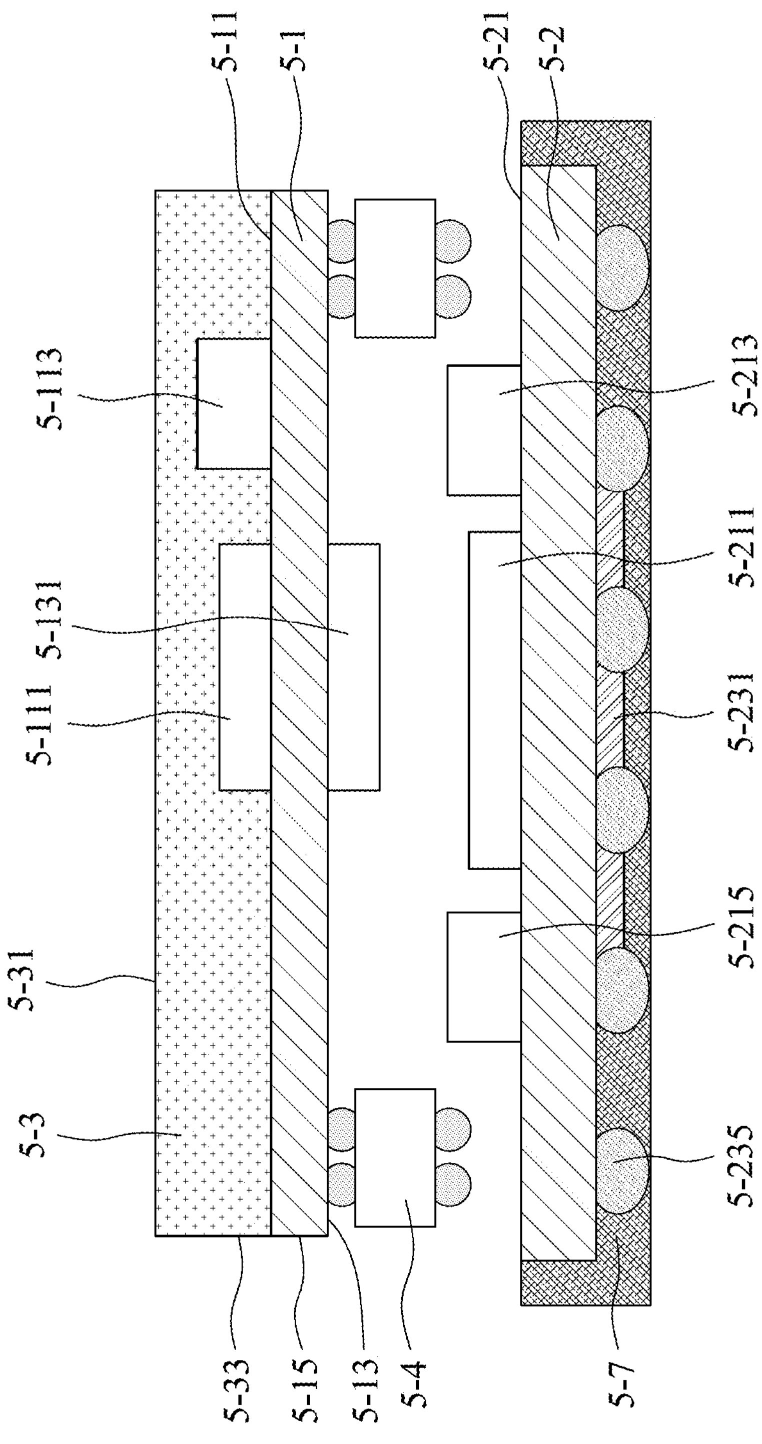

Referring to FIG. 6K, the structure obtained from FIG. 6D may be staked on the structure obtained from FIG. 6J. That is, the substrate 5-1 may be disposed over the substrate 5-2. The surface 5-13 of the substrate 5-1 may face the surface 5-21 of the substrate 5-2. The interposer 5-4 may be arranged between the substrate 5-1 and the substrate 5-2. The substrate 5-1 may be electrically connected to the substrate 5-2 through the interposer 5-4. Since the interposer 5-4 may be disposed on the substrate 5-2 and support the substrate 5-1, the electronic component 5-131 disposed on the surface 5-13 of the substrate 5-1 and the electronic component 5-211 disposed on the surface 5-21 of the substrate 5-2 may be spaced apart from by a distance.

Figure 6L:
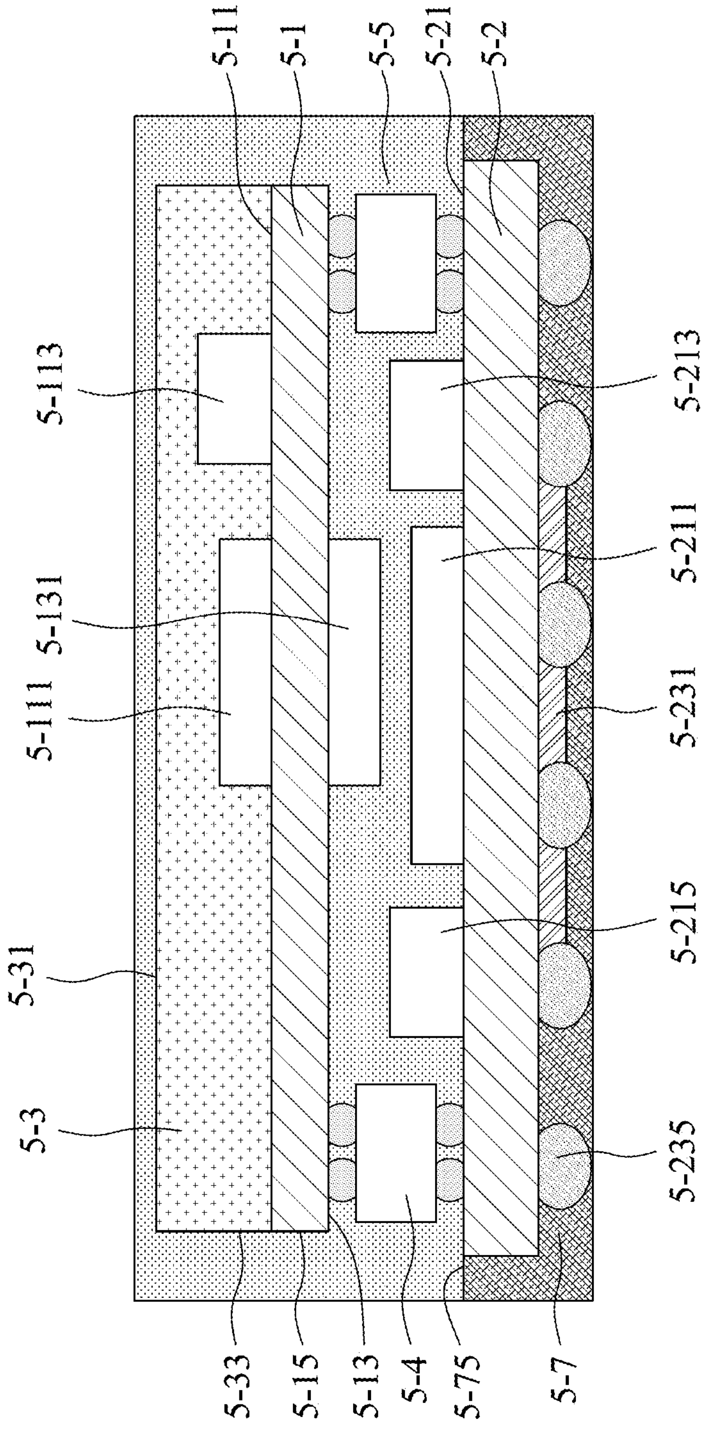

Referring to FIG. 6L, the encapsulant 5-5 is provided. The encapsulant 5-5 may be formed on the surface 5-21 of the substrate 5-2 and the upper surface 5-75 of the encapsulant 5-7. The encapsulant 5-5 may cover the surface 5-21 of the substrate 5-2, the upper surface 5-75 of the encapsulant 5-7, the surface 5-13 of the substrate 5-1, the electronic component 5-131, the electronic components 5-211, 5-213, 5-215 and the interposers 5-4. The encapsulant 5-5 may cover the upper surface 5-31 and the lateral surface 5-35 of the encapsulant 5-3 and the lateral surface 5-15 of the substrate 5-1.

Figure 6M:
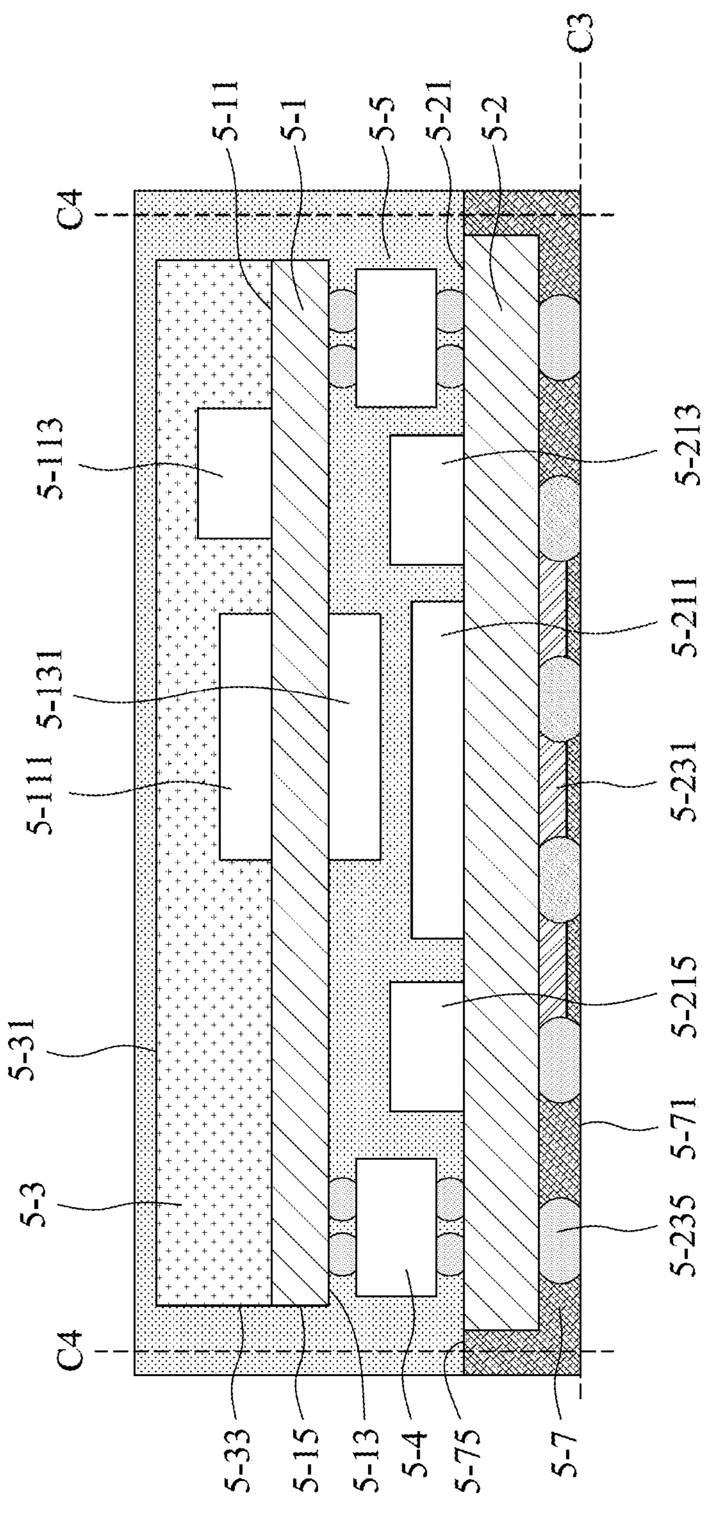

Referring to FIG. 6M, a grinding process is conducted to cut along the imaginary line "C3" through the encapsulant 5-7 and the electrical connections 5-235. After the grinding process, the electrical connections 5-235 may be exposed from the lower surface 5-71 of the encapsulant 5-7. Moreover, another singulation process is conducted to cut along the imaginary line "C4" through the substrate 5-2 and the encapsulants 5-5 and 5-7. After the singulation processes, the semiconductor device package structure 5 as shown in FIG. 5 is formed.

Figure 7:
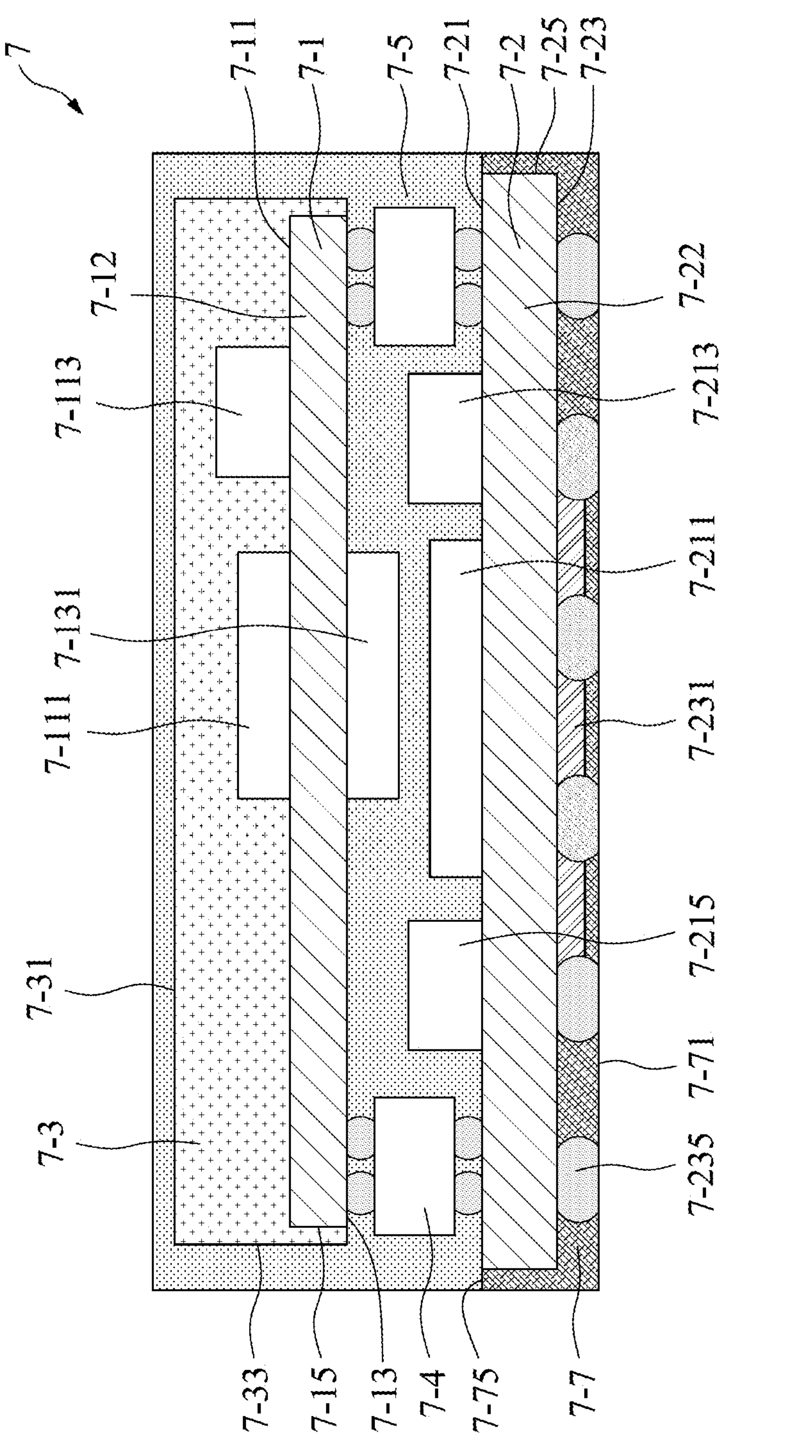
FIG. 7 is a cross-sectional view of a semiconductor device package in accordance with an embodiment of the instant disclosure.

FIG. 7 is a cross-sectional view of a semiconductor device package 7 in accordance with some embodiments of the present disclosure. As shown in FIG. 7, the semiconductor device package 7 may be a three-dimensional (3D) stacked semiconductor device package. The semiconductor device package 7 may include substrates 7-1, 7-2, electronic components 7-111, 7-113, 7-131, 7-211, 7-213, 7-215 and 7-231, encapsulants 7-3, 7-5, 7-7, interposers 7-4 and electrical connections 7-235. The substrate 7-1 may be a coreless substrate and may include traces, pads or interconnections for electrical connection. The substrate 7-2 may be a core substrate or a core-less substrate and may include traces, pads or interconnections for electrical connection. Further, the substrate 7-1 may disposed over and/or above the substrate 7-2.

Referring to FIG. 7, the substrate 7-1 has a surface 7-11 (e.g., an upper surface) and a surface 7-13 (e.g., a lower surface). The electronic components 7-111, 7-113 may be disposed or mounted on the surface 7-11 of the substrate 7-1. The electronic components 7-111, 7-113 may be a die, an active device, a passive device, and/or other electronic devices. In some embodiments of the present disclosure, the electronic components 7-111, 7-113 electrically connects the substrate 7-1 via electrical connections. In some embodiments of the present disclosure, the electronic component 7-111 may include a flash memory device. Further, the electronic component 7-131 may be disposed or mounted on the surface 7-13 of the substrate 7-1. The electronic component 7-131 may be a die, an active device, a passive device, and/or other electronic devices. In some embodiments of the present disclosure, the electronic component 7-131 electrically connects the substrate 7-1 via electrical connections. In some embodiments of the present disclosure, the electronic component 7-131 may include a flash memory device. In some embodiments of the present disclosure, a thickness of the substrate 7-2 is substantially greater than a thickness of the substrate 7-1. In some embodiments of the present disclosure, a thickness a dielectric layer 7-22 of the substrate 7-2 is substantially greater than a thickness of a dielectric layer 7-12 of the substrate 7-1. In some embodiments of the present disclosure, a hardness of the substrate 7-2 is substantially greater than a hardness of the substrate 7-1.

The substrate 7-2 has a surface 7-21 (e.g., an upper surface) and a surface 7-23 (e.g., a lower surface). The electronic components 7-211, 7-213, 7-215 may be disposed or mounted on the surface 7-21 of the substrate 7-2. The electronic components 7-211, 7-213, 7-215 may be a die, an active device, a passive device, and/or other electronic devices. In some embodiments of the present disclosure, the electronic components 7-211, 7-213, 7-215 electrically connects the substrate 7-2 via electrical connections. Further, the electronic component 7-231 may be disposed or mounted on the surface 7-23 of the substrate 7-2. The electronic component 7-231 may be a die, an active device, a passive device, and/or other electronic devices. In some embodiments of the present disclosure, the electronic component 7-231 electrically connects the substrate 7-2 via electrical connections. In some embodiments of the present disclosure, a thickness of the electronic components 7-231 is the thinnest among other components in the semiconductor device package 7. Moreover, a plurality of the electrical connections 7-235 are disposed or mounted on the surface 7-23 of the substrate 7-2. In some embodiments of the present disclosure, the electrical connection 7-235 includes a reflowable material. In some embodiments of the present disclosure, the electrical connection 7-235 includes solder material. The electrical connection 7-235 may include a solder ball. The electrical connection 7-235 may include a conductive pillar, post, or substrate interposer.

The interposers 7-4 may be disposed or mounted on the surface 7-13 of the substrate 7-1 and the surface 7-21 of the substrate 7-2. That is, the interposer 7-4 may be arranged between the substrate 7-1 and the substrate 7-2, and thus the interposer 7-4 may define a space between the substrate 7-1 and 7-2. In some embodiments of the present disclosure, an amount of the electronic components within the space between the substrate 7-1 and the substrate 7-2 and/or defined by the interposer 7-4, such as the electronic components, 7-131, 7-211, 7-213, 7-215, is greater than an amount of the electronic components outside of the space between the substrate 7-1 and the substrate 7-2 and/or defined by the interposer 7-4, such as the electronic components, 7-111, 7-113, 7-231. In some embodiments of the present disclosure, a distance between the adjacent electronic components within the space between the substrate 7-1 and the substrate 7-2 and/or defined by the interposer 7-4, such as the electronic components, 7-131, 7-211, 7-213, 7-215, is smaller than a distance between the adjacent electronic components outside of the space between the substrate 7-1 and the substrate 7-2 and/or defined by the interposer 7-4, such as the electronic components, 7-111, 7-113, 7-231. In some embodiments of the present disclosure, a density of the electronic components within the space between the substrate 7-1 and the substrate 7-2 and/or defined by the interposer 7-4, such as the electronic components, 7-131, 7-211, 7-213, 7-215, is greater than a density of the electronic components outside of the space between the substrate 7-1 and the substrate 7-2 and/or defined by the interposer 7-4, such as the electronic components, 7-111, 7-113, 7-231. Moreover, the interposer 7-4 may electrically connect the substrate 7-1 and the substrate 7-2 via electrical connections. In some embodiments of the present disclosure, such electrical connection includes a solder material. In some embodiments of the present disclosure, the interposer 7-4 includes a substrate interposer with redistribution layers and/or conductive vias.

The encapsulant 7-3 is disposed on the surface 7-11 of the substrate 7-1. The encapsulant 7-3 may cover the surface 7-11 of the substrate 7-1 and the electronic components 7-111 and 7-113 disposed on the surface 7-11 of the substrate 7-1. Further, the encapsulant 7-3 may cover a lateral surface 7-15 of the substrate 7-1, and thus functions as a mold lock. The encapsulant 7-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 7-3 may include a molding underfill (MUF) or a capillary underfill (CUF).

As above-mentioned, the substrate 7-1 may be a core-less substrate, and thus the substrate 7-1 may have a relatively thin thickness and/or a relatively weak stiffness. Therefore, when the electronic components, such as the electronic components, 7-111, 7-113, 7-131, are mounted on the substrate 7-1, the total weight of the electronic components may cause the substrate 7-1 to collapse. That is, the substrate 7-1 may be bended or recessed toward the substrate 7-2 due to the weights of the electronic components 7-111, 7-113, 7-131, and the electronic component 7-131 on the surface 7-13 of the substrate 7-1 may collide with the electronic component 7-211 on the surface of the substrate 7-2 and under the electronic component 7-131. The encapsulant 7-3 may be a reinforcement structure which is configured to improve the strength of the substrate 7-1 such that the substrate 7-1 is strong enough to support the electronic components 7-111, 7-113, 7-131 mounted thereon. Given the above, the encapsulant 7-3 may be configured to prevent the substrate 7-1 from collapsing and being bended or recessed toward the substrate 7-2. That is, the encapsulant 7-3 is configured to define a space between the electronic component 7-131 on the surface 7-13 of the substrate 7-1 and the electronic component 7-211 on the surface 7-21 of the substrate 7-2, and thus the electronic component 7-131 and the electronic component 7-211 may be maintained to be spaced apart from each other by a distance. In some embodiments of the present disclosure, the encapsulant 7-3 is a warpage-resistant layer configured to prevent the warpage of the substrate 7-1.

The encapsulant 7-5 is disposed on the surface 7-21 of the substrate 7-2. The encapsulant 7-5 may cover the surface 7-21 of the substrate 7-2, the electronic components 7-211, 7-213, 7-215 disposed on the surface 7-21 of the substrate 7-2, the surface 7-13 of the substrate 7-1, the electronic component 7-131 disposed on the surface 7-13 of the substrate 7-1 and the interposers 7-4. The encapsulant 7-5 may cover an upper surface 7-31 and a lateral surface 7-33 of the encapsulant 7-3. The encapsulant 7-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 7-5 may include a molding underfill (MUF) or a capillary underfill (CUF).

The encapsulant 7-7 is disposed on the surface 7-23 of the substrate 7-2. The encapsulant 7-7 may cover the surface 7-23 of the substrate 7-2 and the electronic component 7-231 and the electrical connections 7-235 disposed on the surface 7-23 of the substrate 7-2. In addition, the encapsulant 7-7 may cover a lateral surface 7-25 of the substrate 7-2, and thus functions as a mold lock. The encapsulant 7-7 may have a lower surface 7-71 covering the electronic component 7-231. In some embodiments of the present disclosure, a lower surface of the electronic component 7-231 is exposed from the lower surface 7-71 of the encapsulant 7-7. The electrical connections 7-235 may be exposed from the lower surface 7-71 of the encapsulant 7-7. The encapsulant 7-7 may have an upper surface 7-75 which is covered by the encapsulant 7-5. The encapsulant 7-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 7-7 may include a molding underfill (MUF) or a capillary underfill (CUF). In some embodiments of the present disclosure, a thickness of the encapsulant 7-7 is the thinnest among other encapsulants 7-3, 7-5 in the semiconductor device package 7.

In some embodiments of the present disclosure, the material of the encapsulant 7-3 is substantially identical to the material of the encapsulant 7-5, and/or the material of the encapsulant 7-5 is substantially identical to the material of the encapsulant 7-7, and/or the material of the encapsulant 7-3 is substantially identical to the material of the encapsulant 7-7. In some embodiments of the present disclosure, the material of the encapsulant 7-3 is different from the material of the encapsulant 7-5, and/or the material of the encapsulant 7-5 is different from the material of the encapsulant 7-7, and/or the material of the encapsulant 7-3 is different from the material of the encapsulant 7-7. In some embodiments of the present disclosure, the CTE (coefficient of thermal expansion) of the substrate 7-1 is substantially equal to the CTE of the encapsulant 7-3. In some embodiments of the present disclosure, the CTE of the encapsulant 7-5 is substantially equal to or smaller than the CTE of the encapsulant 7-7. In some embodiments of the present disclosure, the difference between the CTE of substrate 7-1 and the CTE of the encapsulant 7-7 is less than the difference between the CTE of substrate 7-1 and the CTE of the encapsulant 7-5 or the difference between the CTE of encapsulant 7-5 and the CTE of the encapsulant 7-7.

In some embodiments of the present disclosure, the substrate 7-1 is the same as, or similar to, the substrate 1-1 as shown in FIGS. 1B and 1C. That is, the substrate 7-1 may include the interconnection which may have the via tapered from the surface 7-11 toward the surface 7-13 or tapered from the surface 7-13 toward the surface 7-11. In some embodiments of the present disclosure, the substrate 7-1 is the same as, or similar to, the substrate 1-1 as shown in FIG. 1D. That is, the substrate 7-1 may include dielectric layers as shown in FIG. 1D.

FIG. 8A, FIG. 8B, FIG. 8C, FIG. 8D, FIG. 8E, FIG. 8F, FIG. 8G, FIG. 8H, FIG. 8I, FIG. 8J, FIG. 8K, FIG. 8L, FIG. 8M, FIG. 8N, FIG. 8O and FIG. 8P illustrate a method of manufacturing a semiconductor device package 7 in accordance with another embodiment of the instant disclosure.

Figure 8A:
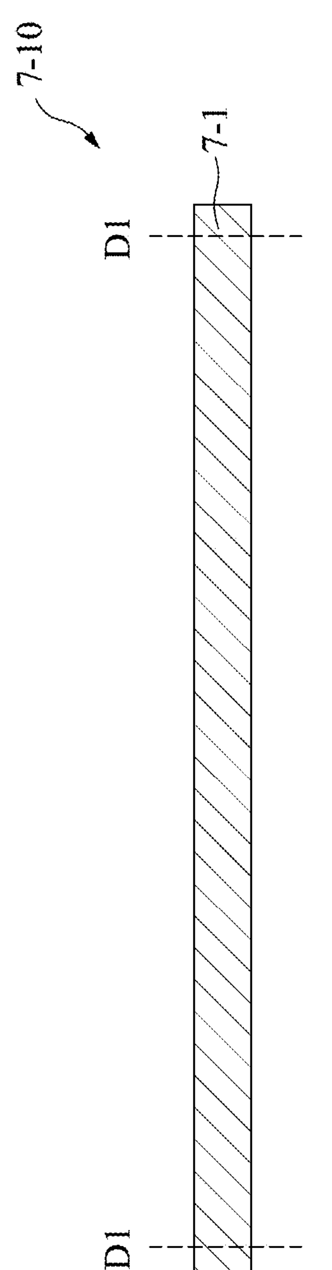
FIG. 8A, FIG. 8B, FIG. 8C, FIG. 8D, FIG. 8E, FIG. 8F, FIG. 8G, FIG. 8H, FIG. 8I, FIG. 8J, FIG. 8K, FIG. 8L, FIG. 8M, FIG. 8N, FIG. 8O and FIG. 8P illustrate a method of manufacturing a semiconductor device package in accordance with another embodiment of the instant disclosure.

Referring to FIG. 8A, a strip 7-10 is provided and a singulation process is conducted to cut along the imaginary line "D1" through the strip 7-10, and thus forming the substrate 7-1 as shown in FIG. 7.

Figure 8B:
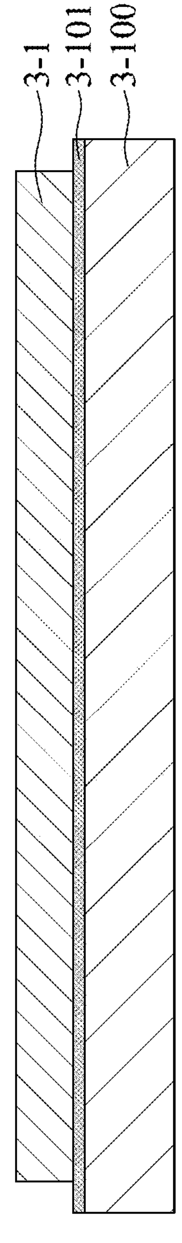

Referring to FIG. 8B, the substrate 7-1 may be arranged on a carrier 7-100 through a tape 7-101. That is, the tape 7-101 may be between the substrate 7-1 and the carrier 7-100.

Figures 8C, 8D:
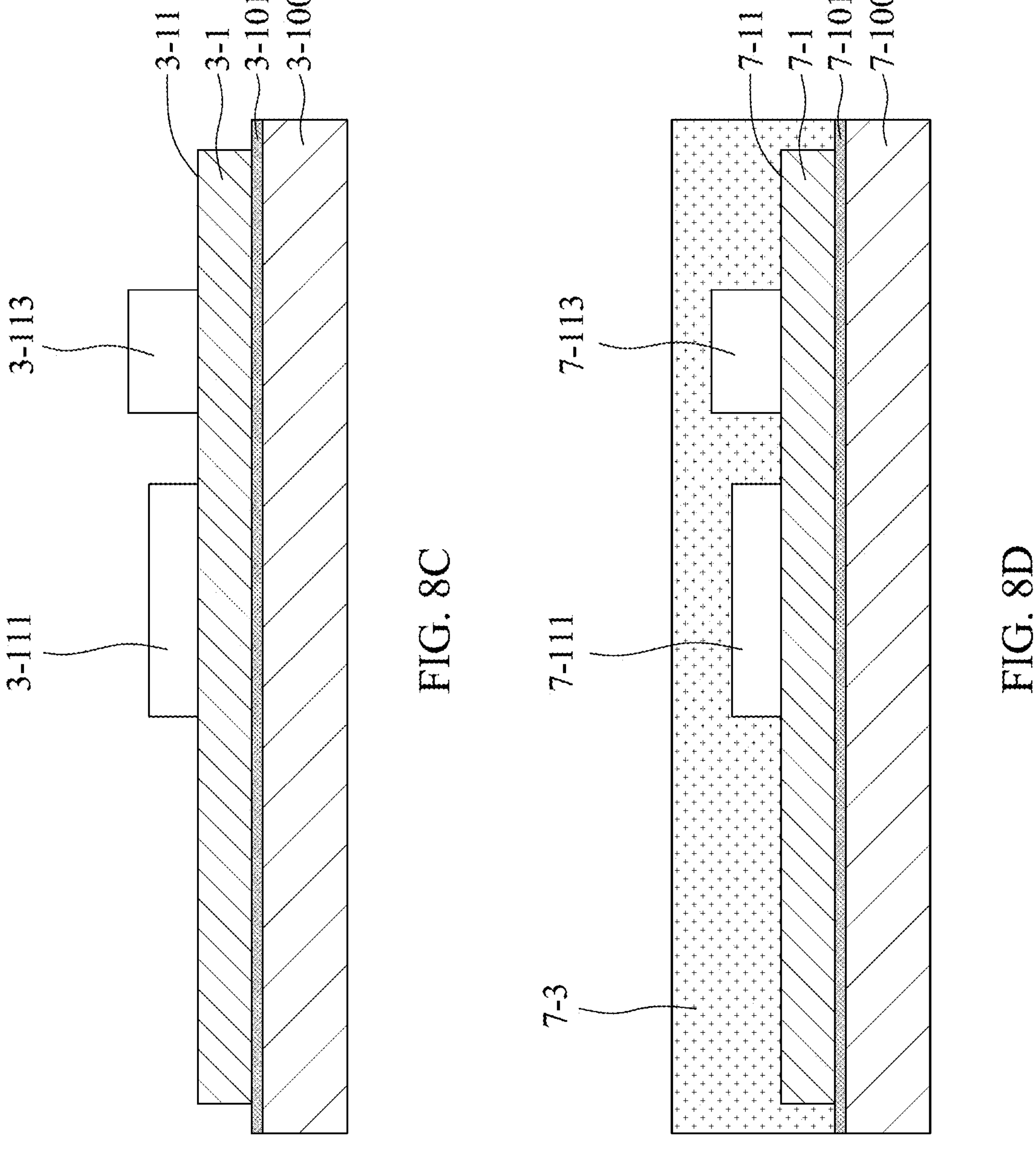

Referring to FIG. 8C, the electronic components 7-111, 7-113 may be disposed or mounted on the surface 7-11 of the substrate 7-1 and electrically connected to the interconnection of the substrate 7-1.

Referring to FIG. 8D, the encapsulant 7-3 is provided. The encapsulant 7-3 may be formed on the surface 7-11 of the substrate 7-1 and the tape 7-101 on the carrier 7-100. The encapsulant 7-3 may cover the surface 7-11 of the substrate 7-1, the electronic components 7-111, 7-113 and the tape 7-101.

Figure 8E:
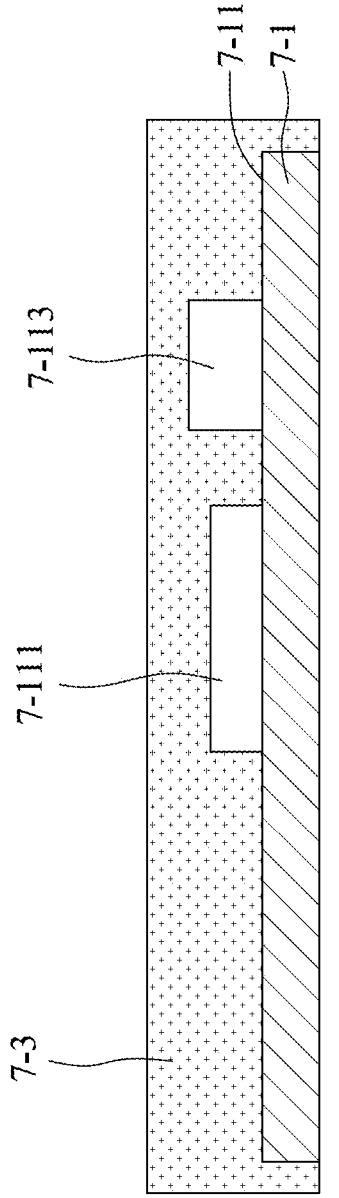
Figure 8E:

Referring to FIG. 8E, the carrier 7-100 and the tape 7-101 are removed (i.e., de-carrier).

Figure 8F:
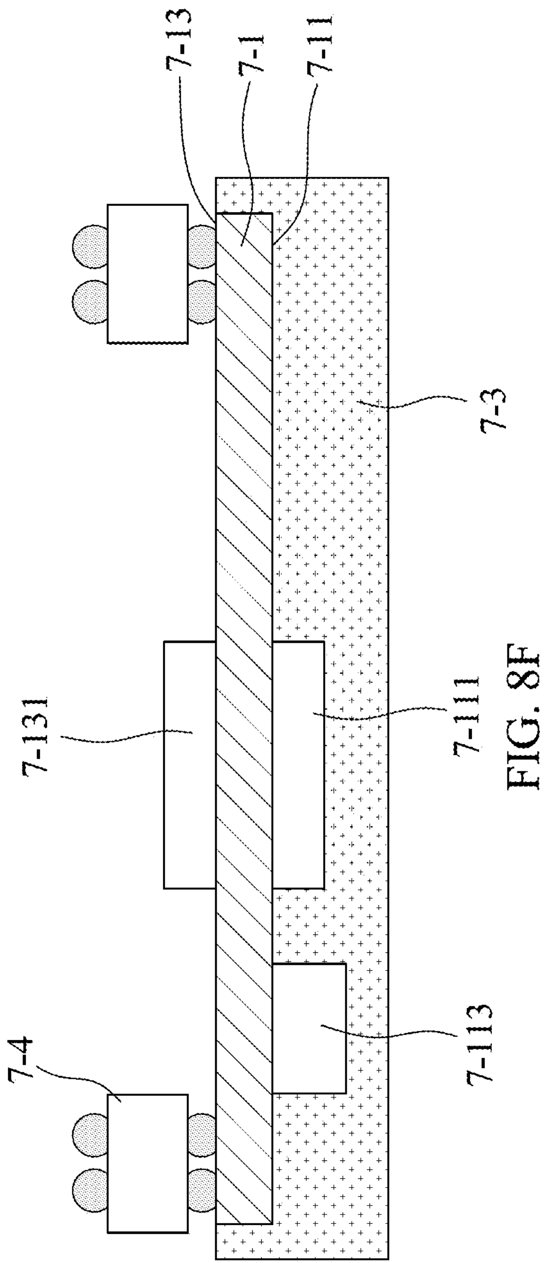

Referring to FIG. 8F, the structure obtained from FIG. 8E may be reversed upside down. The interposers 7-4 and the electronic component 7-131 may be disposed or mounted on the surface 7-13 of the substrate 7-1 and electrically connected to the interconnection of the substrate 7-1.

Figure 8G:
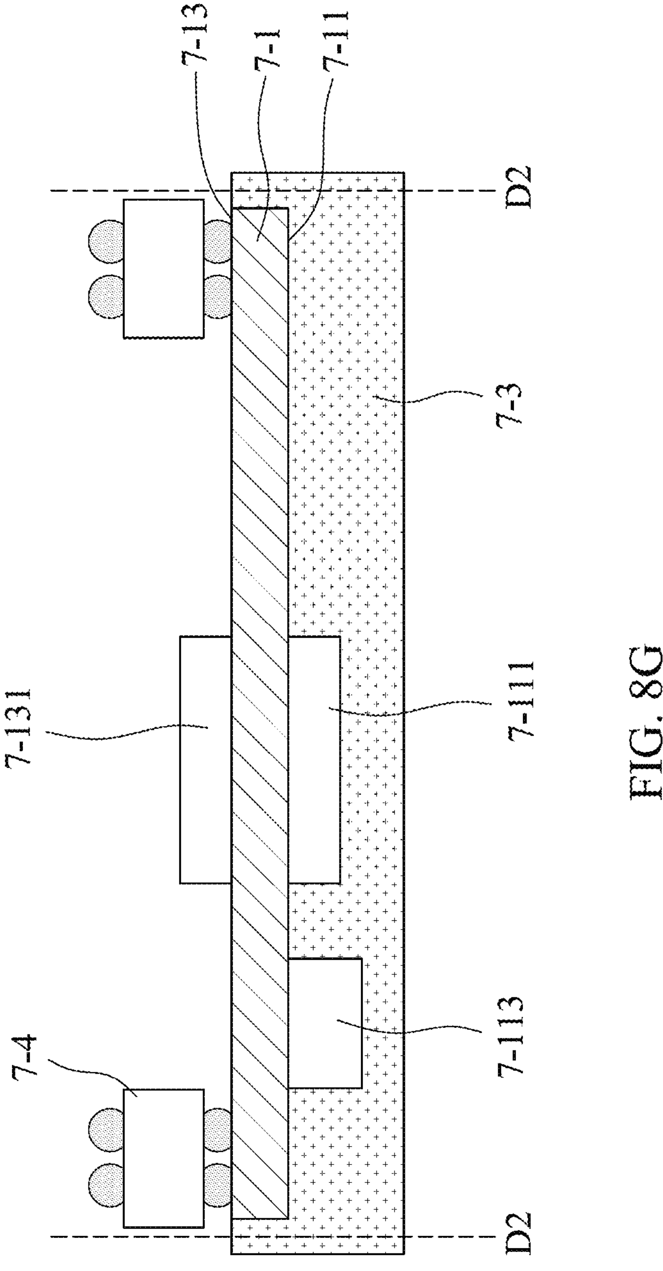

Referring to FIG. 8G, a singulation process is conducted to cut along the imaginary line "D2" through the encapsulant 7-3.

Figure 8H:
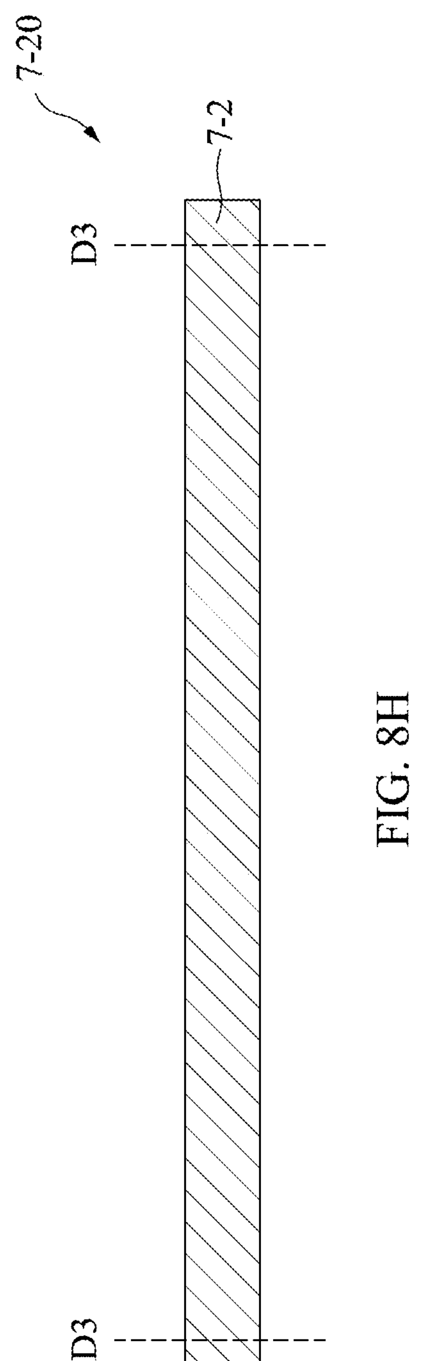

Referring to FIG. 8H, a strip 7-20 is provided and a singulation process is conducted to cut along the imaginary line "D3" through the strip 7-20, and thus forming the substrate 7-2 as shown in FIG. 7.

Figure 8I:
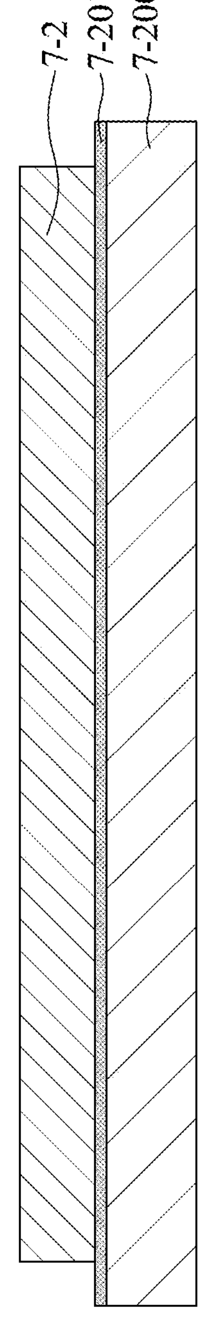

Referring to FIG. 8I, the substrate 7-2 may be arranged on a carrier 7-200 through a tape 7-201. That is, the tape 7-201 may be between the substrate 7-2 and the carrier 7-200.

Figure 8J:
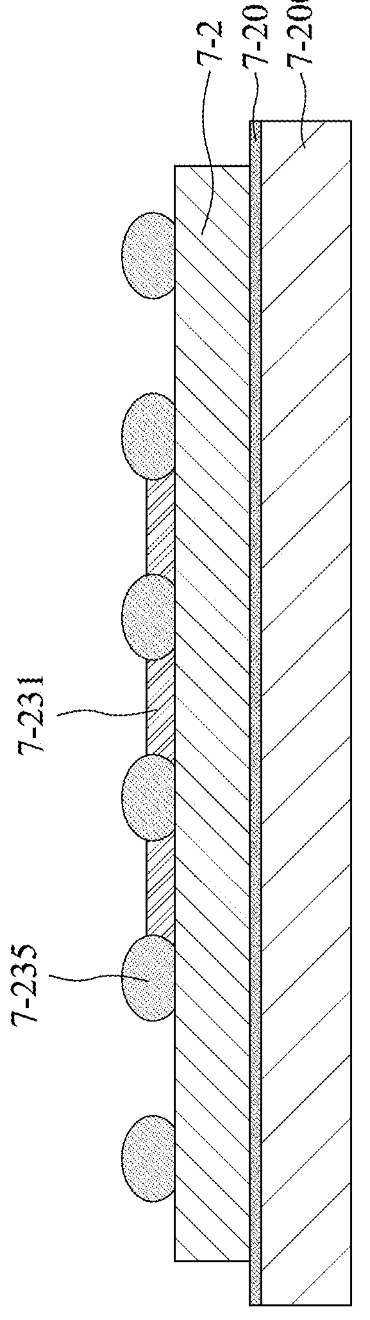
Figure 8J:

Referring to FIG. 8J, the electronic component 7-231 and the electrical connections 7-235 may be disposed or mounted on the surface 7-23 of the substrate 7-2 and electrically connected to the interconnection of the substrate 7-2.

Figure 8K:
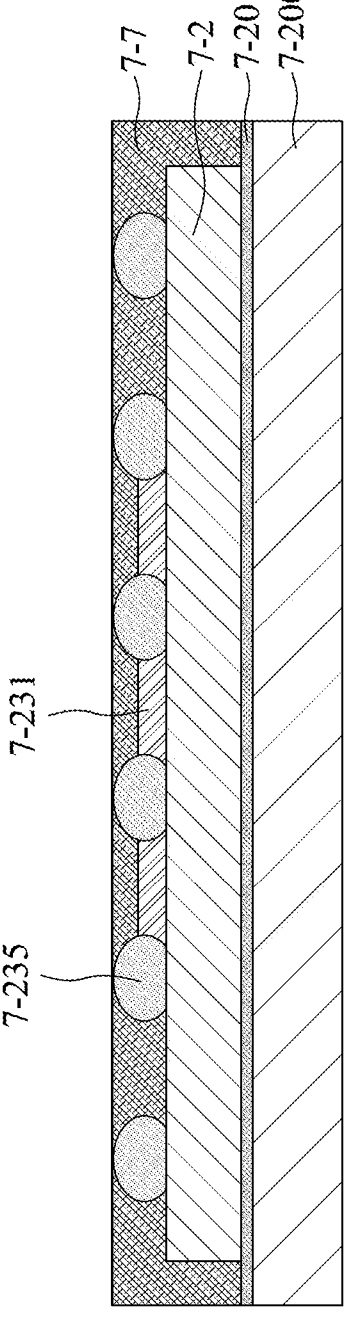

Referring to FIG. 8K, the encapsulant 7-7 is provided. The encapsulant 7-7 may be formed on the surface 7-23 of the substrate 7-2 and the tape 7-201 on the carrier 7-200. The encapsulant 7-7 may cover the surface 7-23 of the substrate 7-2, the electronic component 7-231, the electrical connections 7-235 and the tape 7-201.

Figure 8L:
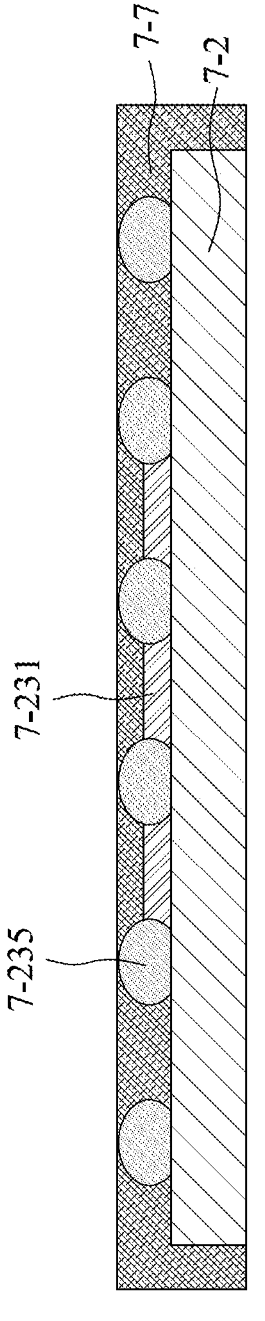

Referring to FIG. 8L, the carrier 7-200 and the tape 7-201 are removed (i.e., de-carrier).

Figure 8M:
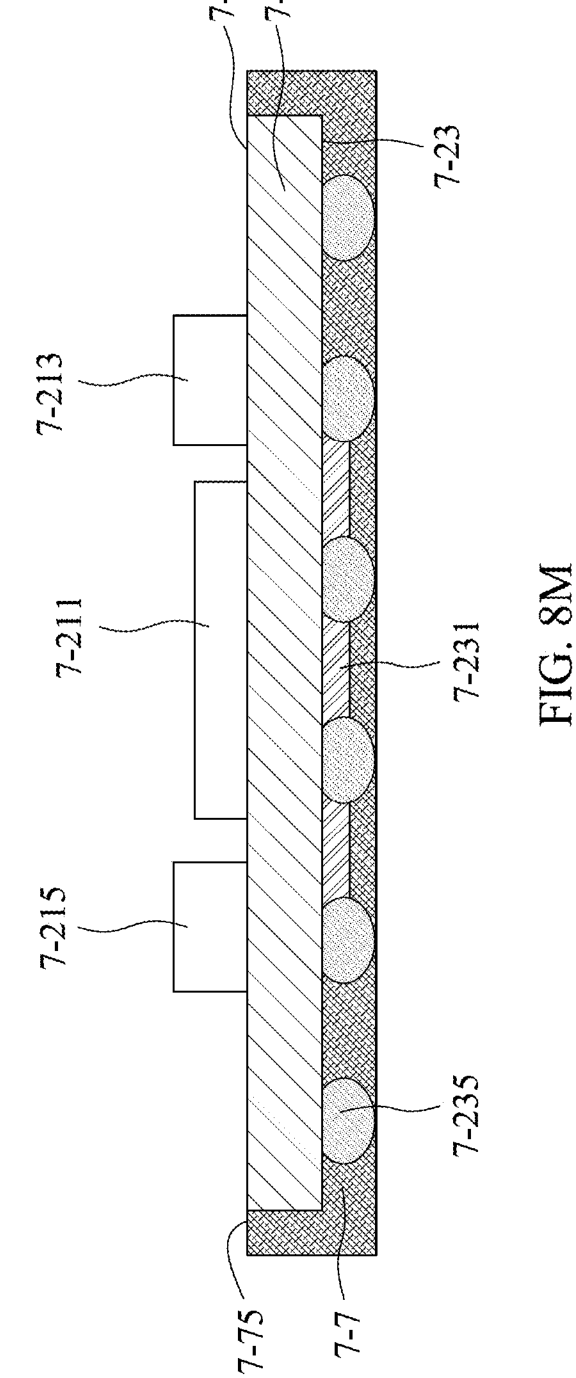

Referring to FIG. 8M, the structure obtained from FIG. 8L may be reversed upside down. The electronic components 7-211, 7-213, 7-215 may be disposed or mounted on the surface 7-21 of the substrate 7-2 and electrically connected to the interconnection of the substrate 7-2.

Figure 8N:
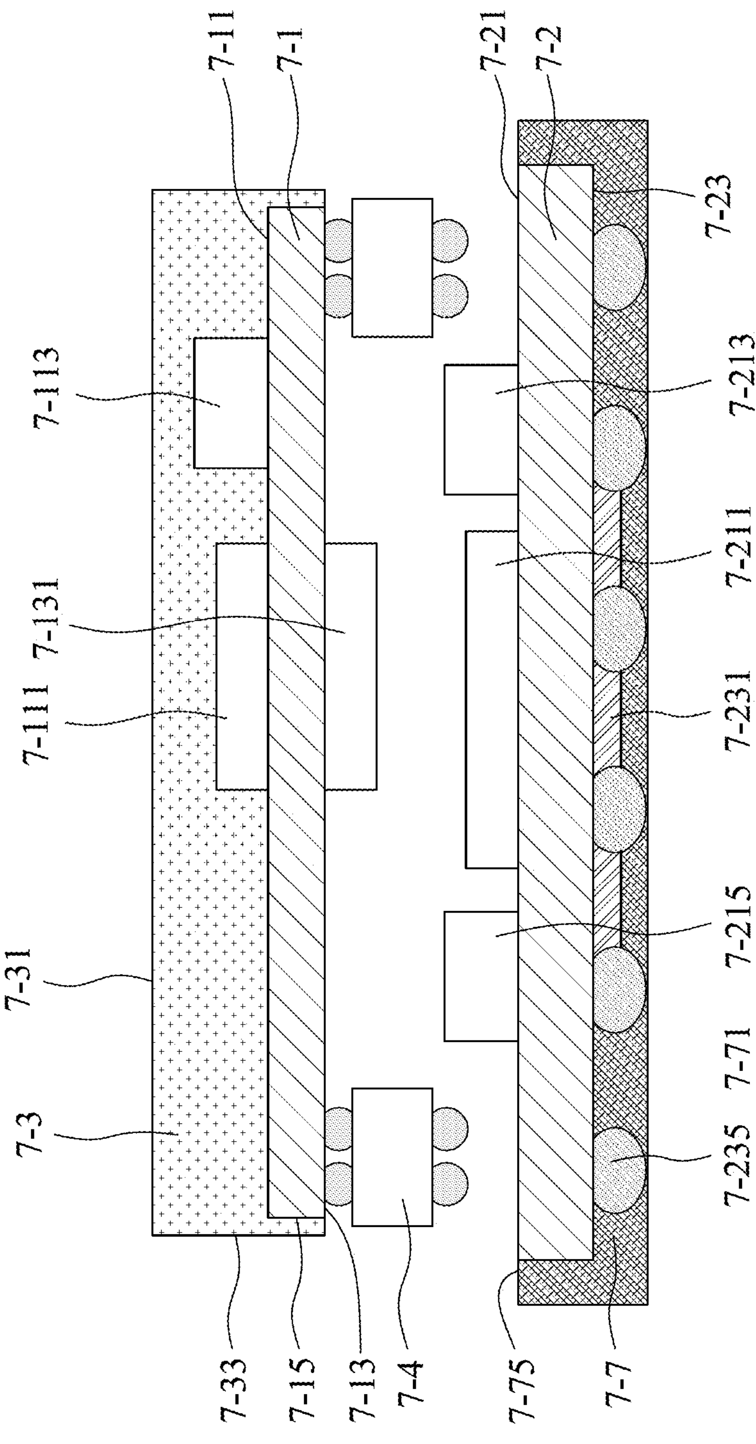

Referring to FIG. 8N, the structure obtained from FIG. 8G may be staked on the structure obtained from FIG. 8M. That is, the substrate 7-1 may be disposed over the substrate 7-2. The surface 7-13 of the substrate 7-1 may face the surface 7-21 of the substrate 7-2. The interposer 7-4 may be arranged between the substrate 7-1 and the substrate 7-2. The substrate 7-1 may be electrically connected to the substrate 7-2 through the interposer 7-4. Since the interposer 7-4 may be disposed on the substrate 7-2 and support the substrate 7-1, the electronic component 7-131 disposed on the surface 7-13 of the substrate 7-1 and the electronic component 7-211 disposed on the surface 7-21 of the substrate 7-2 may be spaced apart from by a distance.

Figure 8O:
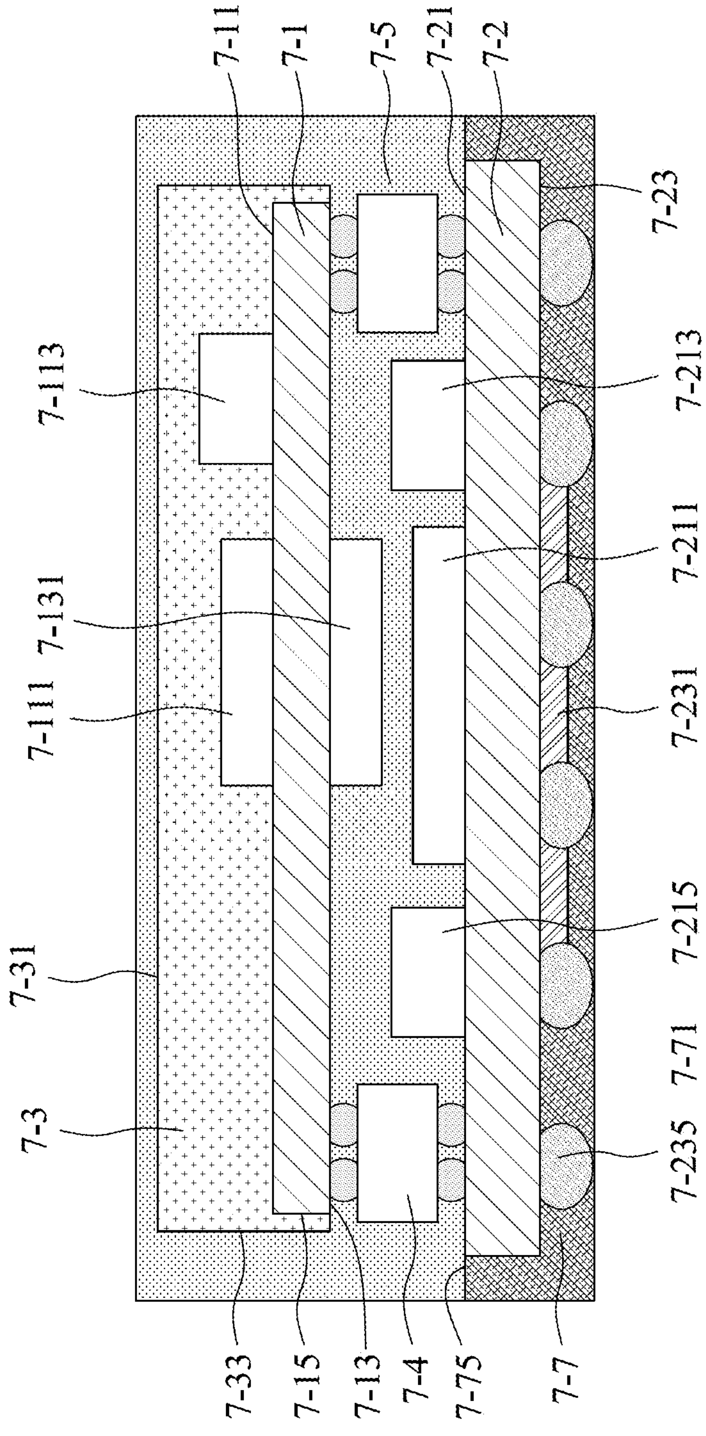

Referring to FIG. 8O, the encapsulant 7-5 is provided. The encapsulant 7-5 may be formed on the surface 7-21 of the substrate 7-2 and the upper surface 7-75 of the encapsulant 7-7. The encapsulant 7-5 may cover the surface 7-21 of the substrate 7-2, the upper surface 7-75 of the encapsulant 7-7, the surface 7-13 of the substrate 7-1, the electronic component 7-131, the electronic components 7-211, 7-213, 7-215 and the interposers 7-4. The encapsulant 7-5 may cover the upper surface 7-31 and the lateral surface 7-35 of the encapsulant 7-3.

Figure 8P:
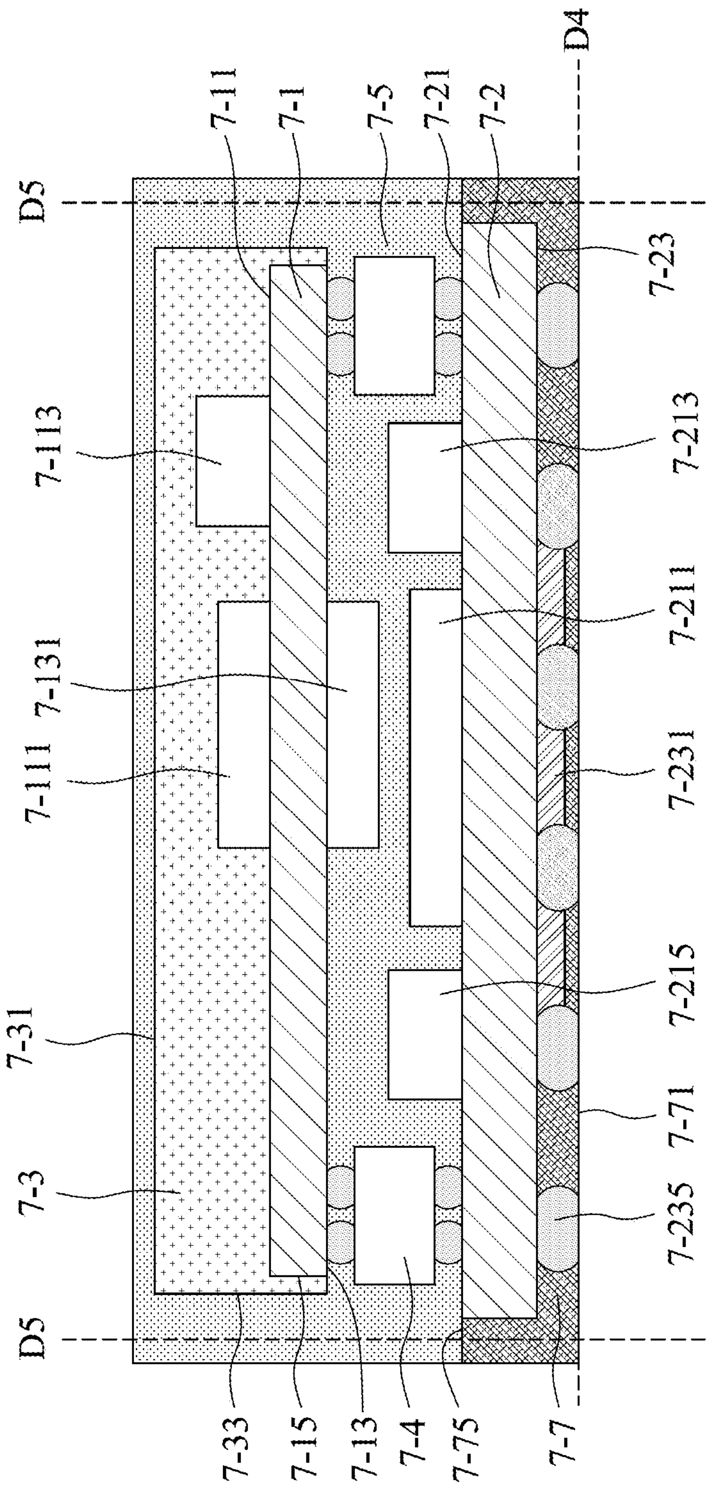

Referring to FIG. 8P, a grinding process is conducted to cut along the imaginary line "D4" through the encapsulant 7-7 and the electrical connections 7-235. After the grinding process, the electrical connections 7-235 may be exposed from the lower surface 7-71 of the encapsulant 7-7. Moreover, a singulation process is conducted to cut along the imaginary line "D5" through the substrate 7-2 and the encapsulants 7-5 and 7-7, and thus forming the semiconductor device package structure 7 as shown in FIG. 7.

Figure 9:
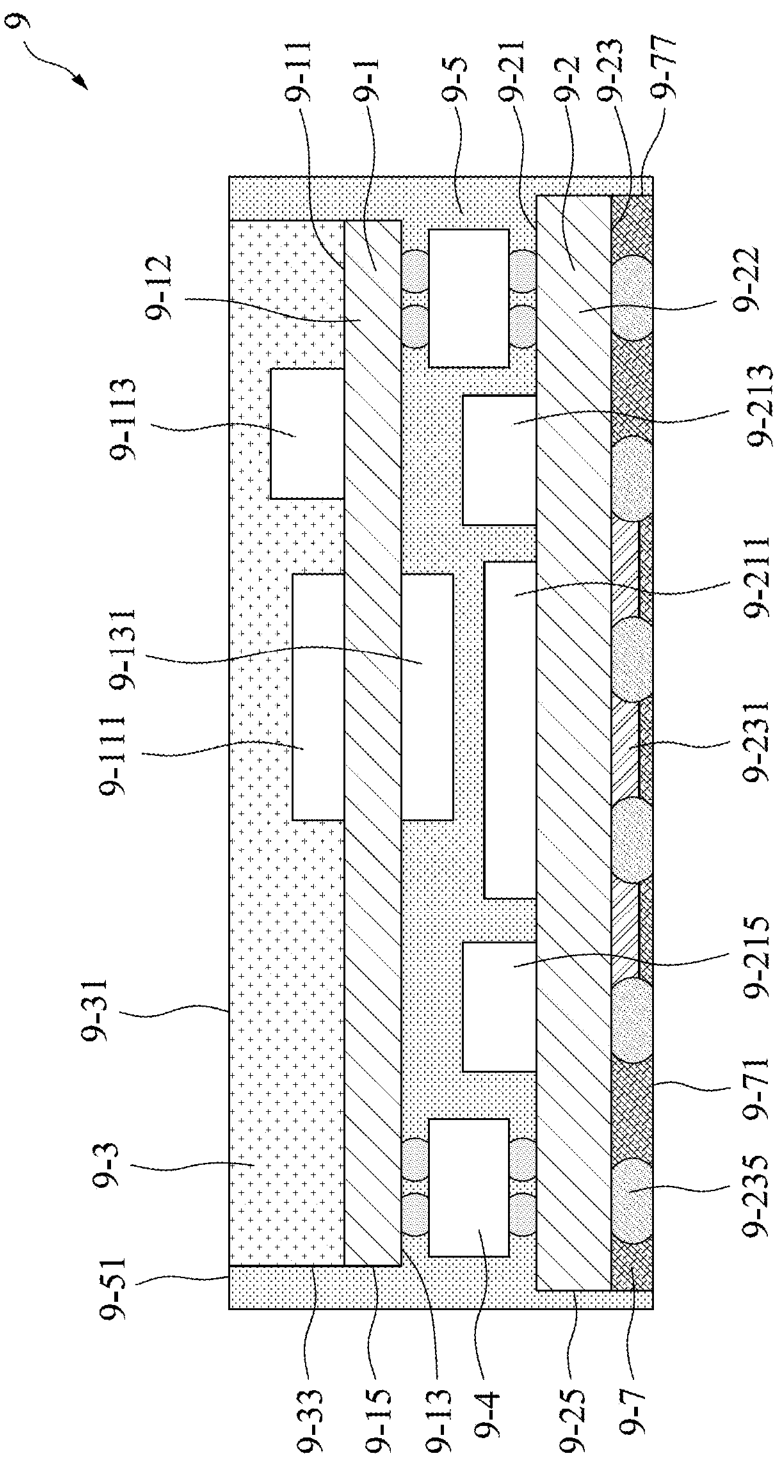
FIG. 9 is a cross-sectional view of a semiconductor device package in accordance with an embodiment of the instant disclosure.

FIG. 9 is a cross-sectional view of a semiconductor device package 9 in accordance with some embodiments of the present disclosure. As shown in FIG. 9, the semiconductor device package 9 may be a three-dimensional (3D) stacked semiconductor device package. The semiconductor device package 9 may include substrates 9-1, 9-2, electronic components 9-111, 9-113, 9-131, 9-211, 9-213, 9-215 and 9-231, encapsulants 9-3, 9-5, 9-7, interposers 9-4 and electrical connections 9-235. The substrate 9-1 may be a coreless substrate and may include traces, pads or interconnections for electrical connection. The substrate 9-2 may be a core substrate or a core-less substrate and may include traces, pads or interconnections for electrical connection. Further, the substrate 9-1 may disposed over and/or above the substrate 9-2.

Referring to FIG. 9, the substrate 9-1 has a surface 9-11 (e.g., an upper surface) and a surface 9-13 (e.g., a lower surface). The electronic components 9-111, 9-113 may be disposed or mounted on the surface 9-11 of the substrate 9-1. The electronic components 9-111, 9-113 may be a die, an active device, a passive device, and/or other electronic devices. In some embodiments of the present disclosure, the electronic components 9-111, 9-113 electrically connects the substrate 9-1 via electrical connections. In some embodiments of the present disclosure, the electronic component 9-111 may include a flash memory device. Further, the electronic component 9-131 may be disposed or mounted on the surface 9-13 of the substrate 9-1. The electronic component 9-131 may be a die, an active device, a passive device, and/or other electronic devices. In some embodiments of the present disclosure, the electronic component 9-131 electrically connects the substrate 9-1 via electrical connections. In some embodiments of the present disclosure, the electronic component 9-131 may include a flash memory device. In some embodiments of the present disclosure, a thickness of the substrate 9-2 is substantially greater than a thickness of the substrate 9-1. In some embodiments of the present disclosure, a thickness a dielectric layer 9-22 of the substrate 9-2 is substantially greater than a thickness of a dielectric layer 9-12 of the substrate 9-1. In some embodiments of the present disclosure, a hardness of the substrate 9-2 is substantially greater than a hardness of the substrate 9-1.

The substrate 9-2 has a surface 9-21 (e.g., an upper surface) and a surface 9-23 (e.g., a lower surface). The electronic components 9-211, 9-213, 9-215 may be disposed or mounted on the surface 9-21 of the substrate 9-2. The electronic components 9-211, 9-213, 9-215 may be a die, an active device, a passive device, and/or other electronic devices. In some embodiments of the present disclosure, the electronic components 9-211, 9-213, 9-215 electrically connects the substrate 9-2 via electrical connections. Further, the electronic component 9-231 may be disposed or mounted on the surface 9-23 of the substrate 9-2. The electronic component 9-231 may be a die, an active device, a passive device, and/or other electronic devices. In some embodiments of the present disclosure, the electronic component 9-231 electrically connects the substrate 9-2 via electrical connections. In some embodiments of the present disclosure, a thickness of the electronic components 9-231 is the thinnest among other components in the semiconductor device package 9. Moreover, a plurality of the electrical connections 9-235 are disposed or mounted on the surface 9-23 of the substrate 9-2. In some embodiments of the present disclosure, the electrical connection 9-235 includes a reflowable material. In some embodiments of the present disclosure, the electrical connection 9-235 includes solder material. The electrical connection 9-235 may include a solder ball. The electrical connection 9-235 may include a conductive pillar, post, or substrate interposer.

The interposers 9-4 may be disposed or mounted on the surface 9-13 of the substrate 9-1 and the surface 9-21 of the substrate 9-2. That is, the interposer 9-4 may be arranged between the substrate 9-1 and the substrate 9-2, and thus the interposer 9-4 may define a space between the substrate 9-1 and 9-2. In some embodiments of the present disclosure, an amount of the electronic components within the space between the substrate 9-1 and the substrate 9-2 and/or defined by the interposer 9-4, such as the electronic components, 9-131, 9-211, 9-213, 9-215, is greater than an amount of the electronic components outside of the space between the substrate 9-1 and the substrate 9-2 and/or defined by the interposer 9-4, such as the electronic components, 9-111, 9-113, 9-231. In some embodiments of the present disclosure, a distance between the adjacent electronic components within the space between the substrate 9-1 and the substrate 9-2 and/or defined by the interposer 9-4, such as the electronic components, 9-131, 9-211, 9-213, 9-215, is smaller than a distance between the adjacent electronic components outside of the space between the substrate 9-1 and the substrate 9-2 and/or defined by the interposer 9-4, such as the electronic components, 9-111, 9-113, 9-231. In some embodiments of the present disclosure, a density of the electronic components within the space between the substrate 9-1 and the substrate 9-2 and/or defined by the interposer 9-4, such as the electronic components, 9-131, 9-211, 9-213, 9-215, is greater than a density of the electronic components outside of the space between the substrate 9-1 and the substrate 9-2 and/or defined by the interposer 9-4, such as the electronic components, 9-111, 9-113, 9-231. Moreover, the interposer 9-4 may electrically connect the substrate 9-1 and the substrate 9-2 via electrical connections. In some embodiments of the present disclosure, such electrical connection includes a solder material. In some embodiments of the present disclosure, the interposer 9-4 includes a substrate interposer with redistribution layers and/or conductive vias.

The encapsulant 9-3 is disposed on the surface 9-11 of the substrate 9-1. The encapsulant 9-3 may cover the surface 9-11 of the substrate 9-1 and the electronic components 9-111 and 9-113 disposed on the surface 9-11 of the substrate 9-1. The encapsulant 9-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-3 may include a molding underfill (MUF) or a capillary underfill (CUF).

As above-mentioned, the substrate 9-1 may be a core-less substrate, and thus the substrate 9-1 may have a relatively thin thickness and/or a relatively weak stiffness. Therefore, when the electronic components, such as the electronic components, 9-111, 9-113, 9-131, are mounted on the substrate 9-1, the total weight of the electronic components may cause the substrate 9-1 to collapse. That is, the substrate 9-1 may be bended or recessed toward the substrate 9-2 due to the weights of the electronic components 9-111, 9-113, 9-131, and the electronic component 9-131 on the surface 9-13 of the substrate 9-1 may collide with the electronic component 9-211 on the surface of the substrate 9-2 and under the electronic component 9-131. The encapsulant 9-3 may be a reinforcement structure which is configured to improve the strength of the substrate 9-1 such that the substrate 9-1 is strong enough to support the electronic components 9-111, 9-113, 9-131 mounted thereon. Given the above, the encapsulant 9-3 may be configured to prevent the substrate 9-1 from collapsing and being bended or recessed toward the substrate 9-2. That is, the encapsulant 9-3 is configured to define a space between the electronic component 9-131 on the surface 9-13 of the substrate 9-1 and the electronic component 9-211 on the surface 9-21 of the substrate 9-2, and thus the electronic component 9-131 and the electronic component 9-211 may be maintained to be spaced apart from each other by a distance. In some embodiments of the present disclosure, the encapsulant 9-3 is a warpage-resistant layer configured to prevent the warpage of the substrate 9-1.

The encapsulant 9-5 is disposed on the surface 9-21 of the substrate 9-2. The encapsulant 9-5 may cover the surface 9-21 of the substrate 9-2, the electronic components 9-211, 9-213, 9-215 disposed on the surface 9-21 of the substrate 9-2, the surface 9-13 of the substrate 9-1, the electronic component 9-131 disposed on the surface 9-13 of the substrate 9-1 and the interposers 9-4. The encapsulant 9-5 may cover a lateral surface 9-15 of the substrate 9-1, a lateral surface 9-33 of the encapsulant 9-3 and a lateral surface 9-25 of the substrate 9-2. In some embodiments of the present disclosure, an upper surface 9-51 of the encapsulant 9-5 is coplanar with an upper surface 9-31 of the encapsulant 9-3. In some embodiments of the present disclosure, the encapsulant 9-5 exposes the upper surface 9-31 of the encapsulant 9-3. The encapsulant 9-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 9-5 may include a molding underfill (MUF) or a capillary underfill (CUF).

The encapsulant 9-7 is disposed on the surface 9-23 of the substrate 9-2. The encapsulant 9-7 may cover the surface 9-23 of the substrate 9-2 and the electronic component 9-231 and the electrical connections 9-235 disposed on the surface 9-23 of the substrate 9-2. The encapsulant 9-7 may have a lower surface 9-71 covering the electronic component 9-231. In some embodiments of the present disclosure, a lower surface of the electronic component 9-231 is exposed from the lower surface 9-71 of the encapsulant 9-7. The electrical connections 9-235 may be exposed from the lower surface 9-71 of the encapsulant 9-7. The encapsulant 9-7 may have a lateral surface 9-77 which is covered by the encapsulant 9-5. The encapsulant 9-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 9-7 may include a molding underfill (MUF) or a capillary underfill (CUF). In some embodiments of the present disclosure, a thickness of the encapsulant 9-7 is the thinnest among other encapsulants 9-3, 9-5 in the semiconductor device package 9.

In some embodiments of the present disclosure, the material of the encapsulant 9-3 is substantially identical to the material of the encapsulant 9-5, and/or the material of the encapsulant 9-5 is substantially identical to the material of the encapsulant 9-7, and/or the material of the encapsulant 9-3 is substantially identical to the material of the encapsulant 9-7. In some embodiments of the present disclosure, the material of the encapsulant 9-3 is different from the material of the encapsulant 9-5, and/or the material of the encapsulant 9-5 is different from the material of the encapsulant 9-7, and/or the material of the encapsulant 9-3 is different from the material of the encapsulant 9-7. In some embodiments of the present disclosure, the CTE (coefficient of thermal expansion) of the substrate 9-1 is substantially equal to the CTE of the encapsulant 9-3. In some embodiments of the present disclosure, the CTE of the encapsulant 9-5 is substantially equal to or smaller than the CTE of the encapsulant 9-7. In some embodiments of the present disclosure, the difference between the CTE of substrate 9-1 and the CTE of the encapsulant 9-7 is less than the difference between the CTE of substrate 9-1 and the CTE of the encapsulant 9-5 or the difference between the CTE of encapsulant 9-5 and the CTE of the encapsulant 9-7.

In some embodiments of the present disclosure, the substrate 9-1 is the same as, or similar to, the substrate 1-1 as shown in FIGS. 1B and 1C. That is, the substrate 9-1 may include the interconnection which may have the via tapered from the surface 9-11 toward the surface 9-13 or tapered from the surface 9-13 toward the surface 9-11. In some embodiments of the present disclosure, the substrate 9-1 is the same as, or similar to, the substrate 1-1 as shown in FIG. 1D. That is, the substrate 9-1 may include dielectric layers as shown in FIG. 1D.

FIG. 10A, FIG. 10B, FIG. 10C, FIG. 10D, FIG. 10E, FIG. 10F, FIG. 10G, FIG. 10H, FIG. 10I, FIG. 10J and FIG. 10K illustrate a method of manufacturing a semiconductor device package 9 in accordance with another embodiment of the instant disclosure.

Figure 10A:
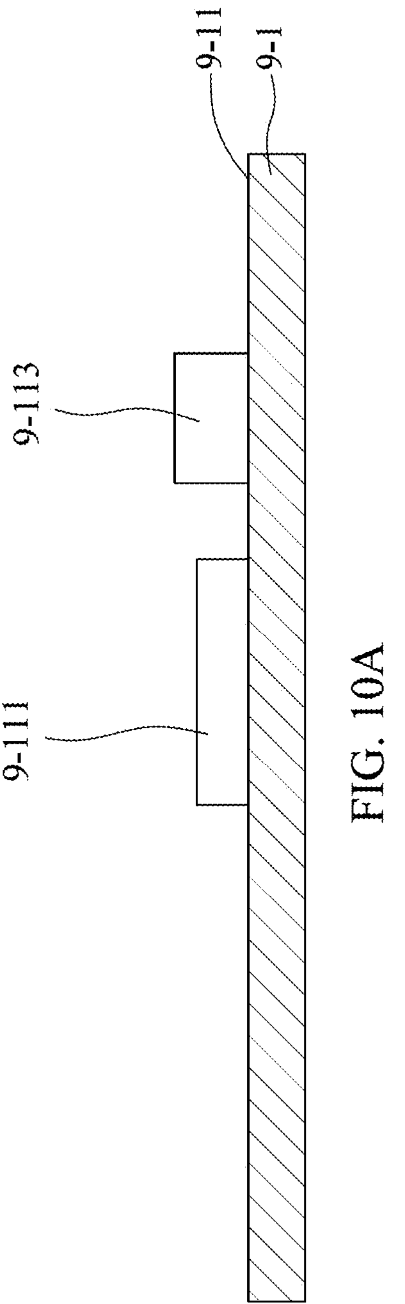
FIG. 10A, FIG. 10B, FIG. 10C, FIG. 10D, FIG. 10E, FIG. 10F, FIG. 10G, FIG. 10H, FIG. 10I, FIG. 10J and FIG. 10K illustrate a method of manufacturing a semiconductor device package in accordance with another embodiment of the instant disclosure.

Referring to FIG. 10A, the substrate 9-1 with the electronic components 9-111, 9-113 is provided. The electronic elements 9-111 and 9-113 may be disposed or mounted on the surface 9-11 of the substrate 9-1 and electrically connected to the interconnection of the substrate 9-1.

Figure 10B:
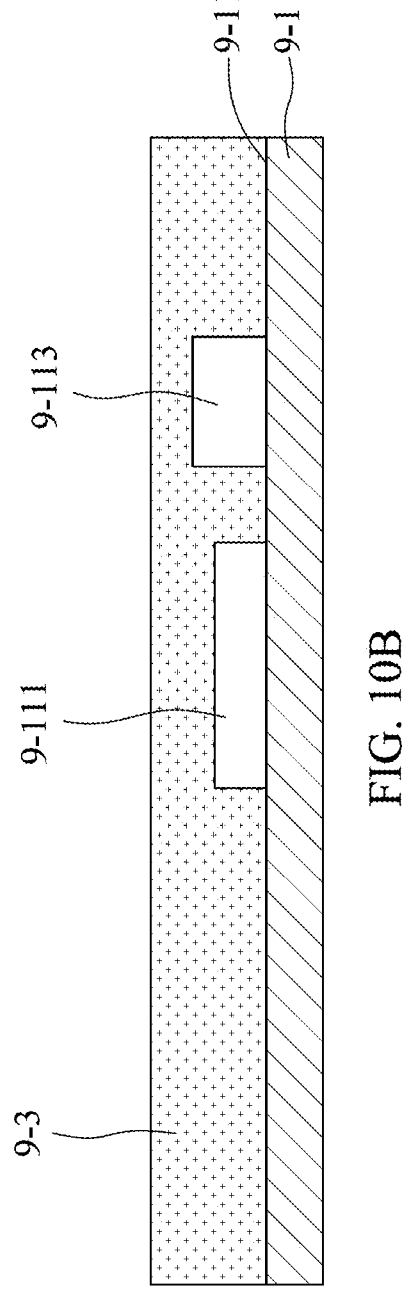

Referring to FIG. 10B, the encapsulant 9-3 is provided. The encapsulant 9-3 may be formed on the surface 9-11 of the substrate 9-1. The encapsulant 9-3 may cover the surface 9-11 of the substrate 9-1 and the electronic components 9-111, 9-113.

Figures 10C, 10D:
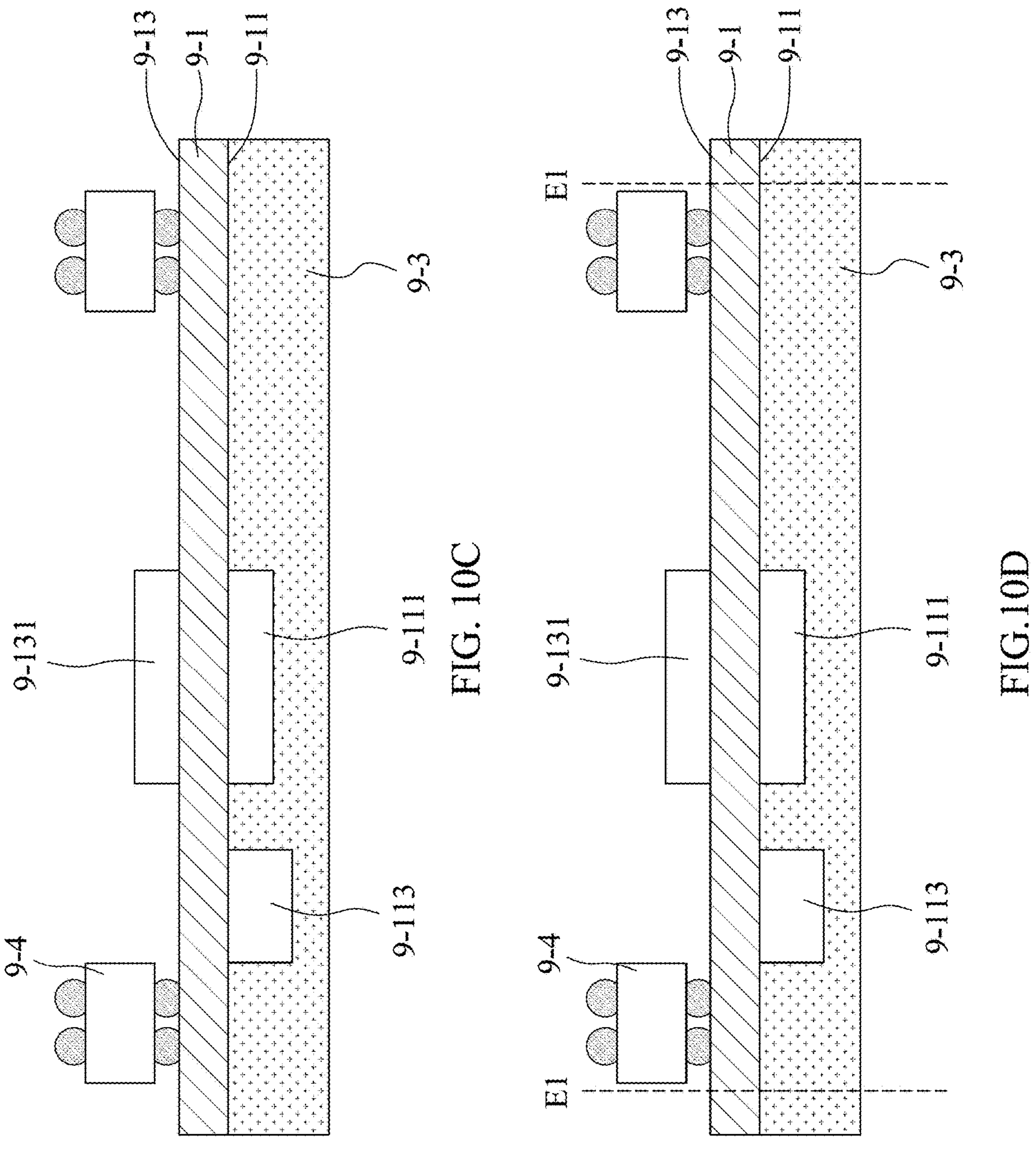

Referring to FIG. 10C, the structure obtained from FIG. 10B may be reversed upside down. The interposers 9-4 and the electronic component 9-131 may be disposed or mounted on the surface 9-13 of the substrate 9-1 and electrically connected to the interconnection of the substrate 9-1.

Referring to FIG. 10D, a singulation process is conducted to cut along the imaginary line "E1" through the substrate 9-1 and the encapsulant 9-3.

Figures 10E, 10F:
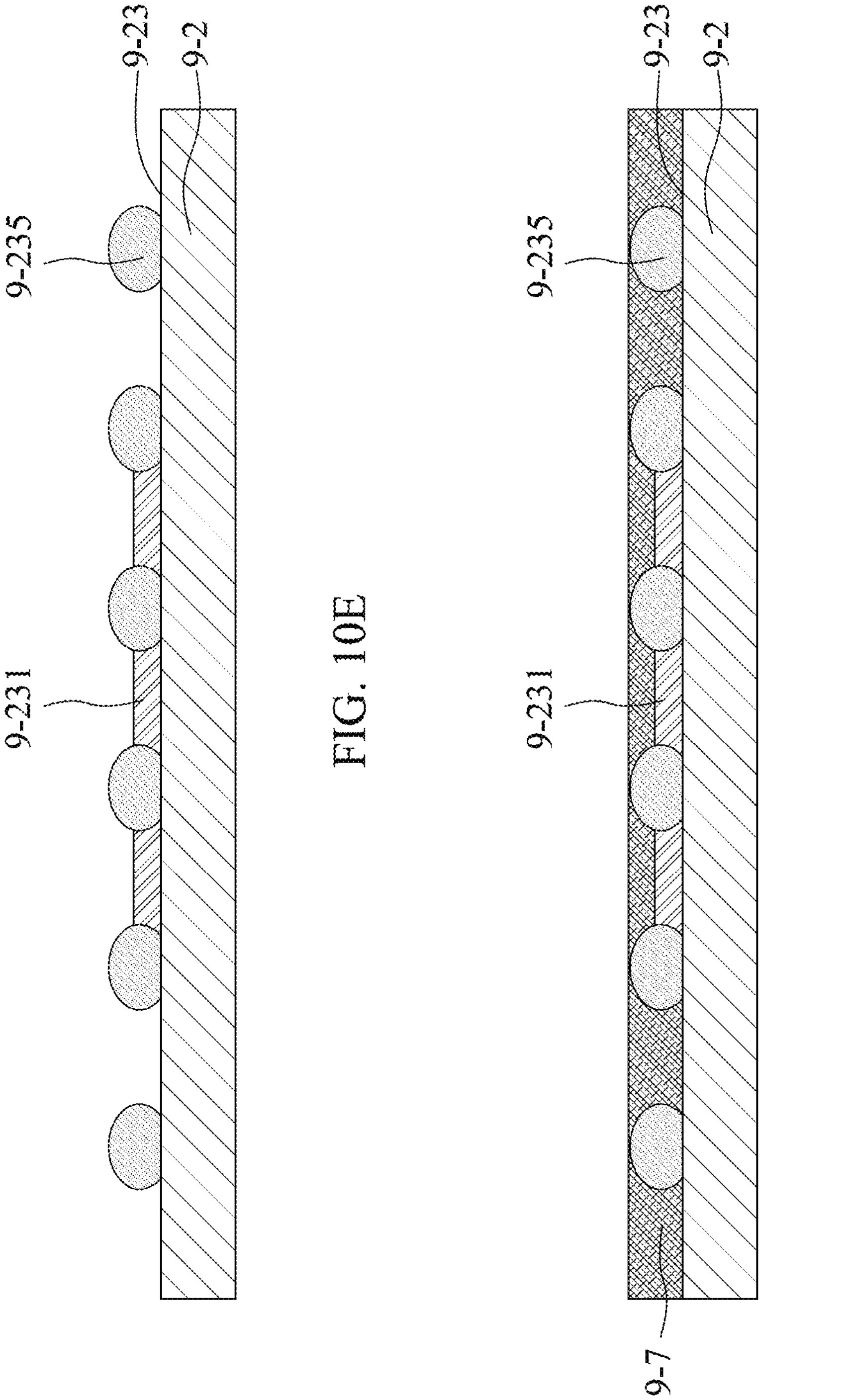

Referring to FIG. 10E, the substrate 9-2 with the electronic component 9-231 and electrical connections 9-235 is provided. The electronic element 9-231 and the electrical connections 9-235 may be disposed or mounted on the surface 9-23 of the substrate 9-2 and electrically connected to the interconnection of the substrate 9-2.

Referring to FIG. 10F, the encapsulant 9-7 is provided. The encapsulant 9-7 may be formed on the surface 9-23 of the substrate 9-2. The encapsulant 9-7 may cover the surface 9-23 of the substrate 9-2, the electronic component 9-231 and the electrical connections 9-235.

Figure 10G:
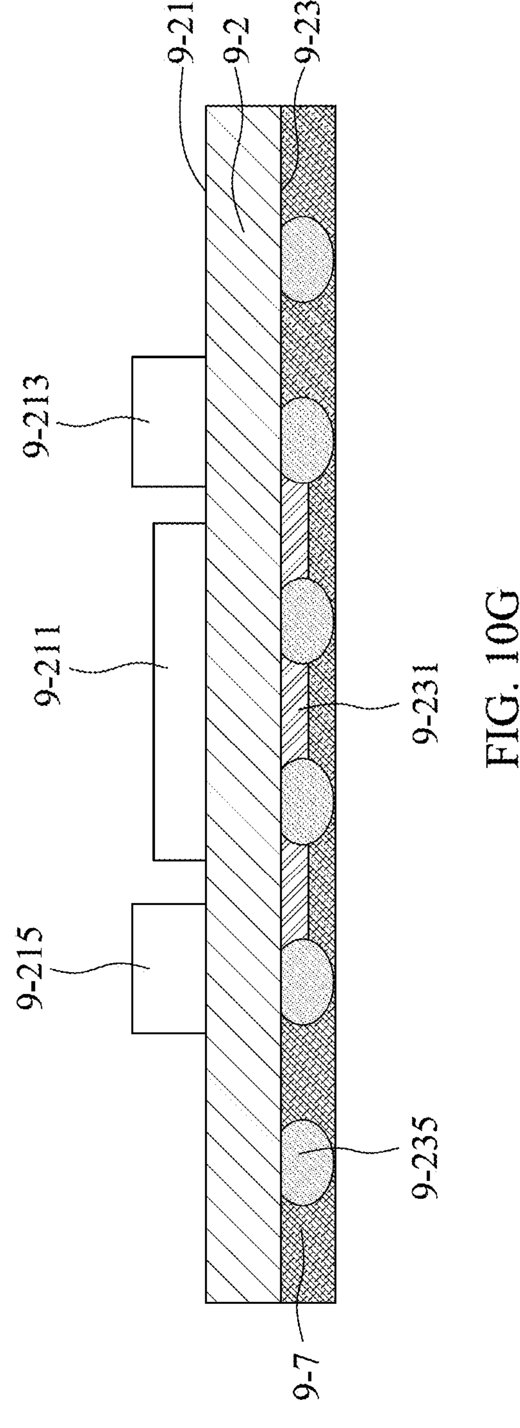

Referring to FIG. 10G, the structure obtained from FIG. 10F may be reversed upside down. The electronic elements 9-211, 9-213 and 9-215 may be disposed or mounted on the surface 9-21 of the substrate 9-2 and electrically connected to the interconnection of the substrate 9-2.

Figure 10H:
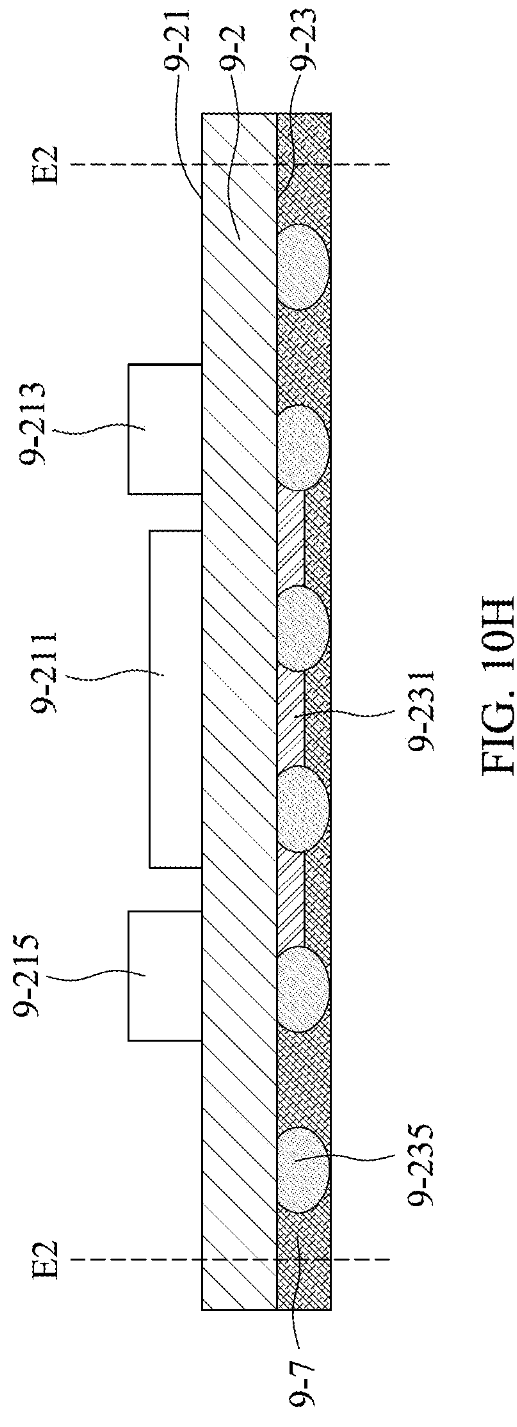

Referring to FIG. 10H, a singulation process is conducted to cut along the imaginary line "E2" through the substrate 9-2 and the encapsulant 9-7.

Figure 10I:
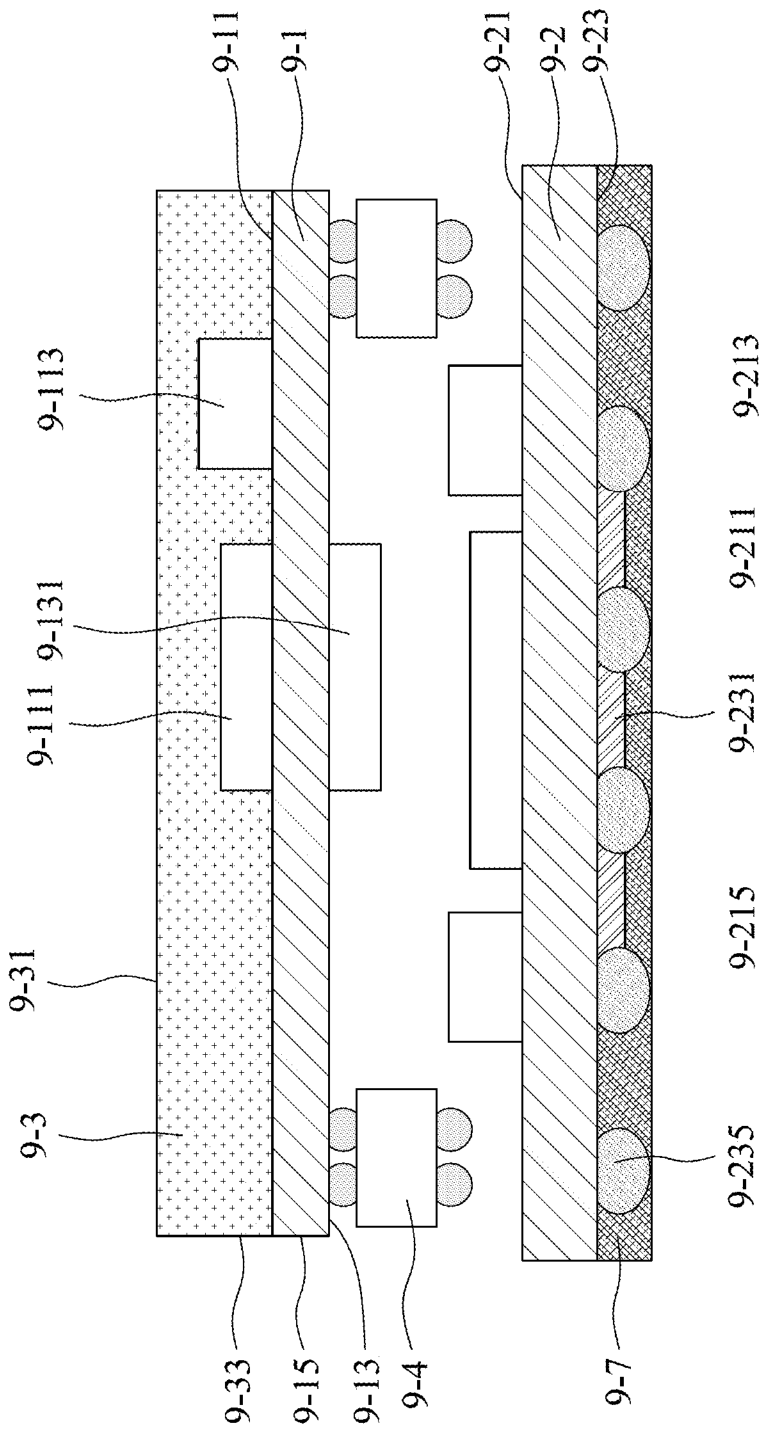

Referring to FIG. 10I, the structure obtained from FIG. 10D may be staked on the structure obtained from FIG. 10H. That is, the substrate 9-1 may be disposed over the substrate 9-2. The surface 9-13 of the substrate 9-1 may face the surface 9-21 of the substrate 9-2. The interposer 9-4 may be arranged between the substrate 1-1 and the substrate 9-2. The substrate 9-1 may be electrically connected to the substrate 9-2 through the interposer 9-4. Since the interposer 9-4 may be disposed on the substrate 9-2 and support the substrate 9-1, the electronic component 9-131 disposed on the surface 9-13 of the substrate 9-1 and the electronic component 9-211 disposed on the surface 9-21 of the substrate 9-2 may be spaced apart from by a distance.

Figure 10J:
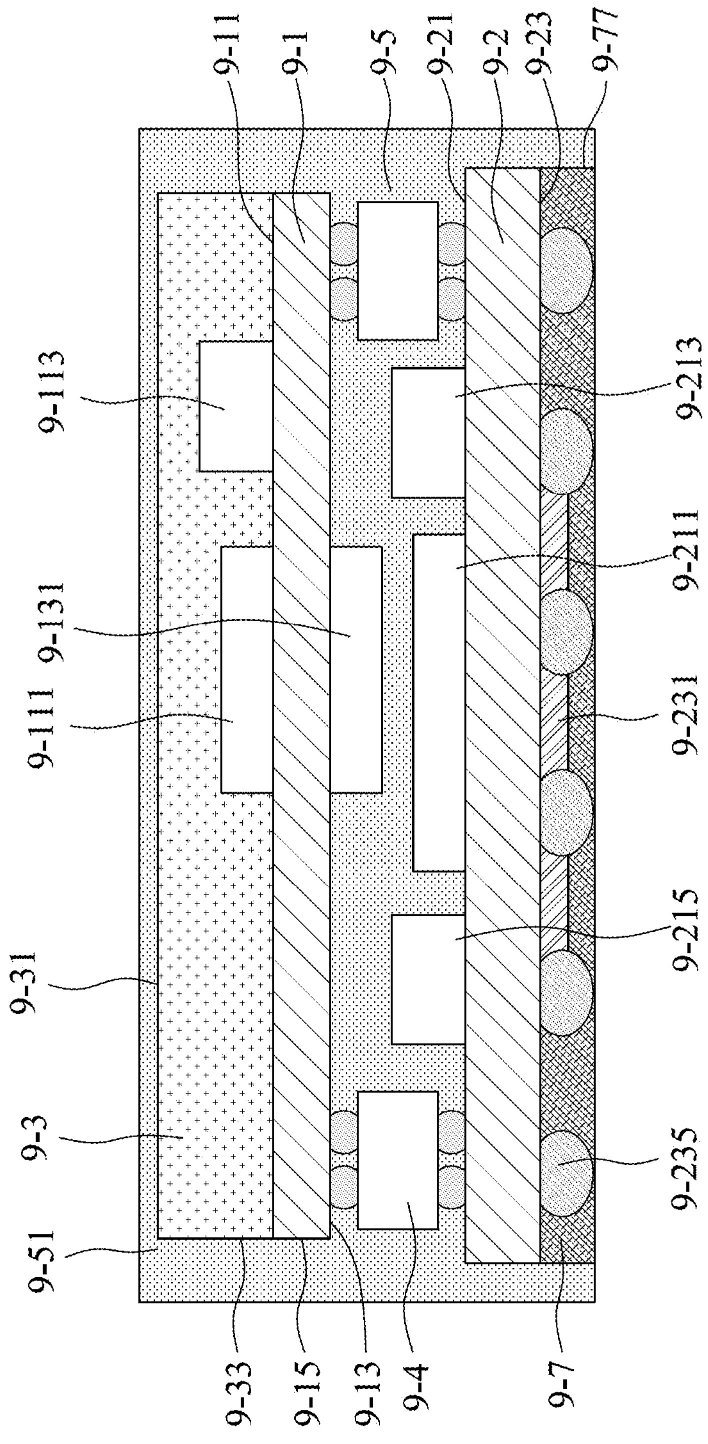

Referring to FIG. 10J, the encapsulant 9-5 is provided. The encapsulant 19-5 may cover the surface 9-21 of the substrate 9-2, the surface 9-13 of the substrate 9-1, the electronic component 9-131, the electronic components 9-211, 9-213, 9-215 and the interposers 9-4. The encapsulant 9-5 may cover the lateral surface 9-77 of the encapsulant 9-7. The encapsulant 9-5 may cover the lateral surface 9-33 of the encapsulant 9-3. The encapsulant 9-5 may cover the lateral surface 9-15 of the substrate 9-1.

Figure 10K:
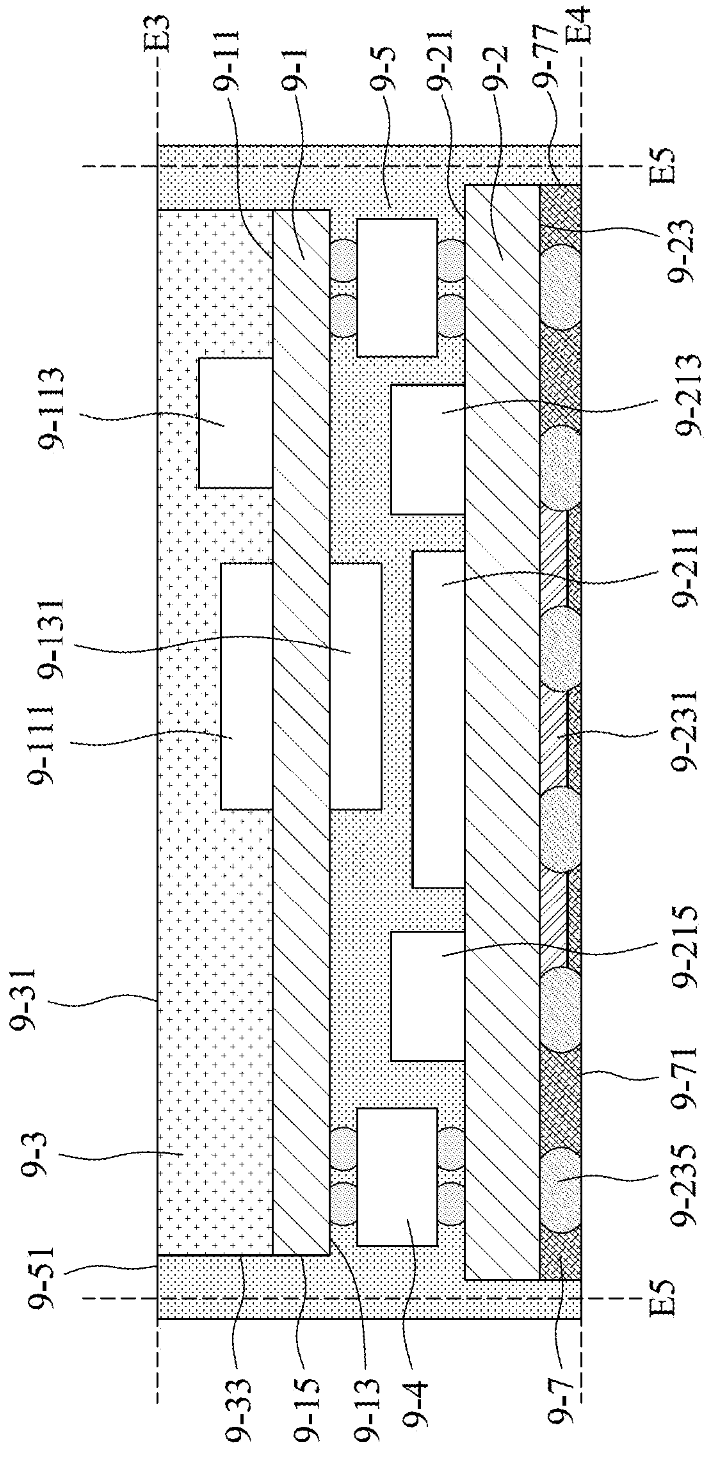

Referring to FIG. 10K, a grinding process is conducted to cut along the imaginary line "E3" through the encapsulant 9-3 and the encapsulant 9-5, and thus the upper surface 9-31 of the encapsulant 9-3 is exposed from the upper surface 9-51 of the encapsulant 9-5. Moreover, another grinding process is conducted to cut along the imaginary line "E4" through the encapsulant 9-7 and the electrical connections 9-235, and thus the electrical connections 9-235 are exposed from the lower surface 9-71 of the encapsulant 9-7. Further, a singulation process is conducted to cut along the imaginary line "E5" through the encapsulants 9-5, and thus forming the semiconductor device package structure 9 as shown in FIG. 9.

Figure 11:
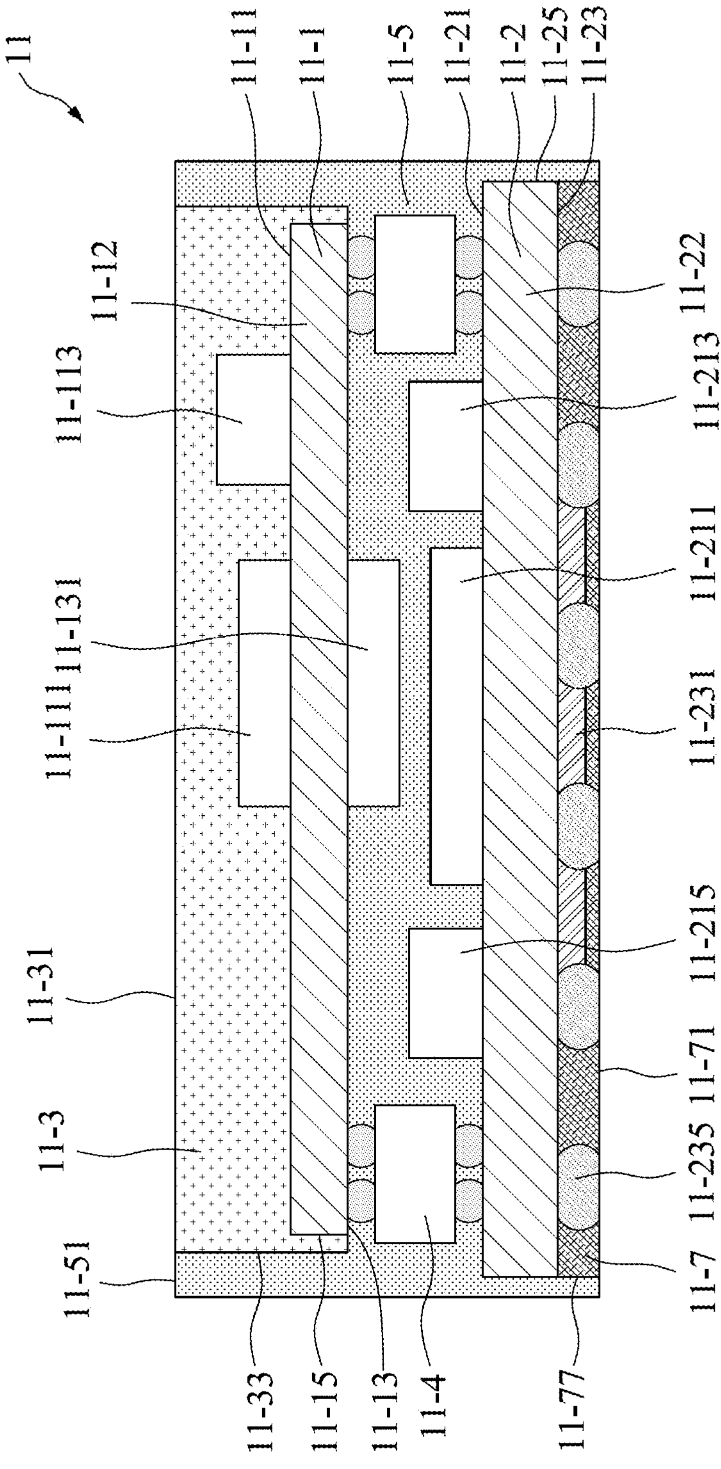
FIG. 11 is a cross-sectional view of a semiconductor device package in accordance with an embodiment of the instant disclosure.

FIG. 11 is a cross-sectional view of a semiconductor device package 11 in accordance with some embodiments of the present disclosure. As shown in FIG. 11, the semiconductor device package 11 may be a three-dimensional (3D) stacked semiconductor device package. The semiconductor device package 11 may include substrates 11-1, 11-2, electronic components 11-111, 11-113, 11-131, 11-211, 11-213, 11-215 and 11-231, encapsulants 11-3, 11-5, 11-7, interposers 11-4 and electrical connections 11-235. The substrate 11-1 may be a coreless substrate and may include traces, pads or interconnections for electrical connection. The substrate 11-2 may be a core substrate or a core-less substrate and may include traces, pads or interconnections for electrical connection. Further, the substrate 11-1 may disposed over and/or above the substrate 11-2.

Referring to FIG. 11, the substrate 11-1 has a surface 11-11 (e.g., an upper surface) and a surface 11-13 (e.g., a lower surface). The electronic components 11-111, 11-113 may be disposed or mounted on the surface 11-11 of the substrate 11-1. The electronic components 11-111, 11-113 may be a die, an active device, a passive device, and/or other electronic devices. In some embodiments of the present disclosure, the electronic components 11-111, 11-113 electrically connects the substrate 11-1 via electrical connections. In some embodiments of the present disclosure, the electronic component 11-111 may include a flash memory device. Further, the electronic component 11-131 may be disposed or mounted on the surface 11-13 of the substrate 11-1. The electronic component 11-131 may be a die, an active device, a passive device, and/or other electronic devices. In some embodiments of the present disclosure, the electronic component 11-131 electrically connects the substrate 11-1 via electrical connections. In some embodiments of the present disclosure, the electronic component 11-131 may include a flash memory device. In some embodiments of the present disclosure, a thickness of the substrate 11-2 is substantially greater than a thickness of the substrate 11-1. In some embodiments of the present disclosure, a thickness a dielectric layer 11-22 of the substrate 11-2 is substantially greater than a thickness of a dielectric layer 11-12 of the substrate 11-1. In some embodiments of the present disclosure, a hardness of the substrate 11-2 is substantially greater than a hardness of the substrate 11-1.

The substrate 11-2 has a surface 11-21 (e.g., an upper surface) and a surface 11-23 (e.g., a lower surface). The electronic components 11-211, 11-213, 11-215 may be disposed or mounted on the surface 11-21 of the substrate 11-2. The electronic components 11-211, 11-213, 11-215 may be a die, an active device, a passive device, and/or other electronic devices. In some embodiments of the present disclosure, the electronic components 11-211, 11-213, 11-215 electrically connects the substrate 11-2 via electrical connections. Further, the electronic component 11-231 may be disposed or mounted on the surface 11-23 of the substrate 11-2. The electronic component 11-231 may be a die, an active device, a passive device, and/or other electronic devices. In some embodiments of the present disclosure, the electronic component 11-231 electrically connects the substrate 11-2 via electrical connections. In some embodiments of the present disclosure, a thickness of the electronic components 11-231 is the thinnest among other components in the semiconductor device package 11. Moreover, a plurality of the electrical connections 11-235 are disposed or mounted on the surface 11-23 of the substrate 11-2. In some embodiments of the present disclosure, the electrical connection 11-235 includes a reflowable material. In some embodiments of the present disclosure, the electrical connection 11-235 includes solder material. The electrical connection 11-235 may include a solder ball. The electrical connection 11-235 may include a conductive pillar, post, or substrate interposer.

The interposers 11-4 may be disposed or mounted on the surface 11-13 of the substrate 11-1 and the surface 11-21 of the substrate 11-2. That is, the interposer 11-4 may be arranged between the substrate 11-1 and the substrate 11-2, and thus the interposer 11-4 may define a space between the substrate 11-1 and 11-2. In some embodiments of the present disclosure, an amount of the electronic components within the space between the substrate 11-1 and the substrate 11-2 and/or defined by the interposer 11-4, such as the electronic components, 11-131, 11-211, 11-213, 11-215, is greater than an amount of the electronic components outside of the space between the substrate 11-1 and the substrate 11-2 and/or defined by the interposer 11-4, such as the electronic components, 11-111, 11-113, 11-231. In some embodiments of the present disclosure, a distance between the adjacent electronic components within the space between the substrate 11-1 and the substrate 11-2 and/or defined by the interposer 11-4, such as the electronic components, 11-131, 11-211, 11-213, 11-215, is smaller than a distance between the adjacent electronic components outside of the space between the substrate 11-1 and the substrate 11-2 and/or defined by the interposer 11-4, such as the electronic components, 11-111, 11-113, 11-231. In some embodiments of the present disclosure, a density of the electronic components within the space between the substrate 11-1 and the substrate 11-2 and/or defined by the interposer 11-4, such as the electronic components, 11-131, 11-211, 11-213, 11-215, is greater than a density of the electronic components outside of the space between the substrate 11-1 and the substrate 11-2 and/or defined by the interposer 11-4, such as the electronic components, 11-111, 11-113, 11-231. Moreover, the interposer 11-4 may electrically connect the substrate 11-1 and the substrate 11-2 via electrical connections. In some embodiments of the present disclosure, such electrical connection includes a solder material. In some embodiments of the present disclosure, the interposer 11-4 includes a substrate interposer with redistribution layers and/or conductive vias.

The encapsulant 11-3 is disposed on the surface 11-11 of the substrate 11-1. The encapsulant 11-3 may cover the surface 11-11 of the substrate 11-1 and the electronic components 11-111 and 11-113 disposed on the surface 11-11 of the substrate 11-1. Further, the encapsulant 11-3 may cover a lateral surface 11-15 of the substrate 11-1, and thus functions as a mold lock. The encapsulant 11-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 11-3 may include a molding underfill (MUF) or a capillary underfill (CUF).

As above-mentioned, the substrate 11-1 may be a coreless substrate, and thus the substrate 11-1 may have a relatively thin thickness and/or a relatively weak stiffness. Therefore, when the electronic components, such as the electronic components, 11-111, 11-113, 11-131, are mounted on the substrate 11-1, the total weight of the electronic components may cause the substrate 11-1 to collapse. That is, the substrate 11-1 may be bended or recessed toward the substrate 11-2 due to the weights of the electronic components 11-111, 11-113, 11-131, and the electronic component 11-131 on the surface 11-13 of the substrate 11-1 may collide with the electronic component 11-211 on the surface of the substrate 11-2 and under the electronic component 11-131. The encapsulant 11-3 may be a reinforcement structure which is configured to improve the strength of the substrate 11-1 such that the substrate 11-1 is strong enough to support the electronic components 11-111, 11-113, 11-131 mounted thereon. Given the above, the encapsulant 11-3 may be configured to prevent the substrate 11-1 from collapsing and being bended or recessed toward the substrate 11-2. That is, the encapsulant 11-3 is configured to define a space between the electronic component 11-131 on the surface 11-13 of the substrate 11-1 and the electronic component 11-211 on the surface 11-21 of the substrate 11-2, and thus the electronic component 11-131 and the electronic component 11-211 may be maintained to be spaced apart from each other by a distance. In some embodiments of the present disclosure, the encapsulant 11-3 is a warpage-resistant layer configured to prevent the warpage of the substrate 11-1.

The encapsulant 11-5 is disposed on the surface 11-21 of the substrate 11-2. The encapsulant 11-5 may cover the surface 11-21 of the substrate 11-2, the electronic components 11-211, 11-213, 11-215 disposed on the surface 11-21 of the substrate 11-2, the surface 11-13 of the substrate 11-1, the electronic component 11-131 disposed on the surface 11-13 of the substrate 11-1 and the interposers 11-4. The encapsulant 11-5 may cover a lateral surface 11-33 of the encapsulant 11-3 and a lateral surface 11-25 of the substrate 11-2. In some embodiments of the present disclosure, an upper surface 11-51 of the encapsulant 11-5 is coplanar with an upper surface 11-31 of the encapsulant 11-3. In some embodiments of the present disclosure, the encapsulant 11-5 exposes the upper surface 11-31 of the encapsulant 11-3. The encapsulant 11-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 11-5 may include a molding underfill (MUF) or a capillary underfill (CUF).

The encapsulant 11-7 is disposed on the surface 11-23 of the substrate 11-2. The encapsulant 11-7 may cover the surface 11-23 of the substrate 11-2 and the electronic component 11-231 and the electrical connections 11-235 disposed on the surface 11-23 of the substrate 11-2. The encapsulant 11-7 may have a lower surface 11-71 covering the electronic component 11-231. In some embodiments of the present disclosure, a lower surface of the electronic component 11-231 is exposed from the lower surface 11-71 of the encapsulant 11-7. The electrical connections 11-235 may be exposed from the lower surface 11-71 of the encapsulant 11-7. The encapsulant 11-7 may have a lateral surface 11-77 which is covered by the encapsulant 11-5. The encapsulant 11-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 11-7 may include a molding underfill (MUF) or a capillary underfill (CUF). In some embodiments of the present disclosure, a thickness of the encapsulant 11-7 is the thinnest among other encapsulants 11-3, 11-5 in the semiconductor device package 11.

In some embodiments of the present disclosure, the material of the encapsulant 11-3 is substantially identical to the material of the encapsulant 11-5, and/or the material of the encapsulant 11-5 is substantially identical to the material of the encapsulant 11-7, and/or the material of the encapsulant 11-3 is substantially identical to the material of the encapsulant 11-7. In some embodiments of the present disclosure, the material of the encapsulant 11-3 is different from the material of the encapsulant 11-5, and/or the material of the encapsulant 11-5 is different from the material of the encapsulant 11-7, and/or the material of the encapsulant 11-3 is different from the material of the encapsulant 11-7. In some embodiments of the present disclosure, the CTE (coefficient of thermal expansion) of the substrate 11-1 is substantially equal to the CTE of the encapsulant 11-3. In some embodiments of the present disclosure, the CTE of the encapsulant 11-5 is substantially equal to or smaller than the CTE of the encapsulant 11-7. In some embodiments of the present disclosure, the difference between the CTE of substrate 11-1 and the CTE of the encapsulant 11-7 is less than the difference between the CTE of substrate 11-1 and the CTE of the encapsulant 11-5 or the difference between the CTE of encapsulant 11-5 and the CTE of the encapsulant 11-7.

In some embodiments of the present disclosure, the substrate 11-1 is the same as, or similar to, the substrate 1-1 as shown in FIGS. 1B and 1C. That is, the substrate 11-1 may include the interconnection which may have the via tapered from the surface 11-11 toward the surface 11-13 or tapered from the surface 11-13 toward the surface 11-11. In some embodiments of the present disclosure, the substrate 11-1 is the same as, or similar to, the substrate 1-1 as shown in FIG. 1D. That is, the substrate 11-1 may include dielectric layers as shown in FIG. 1D.

FIG. 12A, FIG. 12B, FIG. 12C, FIG. 12D, FIG. 12E, FIG. 12F, FIG. 12G, FIG. 12H, FIG. 12I, FIG. 12J, FIG. 12K, FIG. 12L, FIG. 12M and FIG. 12N illustrate a method of manufacturing a semiconductor device package 11 in accordance with another embodiment of the instant disclosure.

Figure 12A:
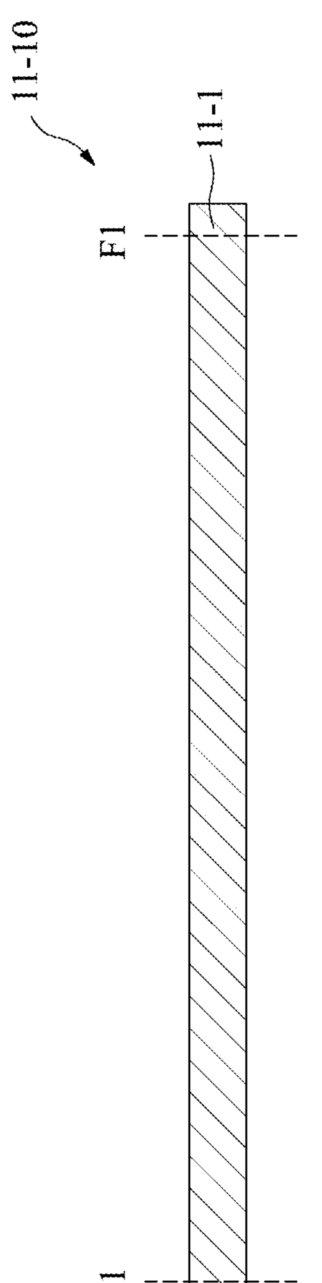
FIG. 12A, FIG. 12B, FIG. 12C, FIG. 12D, FIG. 12E, FIG. 12F, FIG. 12G, FIG. 12H, FIG. 12I, FIG. 12J, FIG. 12K, FIG. 12L, FIG. 12M and FIG. 12N illustrate a method of manufacturing a semiconductor device package in accordance with another embodiment of the instant disclosure.

Referring to FIG. 12A, a strip 11-10 is provided and a singulation process is conducted to cut along the imaginary line "F1" through the strip 11-10, and thus forming the substrate 11-1 as shown in FIG. 3.

Figure 12B:
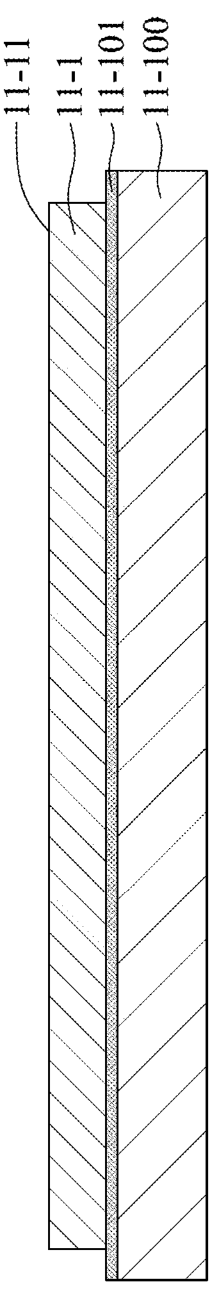

Referring to FIG. 12B, the substrate 11-1 may be arranged on a carrier 11-100 through a tape 11-101. That is, the tape 11-101 may be between the substrate 11-1 and the carrier 11-100.

Figures 12C, 12D:
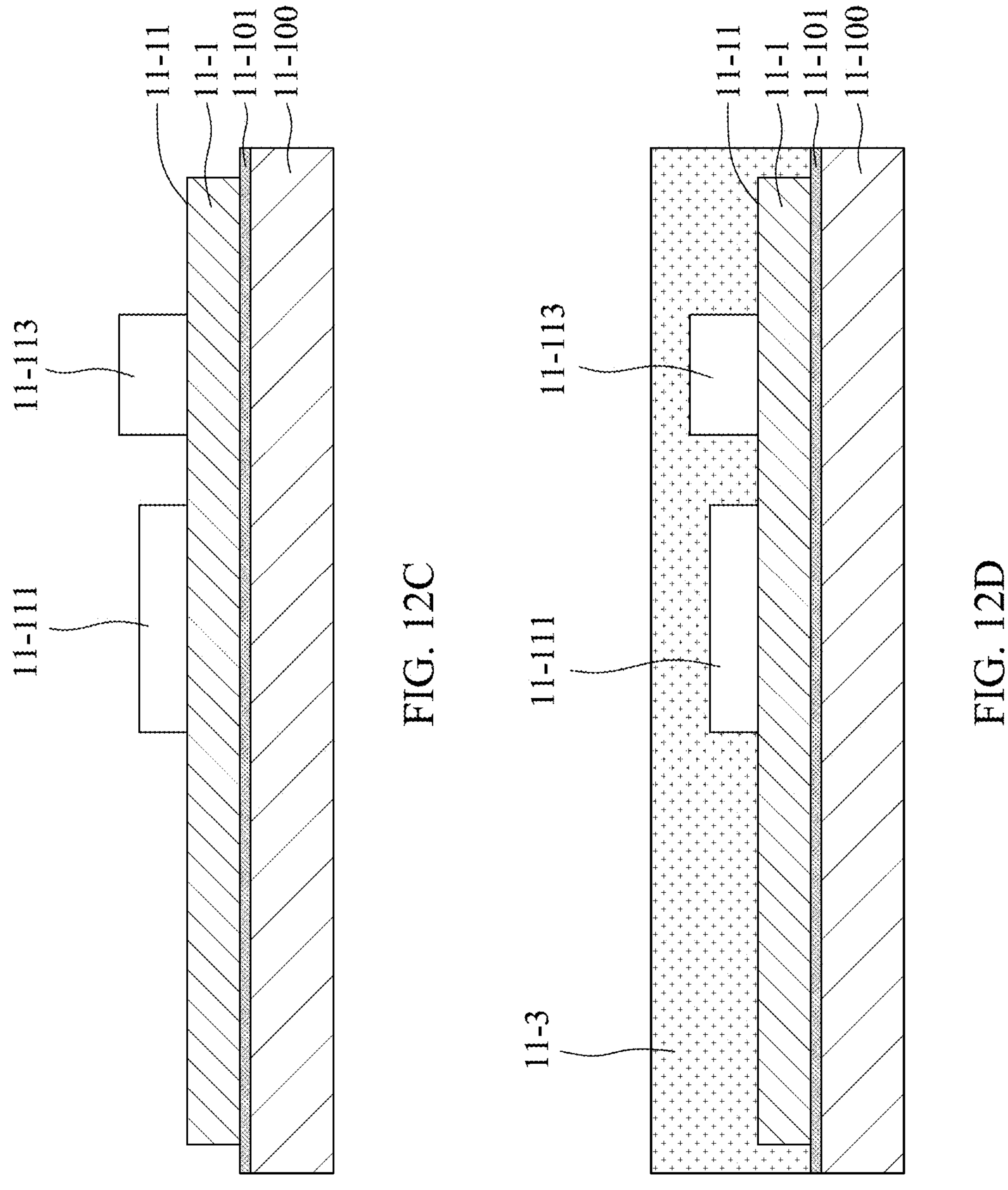

Referring to FIG. 12C, the electronic components 11-111, 11-113 may be disposed or mounted on the surface 11-11 of the substrate 11-1 and electrically connected to the interconnection of the substrate 11-1.

Referring to FIG. 12D, the encapsulant 11-3 is provided. The encapsulant 11-3 may be formed on the surface 11-11 of the substrate 11-1 and the tape 11-101 on the carrier 11-100. The encapsulant 11-3 may cover the surface 11-11 of the substrate 11-1, the electronic components 11-111, 11-113 and the tape 11-101.

Figures 12E, 12F:
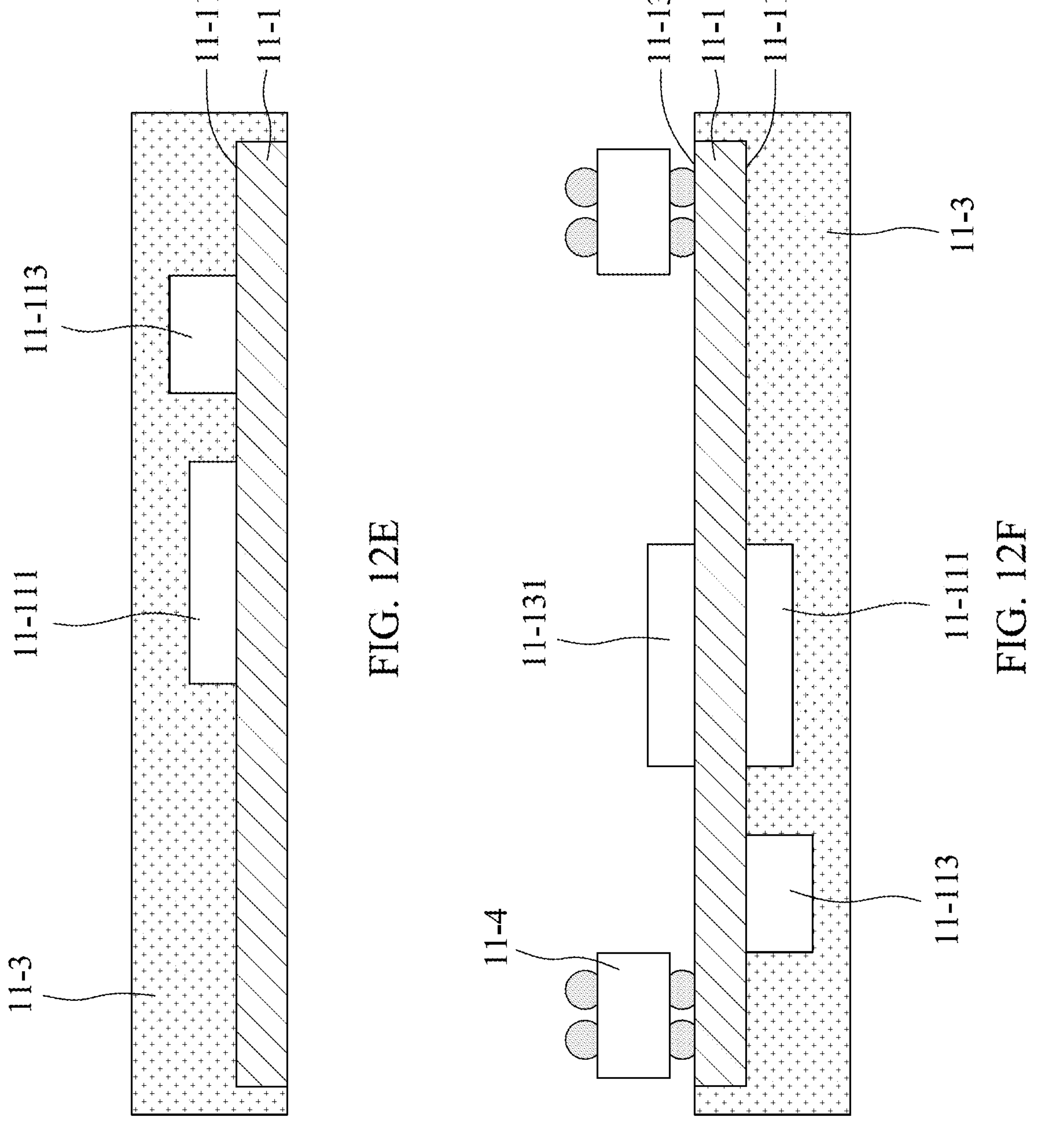

Referring to FIG. 12E, the carrier 11-100 and the tape 11-101 are removed (i.e., de-carrier).

Referring to FIG. 12F, the structure obtained from FIG. 12E may be reversed upside down. The interposers 11-4 and the electronic component 11-131 may be disposed or mounted on the surface 11-13 of the substrate 11-1 and electrically connected to the interconnection of the substrate 11-1.

Figure 12G:
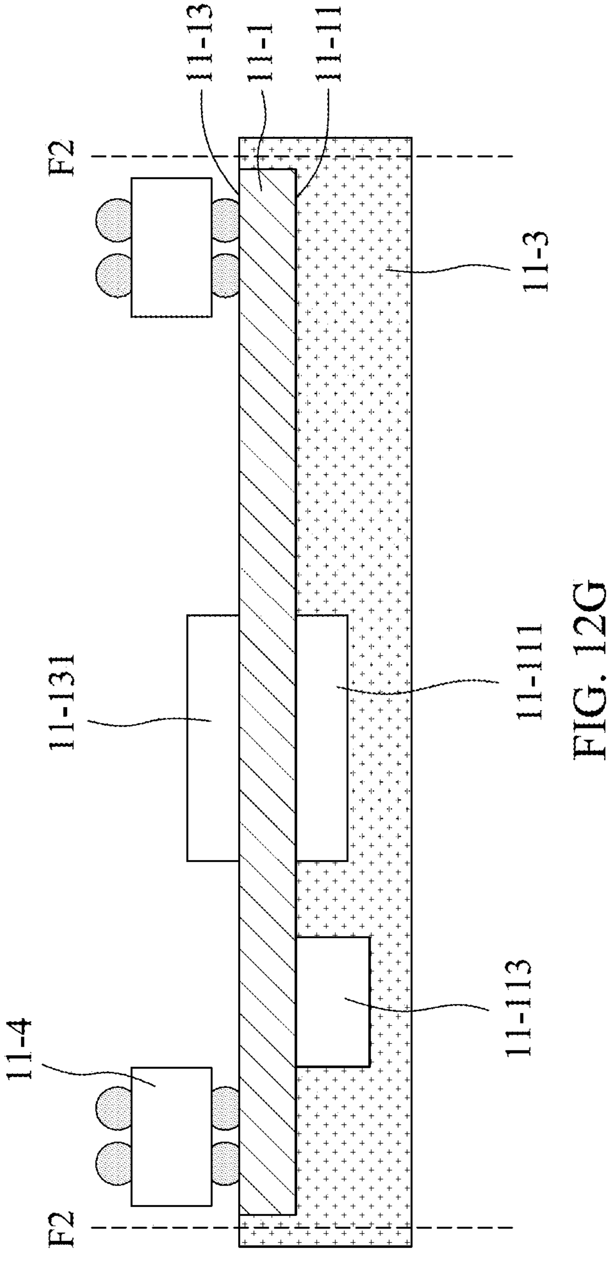

Referring to FIG. 12G, a singulation process is conducted to cut along the imaginary line "F2" through the encapsulant 12-3.

Figure 12H:
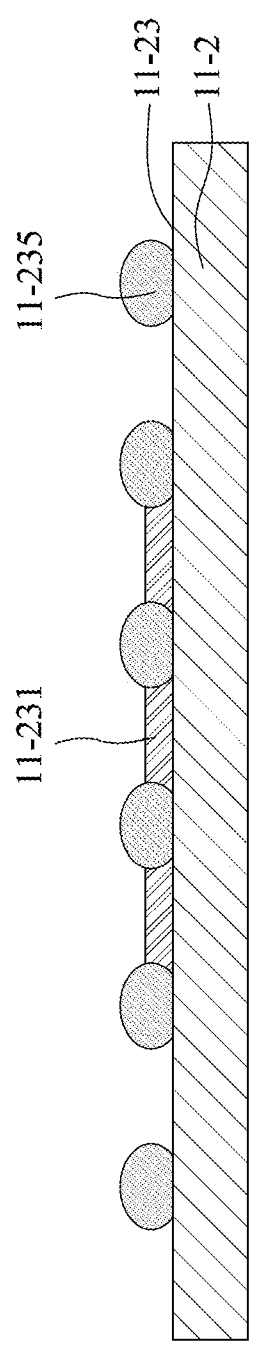

Referring to FIG. 12H, the substrate 11-2 with the electronic component 11-231 and electrical connections 11-235 is provided. The electronic element 11-231 and the electrical connections 11-235 may be disposed or mounted on the surface 11-23 of the substrate 11-2 and electrically connected to the interconnection of the substrate 11-2.

Figure 12I:
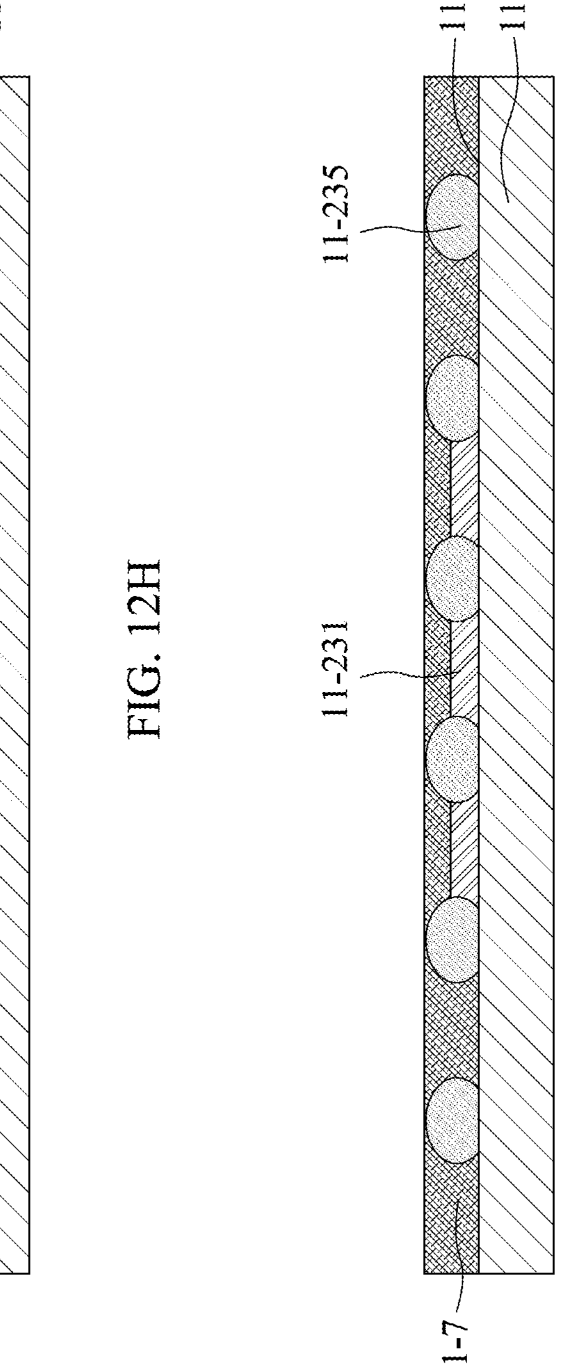

Referring to FIG. 12I, the encapsulant 11-7 is provided. The encapsulant 11-7 may be formed on the surface 11-23 of the substrate 11-2. The encapsulant 11-7 may cover the surface 11-23 of the substrate 11-2, the electronic component 11-231 and the electrical connections 11-235.

Figures 12J, 12K:
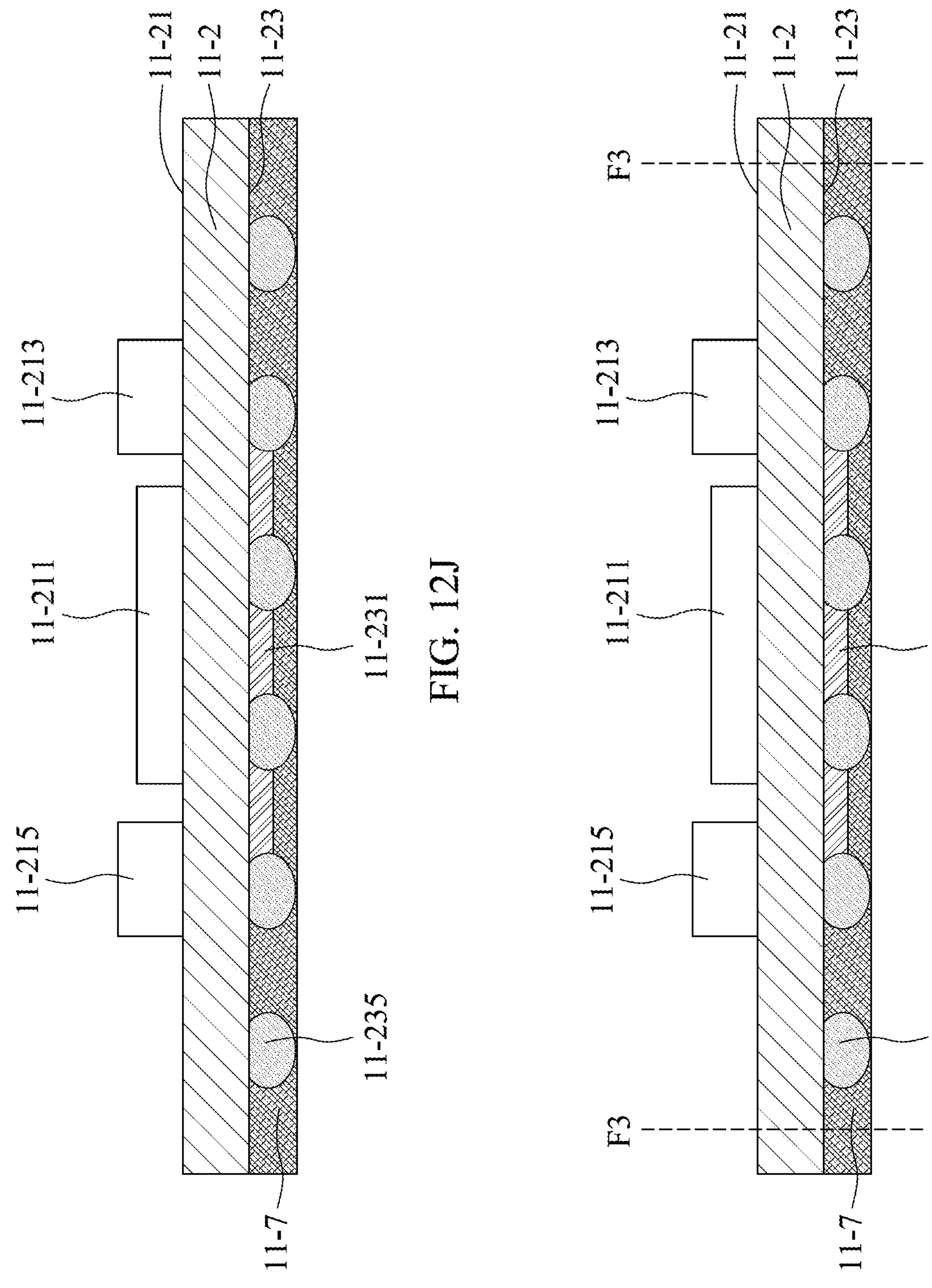

Referring to FIG. 12J, the structure obtained from FIG. 12I may be reversed upside down. The electronic elements 11-211, 11-213 and 11-215 may be disposed or mounted on the surface 11-21 of the substrate 11-2 and electrically connected to the interconnection of the substrate 11-2.

Referring to FIG. 12K, a singulation process is conducted to cut along the imaginary line "F3" through the substrate 11-2 and the encapsulant 11-7.

Figure 12L:
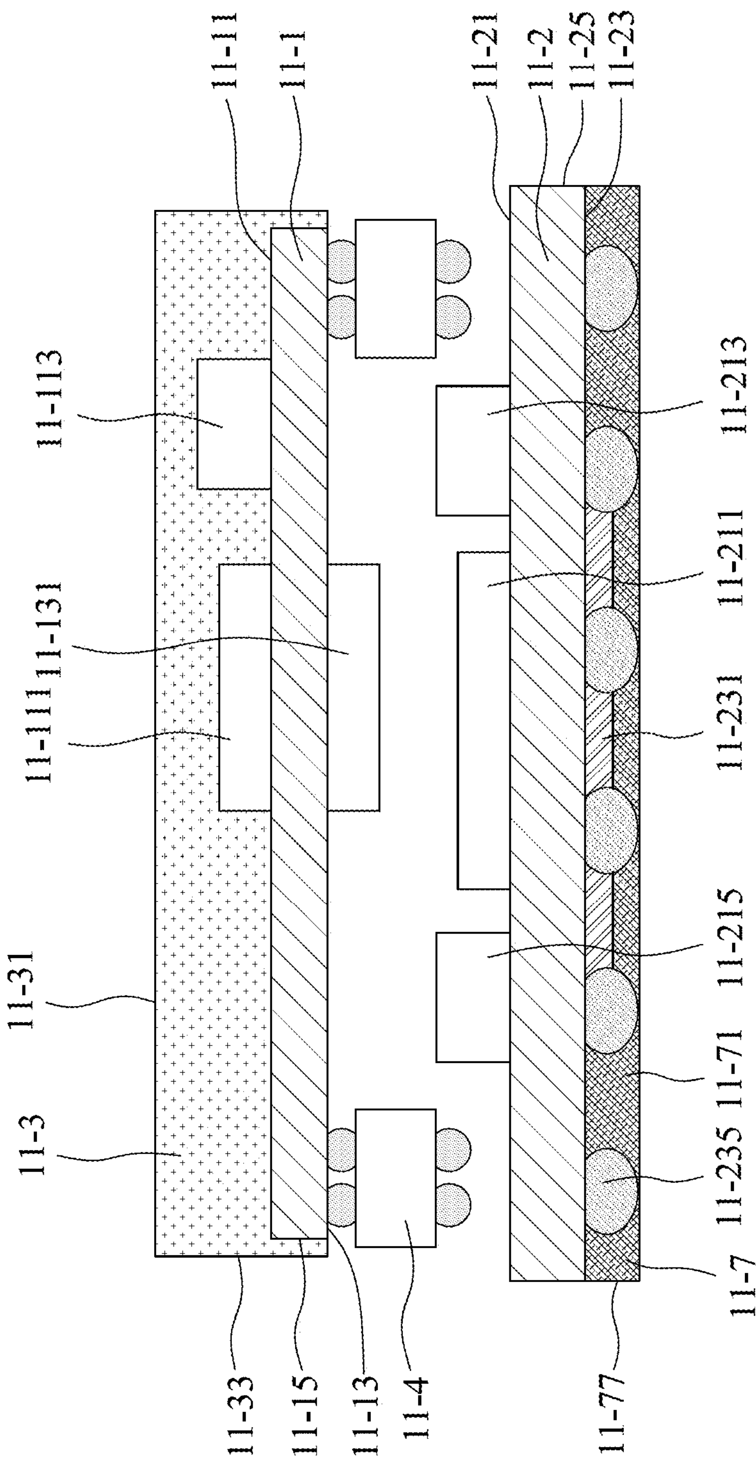

Referring to FIG. 12L, the structure obtained from FIG. 12G may be staked on the structure obtained from FIG. 12K. That is, the substrate 11-1 may be disposed over the substrate 11-2. The surface 11-13 of the substrate 11-1 may face the surface 11-21 of the substrate 11-2. The interposer 11-4 may be arranged between the substrate 1-1 and the substrate 11-2. The substrate 11-1 may be electrically connected to the substrate 11-2 through the interposer 11-4. Since the interposer 11-4 may be disposed on the substrate 11-2 and support the substrate 11-1, the electronic component 11-131 disposed on the surface 11-13 of the substrate 11-1 and the electronic component 11-211 disposed on the surface 11-21 of the substrate 11-2 may be spaced apart from by a distance.

Figure 12M:
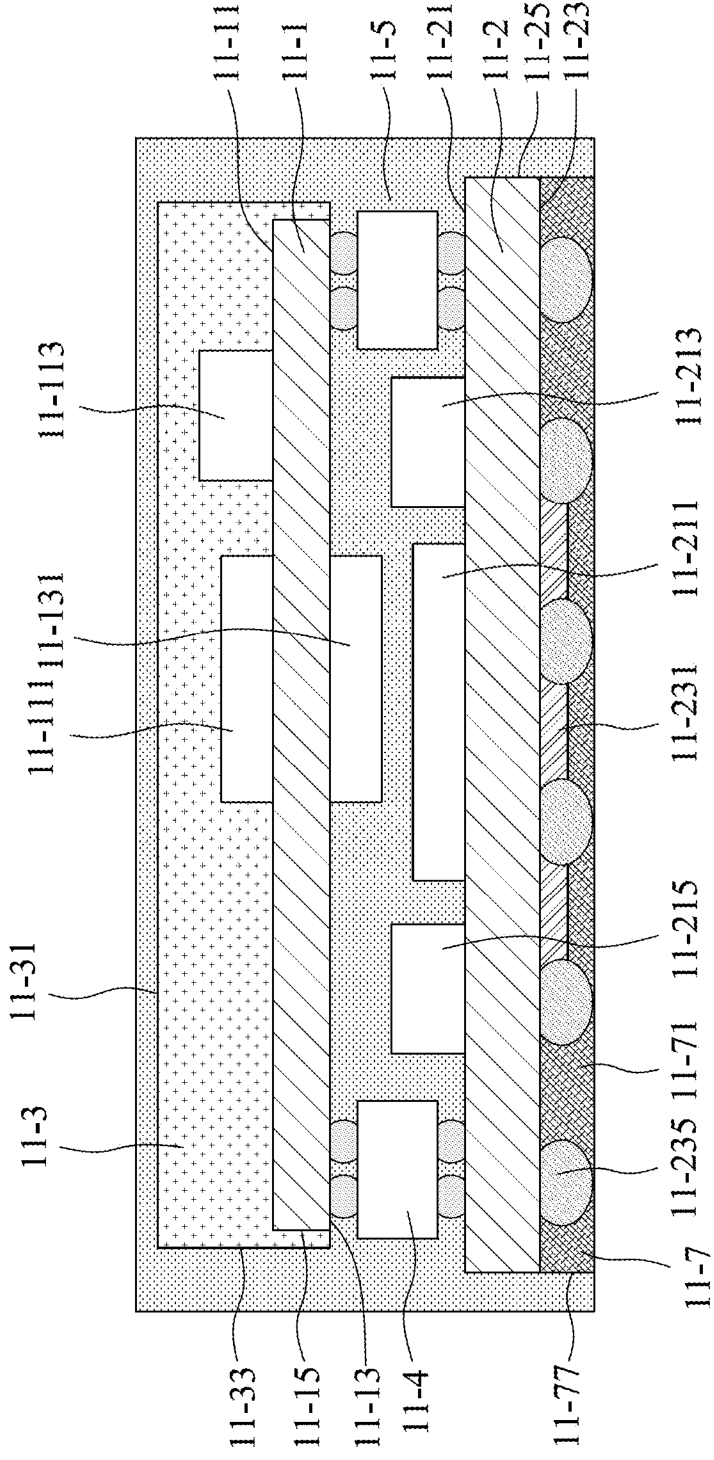

Referring to FIG. 12M, the encapsulant 11-5 is provided. The encapsulant 111-5 may cover the surface 11-21 of the substrate 11-2, the surface 11-13 of the substrate 11-1, the electronic component 11-131, the electronic components 11-211, 11-213, 11-215 and the interposers 11-4. The encapsulant 11-5 may cover the lateral surface 11-77 of the encapsulant 11-7. The encapsulant 11-5 may cover the lateral surface 11-33 of the encapsulant 11-3.

Figure 12N:
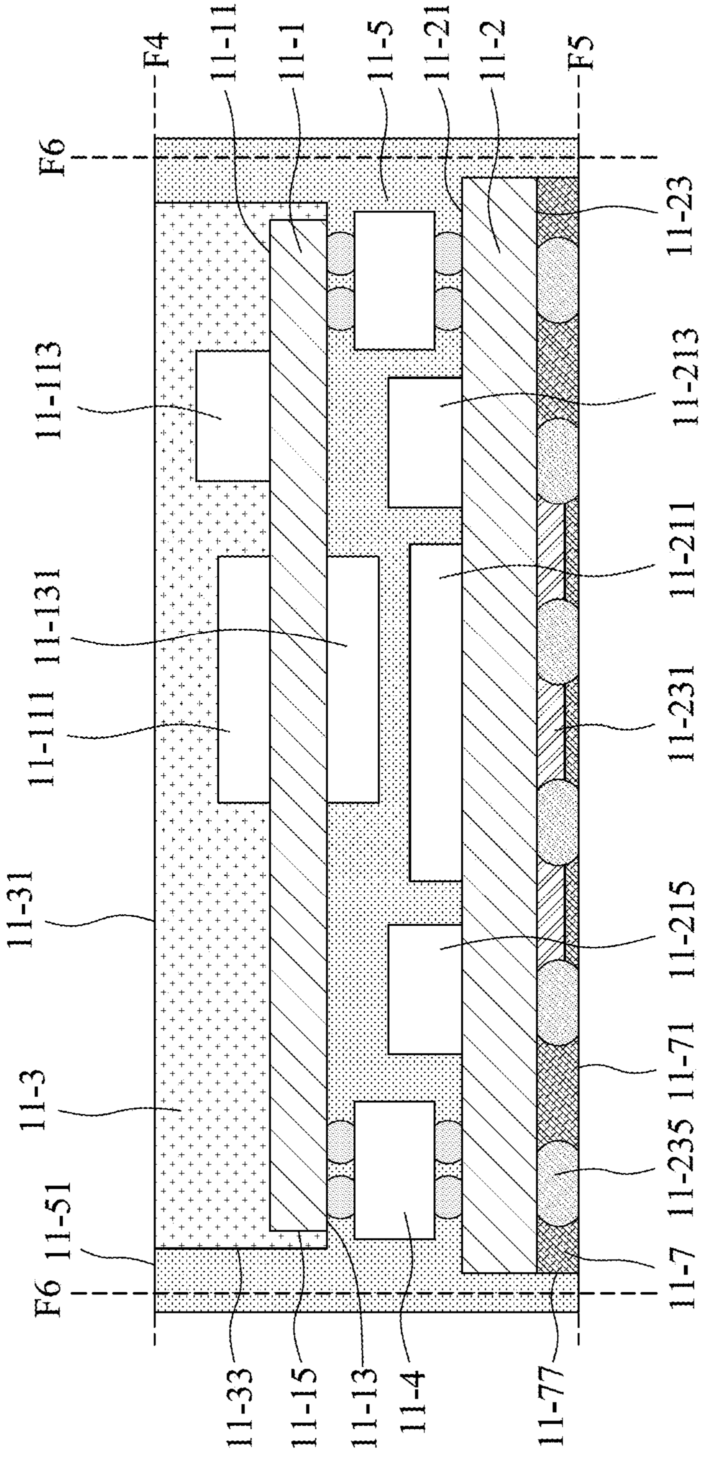

Referring to FIG. 12N, a grinding process is conducted to cut along the imaginary line "F4" through the encapsulant 11-3 and the encapsulant 11-5, and thus the upper surface 11-31 of the encapsulant 11-3 is exposed from the upper surface 11-51 of the encapsulant 11-5. Moreover, another grinding process is conducted to cut along the imaginary line "F5" through the encapsulant 11-7 and the electrical connections 11-235, and thus the electrical connections 11-235 are exposed from the lower surface 11-71 of the encapsulant 11-7. Further, a singulation process is conducted to cut along the imaginary line "F6" through the encapsulants 11-5, and thus forming the semiconductor device package structure 11 as shown in FIG. 11.

Figure 13:
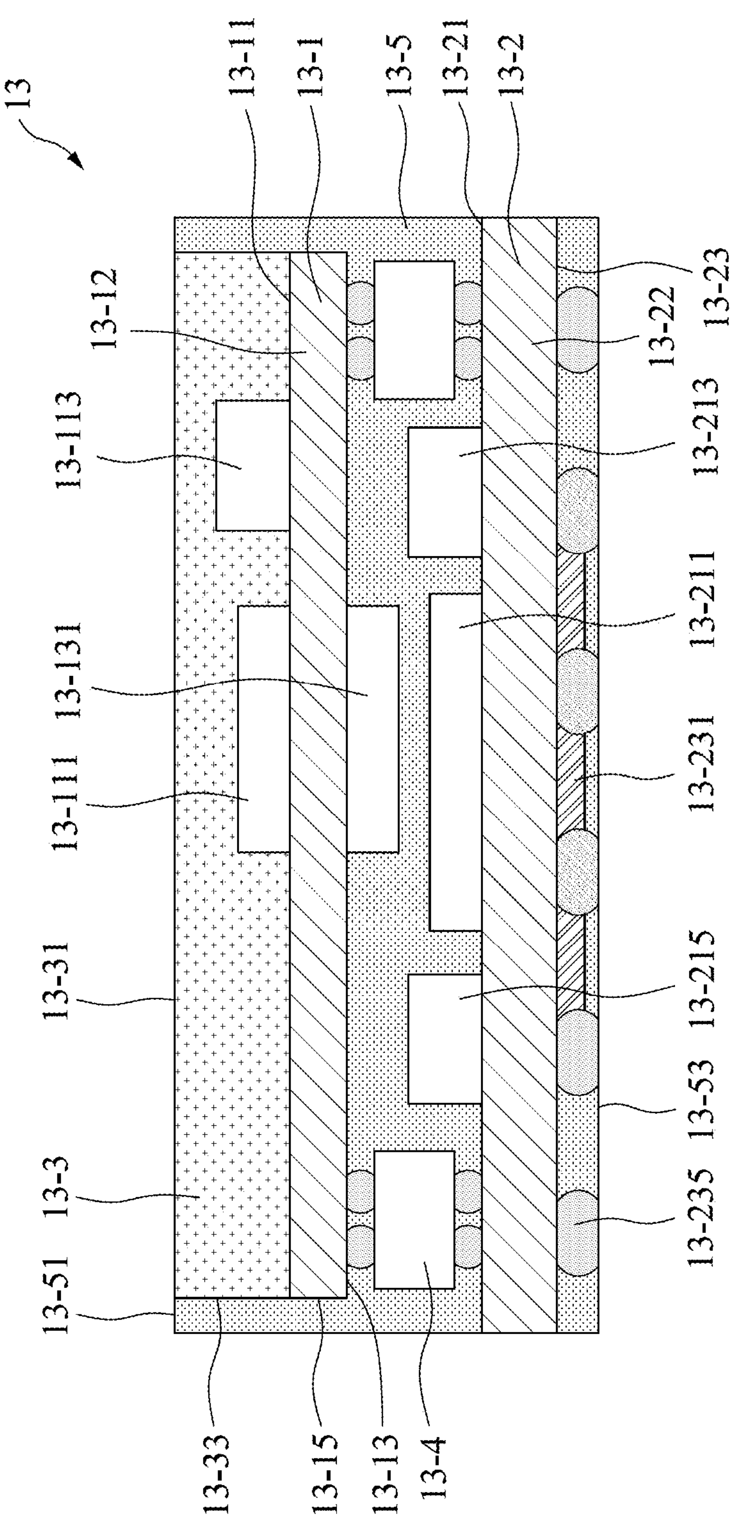
FIG. 13 is a cross-sectional view of a semiconductor device package in accordance with an embodiment of the instant disclosure.

FIG. 13 is a cross-sectional view of a semiconductor device package 13 in accordance with some embodiments of the present disclosure. As shown in FIG. 13, the semiconductor device package 13 may be a three-dimensional (3D) stacked semiconductor device package. The semiconductor device package 13 may include substrates 13-1, 13-2, electronic components 13-111, 13-113, 13-131, 13-211, 13-213, 13-215 and 13-231, encapsulants 13-3, 13-5, interposers 13-4 and electrical connections 13-235. The substrate 13-1 may be a coreless substrate and may include traces, pads or interconnections for electrical connection. The substrate 13-2 may be a core substrate or a core-less substrate and may include traces, pads or interconnections for electrical connection. Further, the substrate 13-1 may disposed over and/or above the substrate 13-2.

Referring to FIG. 13, the substrate 13-1 has a surface 13-11 (e.g., an upper surface) and a surface 13-13 (e.g., a lower surface). The electronic components 13-111, 13-113 may be disposed or mounted on the surface 13-11 of the substrate 13-1. The electronic components 13-111, 13-113 may be a die, an active device, a passive device, and/or other electronic devices. In some embodiments of the present disclosure, the electronic components 13-111, 13-113 electrically connects the substrate 13-1 via electrical connections. In some embodiments of the present disclosure, the electronic component 13-111 may include a flash memory device. Further, the electronic component 13-131 may be disposed or mounted on the surface 13-13 of the substrate 13-1. The electronic component 13-131 may be a die, an active device, a passive device, and/or other electronic devices. In some embodiments of the present disclosure, the electronic component 13-131 electrically connects the substrate 13-1 via electrical connections. In some embodiments of the present disclosure, the electronic component 13-131 may include a flash memory device. In some embodiments of the present disclosure, a thickness of the substrate 13-2 is substantially greater than a thickness of the substrate 13-1. In some embodiments of the present disclosure, a thickness a dielectric layer 13-22 of the substrate 13-2 is substantially greater than a thickness of a dielectric layer 13-12 of the substrate 13-1. In some embodiments of the present disclosure, a hardness of the substrate 13-2 is substantially greater than a hardness of the substrate 13-1.

The substrate 13-2 has a surface 13-21 (e.g., an upper surface) and a surface 13-23 (e.g., a lower surface). The electronic components 13-211, 13-213, 13-215 may be disposed or mounted on the surface 13-21 of the substrate 13-2. The electronic components 13-211, 13-213, 13-215 may be a die, an active device, a passive device, and/or other electronic devices. In some embodiments of the present disclosure, the electronic components 13-211, 13-213, 13-215 electrically connects the substrate 13-2 via electrical connections. Further, the electronic component 13-231 may be disposed or mounted on the surface 13-23 of the substrate 13-2. The electronic component 13-231 may be a die, an active device, a passive device, and/or other electronic devices. In some embodiments of the present disclosure, the electronic component 13-231 electrically connects the substrate 13-2 via electrical connections. In some embodiments of the present disclosure, a thickness of the electronic components 13-231 is the thinnest among other components in the semiconductor device package 13. Moreover, a plurality of the electrical connections 13-235 are disposed or mounted on the surface 13-23 of the substrate 13-2. In some embodiments of the present disclosure, the electrical connection 13-235 includes a reflowable material. In some embodiments of the present disclosure, the electrical connection 13-235 includes solder material. The electrical connection 13-235 may include a solder ball. The electrical connection 13-235 may include a conductive pillar, post, or substrate interposer.

The interposers 13-4 may be disposed or mounted on the surface 13-13 of the substrate 13-1 and the surface 13-21 of the substrate 13-2. That is, the interposer 13-4 may be arranged between the substrate 13-1 and the substrate 13-2, and thus the interposer 13-4 may define a space between the substrate 13-1 and 13-2. In some embodiments of the present disclosure, an amount of the electronic components within the space between the substrate 13-1 and the substrate 13-2 and/or defined by the interposer 13-4, such as the electronic components, 13-131, 13-211, 13-213, 13-215, is greater than an amount of the electronic components outside of the space between the substrate 13-1 and the substrate 13-2 and/or defined by the interposer 13-4, such as the electronic components, 13-111, 13-113, 13-231. In some embodiments of the present disclosure, a distance between the adjacent electronic components within the space between the substrate 13-1 and the substrate 13-2 and/or defined by the interposer 13-4, such as the electronic components, 13-131, 13-211, 13-213, 13-215, is smaller than a distance between the adjacent electronic components outside of the space between the substrate 13-1 and the substrate 13-2 and/or defined by the interposer 13-4, such as the electronic components, 13-111, 13-113, 13-231. In some embodiments of the present disclosure, a density of the electronic components within the space between the substrate 13-1 and the substrate 13-2 and/or defined by the interposer 13-4, such as the electronic components, 13-131, 13-211, 13-213, 13-215, is greater than a density of the electronic components outside of the space between the substrate 13-1 and the substrate 13-2 and/or defined by the interposer 13-4, such as the electronic components, 13-111, 13-113, 13-231. Moreover, the interposer 13-4 may electrically connect the substrate 13-1 and the substrate 13-2 via electrical connections. In some embodiments of the present disclosure, such electrical connection includes a solder material. In some embodiments of the present disclosure, the interposer 13-4 includes a substrate interposer with redistribution layers and/or conductive vias.

The encapsulant 13-3 is disposed on the surface 13-11 of the substrate 13-1. The encapsulant 13-3 may cover the surface 13-11 of the substrate 13-1 and the electronic components 13-111 and 13-113 disposed on the surface 13-11 of the substrate 13-1. The encapsulant 13-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-3 may include a molding underfill (MUF) or a capillary underfill (CUF).

As above-mentioned, the substrate 13-1 may be a coreless substrate, and thus the substrate 13-1 may have a relatively thin thickness and/or a relatively weak stiffness. Therefore, when the electronic components, such as the electronic components, 13-111, 13-113, 13-131, are mounted on the substrate 13-1, the total weight of the electronic components may cause the substrate 13-1 to collapse. That is, the substrate 13-1 may be bended or recessed toward the substrate 13-2 due to the weights of the electronic components 13-111, 13-113, 13-131, and the electronic component 13-131 on the surface 13-13 of the substrate 13-1 may collide with the electronic component 13-211 on the surface of the substrate 13-2 and under the electronic component 13-131. The encapsulant 13-3 may be a reinforcement structure which is configured to improve the strength of the substrate 13-1 such that the substrate 13-1 is strong enough to support the electronic components 13-111, 13-113, 13-131 mounted thereon. Given the above, the encapsulant 13-3 may be configured to prevent the substrate 13-1 from collapsing and being bended or recessed toward the substrate 13-2. That is, the encapsulant 13-3 is configured to define a space between the electronic component

13-131 on the surface 13-13 of the substrate 13-1 and the electronic component 13-211 on the surface 13-21 of the substrate 13-2, and thus the electronic component 13-131 and the electronic component 13-211 may be maintained to be spaced apart from each other by a distance. In some embodiments of the present disclosure, the encapsulant 13-3 is a warpage-resistant layer configured to prevent the warpage of the substrate 13-1.

The encapsulant 13-5 is disposed on the surface 13-21 and the surface 13-23 of the substrate 13-2. The encapsulant 13-5 may cover the surface 13-21 and the surface 13-23 of the substrate 13-2, the electronic components 13-211, 13-213, 13-215 disposed on the surface 13-21 of the substrate 13-2, the surface 13-13 of the substrate 13-1, the electronic component 13-131 disposed on the surface 13-13 of the substrate 13-1, the electronic component 13-231 and the electrical connections 13-235 disposed on the surface 13-23 of the substrate 13-2 and the interposers 13-4. The encapsulant 13-5 may have an upper surface 13-51 which is substantially coplanar with an upper surface 13-31 of the encapsulant 13-3. The encapsulant 13-5 may have a lower surface 13-53 covering the electronic component 13-231. In some embodiments of the present disclosure, a lower surface of the electronic component 13-231 is exposed from the lower surface 13-53 of the encapsulant 13-5. The electrical connections 13-235 may be exposed from the lower surface 13-53 of the encapsulant 13-5. The encapsulant 13-5 may cover a lateral surface 13-15 of the substrate 13-1. The encapsulant 13-5 may cover a lateral surface 13-33 of the encapsulant 13-3. The encapsulant 13-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 13-5 may include a molding underfill (MUF) or a capillary underfill (CUF). In some embodiments of the present disclosure, a portion of the encapsulant 13-5 disposed on the surface 13-21 of the substrate 13-2 and the surface 13-23 and a portion of the encapsulant 13-5 disposed on the surface 13-23 of the substrate 13-2 are formed in a single molding process.

In some embodiments of the present disclosure, the material of the encapsulant 13-3 is substantially identical to the material of the encapsulant 13-5. In some embodiments of the present disclosure, the material of the encapsulant 13-3 is different from the material of the encapsulant 13-5. In some embodiments of the present disclosure, the CTE (coefficient of thermal expansion) of the substrate 13-1 is substantially equal to the CTE of the encapsulant 13-3.

In some embodiments of the present disclosure, the substrate 13-1 is the same as, or similar to, the substrate 1-1 as shown in FIGS. 1B and 1C. That is, the substrate 13-1 may include the interconnection which may have the via tapered from the surface 13-11 toward the surface 13-13 or tapered from the surface 13-13 toward the surface 13-11. In some embodiments of the present disclosure, the substrate 13-1 is the same as, or similar to, the substrate 1-1 as shown in FIG. 1D. That is, the substrate 13-1 may include dielectric layers as shown in FIG. 1D.

FIG. 14A, FIG. 14B, FIG. 14C, FIG. 14D, FIG. 14E, FIG. 14F, FIG. 14G, FIG. 14H, FIG. 14I, FIG. 14J, FIG. 14K and FIG. 14L illustrate a method of manufacturing a semiconductor device package in accordance with another embodiment of the instant disclosure.

Figures 14A, 14B:
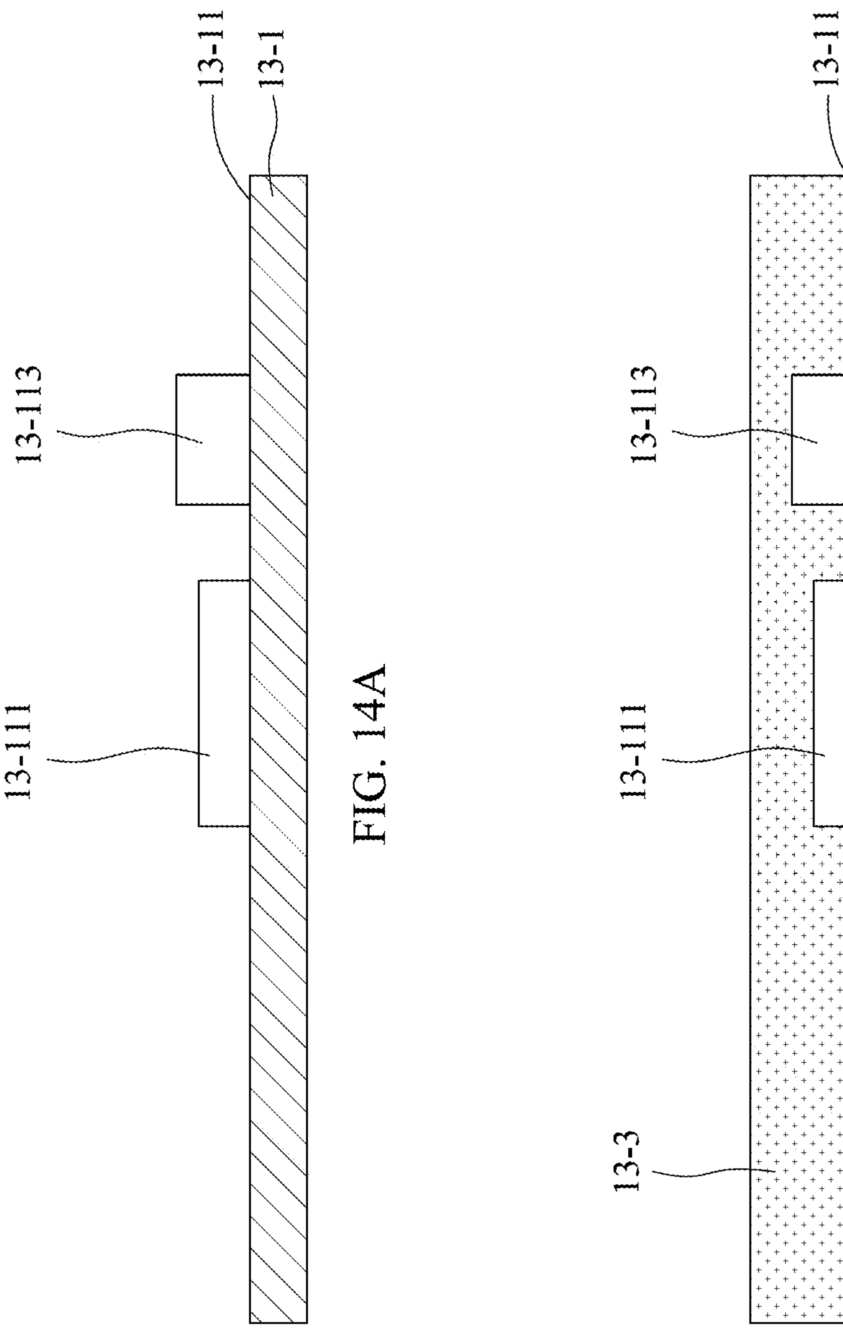
FIG. 14A, FIG. 14B, FIG. 14C, FIG. 14D, FIG. 14E, FIG. 14F, FIG. 14G, FIG. 14H, FIG. 14I, FIG. 14J, FIG. 14K and FIG. 14L illustrate a method of manufacturing a semiconductor device package in accordance with another embodiment of the instant disclosure.

Referring to FIG. 14A, the substrate 13-1 with the electronic components 13-111, 13-113 is provided. The electronic elements 13-111 and 13-113 may be disposed or mounted on the surface 13-11 of the substrate 13-1 and electrically connected to the interconnection of the substrate 13-1.

Referring to FIG. 14B, the encapsulant 13-3 is provided. The encapsulant 13-3 may be formed on the surface 13-11 of the substrate 13-1. The encapsulant 13-3 may cover the surface 13-11 of the substrate 13-1 and the electronic components 13-111, 13-113.

Figures 14C, 14D:
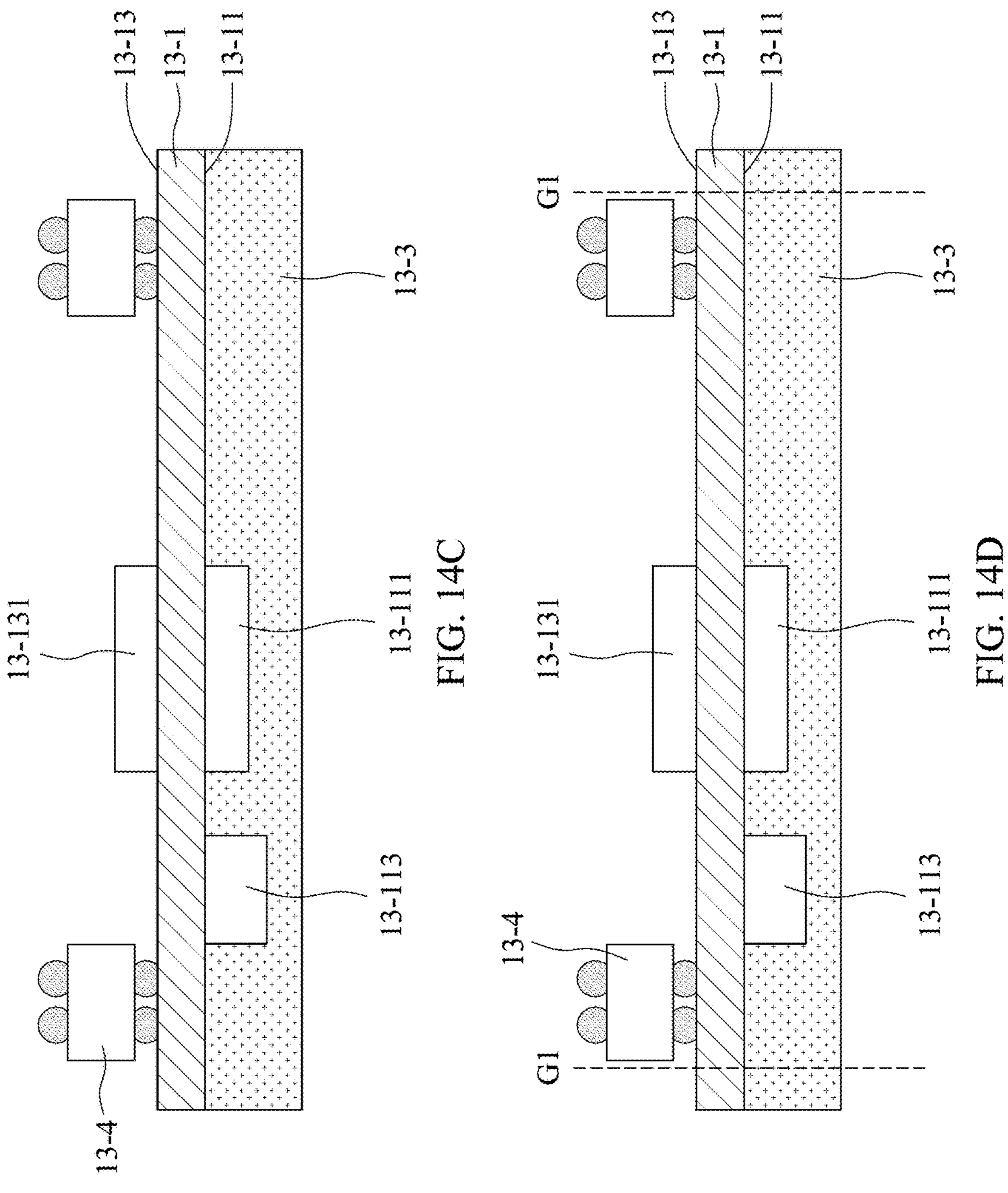

Referring to FIG. 14C, the structure obtained from FIG. 14B may be reversed upside down. The interposers 13-4 and the electronic component 13-131 may be disposed or mounted on the surface 13-13 of the substrate 13-1 and electrically connected to the interconnection of the substrate 13-1.

Referring to FIG. 14D, a singulation process is conducted to cut along the imaginary line "G1" through the substrate 13-1 and the encapsulant 13-3.

Figure 14E:
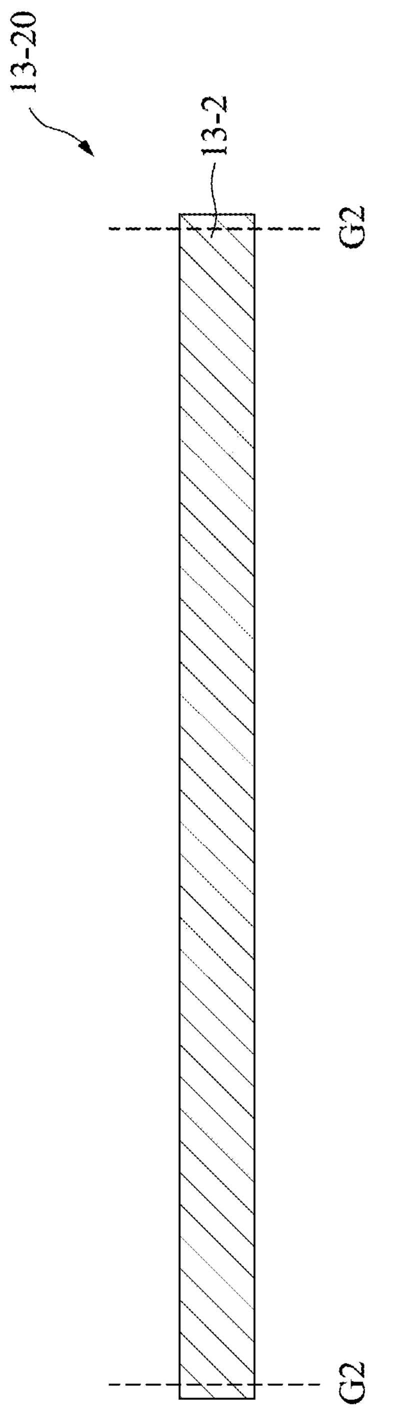

Referring to FIG. 14E, a strip 13-20 is provided and a singulation process is conducted to cut along the imaginary line "G2" through the strip 13-20, and thus forming the substrate 13-2 as shown in FIG. 13.

Figure 14F:
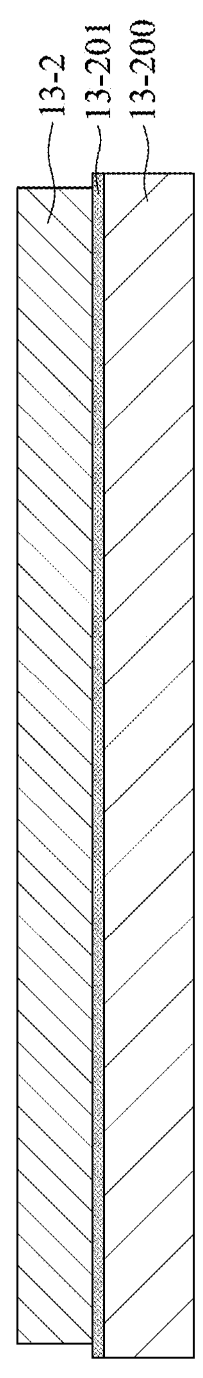

Referring to FIG. 14F, the substrate 13-2 may be arranged on a carrier 13-200 through a tape 13-201. That is, the tape 13-201 may be between the substrate 13-2 and the carrier 13-200.

Figure 14G:
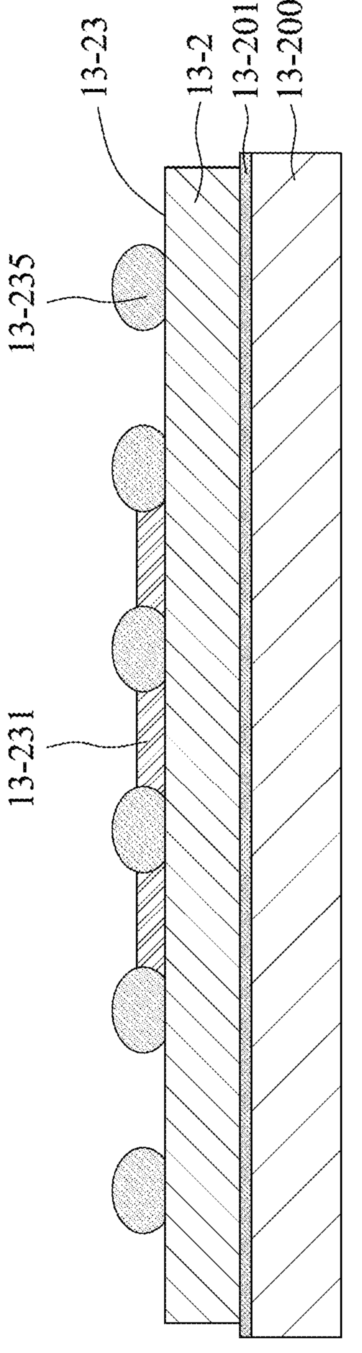
Figure 14G:

Referring to FIG. 14G, the electronic component 13-231 and the electrical connections 13-235 may be disposed or mounted on the surface 13-23 of the substrate 13-2 and electrically connected to the interconnection of the substrate 13-2.

Figure 14H:
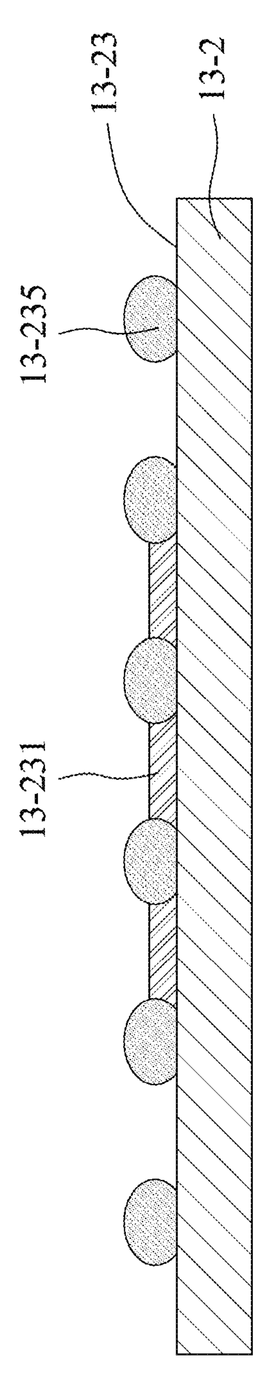

Referring to FIG. 14H, the carrier 13-200 and the tape 13-201 are removed (i.e., de-carrier).

Figure 14I:
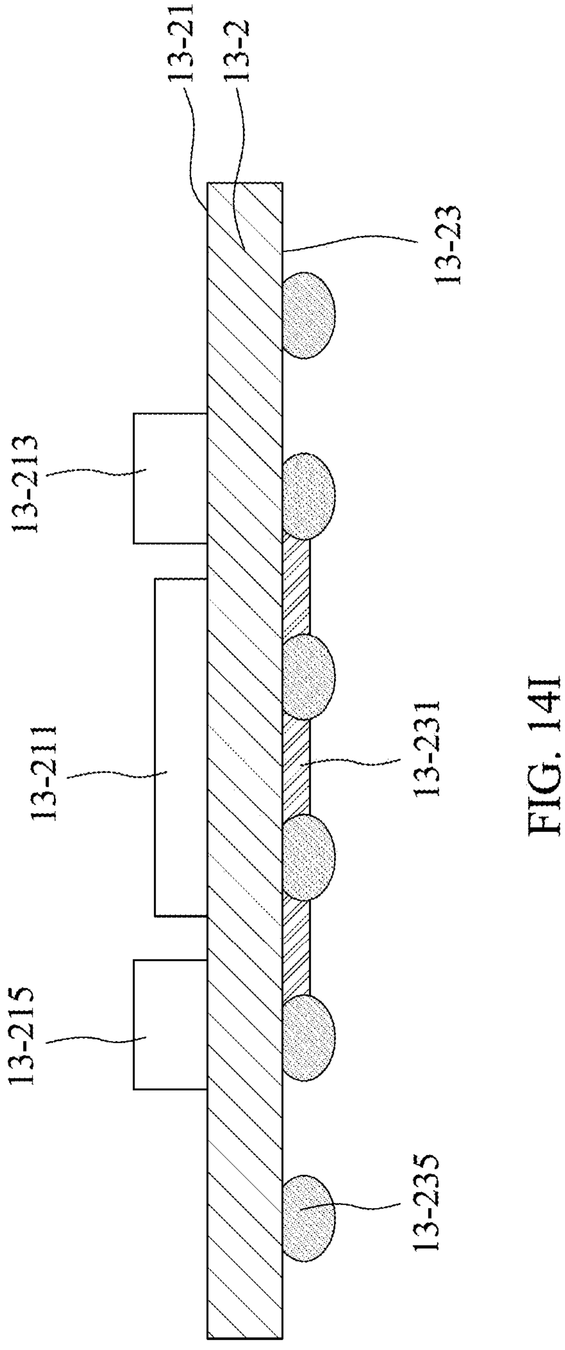

Referring to FIG. 14I, the structure obtained from FIG. 14H may be reversed upside down. The electronic elements 13-211, 13-213 and 13-215 may be disposed or mounted on the surface 13-21 of the substrate 13-2 and electrically connected to the interconnection of the substrate 13-2.

Figure 14J:
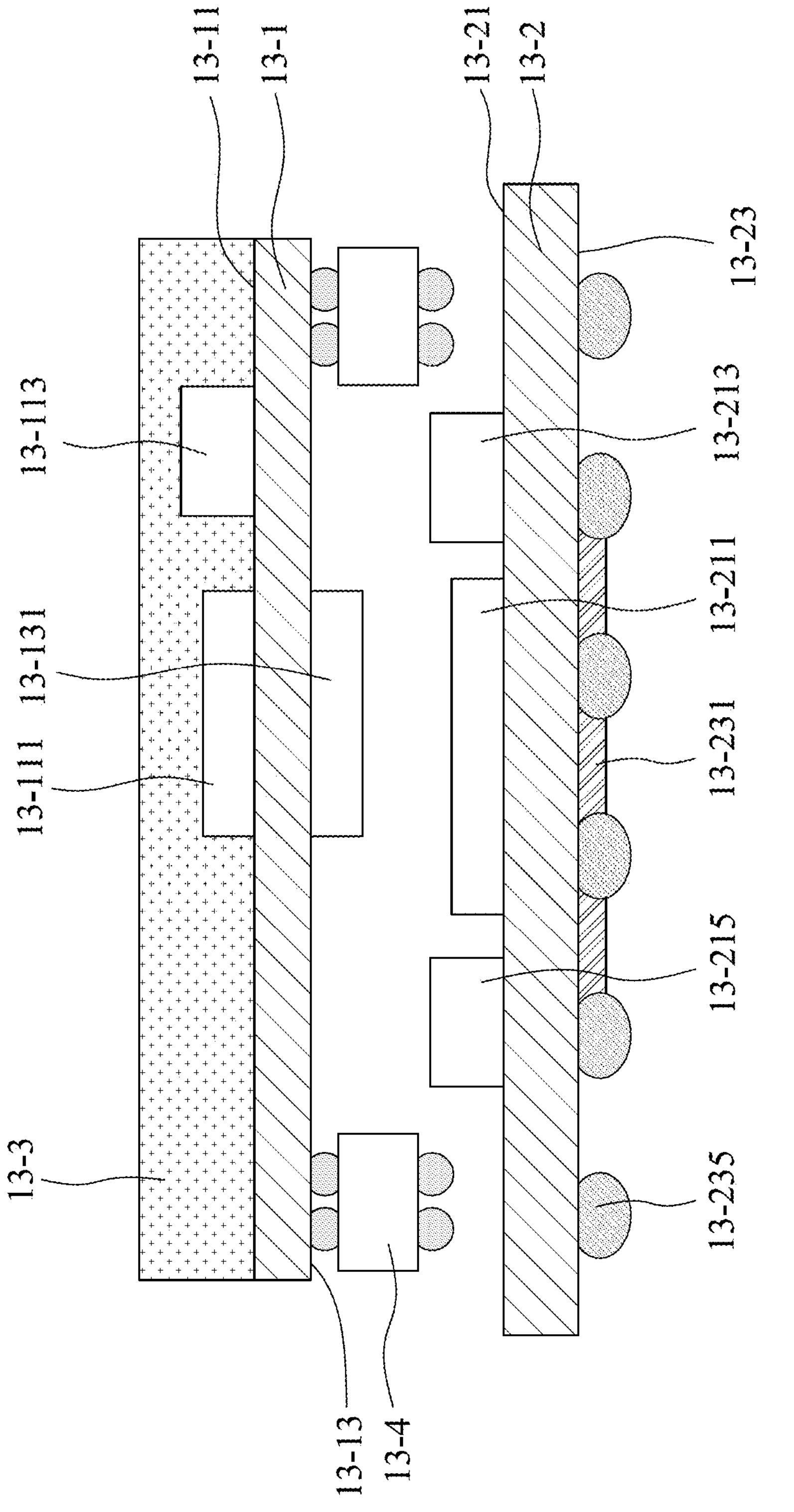

Referring to FIG. 14J, the structure obtained from FIG. 14D may be staked on the structure obtained from FIG. 14I. That is, the substrate 13-1 may be disposed over the substrate 13-2. The surface 13-13 of the substrate 13-1 may face the surface 13-21 of the substrate 13-2. The interposer 13-4 may be arranged between the substrate 1-1 and the substrate 13-2. The substrate 13-1 may be electrically connected to the substrate 13-2 through the interposer 13-4. Since the interposer 13-4 may be disposed on the substrate 13-2 and support the substrate 13-1, the electronic component 13-131 disposed on the surface 13-13 of the substrate 13-1 and the electronic component 13-211 disposed on the surface 13-21 of the substrate 13-2 may be spaced apart from by a distance.

Figure 14K:
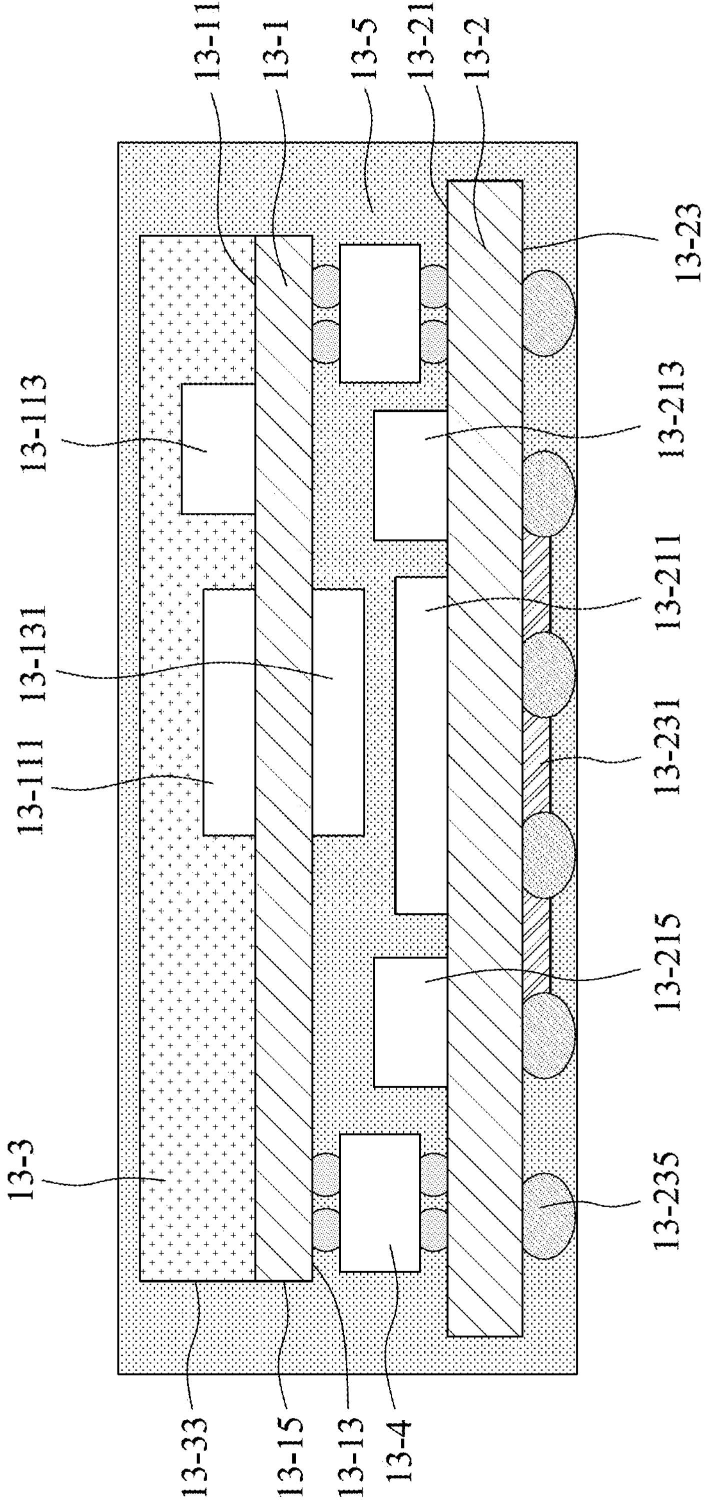

Referring to FIG. 14K, the encapsulant 13-5 is provided. The encapsulant 113-5 may cover the surface 13-21 and the surface 13-23 of the substrate 13-2, the surface 13-13 of the substrate 13-1, the electronic component 13-131, the electronic components 13-211, 13-213, 13-215, the electronic component 13-231, the electrical connections 13-235 and the interposers 13-4. The encapsulant 13-5 may cover the lateral surface 13-15 of the substrate 13-1. The encapsulant 13-5 may cover the lateral surface 13-33 of the encapsulant 13-3.

Figure 14L:
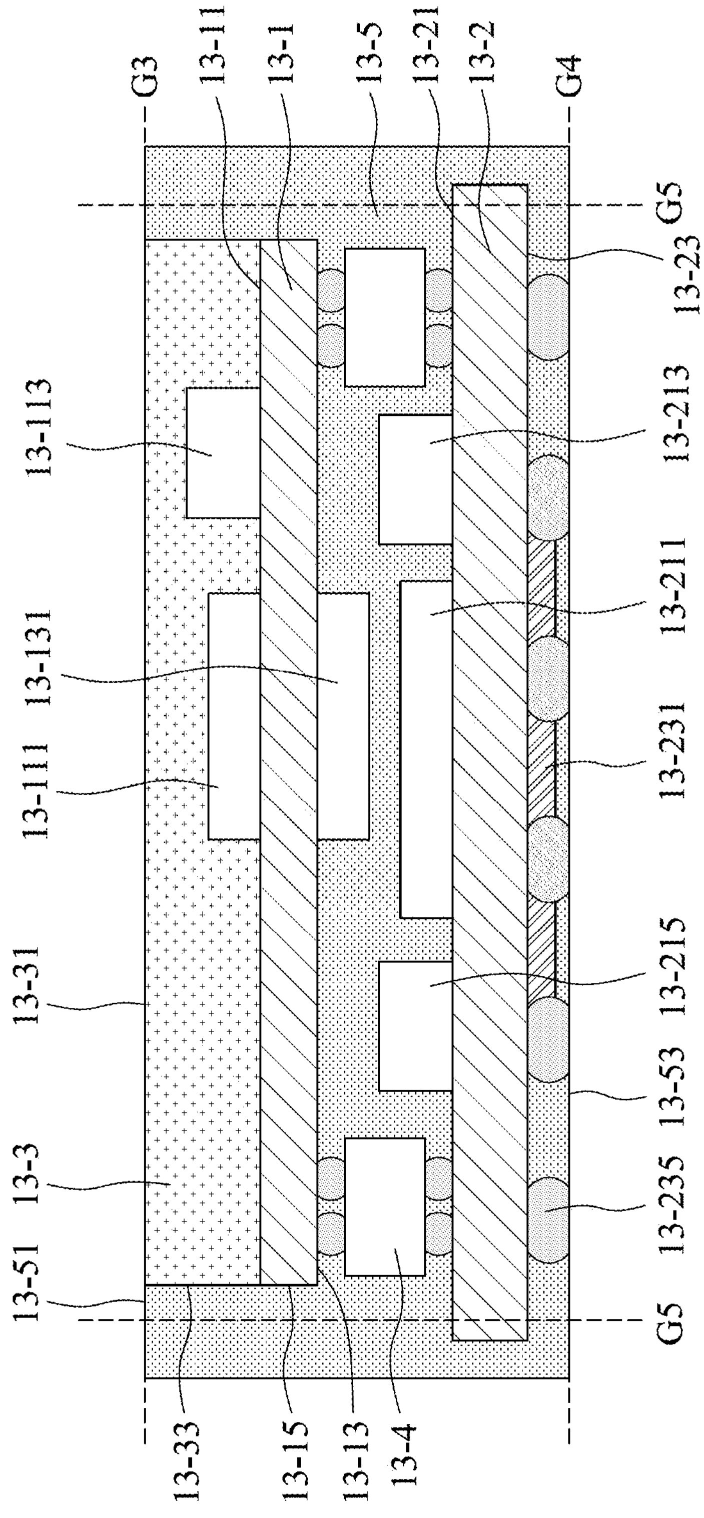

Referring to FIG. 14L, a grinding process is conducted to cut along the imaginary line "G3" through the encapsulant 13-3 and the encapsulant 13-5, and thus the upper surface 13-31 of the encapsulant 13-3 is exposed from the upper surface 13-51 of the encapsulant 13-5. Moreover, another grinding process is conducted to cut along the imaginary line "G4" through the encapsulant 13-5 and the electrical connections 13-235, and thus the electrical connections 13-235 are exposed from the lower surface 13-53 of the encapsulant 13-5. Further, a singulation process is conducted to cut along the imaginary line "G5" through the encapsulant 13-5 and the substrate 13-2, and thus forming the semiconductor device package structure 13 as shown in FIG. 13.

Figure 15:
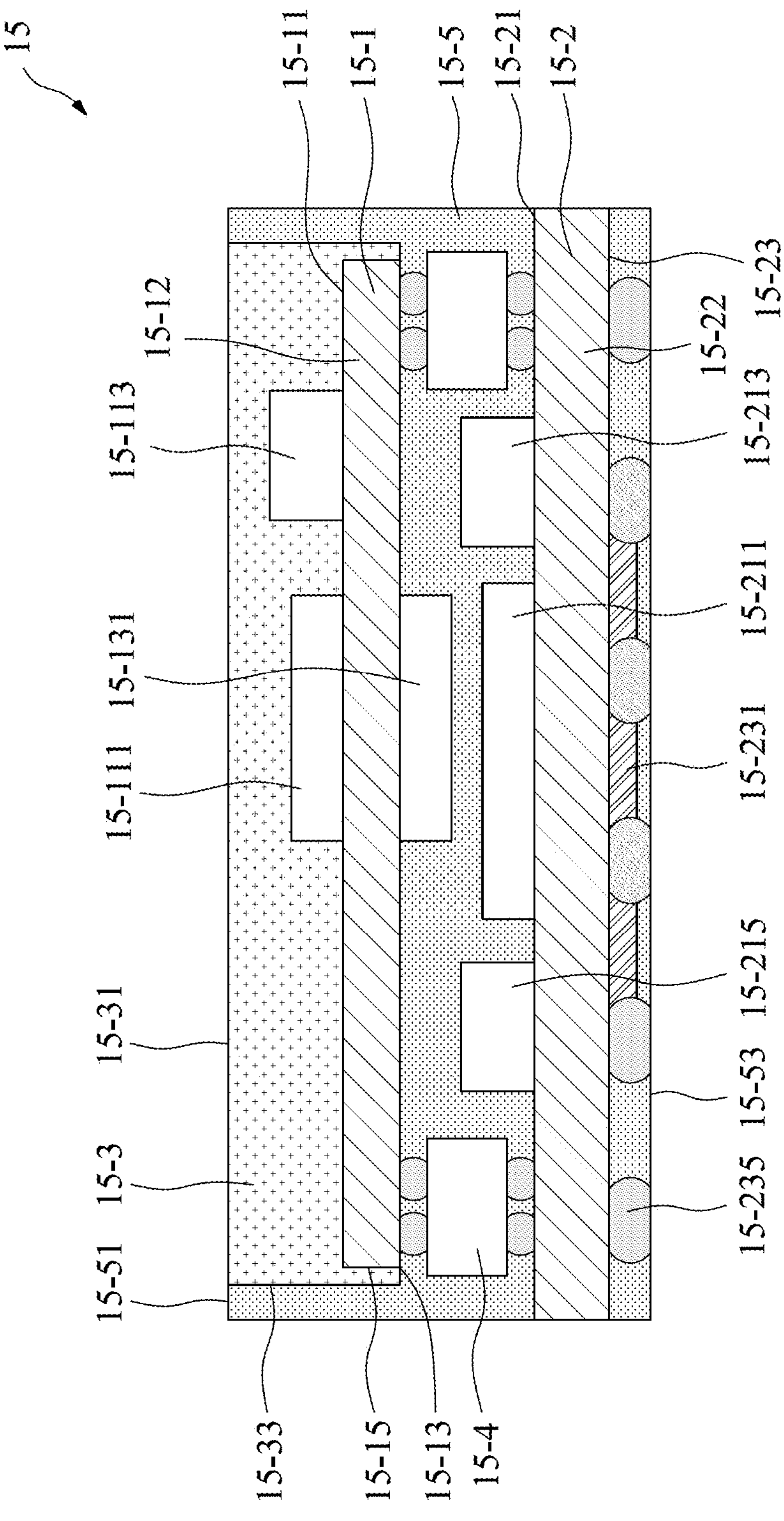
FIG. 15 is a cross-sectional view of a semiconductor device package in accordance with an embodiment of the instant disclosure.

FIG. 15 is a cross-sectional view of a semiconductor device package 15 in accordance with some embodiments of the present disclosure. As shown in FIG. 15, the semiconductor device package 15 may be a three-dimensional (3D) stacked semiconductor device package. The semiconductor device package 15 may include substrates 15-1, 15-2, electronic components 15-111, 15-113, 15-131, 15-211, 15-213, 15-215 and 15-231, encapsulants 15-3, 15-5, interposers 15-4 and electrical connections 15-235. The substrate 15-1 may be a coreless substrate and may include traces, pads or interconnections for electrical connection. The substrate 15-2 may be a core substrate or a core-less substrate and may include traces, pads or interconnections for electrical connection. Further, the substrate 15-1 may disposed over and/or above the substrate 15-2.

Referring to FIG. 15, the substrate 15-1 has a surface 15-11 (e.g., an upper surface) and a surface 15-13 (e.g., a lower surface). The electronic components 15-111, 15-113 may be disposed or mounted on the surface 15-11 of the substrate 15-1. The electronic components 15-111, 15-113 may be a die, an active device, a passive device, and/or other electronic devices. In some embodiments of the present disclosure, the electronic components 15-111, 15-113 electrically connects the substrate 15-1 via electrical connections. In some embodiments of the present disclosure, the electronic component 15-111 may include a flash memory device. Further, the electronic component 15-131 may be disposed or mounted on the surface 15-13 of the substrate 15-1. The electronic component 15-131 may be a die, an active device, a passive device, and/or other electronic devices. In some embodiments of the present disclosure, the electronic component 15-131 electrically connects the substrate 15-1 via electrical connections. In some embodiments of the present disclosure, the electronic component 15-131 may include a flash memory device. In some embodiments of the present disclosure, a thickness of the substrate 15-2 is substantially greater than a thickness of the substrate 15-1. In some embodiments of the present disclosure, a thickness a dielectric layer 15-22 of the substrate 15-2 is substantially greater than a thickness of a dielectric layer 15-12 of the substrate 15-1. In some embodiments of the present disclosure, a hardness of the substrate 15-2 is substantially greater than a hardness of the substrate 15-1.

The substrate 15-2 has a surface 15-21 (e.g., an upper surface) and a surface 15-23 (e.g., a lower surface). The electronic components 15-211, 15-213, 15-215 may be disposed or mounted on the surface 15-21 of the substrate 15-2. The electronic components 15-211, 15-213, 15-215 may be a die, an active device, a passive device, and/or other electronic devices. In some embodiments of the present disclosure, the electronic components 15-211, 15-213, 15-215 electrically connects the substrate 15-2 via electrical connections. Further, the electronic component 15-231 may be disposed or mounted on the surface 15-23 of the substrate 15-2. The electronic component 15-231 may be a die, an active device, a passive device, and/or other electronic devices. In some embodiments of the present disclosure, the electronic component 15-231 electrically connects the substrate 15-2 via electrical connections. In some embodiments of the present disclosure, a thickness of the electronic components 15-231 is the thinnest among other components in the semiconductor device package 15. Moreover, a plurality of the electrical connections 15-235 are disposed or mounted on the surface 15-23 of the substrate 15-2. In some embodiments of the present disclosure, the electrical connection 15-235 includes a reflowable material. In some embodiments of the present disclosure, the electrical connection 15-235 includes solder material. The electrical connection 15-235 may include a solder ball. The electrical connection 15-235 may include a conductive pillar, post, or substrate interposer.

The interposers 15-4 may be disposed or mounted on the surface 15-13 of the substrate 15-1 and the surface 15-21 of the substrate 15-2. That is, the interposer 15-4 may be arranged between the substrate 15-1 and the substrate 15-2, and thus the interposer 15-4 may define a space between the substrate 15-1 and 15-2. In some embodiments of the present disclosure, an amount of the electronic components within the space between the substrate 15-1 and the substrate 15-2 and/or defined by the interposer 15-4, such as the electronic components, 15-131, 15-211, 15-213, 15-215, is greater than an amount of the electronic components outside of the space between the substrate 15-1 and the substrate 15-2 and/or defined by the interposer 15-4, such as the electronic components, 15-111, 15-113, 15-231. In some embodiments of the present disclosure, a distance between the adjacent electronic components within the space between the substrate 15-1 and the substrate 15-2 and/or defined by the interposer 15-4, such as the electronic components, 15-131, 15-211, 15-213, 15-215, is smaller than a distance between the adjacent electronic components outside of the space between the substrate 15-1 and the substrate 15-2 and/or defined by the interposer 15-4, such as the electronic components, 15-111, 15-113, 15-231. In some embodiments of the present disclosure, a density of the electronic components within the space between the substrate 15-1 and the substrate 15-2 and/or defined by the interposer 15-4, such as the electronic components, 15-131, 15-211, 15-213, 15-215, is greater than a density of the electronic components outside of the space between the substrate 15-1 and the substrate 15-2 and/or defined by the interposer 15-4, such as the electronic components, 15-111, 15-113, 15-231. Moreover, the interposer 15-4 may electrically connect the substrate 15-1 and the substrate 15-2 via electrical connections. In some embodiments of the present disclosure, such electrical connection includes a solder material. In some embodiments of the present disclosure, the interposer 15-4 includes a substrate interposer with redistribution layers and/or conductive vias.

The encapsulant 15-3 is disposed on the surface 15-11 of the substrate 15-1. The encapsulant 15-3 may cover the surface 15-11 of the substrate 15-1 and the electronic components 15-111 and 15-113 disposed on the surface 15-11 of the substrate 15-1. Moreover, the encapsulant 15-3 may cover a lateral surface 15-15 of the substrate 15-1, and thus functions as a mold lock. The encapsulant 15-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-3 may include a molding underfill (MUF) or a capillary underfill (CUF).

As above-mentioned, the substrate 15-1 may be a coreless substrate, and thus the substrate 15-1 may have a relatively thin thickness and/or a relatively weak stiffness. Therefore, when the electronic components, such as the electronic components, 15-111, 15-113, 15-131, are mounted on the substrate 15-1, the total weight of the electronic components may cause the substrate 15-1 to collapse. That is, the substrate 15-1 may be bended or recessed toward the substrate 15-2 due to the weights of the electronic components 15-111, 15-113, 15-131, and the electronic component 15-131 on the surface 15-13 of the substrate 15-1 may collide with the electronic component 15-211 on the surface of the substrate 15-2 and under the electronic component 15-131. The encapsulant 15-3 may be a reinforcement structure which is configured to improve the strength of the substrate 15-1 such that the substrate 15-1 is strong enough to support the electronic components 15-111, 15-113, 15-131 mounted thereon. Given the above, the encapsulant 15-3 may be configured to prevent the substrate 15-1 from collapsing and being bended or recessed toward the substrate 15-2. That is, the encapsulant 15-3 is configured to define a space between the electronic component 15-131 on the surface 15-13 of the substrate 15-1 and the electronic component 15-211 on the surface 15-21 of the substrate 15-2, and thus the electronic component 15-131 and the electronic component 15-211 may be maintained to be spaced apart from each other by a distance. In some embodiments of the present disclosure, the encapsulant 15-3 is a warpage-resistant layer configured to prevent the warpage of the substrate 15-1.

The encapsulant 15-5 is disposed on the surface 15-21 and the surface 15-23 of the substrate 15-2. The encapsulant 15-5 may cover the surface 15-21 and the surface 15-23 of the substrate 15-2, the electronic components 15-211, 15-213, 15-215 disposed on the surface 15-21 of the substrate 15-2, the surface 15-13 of the substrate 15-1, the electronic component 15-131 disposed on the surface 15-13 of the substrate 15-1, the electronic component 15-231 and the electrical connections 15-235 disposed on the surface 15-23 of the substrate 15-2 and the interposers 15-4. The encapsulant 15-5 may have an upper surface 15-51 which is substantially coplanar with an upper surface 15-31 of the encapsulant 15-3. The encapsulant 15-5 may have a lower surface 15-53 covering the electronic component 15-231. In some embodiments of the present disclosure, a lower surface of the electronic component 15-231 is exposed from the lower surface 15-53 of the encapsulant 15-5. The electrical connections 15-235 may be exposed from the lower surface 15-53 of the encapsulant 15-5. Moreover, the encapsulant 15-5 may cover a lateral surface 15-33 of the encapsulant 15-3. The encapsulant 15-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 15-5 may include a molding underfill (MUF) or a capillary underfill (CUF). In some embodiments of the present disclosure, a portion of the encapsulant 15-5 disposed on the surface 15-21 of the substrate 15-2 and the surface 15-23 and a portion of the encapsulant 15-5 disposed on the surface 15-23 of the substrate 15-2 are formed in a single molding process.

In some embodiments of the present disclosure, the material of the encapsulant 15-3 is substantially identical to the material of the encapsulant 15-5. In some embodiments of the present disclosure, the material of the encapsulant 15-3 is different from the material of the encapsulant 15-5. In some embodiments of the present disclosure, the CTE (coefficient of thermal expansion) of the substrate 15-1 is substantially equal to the CTE of the encapsulant 15-3.

In some embodiments of the present disclosure, the substrate 15-1 is the same as, or similar to, the substrate 1-1 as shown in FIGS. 1B and 1C. That is, the substrate 15-1 may include the interconnection which may have the via tapered from the surface 15-11 toward the surface 15-13 or tapered from the surface 15-13 toward the surface 15-11. In some embodiments of the present disclosure, the substrate 15-1 is the same as, or similar to, the substrate 1-1 as shown in FIG. 1D. That is, the substrate 15-1 may include dielectric layers as shown in FIG. 1D.

FIG. 16A, FIG. 16B, FIG. 16C, FIG. 16D, FIG. 16E, FIG. 16F, FIG. 16G, FIG. 16H, FIG. 16I, FIG. 16J, FIG. 16K, FIG. 16L, FIG. 16M, FIG. 16N and FIG. 16O illustrate a method of manufacturing a semiconductor device package 15 in accordance with another embodiment of the instant disclosure.

Figure 16A:
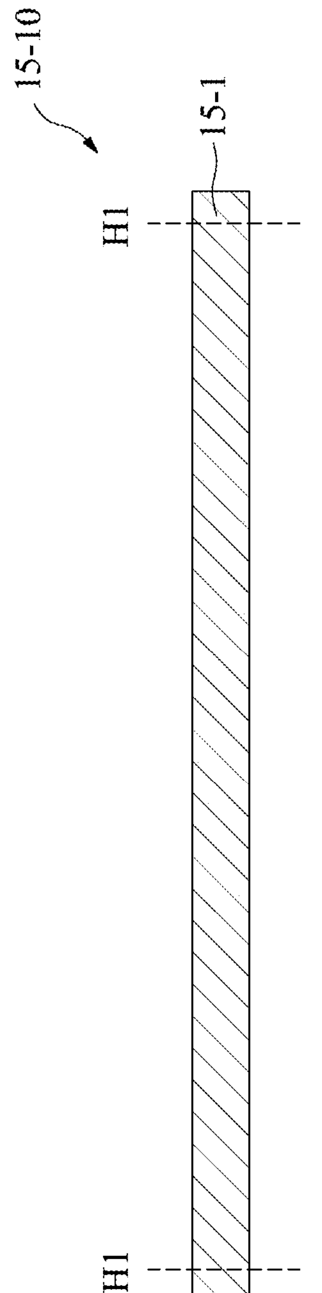
FIG. 16A, FIG. 16B, FIG. 16C, FIG. 16D, FIG. 16E, FIG. 16F, FIG. 16G, FIG. 16H, FIG. 16I, FIG. 16J, FIG. 16K, FIG. 16L, FIG. 16M, FIG. 16N and FIG. 16O illustrate a method of manufacturing a semiconductor device package in accordance with another embodiment of the instant disclosure.

Referring to FIG. 16A, a strip 15-10 is provided and a singulation process is conducted to cut along the imaginary line "H1" through the strip 15-10, and thus forming the substrate 15-1 as shown in FIG. 15.

Figure 16B:
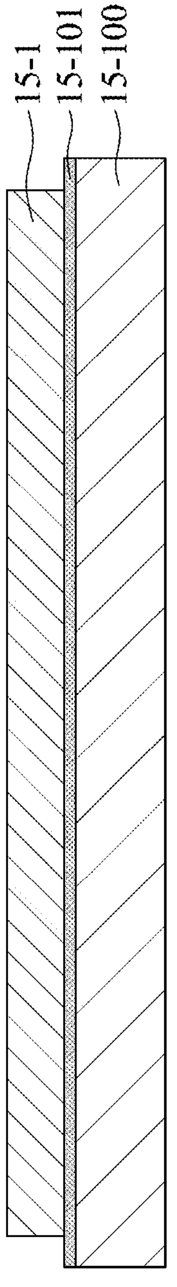

Referring to FIG. 16B, the substrate 15-1 may be arranged on a carrier 15-100 through a tape 15-101. That is, the tape 15-101 may be between the substrate 15-1 and the carrier 15-100.

Figures 16C, 16D:
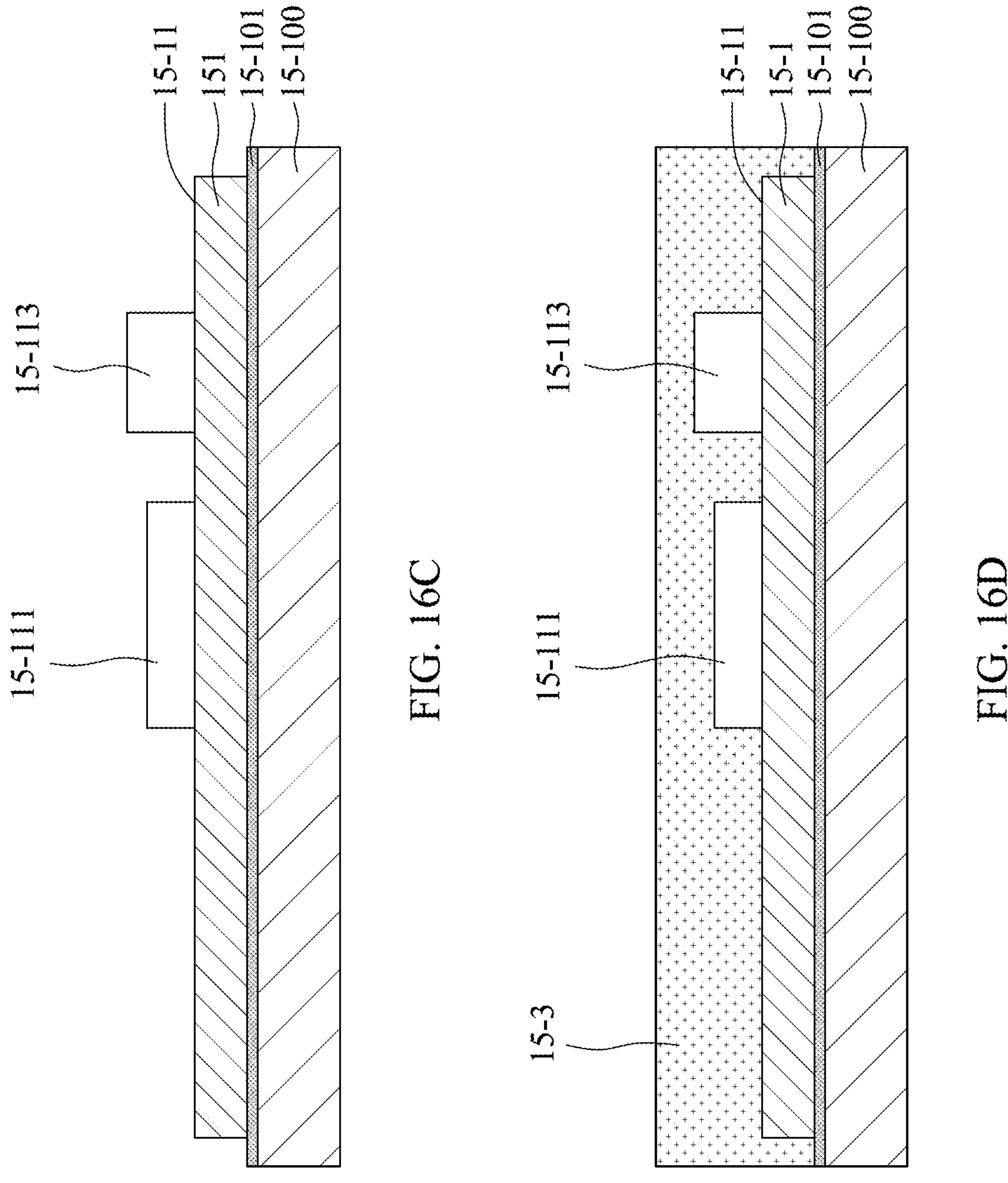

Referring to FIG. 16C, the electronic components 15-111, 15-113 may be disposed or mounted on the surface 15-11 of the substrate 15-1 and electrically connected to the interconnection of the substrate 15-1.

Referring to FIG. 16D, the encapsulant 15-3 is provided. The encapsulant 15-3 may be formed on the surface 15-11 of the substrate 15-1 and the tape 15-101 on the carrier 15-100. The encapsulant 15-3 may cover the surface 15-11 of the substrate 15-1, the electronic components 15-111, 15-113 and the tape 15-101. The encapsulant 15-3 may cover the lateral surface 15-15 of the substrate 15-1.

Figures 16E, 16F:
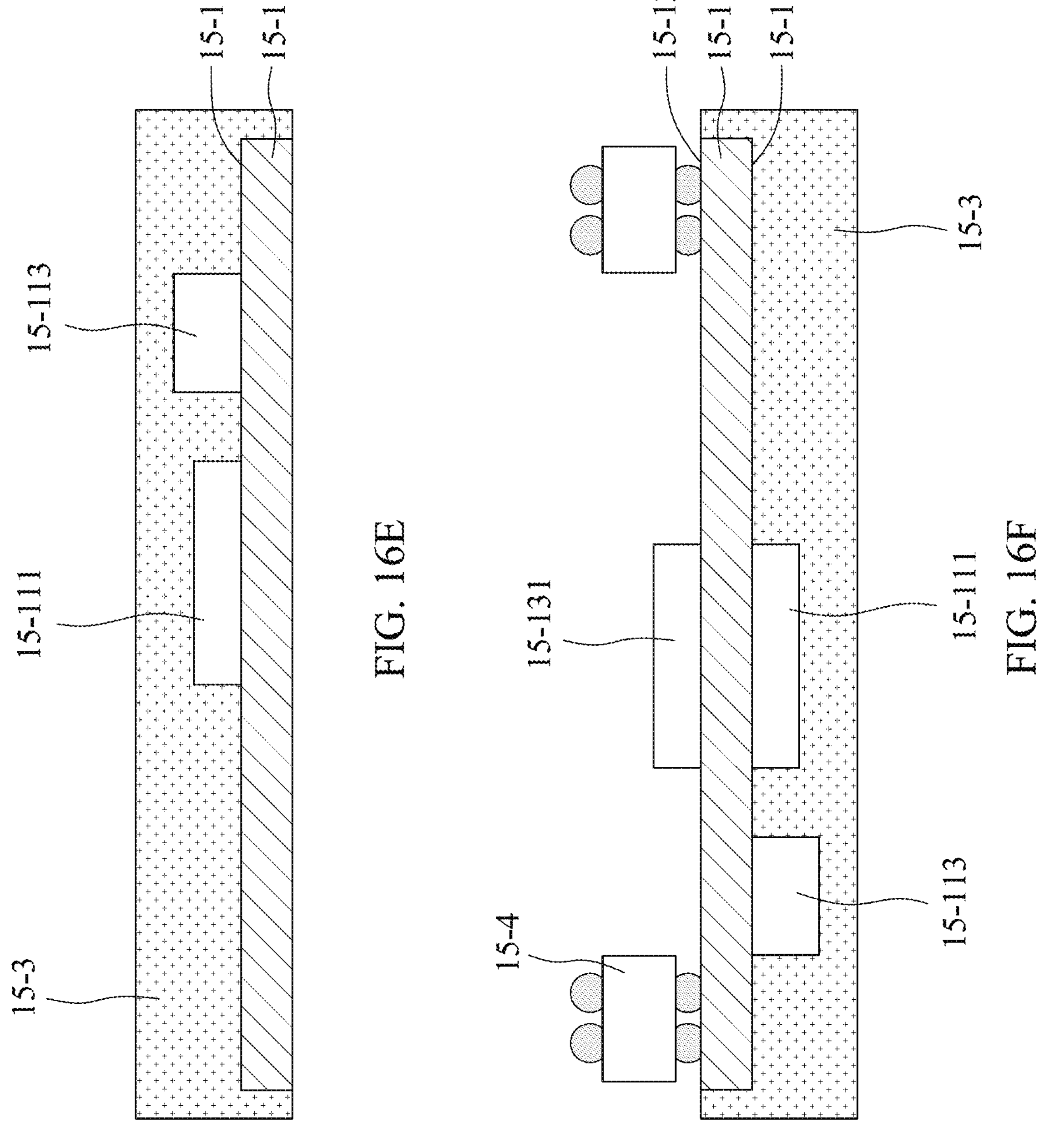

Referring to FIG. 16E, the carrier 15-100 and the tape 15-101 are removed (i.e., de-carrier).

Referring to FIG. 16F, the structure obtained from FIG. 16E may be reversed upside down. The interposers 15-4 and the electronic component 15-131 may be disposed or mounted on the surface 15-13 of the substrate 15-1 and electrically connected to the interconnection of the substrate 15-1.

Figures 16G, 16H:
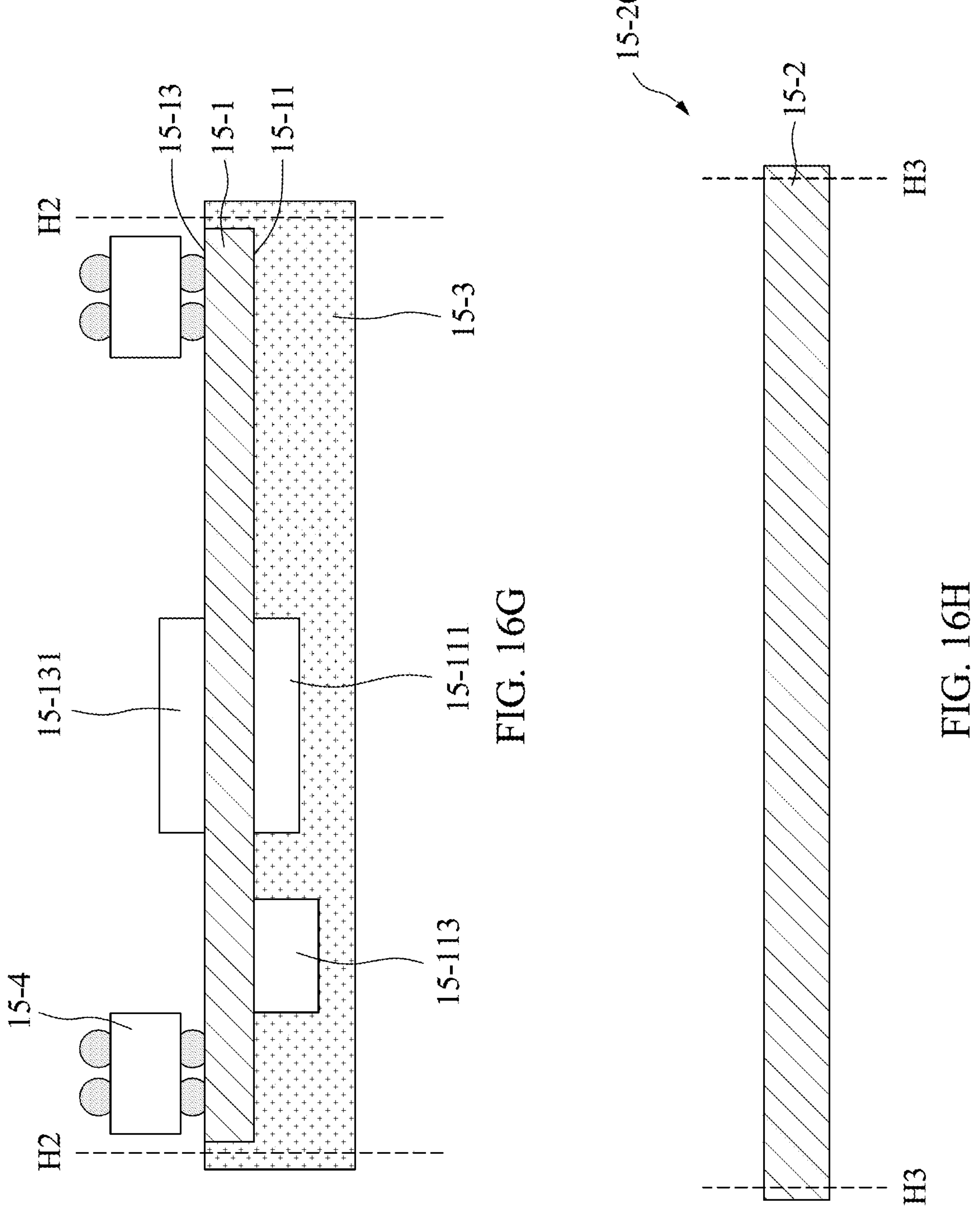

Referring to FIG. 16G, a singulation process is conducted to cut along the imaginary line "H2" through the encapsulant 15-3.

Referring to FIG. 16H, a strip 15-20 is provided and a singulation process is conducted to cut along the imaginary line "H3" through the strip 15-20, and thus forming the substrate 15-2 as shown in FIG. 13.

Figure 16I:
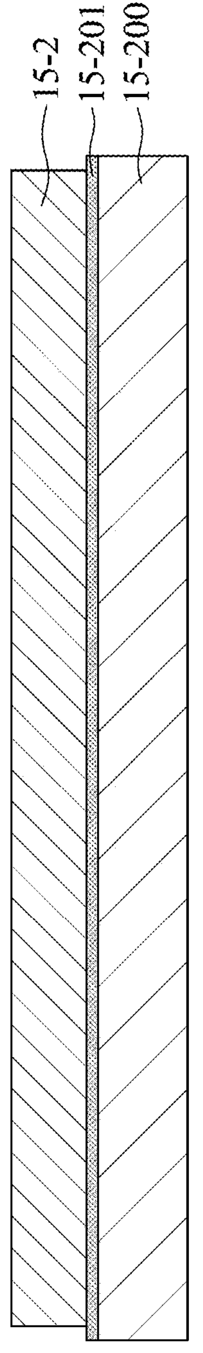

Referring to FIG. 16I, the substrate 15-2 may be arranged on a carrier 15-200 through a tape 15-201. That is, the tape 15-201 may be between the substrate 15-2 and the carrier 15-200.

Figure 16J:
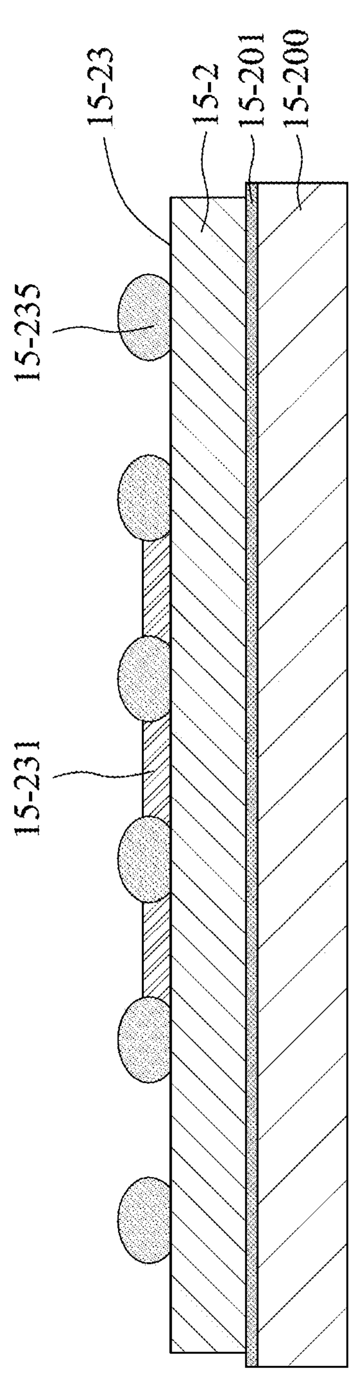

Referring to FIG. 16J, the electronic component 15-231 and the electrical connections 15-235 may be disposed or mounted on the surface 15-23 of the substrate 15-2 and electrically connected to the interconnection of the substrate 15-2.

Figures 16K, 16L:
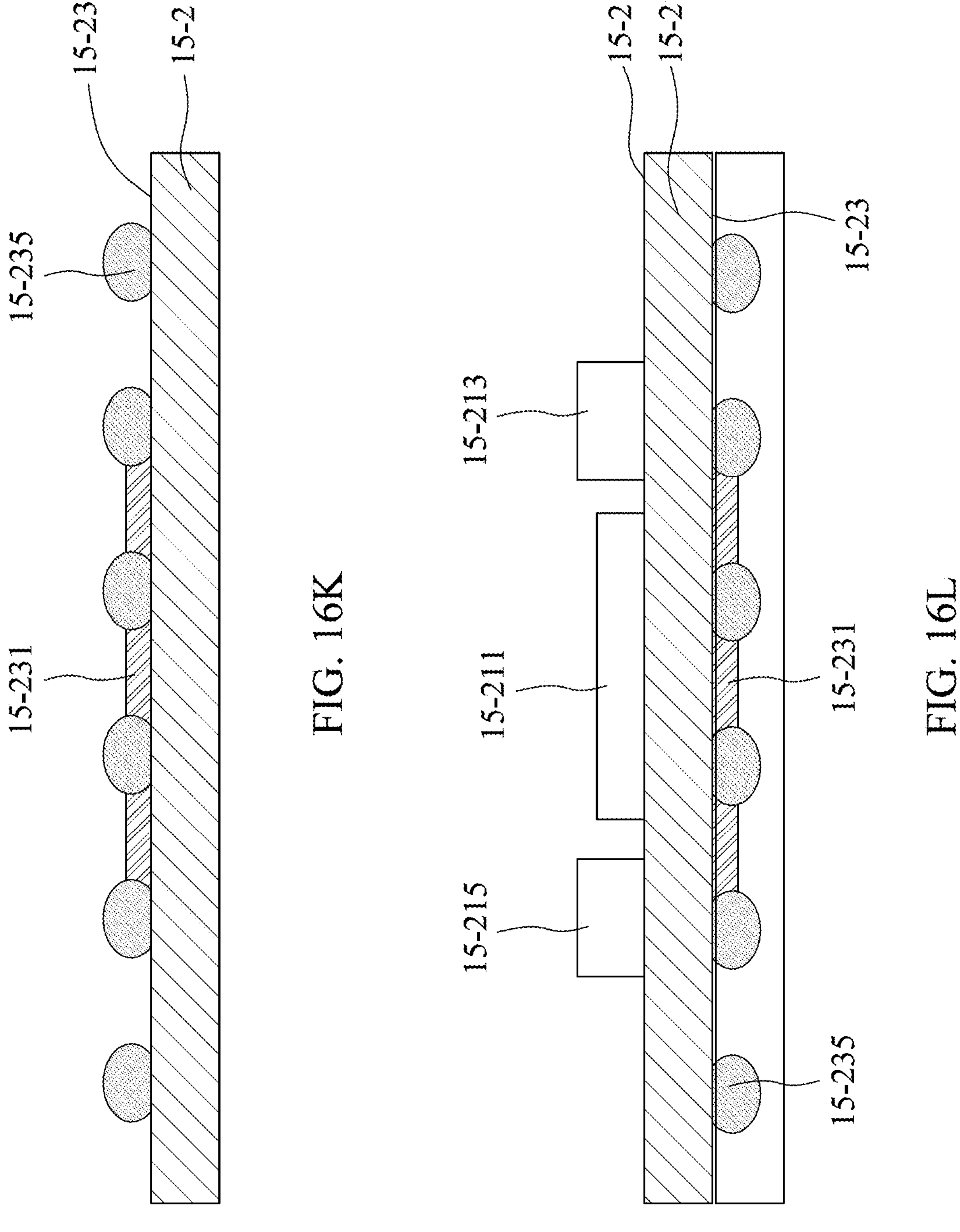

Referring to FIG. 16K, the carrier 15-200 and the tape 15-201 are removed (i.e., de-carrier).

Referring to FIG. 16L, the structure obtained from FIG. 14H may be reversed upside down. The electronic elements 15-211, 15-213 and 15-215 may be disposed or mounted on the surface 15-21 of the substrate 15-2 and electrically connected to the interconnection of the substrate 15-2.

Figure 16M:
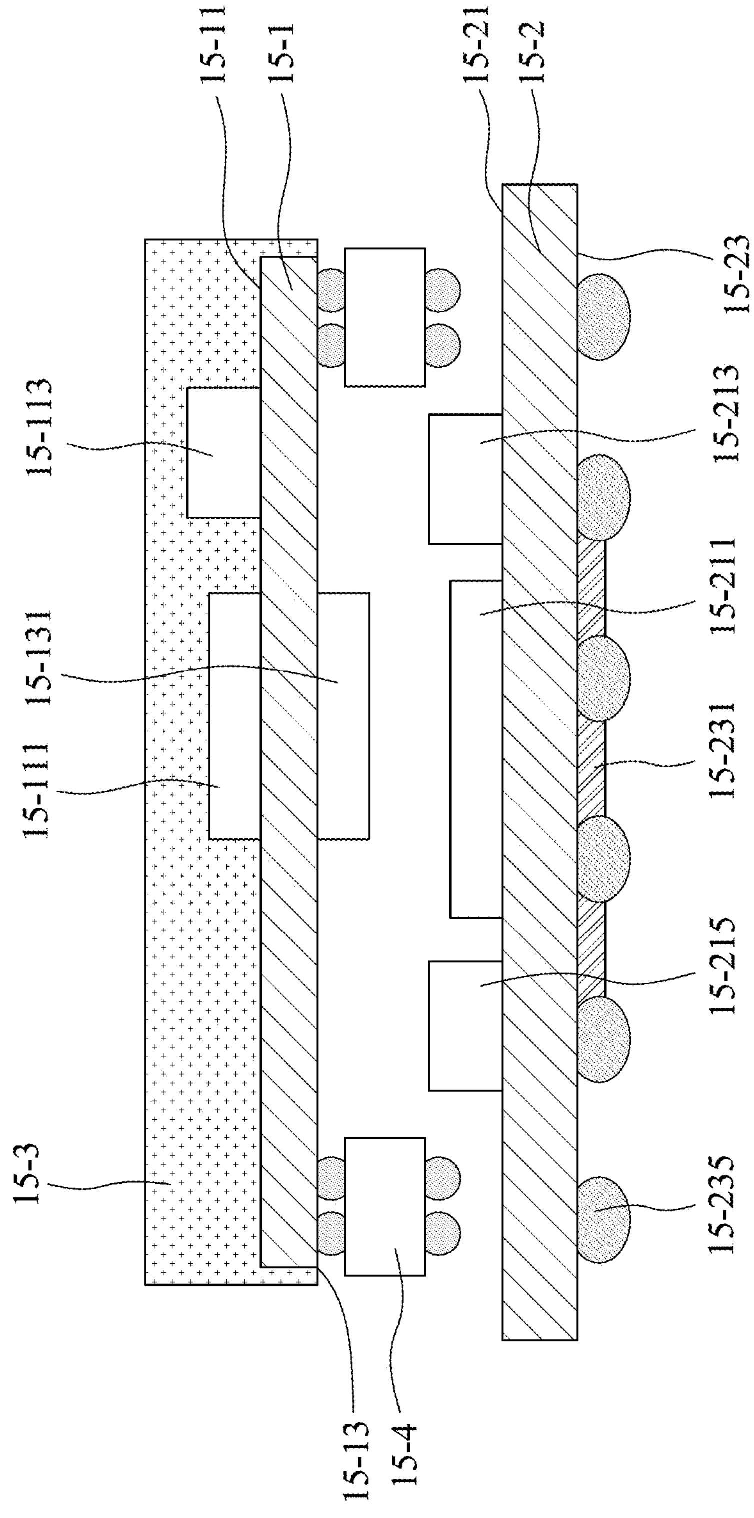

Referring to FIG. 16M, the structure obtained from FIG. 16G may be staked on the structure obtained from FIG. 16L. That is, the substrate 15-1 may be disposed over the substrate 15-2. The surface 15-13 of the substrate 15-1 may face the surface 15-21 of the substrate 15-2. The interposer 15-4 may be arranged between the substrate 1-1 and the substrate 15-2. The substrate 15-1 may be electrically connected to the substrate 15-2 through the interposer 15-4. Since the interposer 15-4 may be disposed on the substrate 15-2 and support the substrate 15-1, the electronic component 15-131 disposed on the surface 15-13 of the substrate 15-1 and the electronic component 15-211 disposed on the surface 15-21 of the substrate 15-2 may be spaced apart from by a distance.

Figure 16N:
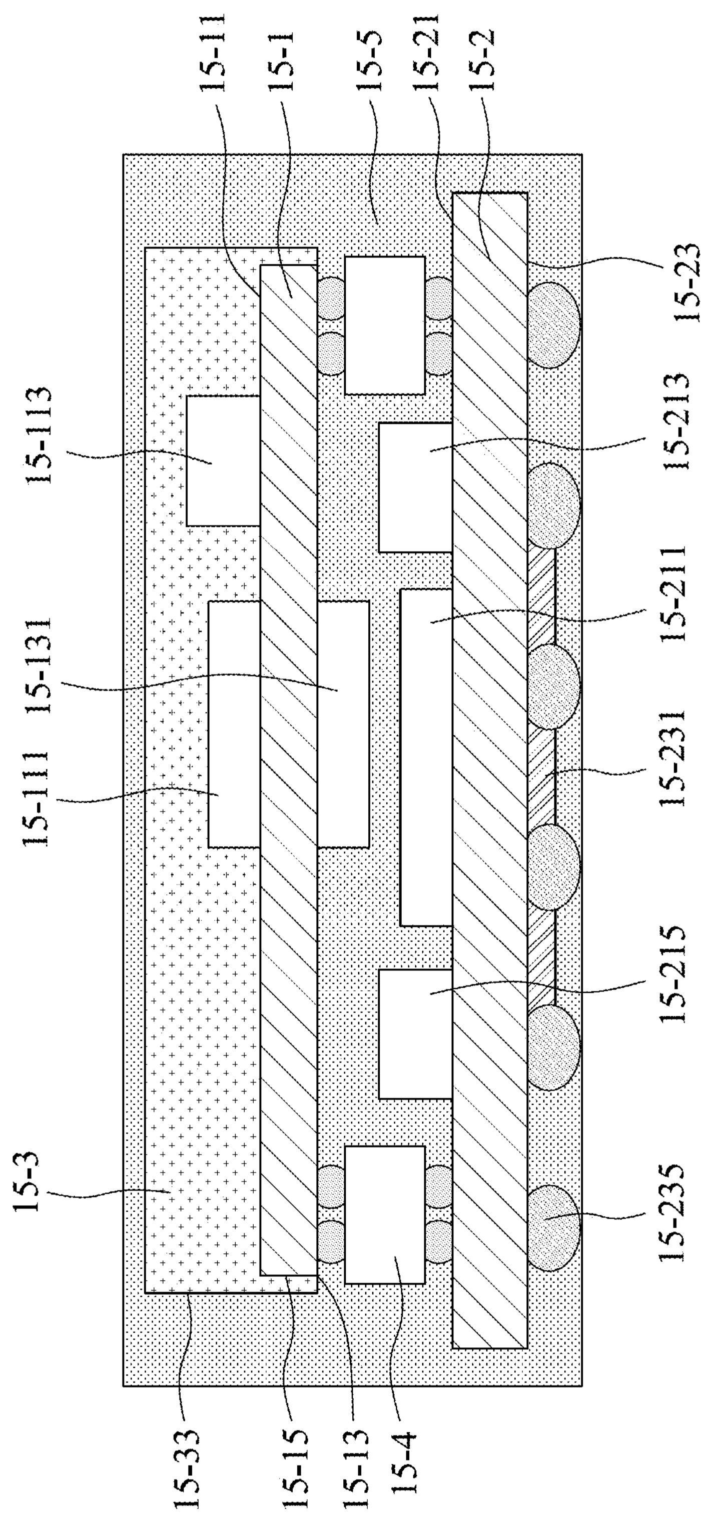

Referring to FIG. 16N, the encapsulant 15-5 is provided. The encapsulant 115-5 may cover the surface 15-21 and the surface 15-23 of the substrate 15-2, the surface 15-13 of the substrate 15-1, the electronic component 15-131, the electronic components 15-211, 15-213, 15-215, the electronic component 15-231, the electrical connections 15-235 and the interposers 15-4. The encapsulant 15-5 may cover the lateral surface 15-33 of the encapsulant 15-3.

Figure 16O:
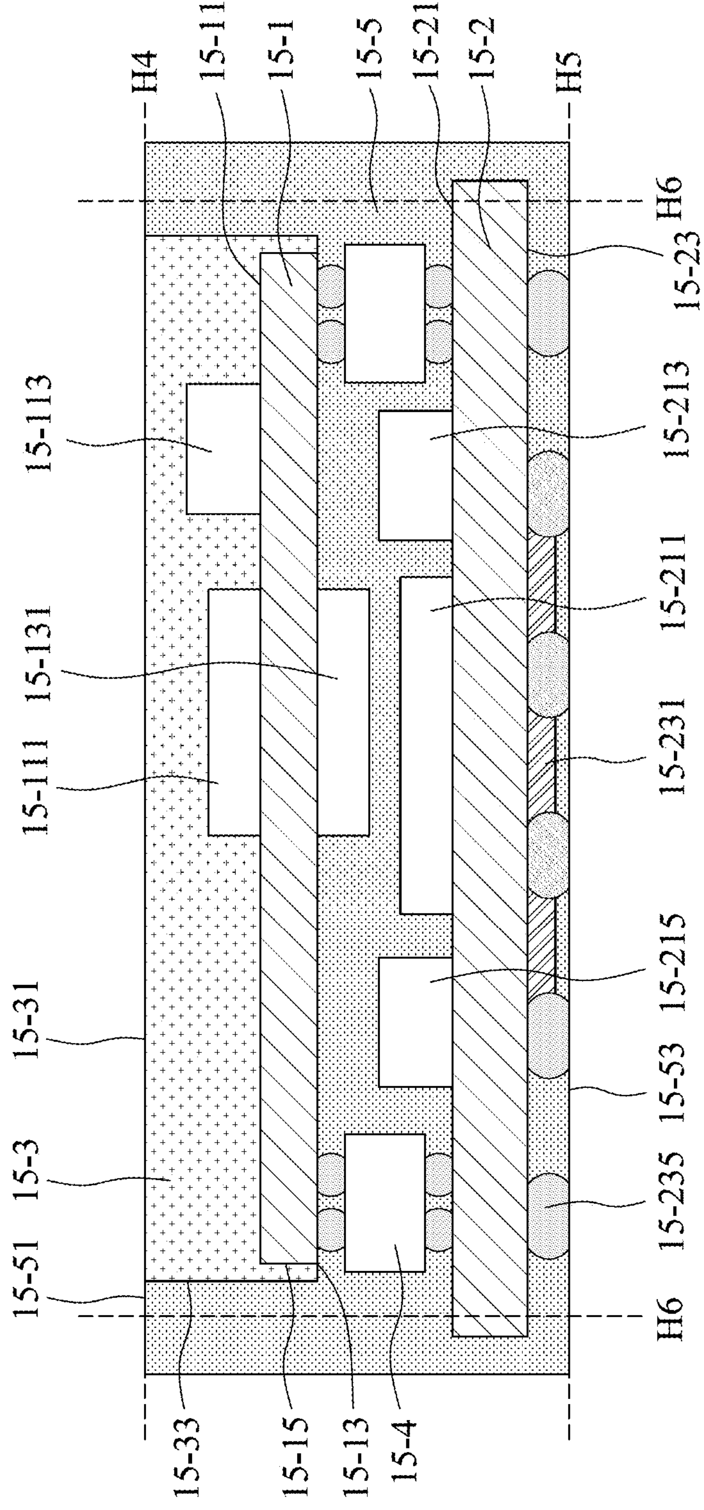

Referring to FIG. 16O, a grinding process is conducted to cut along the imaginary line "H4" through the encapsulant 15-3 and the encapsulant 15-5, and thus the upper surface 15-31 of the encapsulant 15-3 is exposed from the upper surface 15-51 of the encapsulant 15-5. Moreover, another grinding process is conducted to cut along the imaginary line "H5" through the encapsulant 15-5 and the electrical connections 15-235, and thus the electrical connections 15-235 are exposed from the lower surface 15-53 of the encapsulant 15-5. Further, a singulation process is conducted to cut along the imaginary line "H6" through the encapsulant 15-5 and the substrate 15-2, and thus forming the semiconductor device package structure 15 as shown in FIG. 15.

Figure 17:
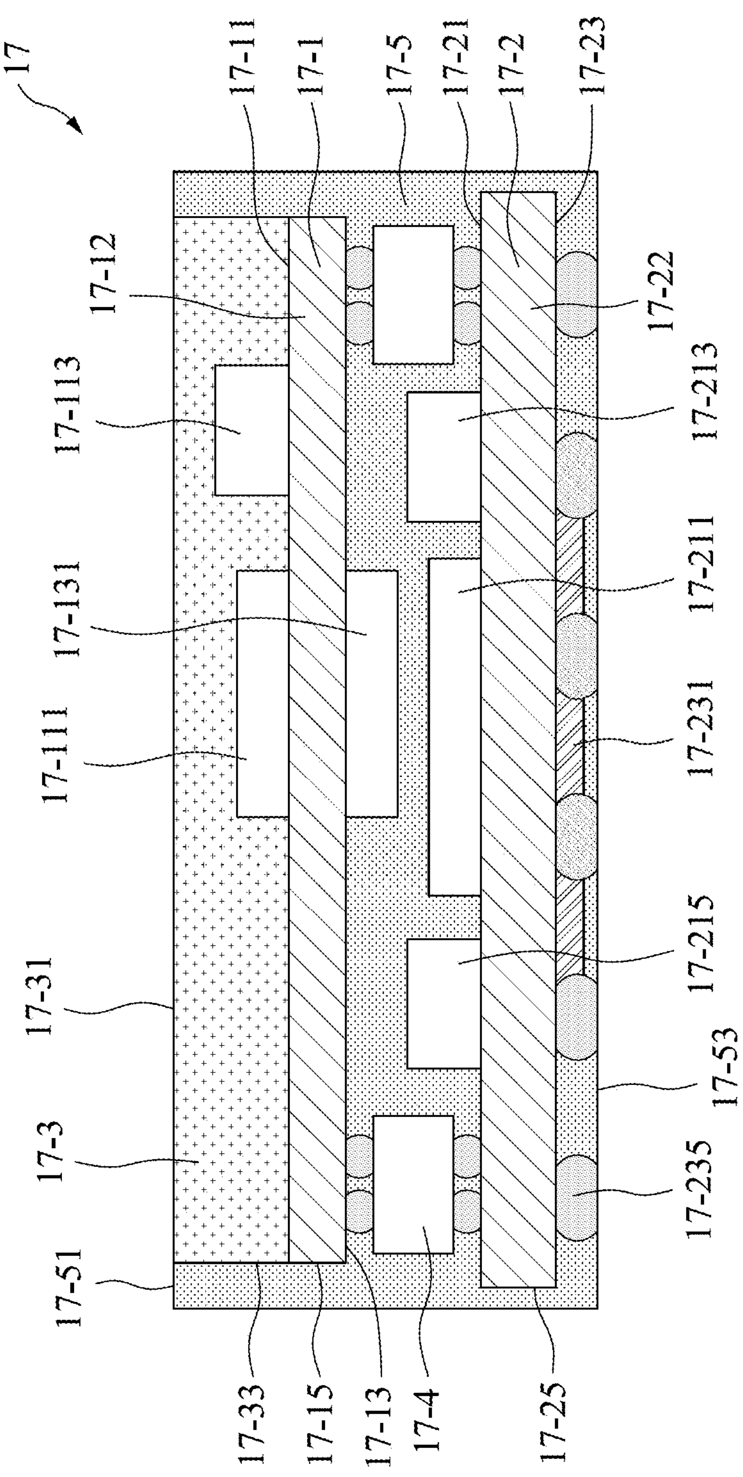
FIG. 17 is a cross-sectional view of a semiconductor device package in accordance with an embodiment of the instant disclosure.

FIG. 17 is a cross-sectional view of a semiconductor device package 17 in accordance with some embodiments of the present disclosure. As shown in FIG. 17, the semiconductor device package 17 may be a three-dimensional (3D) stacked semiconductor device package. The semiconductor device package 17 may include substrates 17-1, 17-2, electronic components 17-111, 17-113, 17-131, 17-211, 17-213, 17-215 and 17-231, encapsulants 17-3, 17-5, interposers 17-4 and electrical connections 17-235. The substrate 17-1 may be a coreless substrate and may include traces, pads or interconnections for electrical connection. The substrate 17-2 may be a core substrate or a core-less substrate and may include traces, pads or interconnections for electrical connection. Further, the substrate 17-1 may disposed over and/or above the substrate 17-2.

Referring to FIG. 17, the substrate 17-1 has a surface 17-11 (e.g., an upper surface) and a surface 17-13 (e.g., a lower surface). The electronic components 17-111, 17-113 may be disposed or mounted on the surface 17-11 of the substrate 17-1. The electronic components 17-111, 17-113 may be a die, an active device, a passive device, and/or other electronic devices. In some embodiments of the present disclosure, the electronic components 17-111, 17-113 electrically connects the substrate 17-1 via electrical connections. In some embodiments of the present disclosure, the electronic component 17-111 may include a flash memory device. Further, the electronic component 17-131 may be disposed or mounted on the surface 17-13 of the substrate 17-1. The electronic component 17-131 may be a die, an active device, a passive device, and/or other electronic devices. In some embodiments of the present disclosure, the electronic component 17-131 electrically connects the substrate 17-1 via electrical connections. In some embodiments of the present disclosure, the electronic component 17-131 may include a flash memory device. In some embodiments of the present disclosure, a thickness of the substrate 17-2 is substantially greater than a thickness of the substrate 17-1. In some embodiments of the present disclosure, a thickness a dielectric layer 17-22 of the substrate 17-2 is substantially greater than a thickness of a dielectric layer 17-12 of the substrate 17-1. In some embodiments of the present disclosure, a hardness of the substrate 17-2 is substantially greater than a hardness of the substrate 17-1.

The substrate 17-2 has a surface 17-21 (e.g., an upper surface) and a surface 17-23 (e.g., a lower surface). The electronic components 17-211, 17-213, 17-215 may be disposed or mounted on the surface 17-21 of the substrate 17-2. The electronic components 17-211, 17-213, 17-215 may be a die, an active device, a passive device, and/or other electronic devices. In some embodiments of the present disclosure, the electronic components 17-211, 17-213, 17-215 electrically connects the substrate 17-2 via electrical connections. Further, the electronic component 17-231 may be disposed or mounted on the surface 17-23 of the substrate 17-2. The electronic component 17-231 may be a die, an active device, a passive device, and/or other electronic devices. In some embodiments of the present disclosure, the electronic component 17-231 electrically connects the substrate 17-2 via electrical connections. In some embodiments of the present disclosure, a thickness of the electronic components 17-231 is the thinnest among other components in the semiconductor device package 17. Moreover, a plurality of the electrical connections 17-235 are disposed or mounted on the surface 17-23 of the substrate 17-2. In some embodiments of the present disclosure, the electrical connection 17-235 includes a reflowable material. In some embodiments of the present disclosure, the electrical connection 17-235 includes solder material. The electrical connection 17-235 may include a solder ball. The electrical connection 17-235 may include a conductive pillar, post, or substrate interposer.

The interposers 17-4 may be disposed or mounted on the surface 17-13 of the substrate 17-1 and the surface 17-21 of the substrate 17-2. That is, the interposer 17-4 may be arranged between the substrate 17-1 and the substrate 17-2, and thus the interposer 17-4 may define a space between the substrate 17-1 and 17-2. In some embodiments of the present disclosure, an amount of the electronic components within the space between the substrate 17-1 and the substrate 17-2 and/or defined by the interposer 17-4, such as the electronic components, 17-131, 17-211, 17-213, 17-215, is greater than an amount of the electronic components outside of the space between the substrate 17-1 and the substrate 17-2 and/or defined by the interposer 17-4, such as the electronic components, 17-111, 17-113, 17-231. In some embodiments of the present disclosure, a distance between the adjacent electronic components within the space between the substrate 17-1 and the substrate 17-2 and/or defined by the interposer 17-4, such as the electronic components, 17-131, 17-211, 17-213, 17-215, is smaller than a distance between the adjacent electronic components outside of the space between the substrate 17-1 and the substrate 17-2 and/or defined by the interposer 17-4, such as the electronic components, 17-111, 17-113, 17-231. In some embodiments of the present disclosure, a density of the electronic components within the space between the substrate 17-1 and the substrate 17-2 and/or defined by the interposer 17-4, such as the electronic components, 17-131, 17-211, 17-213, 17-215, is greater than a density of the electronic components outside of the space between the substrate 17-1 and the substrate 17-2 and/or defined by the interposer 17-4, such as the electronic components, 17-111, 17-113, 17-231. Moreover, the interposer 17-4 may electrically connect the substrate 17-1 and the substrate 17-2 via electrical connections.

In some embodiments of the present disclosure, such electrical connection includes a solder material. In some embodiments of the present disclosure, the interposer 17-4 includes a substrate interposer with redistribution layers and/or conductive vias.

The encapsulant 17-3 is disposed on the surface 17-11 of the substrate 17-1. The encapsulant 17-3 may cover the surface 17-11 of the substrate 17-1 and the electronic components 17-111 and 17-113 disposed on the surface 17-11 of the substrate 17-1. The encapsulant 17-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-3 may include a molding underfill (MUF) or a capillary underfill (CUF).

As above-mentioned, the substrate 17-1 may be a coreless substrate, and thus the substrate 17-1 may have a relatively thin thickness and/or a relatively weak stiffness. Therefore, when the electronic components, such as the electronic components, 17-111, 17-113, 17-131, are mounted on the substrate 17-1, the total weight of the electronic components may cause the substrate 17-1 to collapse. That is, the substrate 17-1 may be bended or recessed toward the substrate 17-2 due to the weights of the electronic components 17-111, 17-113, 17-131, and the electronic component 17-131 on the surface 17-13 of the substrate 17-1 may collide with the electronic component 17-211 on the surface of the substrate 17-2 and under the electronic component 17-131. The encapsulant 17-3 may be a reinforcement structure which is configured to improve the strength of the substrate 17-1 such that the substrate 17-1 is strong enough to support the electronic components 17-111, 17-113, 17-131 mounted thereon. Given the above, the encapsulant 17-3 may be configured to prevent the substrate 17-1 from collapsing and being bended or recessed toward the substrate 17-2. That is, the encapsulant 17-3 is configured to define a space between the electronic component 17-131 on the surface 17-13 of the substrate 17-1 and the electronic component 17-211 on the surface 17-21 of the substrate 17-2, and thus the electronic component 17-131 and the electronic component 17-211 may be maintained to be spaced apart from each other by a distance. In some embodiments of the present disclosure, the encapsulant 17-3 is a warpage-resistant layer configured to prevent the warpage of the substrate 17-1.

The encapsulant 17-5 may cover the surface 17-21 and the surface 17-23 of the substrate 17-2, the electronic components 17-211, 17-213, 17-215 disposed on the surface 17-21 of the substrate 17-2, the surface 17-13 of the substrate 17-1, the electronic component 17-131 disposed on the surface 17-13 of the substrate 17-1, the electronic component 17-231 and the electrical connections 17-235 disposed on the surface 17-23 of the substrate 17-2 and the interposers 17-4. The encapsulant 17-5 may have an upper surface 17-51 which is substantially coplanar with an upper surface 17-31 of the encapsulant 17-3. The encapsulant 17-5 may have a lower surface 17-53 covering the electronic component 17-231. In some embodiments of the present disclosure, a lower surface of the electronic component 17-231 is exposed from the lower surface 17-53 of the encapsulant 17-5. The electrical connections 17-235 may be exposed from the lower surface 17-53 of the encapsulant 17-5. The encapsulant 17-5 may cover a lateral surface 17-15 of the substrate 17-1. The encapsulant 17-5 may cover a lateral surface 17-25 of the substrate 17-2. The encapsulant 17-5 may cover a lateral surface 17-33 of the encapsulant 17-3.

The encapsulant 17-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 17-5 may include a molding underfill (MUF) or a capillary underfill (CUF).

In some embodiments of the present disclosure, the material of the encapsulant 17-3 is substantially identical to the material of the encapsulant 17-5. In some embodiments of the present disclosure, the material of the encapsulant 17-3 is different from the material of the encapsulant 17-5. In some embodiments of the present disclosure, the CTE (coefficient of thermal expansion) of the substrate 17-1 is substantially equal to the CTE of the encapsulant 17-3.

In some embodiments of the present disclosure, the substrate 17-1 is the same as, or similar to, the substrate 1-1 as shown in FIGS. 1B and 1C. That is, the substrate 17-1 may include the interconnection which may have the via tapered from the surface 17-11 toward the surface 17-13 or tapered from the surface 17-13 toward the surface 17-11. In some embodiments of the present disclosure, the substrate 17-1 is the same as, or similar to, the substrate 1-1 as shown in FIG. 1D. That is, the substrate 17-1 may include dielectric layers as shown in FIG. 1D.

FIG. 18A, FIG. 18B, FIG. 18C, FIG. 18D, FIG. 18E, FIG. 18F, FIG. 18G, FIG. 14H, FIG. 18I, FIG. 18J, FIG. 18K and FIG. 18L illustrate a method of manufacturing a semiconductor device package in accordance with another embodiment of the instant disclosure.

Figures 18A, 18B:
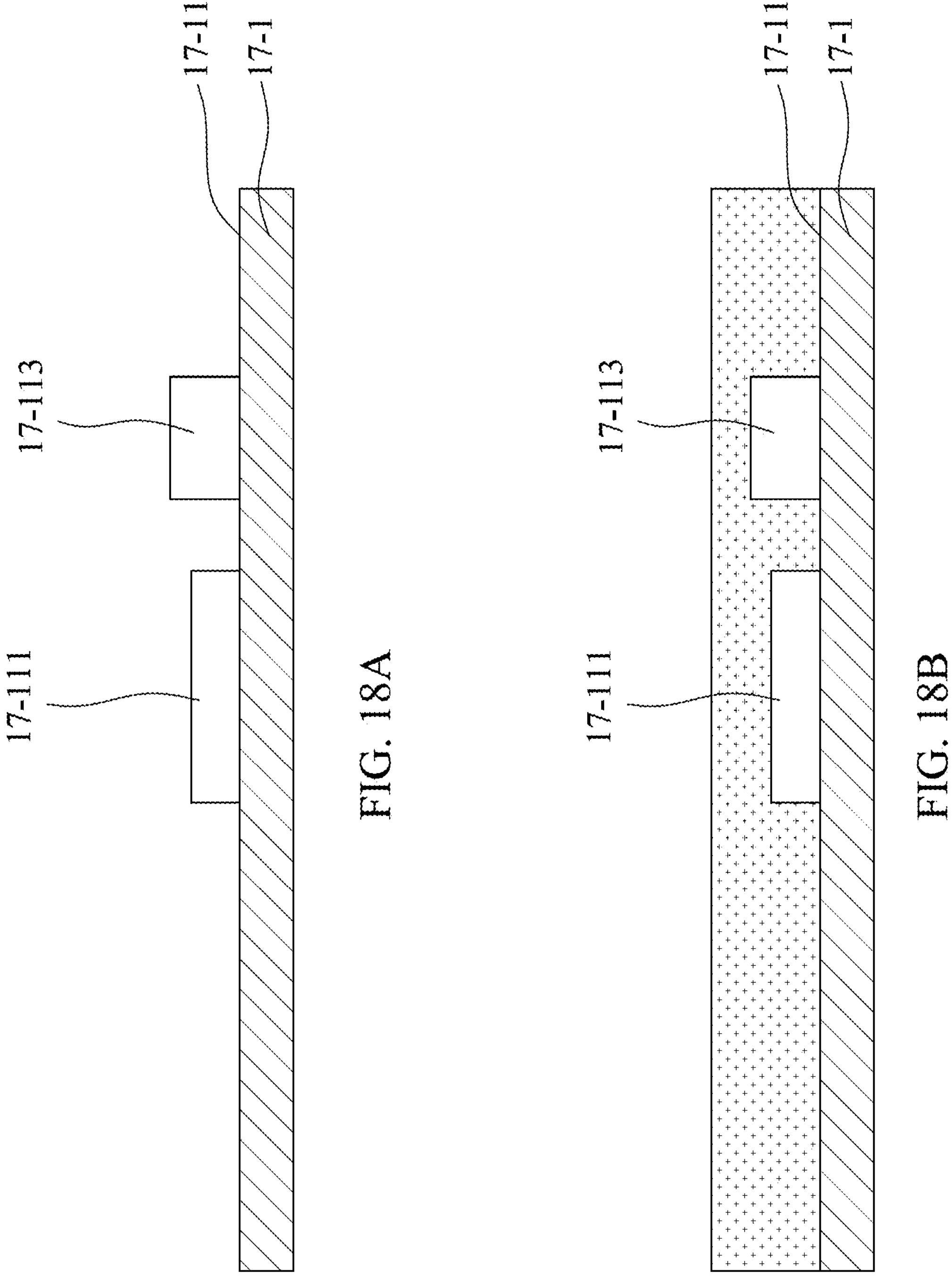
FIG. 18A, FIG. 18B, FIG. 18C, FIG. 18D, FIG. 18E, FIG. 18F, FIG. 18G, FIG. 18H, FIG. 18I, FIG. 18J, FIG. 18K and FIG. 18L illustrate a method of manufacturing a semiconductor device package in accordance with another embodiment of the instant disclosure.

Referring to FIG. 18A, the substrate 17-1 with the electronic components 17-111, 17-113 is provided. The electronic elements 17-111 and 17-113 may be disposed or mounted on the surface 17-11 of the substrate 17-1 and electrically connected to the interconnection of the substrate 17-1.

Referring to FIG. 18B, the encapsulant 17-3 is provided. The encapsulant 17-3 may be formed on the surface 17-11 of the substrate 17-1. The encapsulant 17-3 may cover the surface 17-11 of the substrate 17-1 and the electronic components 17-111, 17-113.

Figures 18C, 18D:
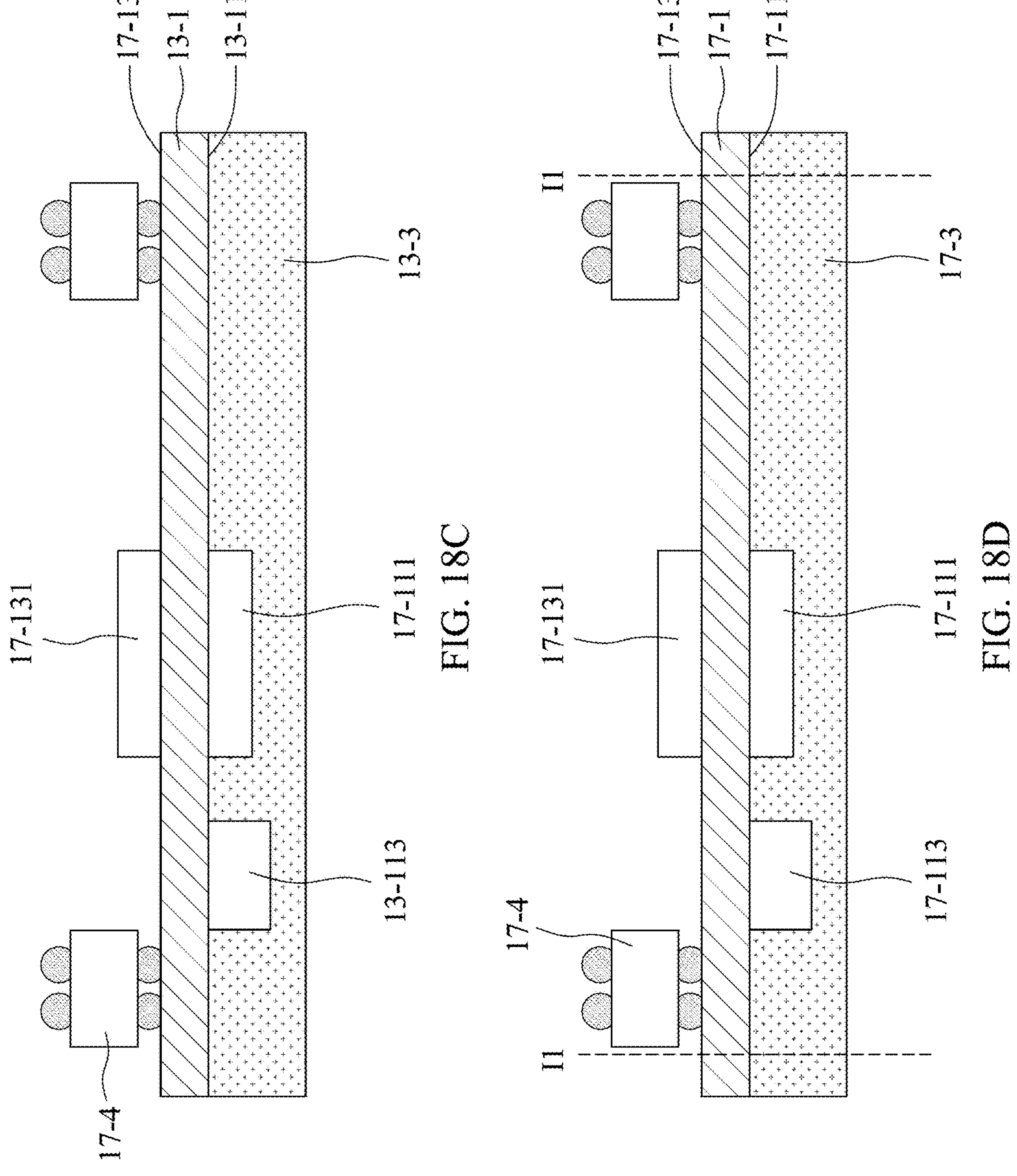

Referring to FIG. 18C, the structure obtained from FIG. 18B may be reversed upside down. The interposers 17-4 and the electronic component 17-131 may be disposed or mounted on the surface 17-13 of the substrate 17-1 and electrically connected to the interconnection of the substrate 17-1.

Referring to FIG. 18D, a singulation process is conducted to cut along the imaginary line "I1" through the substrate 17-1 and the encapsulant 17-3.

Figure 18E:
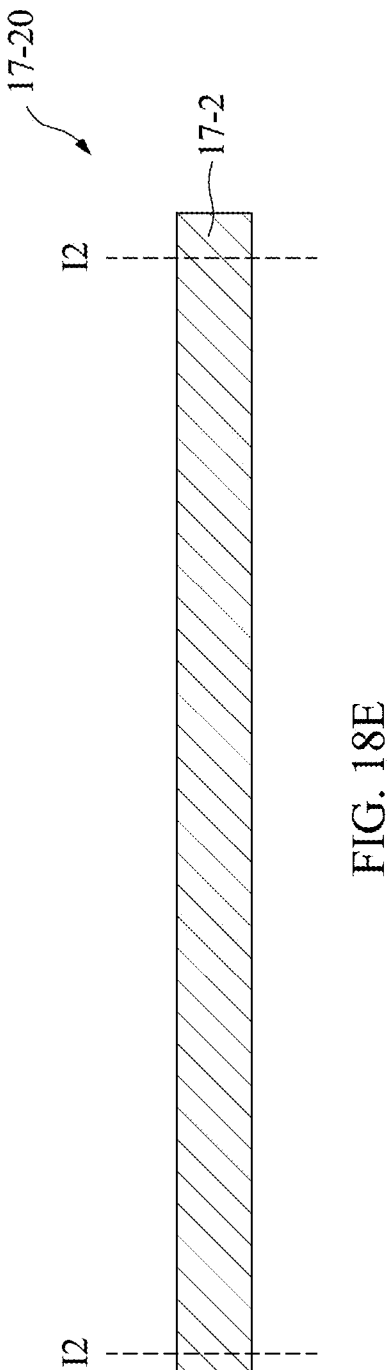

Referring to FIG. 18E, a strip 17-20 is provided and a singulation process is conducted to cut along the imaginary line "I2" through the strip 17-20, and thus forming the substrate 17-2 as shown in FIG. 17.

Figure 18F:
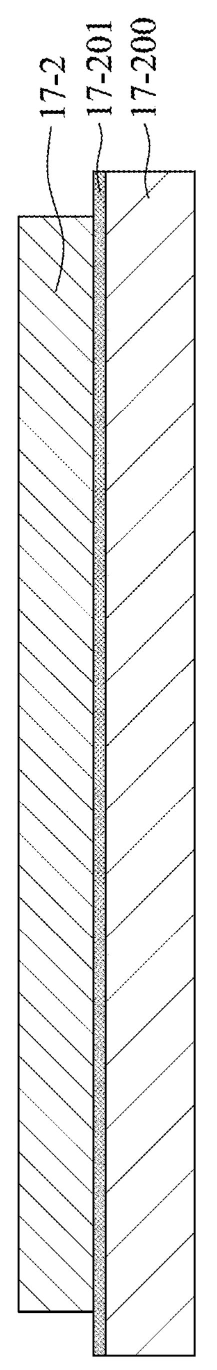

Referring to FIG. 18F, the substrate 17-2 may be arranged on a carrier 17-200 through a tape 17-201. That is, the tape 17-201 may be between the substrate 17-2 and the carrier 17-200.

Figure 18G:
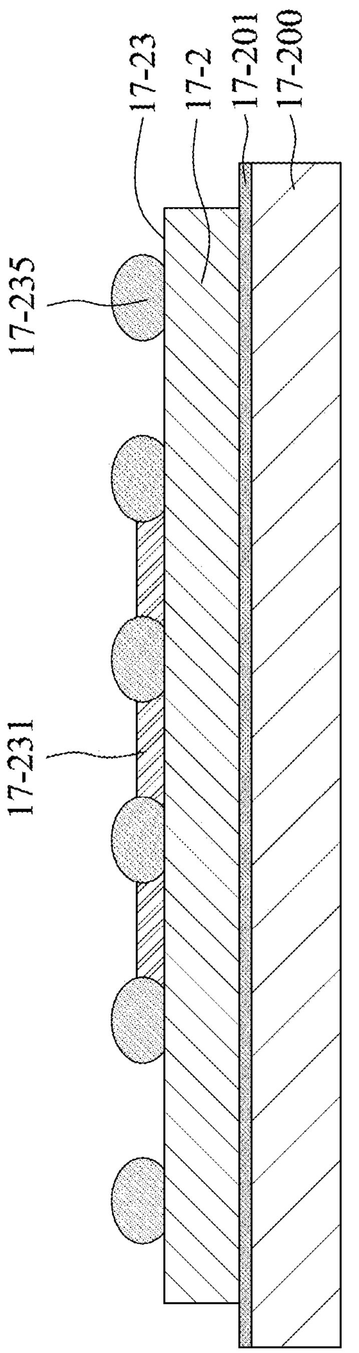
Figure 18G:

Referring to FIG. 18G, the electronic component 17-231 and the electrical connections 17-235 may be disposed or mounted on the surface 17-23 of the substrate 17-2 and electrically connected to the interconnection of the substrate 17-2.

Figure 18H:
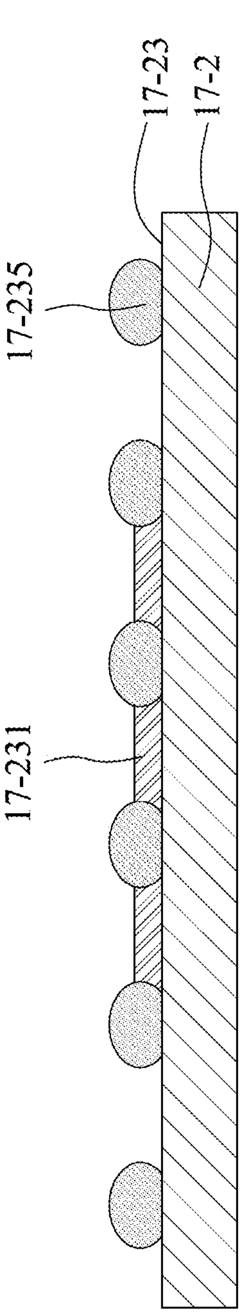

Referring to FIG. 18H, the carrier 17-200 and the tape 17-201 are removed (i.e., de-carrier).

Figure 18I:
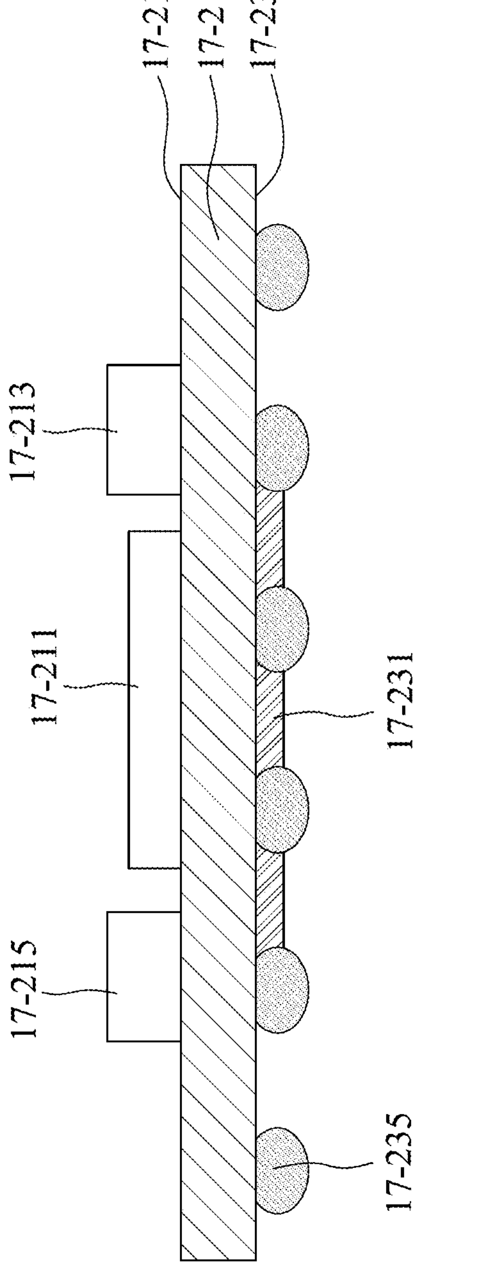

Referring to FIG. 18I, the structure obtained from FIG. 18H may be reversed upside down. The electronic elements 17-211, 17-213 and 17-215 may be disposed or mounted on the surface 17-21 of the substrate 17-2 and electrically connected to the interconnection of the substrate 17-2.

Figure 18J:
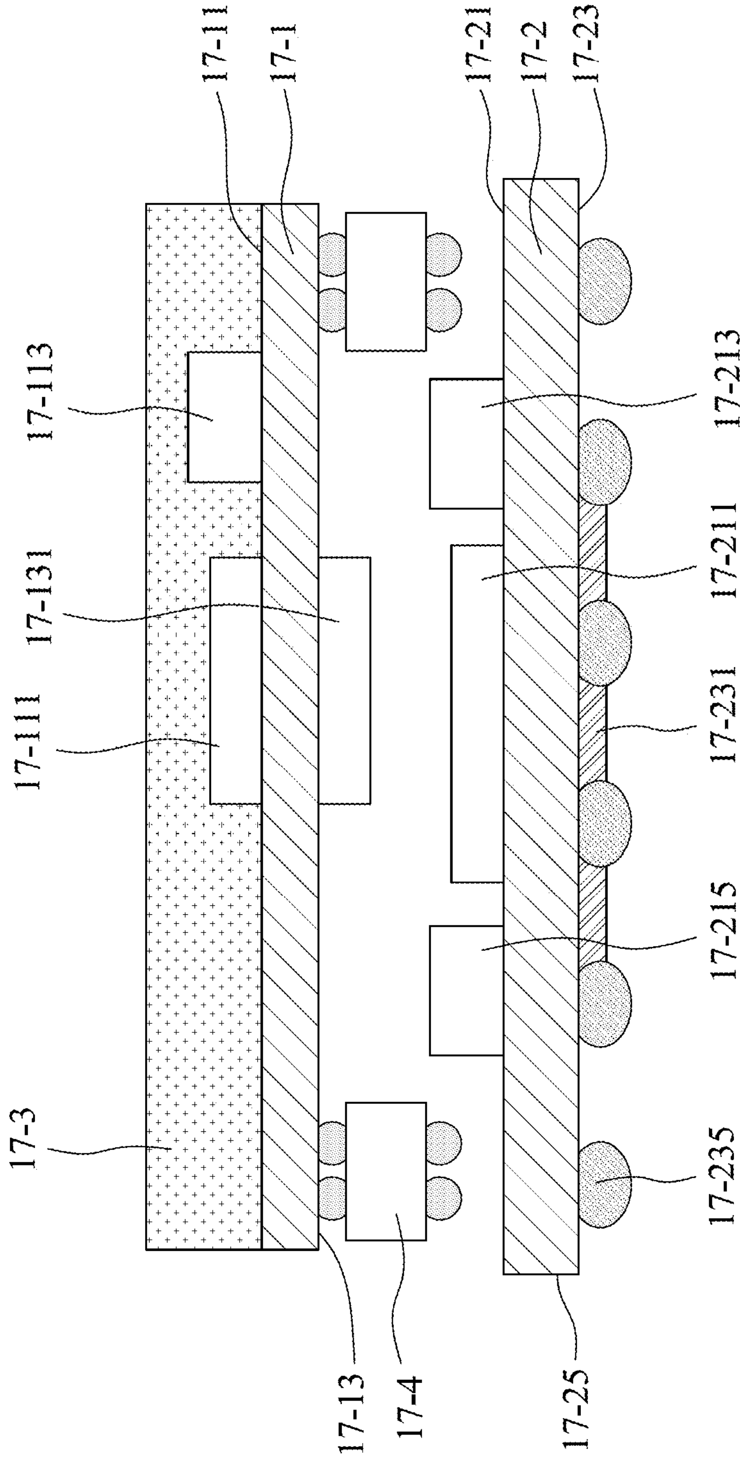

Referring to FIG. 18J, the structure obtained from FIG. 18D may be staked on the structure obtained from FIG. 18I. That is, the substrate 17-1 may be disposed over the substrate 17-2. The surface 17-13 of the substrate 17-1 may face the surface 17-21 of the substrate 17-2. The interposer 17-4 may be arranged between the substrate 1-1 and the substrate 17-2. The substrate 17-1 may be electrically connected to the substrate 17-2 through the interposer 17-4. Since the interposer 17-4 may be disposed on the substrate 17-2 and support the substrate 17-1, the electronic component 17-131 disposed on the surface 17-13 of the substrate 17-1 and the electronic component 17-211 disposed on the surface 17-21 of the substrate 17-2 may be spaced apart from by a distance.

Figure 18K:
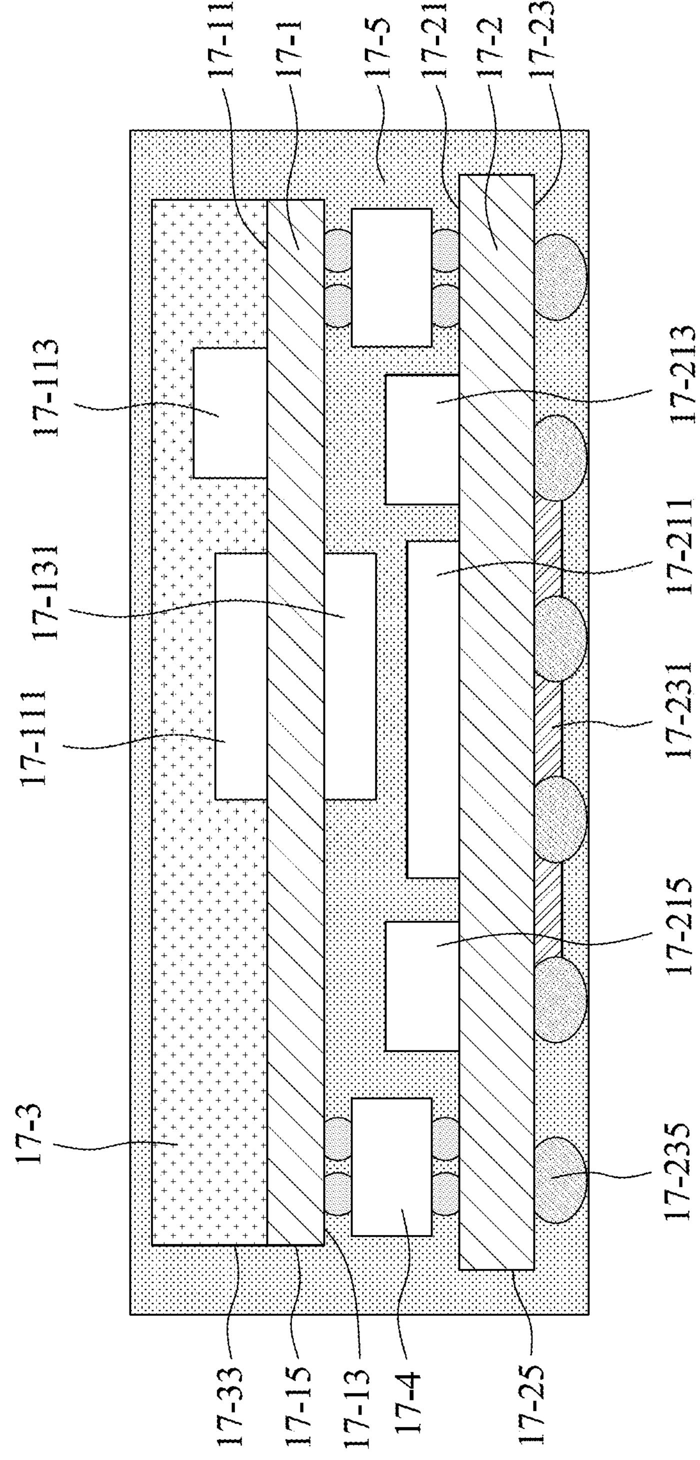

Referring to FIG. 18K, the encapsulant 17-5 is provided. The encapsulant 117-5 may cover the surface 17-21 and the surface 17-23 of the substrate 17-2, the surface 17-13 of the substrate 17-1, the electronic component 17-131, the electronic components 17-211, 17-213, 17-215, the electronic component 17-231, the electrical connections 17-235 and the interposers 17-4. The encapsulant 17-5 may cover the lateral surface 17-15 of the substrate 17-1. The encapsulant 17-5 may cover the lateral surface 17-33 of the encapsulant 17-3. The encapsulant may cover the lateral surface 17-25 of the substrate 17-2.

Figure 18L:
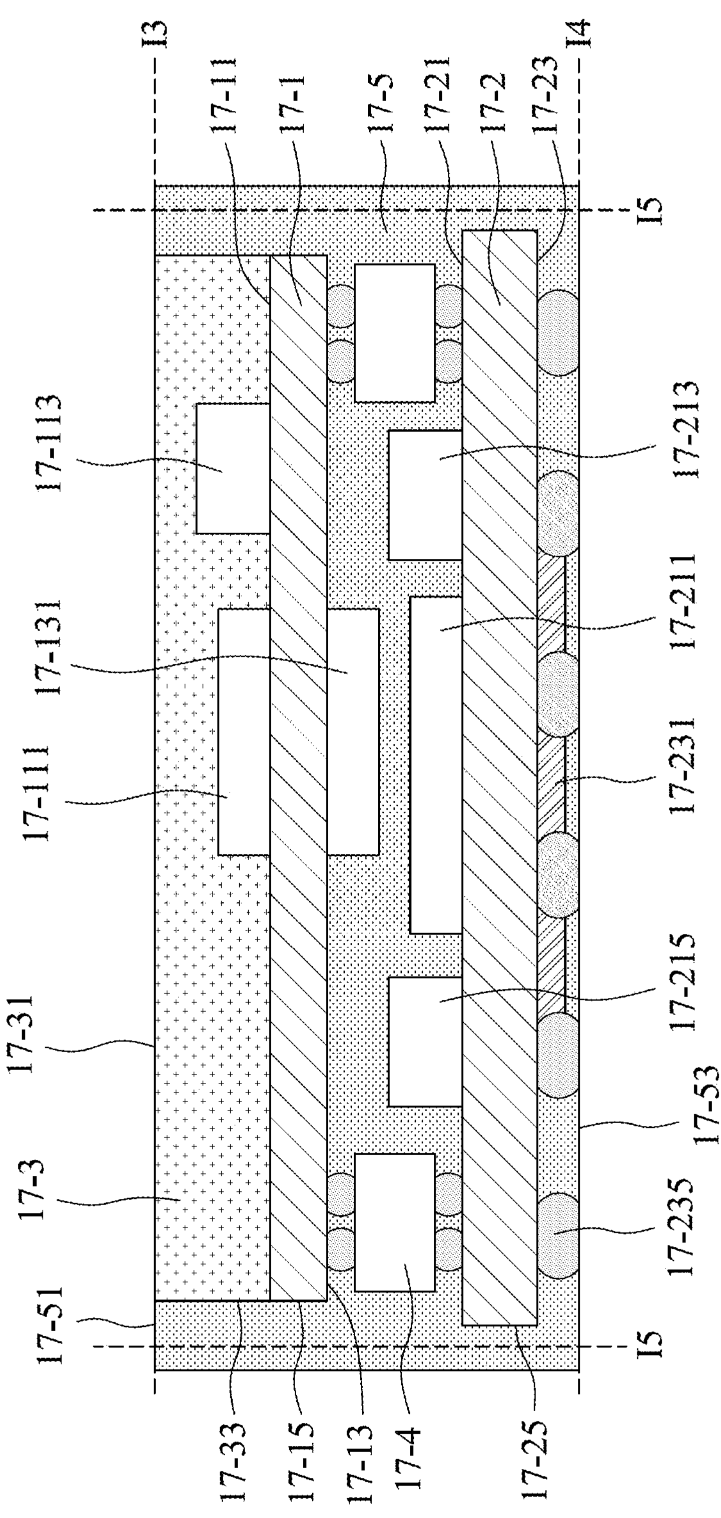

Referring to FIG. 18L, a grinding process is conducted to cut along the imaginary line "I3" through the encapsulant 17-3 and the encapsulant 17-5, and thus the upper surface 17-31 of the encapsulant 17-3 is exposed from the upper surface 17-51 of the encapsulant 17-5. Moreover, another grinding process is conducted to cut along the imaginary line "I4" through the encapsulant 17-5 and the electrical connections 17-235, and thus the electrical connections 17-235 are exposed from the lower surface 17-53 of the encapsulant 17-5. Further, a singulation process is conducted to cut along the imaginary line "I5" through the encapsulants 17-5, and thus forming the semiconductor device package structure 17 as shown in FIG. 17.

Figure 19:
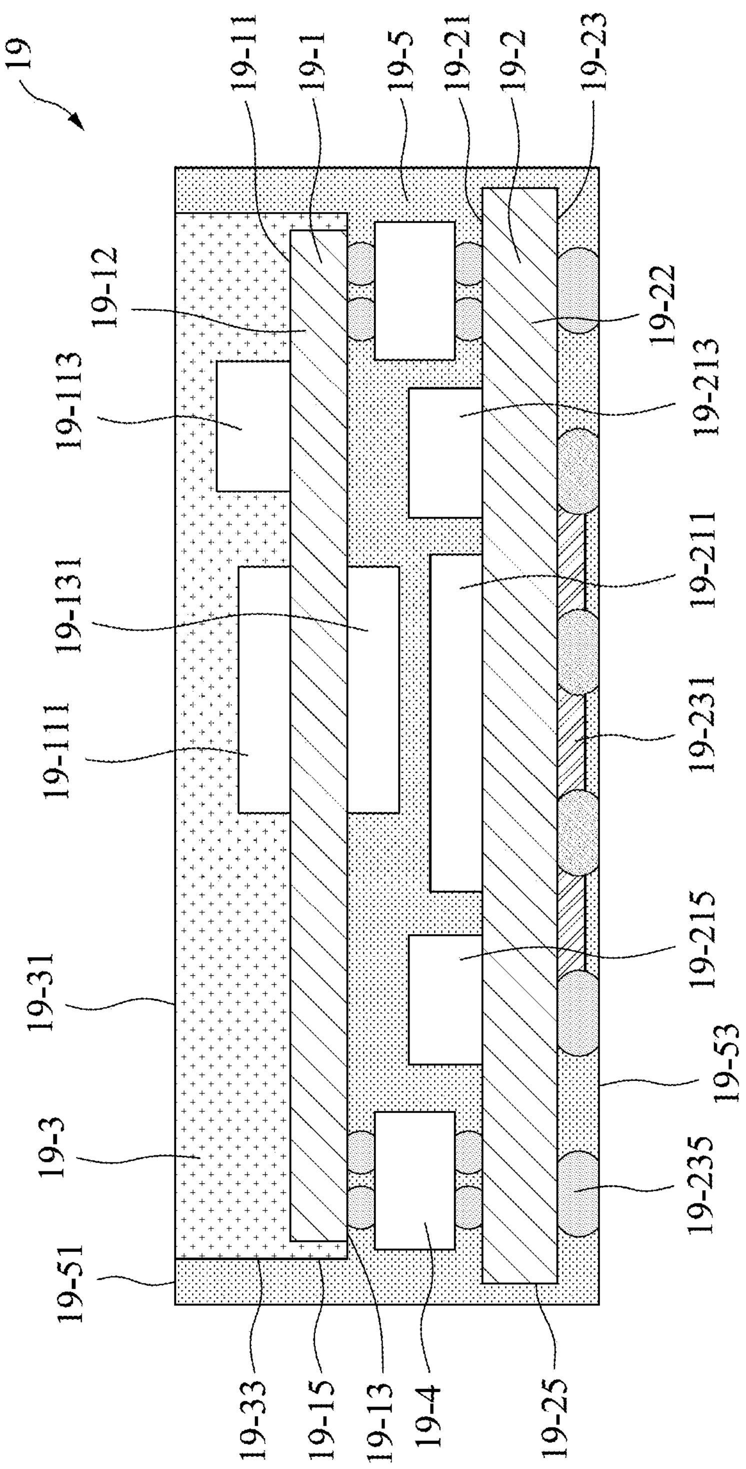
FIG. 19 is a cross-sectional view of a semiconductor device package in accordance with an embodiment of the instant disclosure.

FIG. 19 is a cross-sectional view of a semiconductor device package 19 in accordance with some embodiments of the present disclosure. As shown in FIG. 19, the semiconductor device package 19 may be a three-dimensional (3D) stacked semiconductor device package. The semiconductor device package 19 may include substrates 19-1, 19-2, electronic components 19-111, 19-113, 19-131, 19-211, 19-213, 19-215 and 19-231, encapsulants 19-3, 19-5, interposers 19-4 and electrical connections 19-235. The substrate 19-1 may be a coreless substrate and may include traces, pads or interconnections for electrical connection. The substrate 19-2 may be a core substrate or a core-less substrate and may include traces, pads or interconnections for electrical connection. Further, the substrate 19-1 may disposed over and/or above the substrate 19-2.

Referring to FIG. 19, the substrate 19-1 has a surface 19-11 (e.g., an upper surface) and a surface 19-13 (e.g., a lower surface). The electronic components 19-111, 19-113 may be disposed or mounted on the surface 19-11 of the substrate 19-1. The electronic components 19-111, 19-113 may be a die, an active device, a passive device, and/or other electronic devices. In some embodiments of the present disclosure, the electronic components 19-111, 19-113 electrically connects the substrate 19-1 via electrical connections. In some embodiments of the present disclosure, the electronic component 19-111 may include a flash memory device. Further, the electronic component 19-131 may be disposed or mounted on the surface 19-13 of the substrate 19-1. The electronic component 19-131 may be a die, an active device, a passive device, and/or other electronic devices. In some embodiments of the present disclosure, the electronic component 19-131 electrically connects the substrate 19-1 via electrical connections. In some embodiments of the present disclosure, the electronic component 19-131 may include a flash memory device. In some embodiments of the present disclosure, a thickness of the substrate 19-2 is substantially greater than a thickness of the substrate 19-1. In some embodiments of the present disclosure, a thickness a dielectric layer 19-22 of the substrate 19-2 is substantially greater than a thickness of a dielectric layer 19-12 of the substrate 19-1. In some embodiments of the present disclosure, a hardness of the substrate 19-2 is substantially greater than a hardness of the substrate 19-1.

The substrate 19-2 has a surface 19-21 (e.g., an upper surface) and a surface 19-23 (e.g., a lower surface). The electronic components 19-211, 19-213, 19-215 may be disposed or mounted on the surface 19-21 of the substrate 19-2. The electronic components 19-211, 19-213, 19-215 may be a die, an active device, a passive device, and/or other electronic devices. In some embodiments of the present disclosure, the electronic components 19-211, 19-213, 19-215 electrically connects the substrate 19-2 via electrical connections. Further, the electronic component 19-231 may be disposed or mounted on the surface 19-23 of the substrate 19-2. The electronic component 19-231 may be a die, an active device, a passive device, and/or other electronic devices. In some embodiments of the present disclosure, the electronic component 19-231 electrically connects the substrate 19-2 via electrical connections. In some embodiments of the present disclosure, a thickness of the electronic components 19-231 is the thinnest among other components in the semiconductor device package 19. Moreover, a plurality of the electrical connections 19-235 are disposed or mounted on the surface 19-23 of the substrate 19-2. In some embodiments of the present disclosure, the electrical connection 19-235 includes a reflowable material. In some embodiments of the present disclosure, the electrical connection 19-235 includes solder material. The electrical connection 19-235 may include a solder ball. The electrical connection 19-235 may include a conductive pillar, post, or substrate interposer.

The interposers 19-4 may be disposed or mounted on the surface 19-13 of the substrate 19-1 and the surface 19-21 of the substrate 19-2. That is, the interposer 19-4 may be arranged between the substrate 19-1 and the substrate 19-2, and thus the interposer 19-4 may define a space between the substrate 19-1 and 19-2. In some embodiments of the present disclosure, an amount of the electronic components within the space between the substrate 19-1 and the substrate 19-2 and/or defined by the interposer 19-4, such as the electronic components, 19-131, 19-211, 19-213, 19-215, is greater than an amount of the electronic components outside of the space between the substrate 19-1 and the substrate 19-2 and/or defined by the interposer 19-4, such as the electronic components, 19-111, 19-113, 19-231. In some embodiments of the present disclosure, a distance between the adjacent electronic components within the space between the substrate 19-1 and the substrate 19-2 and/or defined by the interposer 19-4, such as the electronic components, 19-131, 19-211, 19-213, 19-215, is smaller than a distance between the adjacent electronic components outside of the space between the substrate 19-1 and the substrate 19-2 and/or defined by the interposer 19-4, such as the electronic components, 19-111, 19-113, 19-231. In some embodiments of the present disclosure, a density of the electronic components within the space between the substrate 19-1 and the substrate 19-2 and/or defined by the interposer 19-4, such as the electronic components, 19-131, 19-211, 19-213, 19-215, is greater than a density of the electronic components outside of the space between the substrate 19-1 and the substrate 19-2 and/or defined by the interposer 19-4, such as the electronic components, 19-111, 19-113, 19-231. Moreover, the interposer 19-4 may electrically connect the substrate 19-1 and the substrate 19-2 via electrical connections. In some embodiments of the present disclosure, such electrical connection includes a solder material. In some embodiments of the present disclosure, the interposer 19-4 includes a substrate interposer with redistribution layers and/or conductive vias.

The encapsulant 19-3 is disposed on the surface 19-11 of the substrate 19-1. The encapsulant 19-3 may cover the surface 19-11 of the substrate 19-1 and the electronic components 19-111 and 19-113 disposed on the surface 19-11 of the substrate 19-1. Moreover, the encapsulant 19-3 may cover a lateral surface 19-15 of the substrate 19-1, and thus functions as a mold lock. The encapsulant 19-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 1-3 may include a molding underfill (MUF) or a capillary underfill (CUF).

As above-mentioned, the substrate 19-1 may be a coreless substrate, and thus the substrate 19-1 may have a relatively thin thickness and/or a relatively weak stiffness. Therefore, when the electronic components, such as the electronic components, 19-111, 19-113, 19-131, are mounted on the substrate 19-1, the total weight of the electronic components may cause the substrate 19-1 to collapse. That is, the substrate 19-1 may be bended or recessed toward the substrate 19-2 due to the weights of the electronic components 19-111, 19-113, 19-131, and the electronic component 19-131 on the surface 19-13 of the substrate 19-1 may collide with the electronic component 19-211 on the surface of the substrate 19-2 and under the electronic component 19-131. The encapsulant 19-3 may be a reinforcement structure which is configured to improve the strength of the substrate 19-1 such that the substrate 19-1 is strong enough to support the electronic components 19-111, 19-113, 19-131 mounted thereon. Given the above, the encapsulant 19-3 may be configured to prevent the substrate 19-1 from collapsing and being bended or recessed toward the substrate 19-2. That is, the encapsulant 19-3 is configured to define a space between the electronic component 19-131 on the surface 19-13 of the substrate 19-1 and the electronic component 19-211 on the surface 19-21 of the substrate 19-2, and thus the electronic component 19-131 and the electronic component 19-211 may be maintained to be spaced apart from each other by a distance. In some embodiments of the present disclosure, the encapsulant 19-3 is a warpage-resistant layer configured to prevent the warpage of the substrate 19-1.

The encapsulant 19-5 may cover the surface 19-21 and the surface 19-23 of the substrate 19-2, the electronic components 19-211, 19-213, 19-215 disposed on the surface 19-21 of the substrate 19-2, the surface 19-13 of the substrate 19-1, the electronic component 19-131 disposed on the surface 19-13 of the substrate 19-1, the electronic component 19-231 and the electrical connections 19-235 disposed on the surface 19-23 of the substrate 19-2 and the interposers 19-4. The encapsulant 19-5 may have an upper surface 19-51 which is substantially coplanar with an upper surface 19-31 of the encapsulant 19-3. The encapsulant 19-5 may have a lower surface 19-53 covering the electronic component 19-231. In some embodiments of the present disclosure, a lower surface of the electronic component 19-231 is exposed from the lower surface 19-53 of the encapsulant 19-5. The electrical connections 19-235 may be exposed from the lower surface 19-53 of the encapsulant 19-5. Moreover, the encapsulant 19-5 may cover a lateral surface 19-33 of the encapsulant 19-3. The encapsulant 19-5 may cover a lateral surface 19-25 of the substrate 19-2. The encapsulant 19-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 19-5 may include a molding underfill (MUF) or a capillary underfill (CUF).

In some embodiments of the present disclosure, the material of the encapsulant 19-3 is substantially identical to the material of the encapsulant 19-5. In some embodiments of the present disclosure, the material of the encapsulant 19-3 is different from the material of the encapsulant 19-5. In some embodiments of the present disclosure, the CTE (coefficient of thermal expansion) of the substrate 19-1 is substantially equal to the CTE of the encapsulant 19-3.

In some embodiments of the present disclosure, the substrate 19-1 is the same as, or similar to, the substrate 1-1 as shown in FIGS. 1B and 1C. That is, the substrate 19-1 may include the interconnection which may have the via tapered from the surface 19-11 toward the surface 19-13 or tapered from the surface 19-13 toward the surface 19-11. In some embodiments of the present disclosure, the substrate 19-1 is the same as, or similar to, the substrate 1-1 as shown in FIG. 1D. That is, the substrate 19-1 may include dielectric layers as shown in FIG. 1D.

FIG. 20A, FIG. 20B, FIG. 20C, FIG. 20D, FIG. 20E, FIG. 20F, FIG. 20G, FIG. 16H, FIG. 20I, FIG. 20J, FIG. 20K, FIG. 20L, FIG. 20M, FIG. 20N and FIG. 20O illustrate a method of manufacturing a semiconductor device package 15 in accordance with another embodiment of the instant disclosure.

Figure 20A:
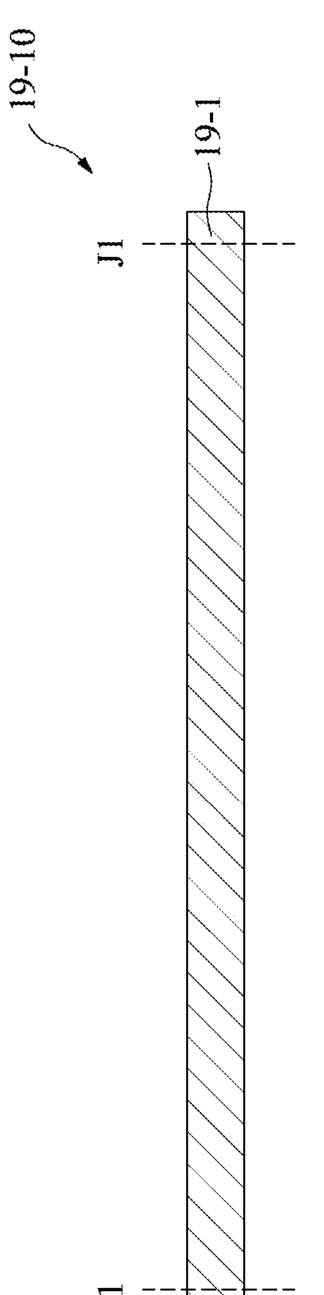
FIG. 20A, FIG. 20B, FIG. 20C, FIG. 20D, FIG. 20E, FIG. 20F, FIG. 20G, FIG. 20H, FIG. 20I, FIG. 20J, FIG. 20K, FIG. 20L, FIG. 20M, FIG. 20N and FIG. 20O illustrate a method of manufacturing a semiconductor device package in accordance with another embodiment of the instant disclosure.

Referring to FIG. 20A, a strip 19-10 is provided and a singulation process is conducted to cut along the imaginary line "J1" through the strip 19-10, and thus forming the substrate 19-1 as shown in FIG. 15.

Figure 20B:
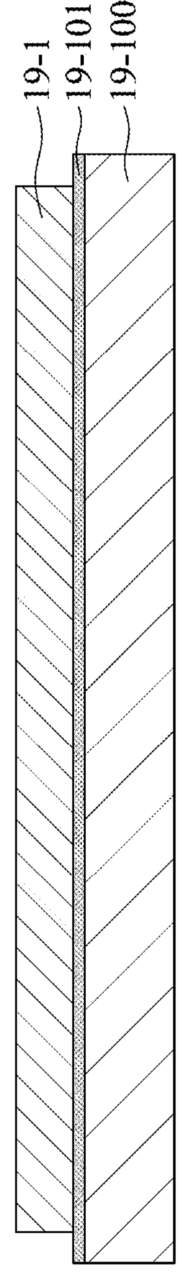

Referring to FIG. 20B, the substrate 19-1 may be arranged on a carrier 19-100 through a tape 19-101. That is, the tape 19-101 may be between the substrate 19-1 and the carrier 19-100.

Figures 20C, 20D:
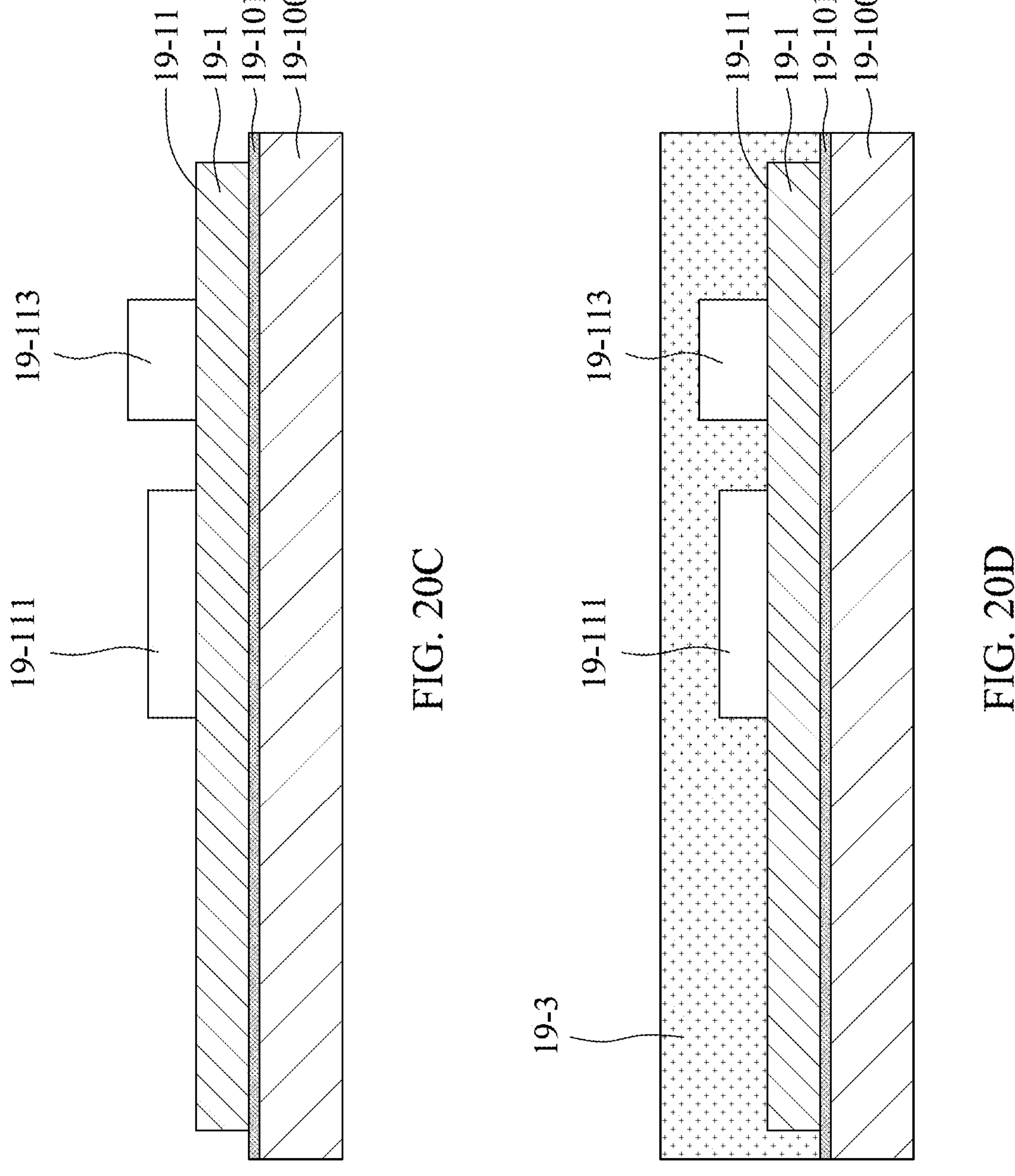

Referring to FIG. 20C, the electronic components 19-111, 19-113 may be disposed or mounted on the surface 19-11 of the substrate 19-1 and electrically connected to the interconnection of the substrate 19-1.

Referring to FIG. 20D, the encapsulant 19-3 is provided. The encapsulant 19-3 may be formed on the surface 19-11 of the substrate 19-1 and the tape 19-101 on the carrier 19-100. The encapsulant 19-3 may cover the surface 19-11 of the substrate 19-1, the electronic components 19-111, 19-113 and the tape 19-101. The encapsulant 19-3 may cover the lateral surface 19-15 of the substrate 19-1.

Figures 20E, 20F:
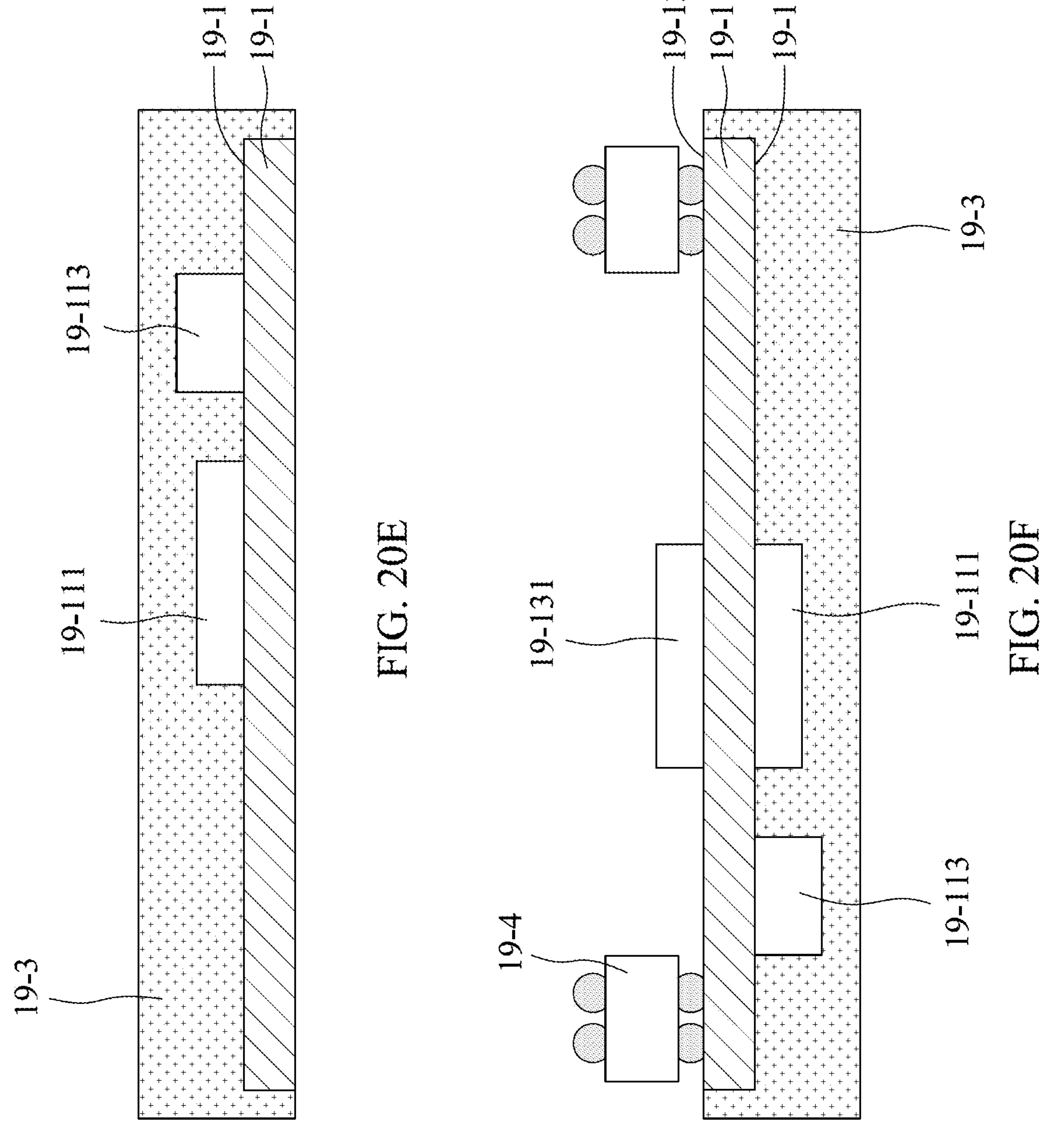

Referring to FIG. 20E, the carrier 19-100 and the tape 19-101 are removed (i.e., de-carrier).

Referring to FIG. 20F, the structure obtained from FIG. 20E may be reversed upside down. The interposers 19-4 and the electronic component 19-131 may be disposed or mounted on the surface 19-13 of the substrate 19-1 and electrically connected to the interconnection of the substrate 19-1.

Figures 20G, 20H:
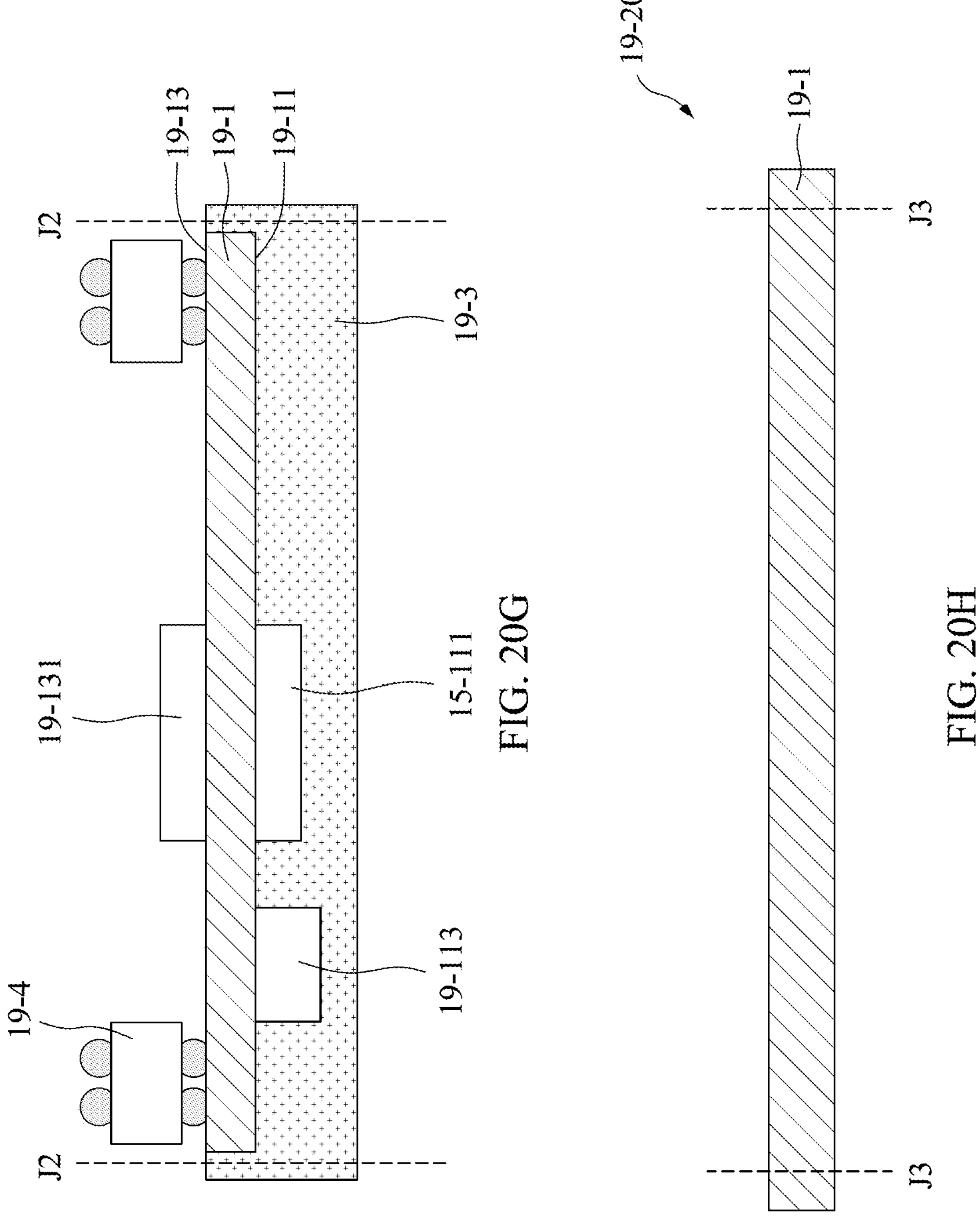

Referring to FIG. 20G, a singulation process is conducted to cut along the imaginary line "J2" through the encapsulant 19-3.

Referring to FIG. 20H, a strip 19-20 is provided and a singulation process is conducted to cut along the imaginary line "J3" through the strip 19-20, and thus forming the substrate 19-2 as shown in FIG. 13.

Figure 20I:
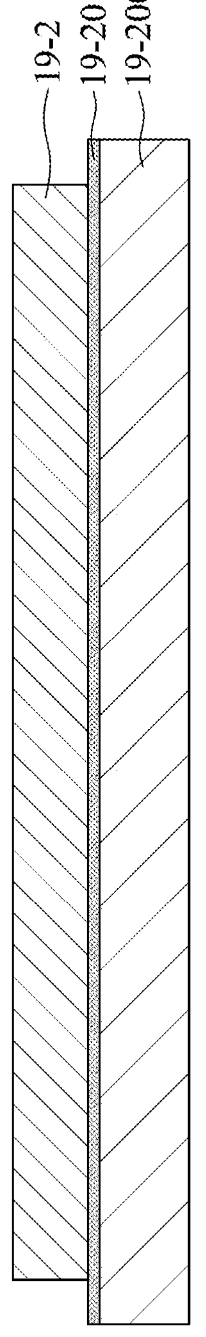
Figure 20I:

Referring to FIG. 20I, the substrate 19-2 may be arranged on a carrier 19-200 through a tape 19-201. That is, the tape 19-201 may be between the substrate 19-2 and the carrier 19-200.

Figure 20J:
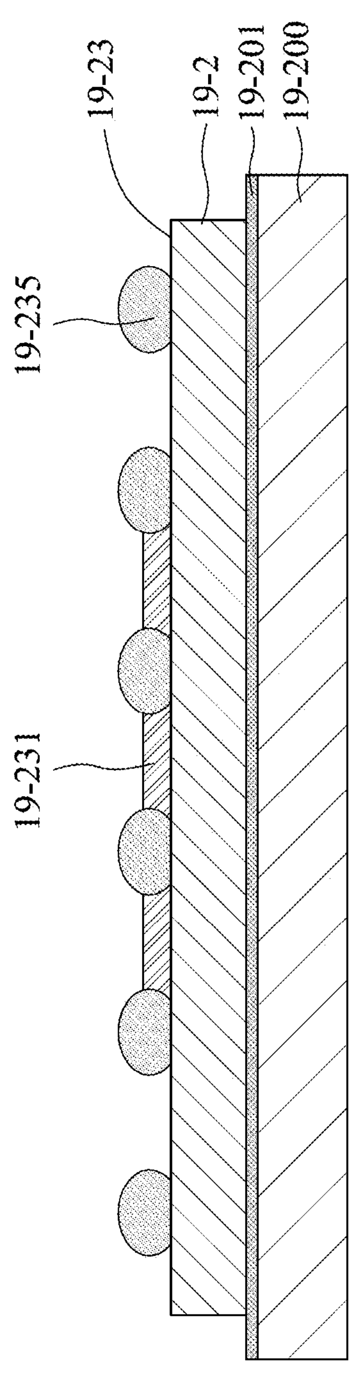

Referring to FIG. 20J, the electronic component 19-231 and the electrical connections 19-235 may be disposed or mounted on the surface 19-23 of the substrate 19-2 and electrically connected to the interconnection of the substrate 19-2.

Figure 20K:
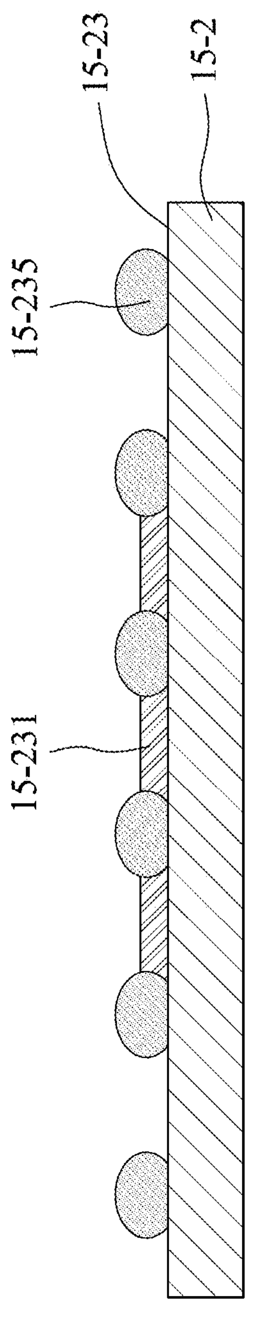

Referring to FIG. 20K, the carrier 19-200 and the tape 19-201 are removed (i.e., de-carrier).

Figure 20L:
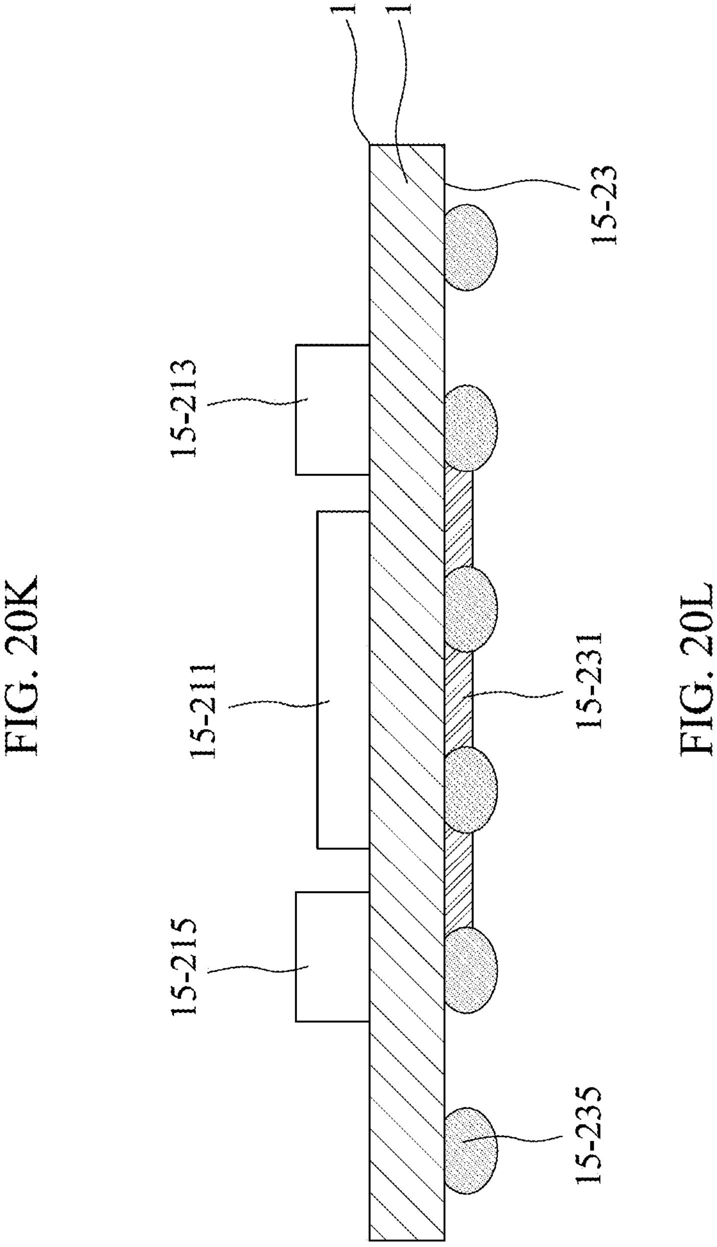

Referring to FIG. 20L, the structure obtained from FIG. 14H may be reversed upside down. The electronic elements 19-211, 19-213 and 19-215 may be disposed or mounted on the surface 19-21 of the substrate 19-2 and electrically connected to the interconnection of the substrate 19-2.

Figure 20M:
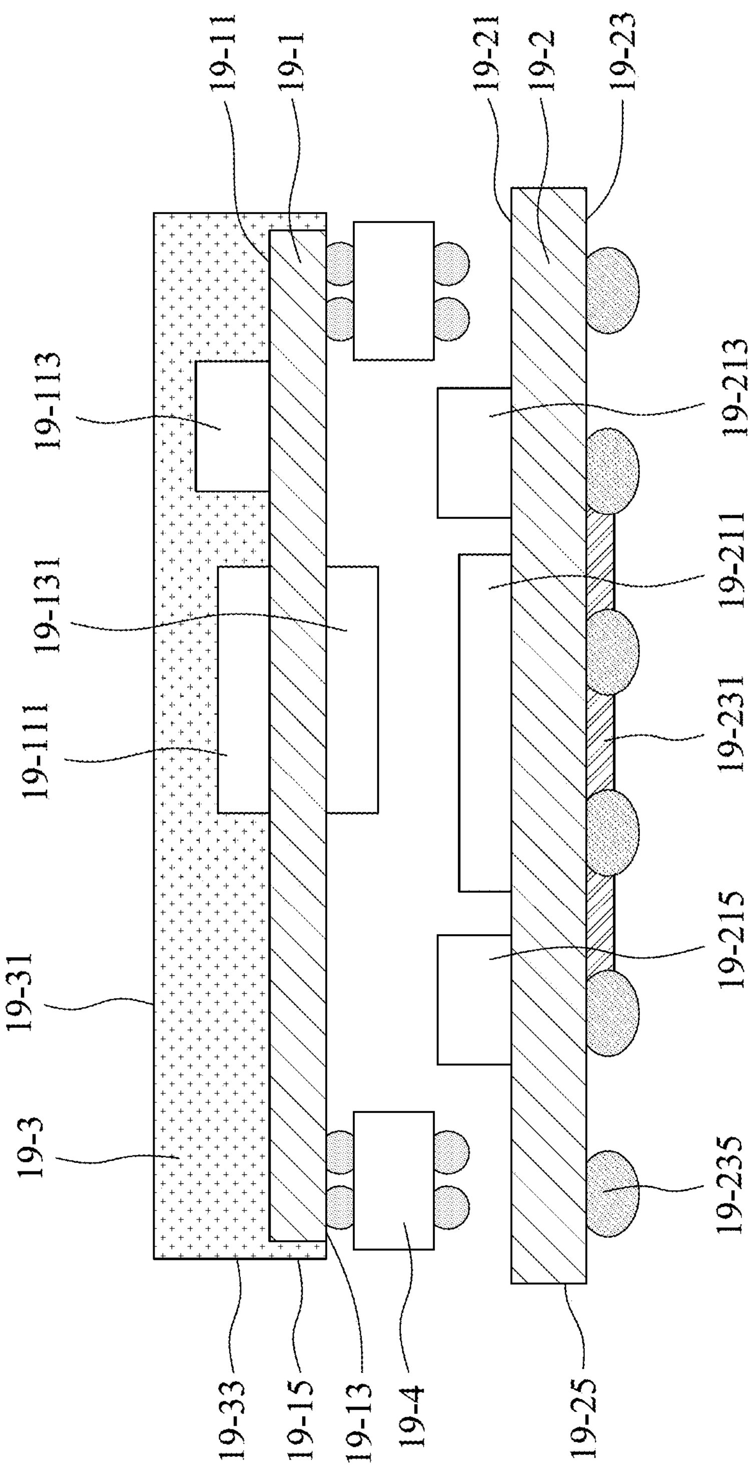

Referring to FIG. 20M, the structure obtained from FIG. 20G may be staked on the structure obtained from FIG. 20L. That is, the substrate 19-1 may be disposed over the substrate 19-2. The surface 19-13 of the substrate 19-1 may face the surface 19-21 of the substrate 19-2. The interposer 19-4 may be arranged between the substrate 1-1 and the substrate 19-2. The substrate 19-1 may be electrically connected to the substrate 19-2 through the interposer 19-4. Since the interposer 19-4 may be disposed on the substrate 19-2 and support the substrate 19-1, the electronic component 19-131 disposed on the surface 19-13 of the substrate 19-1 and the electronic component 19-211 disposed on the surface 19-21 of the substrate 19-2 may be spaced apart from by a distance.

Figure 20N:
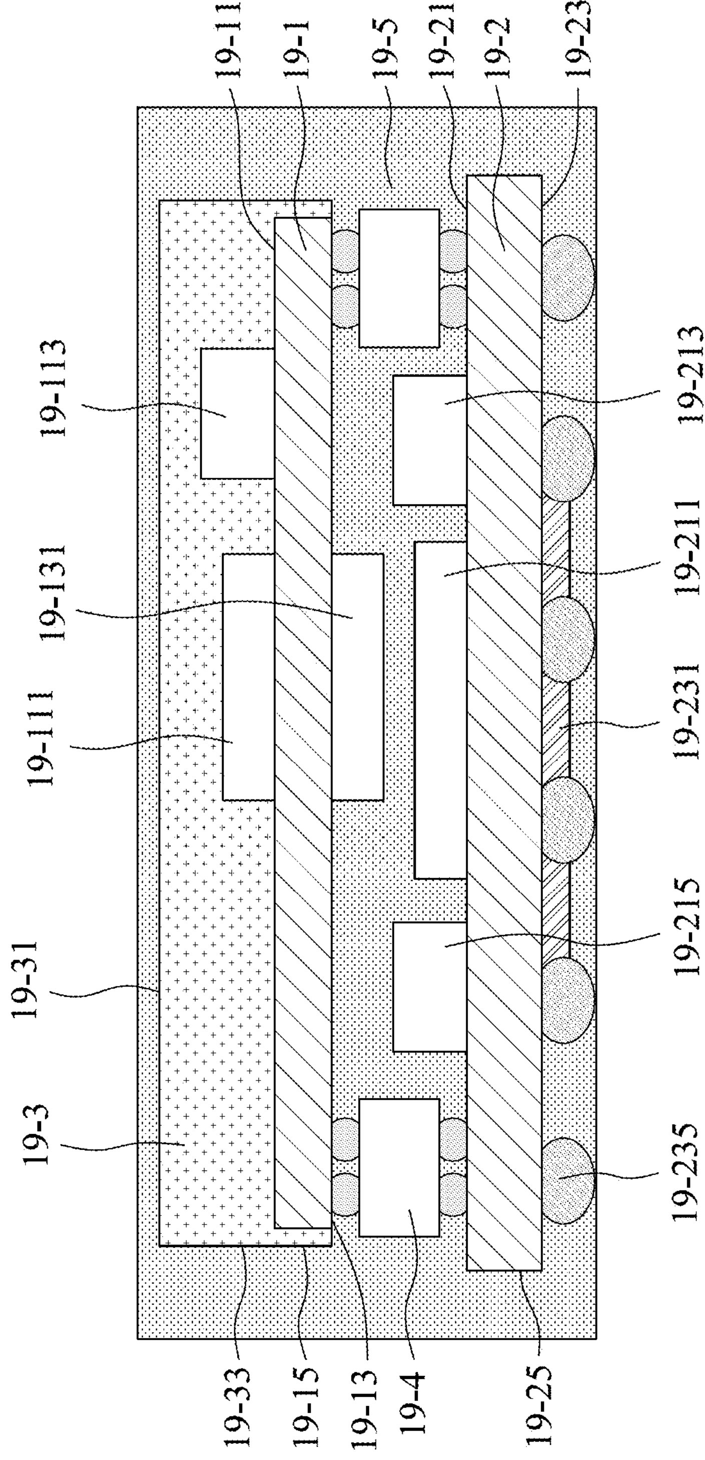

Referring to FIG. 20N, the encapsulant 19-5 is provided. The encapsulant 119-5 may cover the surface 19-21 and the surface 19-23 of the substrate 19-2, the surface 19-13 of the substrate 19-1, the electronic component 19-131, the electronic components 19-211, 19-213, 19-215, the electronic component 19-231, the electrical connections 19-235 and the interposers 19-4. The encapsulant 19-5 may cover the lateral surface 19-33 of the encapsulant 19-3. The encapsulant 19-5 may cover the lateral surface 19-25 of the substrate 19-2.

Figure 20O:
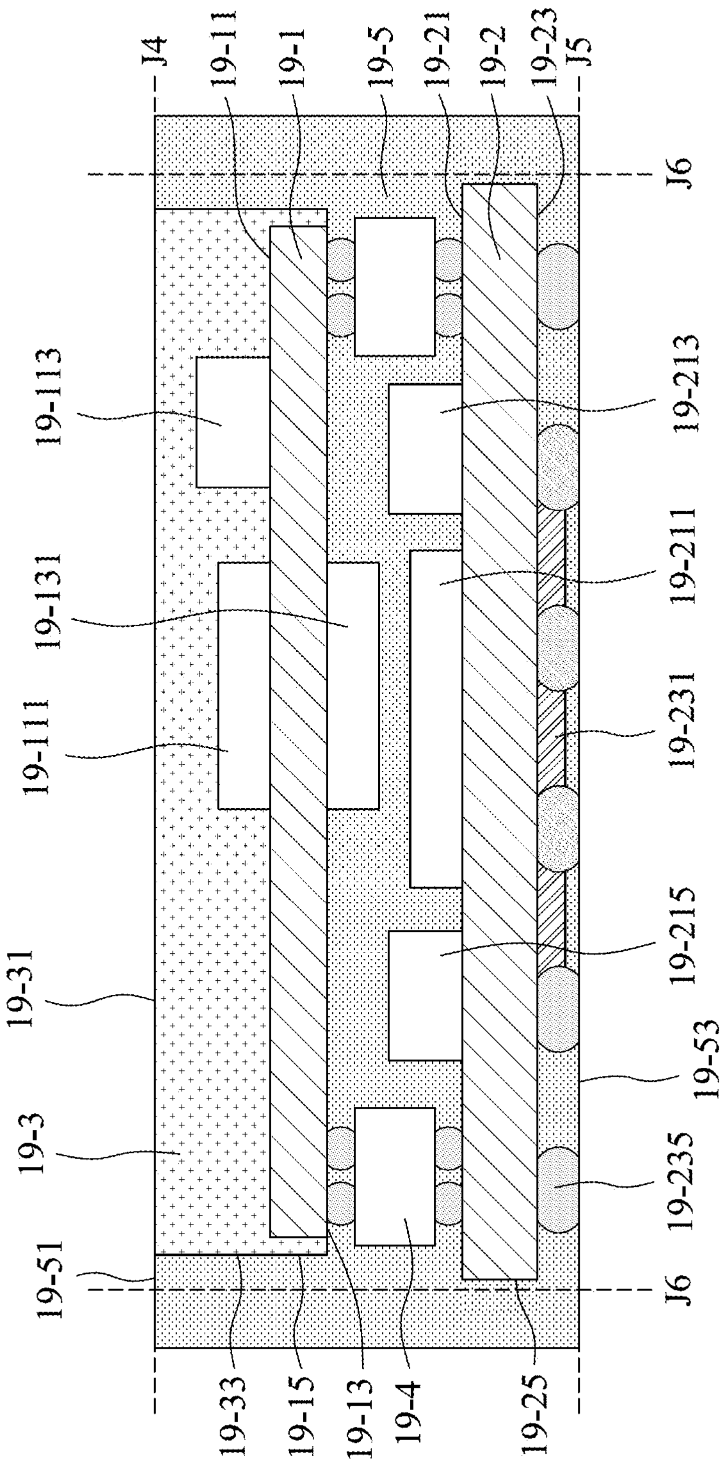

Referring to FIG. 20O, a grinding process is conducted to cut along the imaginary line "J4" through the encapsulant 19-3 and the encapsulant 19-5, and thus the upper surface 19-31 of the encapsulant 19-3 is exposed from the upper surface 19-51 of the encapsulant 19-5. Moreover, another grinding process is conducted to cut along the imaginary line "J5" through the encapsulant 19-5 and the electrical connections 19-235, and thus the electrical connections 19-235 are exposed from the lower surface 19-53 of the encapsulant 19-5. Further, a singulation process is conducted to cut along the imaginary line "J6" through the encapsulants 19-5, and thus forming the semiconductor device package structure 19 as shown in FIG. 19.

Figure 21:
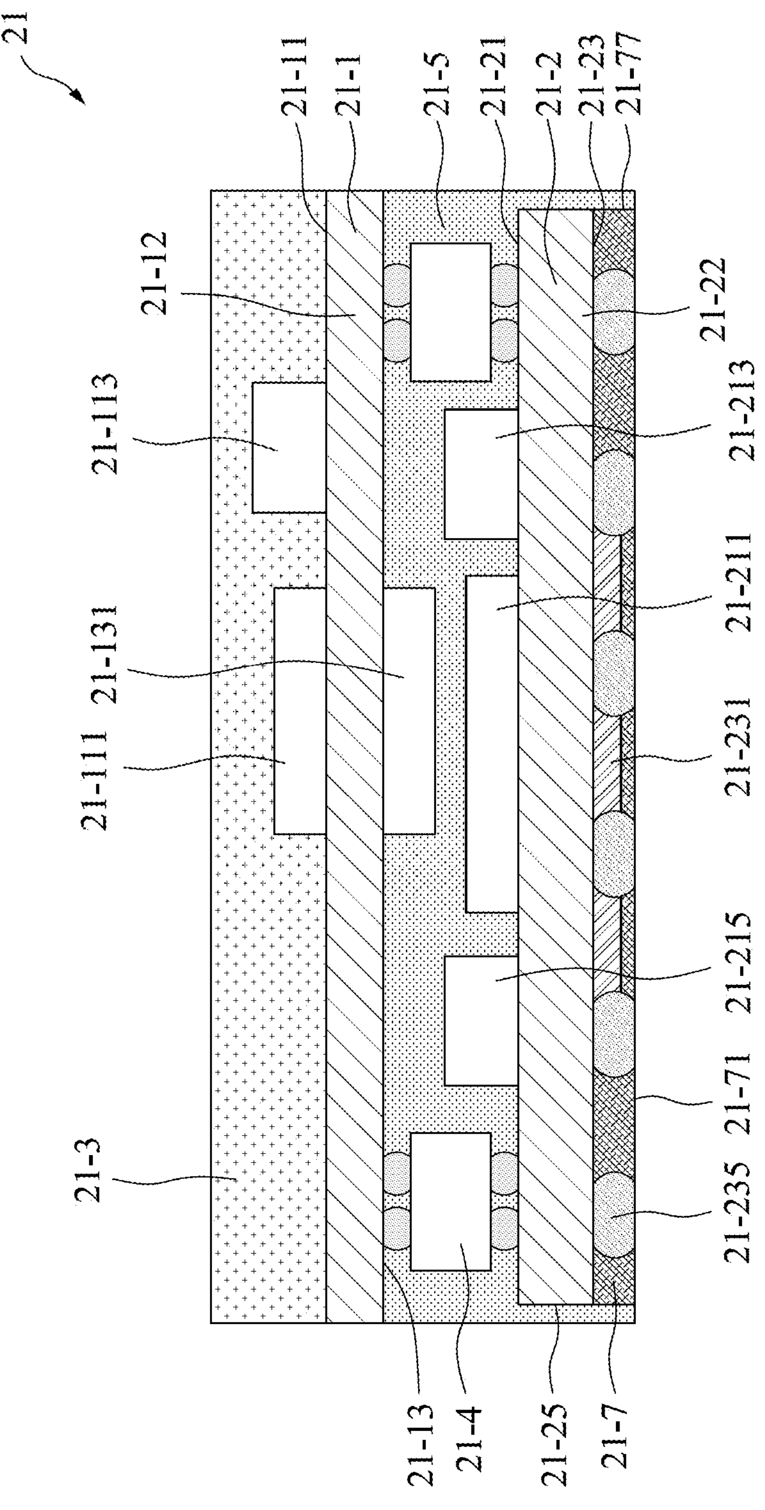
FIG. 21 is a cross-sectional view of a semiconductor device package in accordance with an embodiment of the instant disclosure.

FIG. 21 is a cross-sectional view of a semiconductor device package 21 in accordance with some embodiments of the present disclosure. As shown in FIG. 21, the semiconductor device package 21 may be a three-dimensional (3D) stacked semiconductor device package. The semiconductor device package 21 may include substrates 21-1, 21-2, electronic components 21-111, 21-113, 21-131, 21-211, 21-213, 21-215 and 21-231, encapsulants 21-3, 21-5, 21-7, interposers 21-4 and electrical connections 21-235. The substrate 21-1 may be a coreless substrate and may include traces, pads or interconnections for electrical connection. The substrate 21-2 may be a core substrate or a core-less substrate and may include traces, pads or interconnections for electrical connection. Further, the substrate 21-1 may disposed over and/or above the substrate 21-2.

Referring to FIG. 21, the substrate 21-1 has a surface 21-11 (e.g., an upper surface) and a surface 21-13 (e.g., a lower surface). The electronic components 21-111, 21-113 may be disposed or mounted on the surface 21-11 of the substrate 21-1. The electronic components 21-111, 21-113 may be a die, an active device, a passive device, and/or other electronic devices. In some embodiments of the present disclosure, the electronic components 21-111, 21-113 electrically connects the substrate 21-1 via electrical connections. In some embodiments of the present disclosure, the electronic component 21-111 may include a flash memory device. Further, the electronic component 21-131 may be disposed or mounted on the surface 21-13 of the substrate 21-1. The electronic component 21-131 may be a die, an active device, a passive device, and/or other electronic devices. In some embodiments of the present disclosure, the electronic component 21-131 electrically connects the substrate 21-1 via electrical connections. In some embodiments of the present disclosure, the electronic component 21-131 may include a flash memory device. In some embodiments of the present disclosure, a thickness of the substrate 21-2 is substantially greater than a thickness of the substrate 21-1. In some embodiments of the present disclosure, a thickness a dielectric layer 21-22 of the substrate 21-2 is substantially greater than a thickness of a dielectric layer 21-12 of the substrate 21-1. In some embodiments of the present disclosure, a cross-sectional width of the substrate 21-1 is greater than a cross-sectional width of the substrate 21-2. In some embodiments of the present disclosure, a hardness of the substrate 21-2 is substantially greater than a hardness of the substrate 21-1.

The substrate 21-2 has a surface 21-21 (e.g., an upper surface) and a surface 21-23 (e.g., a lower surface). The electronic components 21-211, 21-213, 21-215 may be disposed or mounted on the surface 21-21 of the substrate 21-2. The electronic components 21-211, 21-213, 21-215 may be a die, an active device, a passive device, and/or other electronic devices. In some embodiments of the present disclosure, the electronic components 21-211, 21-213, 21-215 electrically connects the substrate 21-2 via electrical connections. Further, the electronic component 21-231 may be disposed or mounted on the surface 21-23 of the substrate 21-2. The electronic component 21-231 may be a die, an active device, a passive device, and/or other electronic devices. In some embodiments of the present disclosure, the electronic component 21-231 electrically connects the substrate 21-2 via electrical connections. In some embodiments of the present disclosure, a thickness of the electronic components 21-231 is the thinnest among other components in the semiconductor device package 21. Moreover, a plurality of the electrical connections 21-235 are disposed or mounted on the surface 21-23 of the substrate 21-2. In some embodiments of the present disclosure, the electrical connection 21-235 includes a reflowable material. In some embodiments of the present disclosure, the electrical connection 21-235 includes solder material. The electrical connection 21-235 may include a solder ball. The electrical connection 21-235 may include a conductive pillar, post, or substrate interposer.

The interposers 21-4 may be disposed or mounted on the surface 21-13 of the substrate 21-1 and the surface 21-21 of the substrate 21-2. That is, the interposer 21-4 may be arranged between the substrate 21-1 and the substrate 21-2, and thus the interposer 21-4 may define a space between the substrate 21-1 and 21-2. In some embodiments of the present disclosure, an amount of the electronic components within the space between the substrate 21-1 and the substrate 21-2 and/or defined by the interposer 21-4, such as the electronic components, 21-131, 21-211, 21-213, 21-215, is greater than an amount of the electronic components outside of the space between the substrate 21-1 and the substrate 21-2 and/or defined by the interposer 21-4, such as the electronic components, 21-111, 21-113, 21-231. In some embodiments of the present disclosure, a distance between the adjacent electronic components within the space between the substrate 21-1 and the substrate 21-2 and/or defined by the interposer 21-4, such as the electronic components, 21-131, 21-211, 21-213, 21-215, is smaller than a distance between the adjacent electronic components outside of the space between the substrate 21-1 and the substrate 21-2 and/or defined by the interposer 21-4, such as the electronic components, 21-111, 21-113, 21-231. In some embodiments of the present disclosure, a density of the electronic components within the space between the substrate 21-1 and the substrate 21-2 and/or defined by the interposer 21-4, such as the electronic components, 21-131, 21-211, 21-213, 21-215, is greater than a density of the electronic components outside of the space between the substrate 21-1 and the substrate 21-2 and/or defined by the interposer 21-4, such as the electronic components, 21-111, 21-113, 21-231. Moreover, the interposer 21-4 may electrically connect the substrate 21-1 and the substrate 21-2 via electrical connections. In some embodiments of the present disclosure, such electrical connection includes a solder material. In some embodiments of the present disclosure, the interposer 21-4 includes a substrate interposer with redistribution layers and/or conductive vias.

The encapsulant 21-3 is disposed on the surface 21-11 of the substrate 21-1. The encapsulant 21-3 may cover the surface 21-11 of the substrate 21-1 and the electronic components 21-111 and 21-113 disposed on the surface 21-11 of the substrate 21-1. The encapsulant 21-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 21-3 may include a molding underfill (MUF) or a capillary underfill (CUF).

As above-mentioned, the substrate 21-1 may be a coreless substrate, and thus the substrate 21-1 may have a relatively thin thickness and/or a relatively weak stiffness. Therefore, when the electronic components, such as the electronic components, 21-111, 21-113, 21-131, are mounted on the substrate 21-1, the total weight of the electronic components may cause the substrate 21-1 to collapse. That is, the substrate 21-1 may be bended or recessed toward the substrate 21-2 due to the weights of the electronic components 21-111, 21-113, 21-131, and the electronic component 21-131 on the surface 21-13 of the substrate 21-1 may collide with the electronic component 21-211 on the surface of the substrate 21-2 and under the electronic component 21-131. The encapsulant 21-3 may be a reinforcement structure which is configured to improve the strength of the substrate 21-1 such that the substrate 21-1 is strong enough to support the electronic components 21-111, 21-113, 21-131 mounted thereon. Given the above, the encapsulant 21-3 may be configured to prevent the substrate 21-1 from collapsing and being bended or recessed toward the substrate 21-2. That is, the encapsulant 21-3 is configured to define a space between the electronic component 21-131 on the surface 21-13 of the substrate 21-1 and the electronic component 21-211 on the surface 21-21 of the substrate 21-2, and thus the electronic component 21-131 and the electronic component 21-211 may be maintained to be spaced apart from each other by a distance. In some embodiments of the present disclosure, the encapsulant 21-3 is a warpage-resistant layer configured to prevent the warpage of the substrate 21-1.

The encapsulant 21-5 may cover the surface 21-21 of the substrate 21-2, the electronic components 21-211, 21-213, 21-215 disposed on the surface 21-21 of the substrate 21-2, the surface 21-13 of the substrate 21-1, the electronic component 21-131 disposed on the surface 21-13 of the substrate 21-1 and the interposers 21-4. The encapsulant 21-5 may cover a lateral surface 21-25 of the substrate 21-2. The encapsulant 21-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 21-5 may include a molding underfill (MUF) or a capillary underfill (CUF).

The encapsulant 21-7 is disposed on the surface 21-23 of the substrate 21-2. The encapsulant 21-7 may cover the surface 21-23 of the substrate 21-2 and the electronic component 21-231 and the electrical connections 21-235 disposed on the surface 21-23 of the substrate 21-2. The encapsulant 21-7 may have a lower surface 21-71 covering the electronic component 21-231. In some embodiments of the present disclosure, a lower surface of the electronic component 21-231 is exposed from the lower surface 21-71 of the encapsulant 21-7. The electrical connections 21-235 may be exposed from the lower surface 21-71 of the encapsulant 21-7. The encapsulant 21-7 may have a lateral surface 21-77 which is covered by the encapsulant 21-5. The encapsulant 21-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 21-7 may include a molding underfill (MUF) or a capillary underfill (CUF). In some embodiments of the present disclosure, a thickness of the encapsulant 21-7 is the thinnest among other encapsulants 21-3, 21-5 in the semiconductor device package 21.

In some embodiments of the present disclosure, the material of the encapsulant 21-3 is substantially identical to the material of the encapsulant 21-5, and/or the material of the encapsulant 21-5 is substantially identical to the material of the encapsulant 21-7, and/or the material of the encapsulant 21-3 is substantially identical to the material of the encapsulant 21-7. In some embodiments of the present disclosure, the material of the encapsulant 21-3 is different from the material of the encapsulant 21-5, and/or the material of the encapsulant 21-5 is different from the material of the encapsulant 21-7, and/or the material of the encapsulant 21-3 is different from the material of the encapsulant 21-7. In some embodiments of the present disclosure, the CTE (coefficient of thermal expansion) of the substrate 21-1 is substantially equal to the CTE of the encapsulant 21-3. In some embodiments of the present disclosure, the CTE of the encapsulant 21-5 is substantially equal to or smaller than the CTE of the encapsulant 21-7. In some embodiments of the present disclosure, the difference between the CTE of substrate 21-1 and the CTE of the encapsulant 21-7 is less than the difference between the CTE of substrate 21-1 and the CTE of the encapsulant 21-5 or the difference between the CTE of encapsulant 21-5 and the CTE of the encapsulant 21-7.

In some embodiments of the present disclosure, the substrate 21-1 is the same as, or similar to, the substrate 1-1 as shown in FIGS. 1B and 1C. That is, the substrate 21-1 may include the interconnection which may have the via tapered from the surface 21-11 toward the surface 21-13 or tapered from the surface 21-13 toward the surface 21-11. In some embodiments of the present disclosure, the substrate 21-1 is the same as, or similar to, the substrate 1-1 as shown in FIG. 1D. That is, the substrate 21-1 may include dielectric layers as shown in FIG. 1D.

FIG. 22A, FIG. 22B, FIG. 22C, FIG. 22D, FIG. 22E, FIG. 22F, FIG. 22G, FIG. 22H, FIG. 22I and FIG. 22J illustrate a method of manufacturing a semiconductor device package in accordance with another embodiment of the instant disclosure.

Figures 22A, 22B:
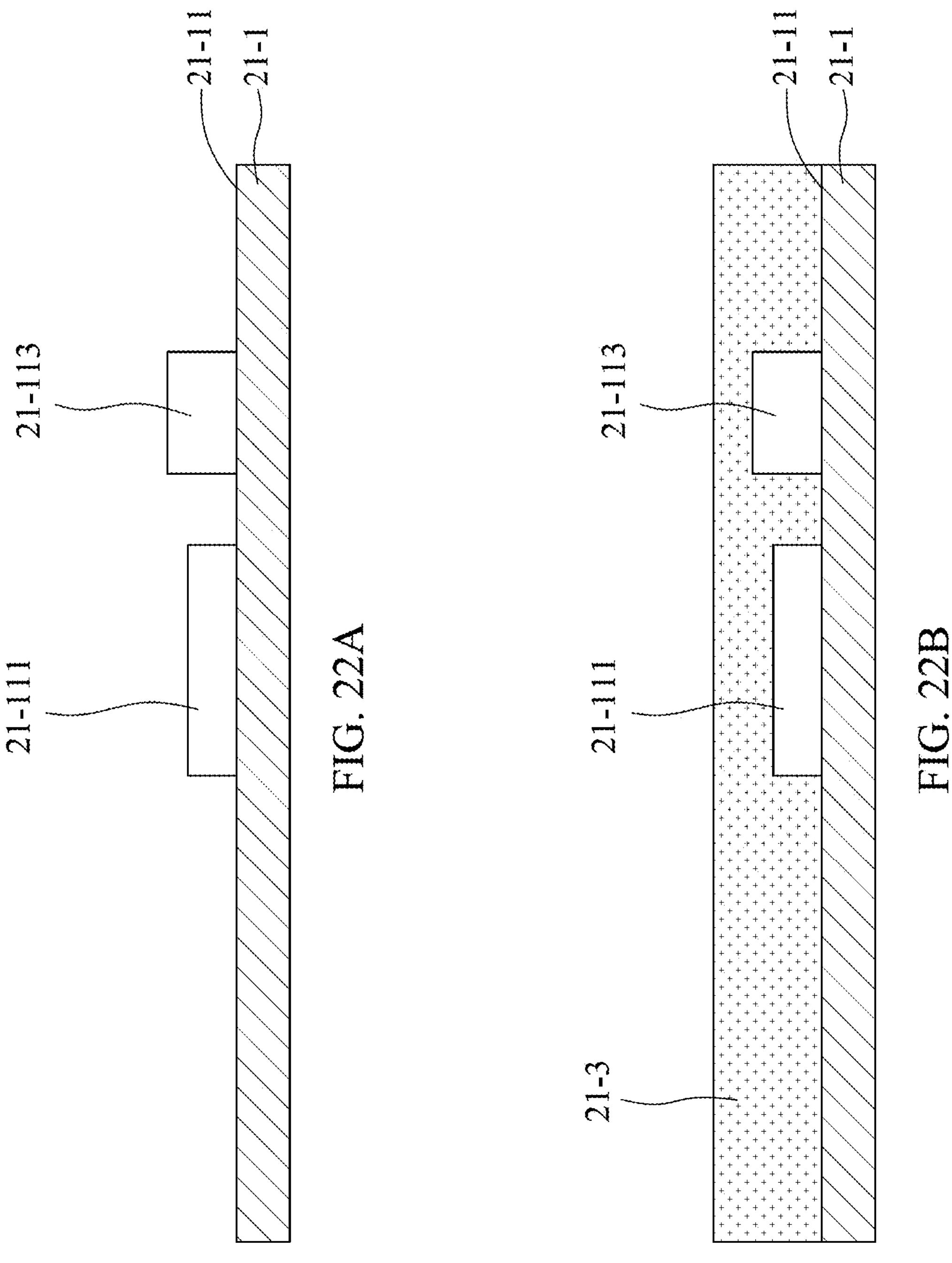
FIG. 22A, FIG. 22B, FIG. 22C, FIG. 22D, FIG. 22E, FIG. 22F, FIG. 22G, FIG. 22H, FIG. 22I and FIG. 22J illustrate a method of manufacturing a semiconductor device package in accordance with another embodiment of the instant disclosure.

Referring to FIG. 22A, the substrate 21-1 with the electronic components 21-111, 21-113 is provided. The electronic elements 21-111 and 21-113 may be disposed or mounted on the surface 21-11 of the substrate 21-1 and electrically connected to the interconnection of the substrate 21-1.

Referring to FIG. 22B, the encapsulant 21-3 is provided. The encapsulant 21-3 may be formed on the surface 21-11 of the substrate 21-1. The encapsulant 21-3 may cover the surface 21-11 of the substrate 21-1 and the electronic components 21-111, 21-113.

Figures 22C, 22D:
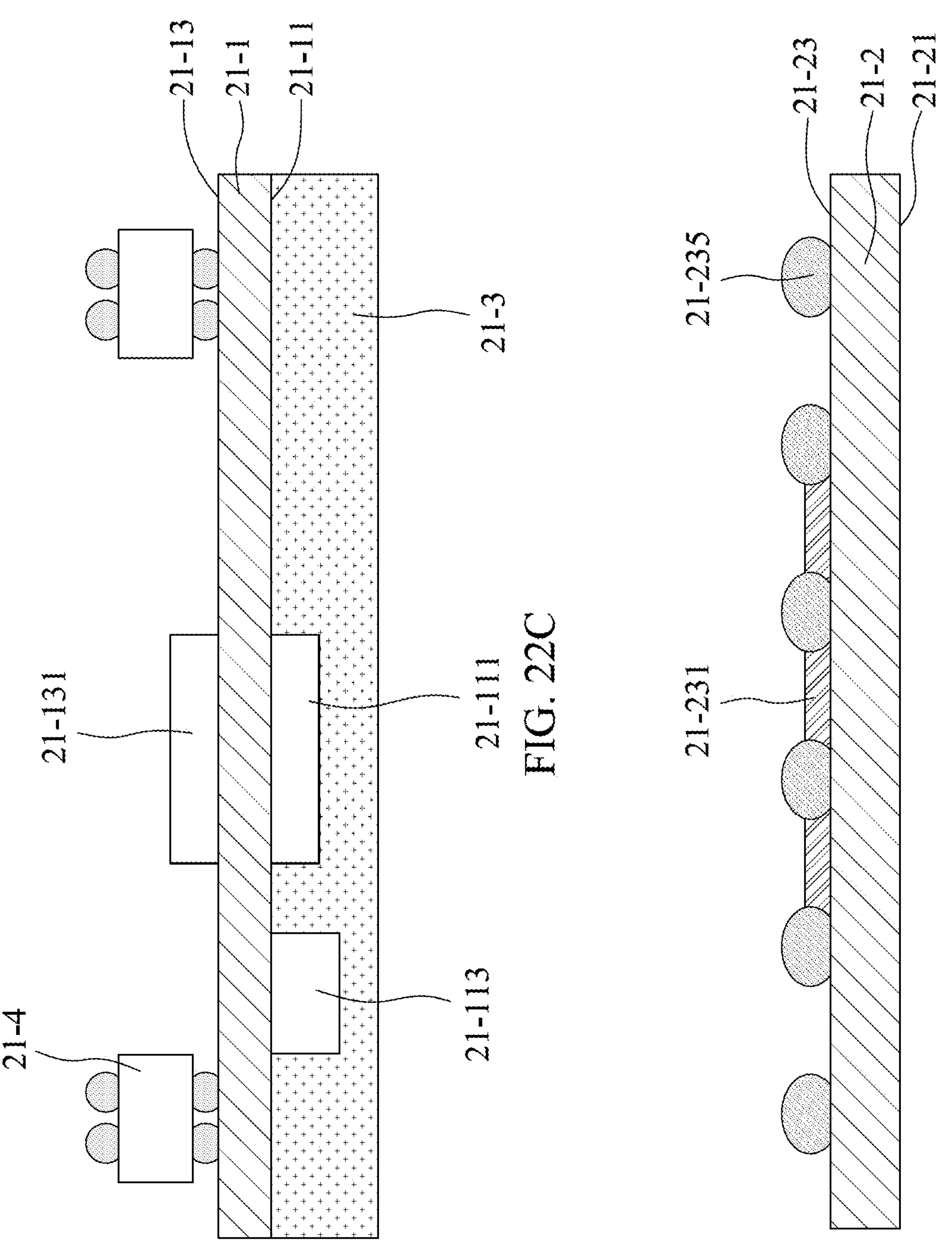

Referring to FIG. 22C, the structure obtained from FIG. 22B may be reversed upside down. The interposers 21-4 and the electronic component 21-131 may be disposed or mounted on the surface 21-13 of the substrate 21-1 and electrically connected to the interconnection of the substrate 21-1.

Referring to FIG. 22D, the substrate 21-2 with the electronic component 21-231 and electrical connections 21-235 is provided. The electronic element 21-231 and the electrical connections 21-235 may be disposed or mounted on the surface 21-23 of the substrate 21-2 and electrically connected to the interconnection of the substrate 21-2.

Figures 22E, 22F:
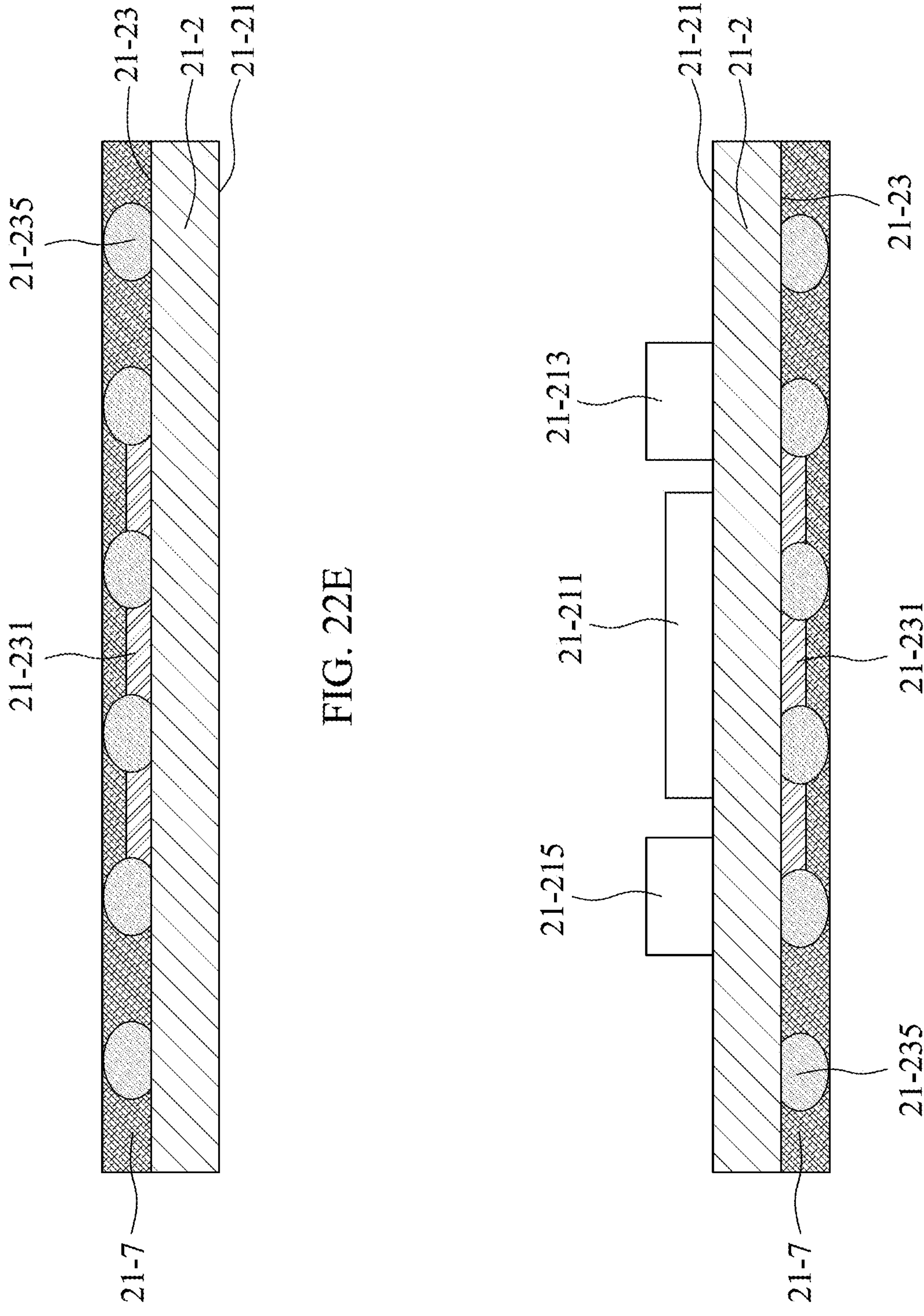

Referring to FIG. 22E, the encapsulant 21-7 is provided. The encapsulant 21-7 may be formed on the surface 21-23 of the substrate 21-2. The encapsulant 21-7 may cover the surface 21-23 of the substrate 21-2, the electronic component 21-231 and the electrical connections 21-235.

Referring to FIG. 22F, the structure obtained from FIG. 22E may be reversed upside down. The electronic elements 21-211, 21-213 and 21-215 may be disposed or mounted on the surface 21-21 of the substrate 21-2 and electrically connected to the interconnection of the substrate 21-2.

Figure 22G:
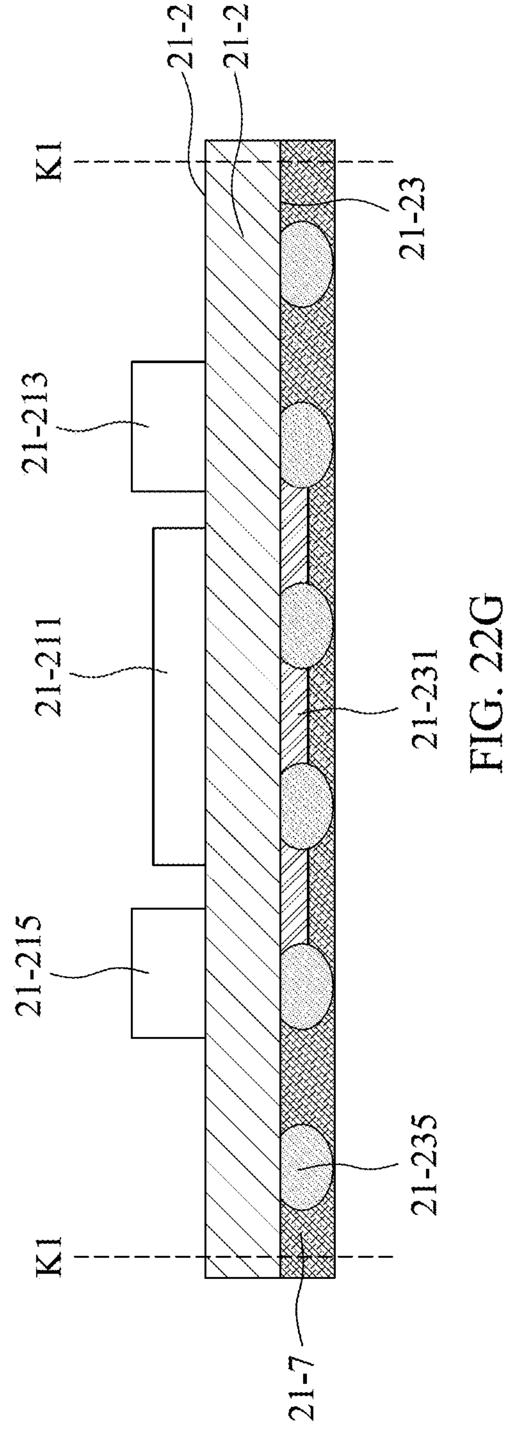

Referring to FIG. 22G, a singulation process is conducted to cut along the imaginary line "K1" through the substrate 21-2 and the encapsulant 21-7.

Figure 22H:
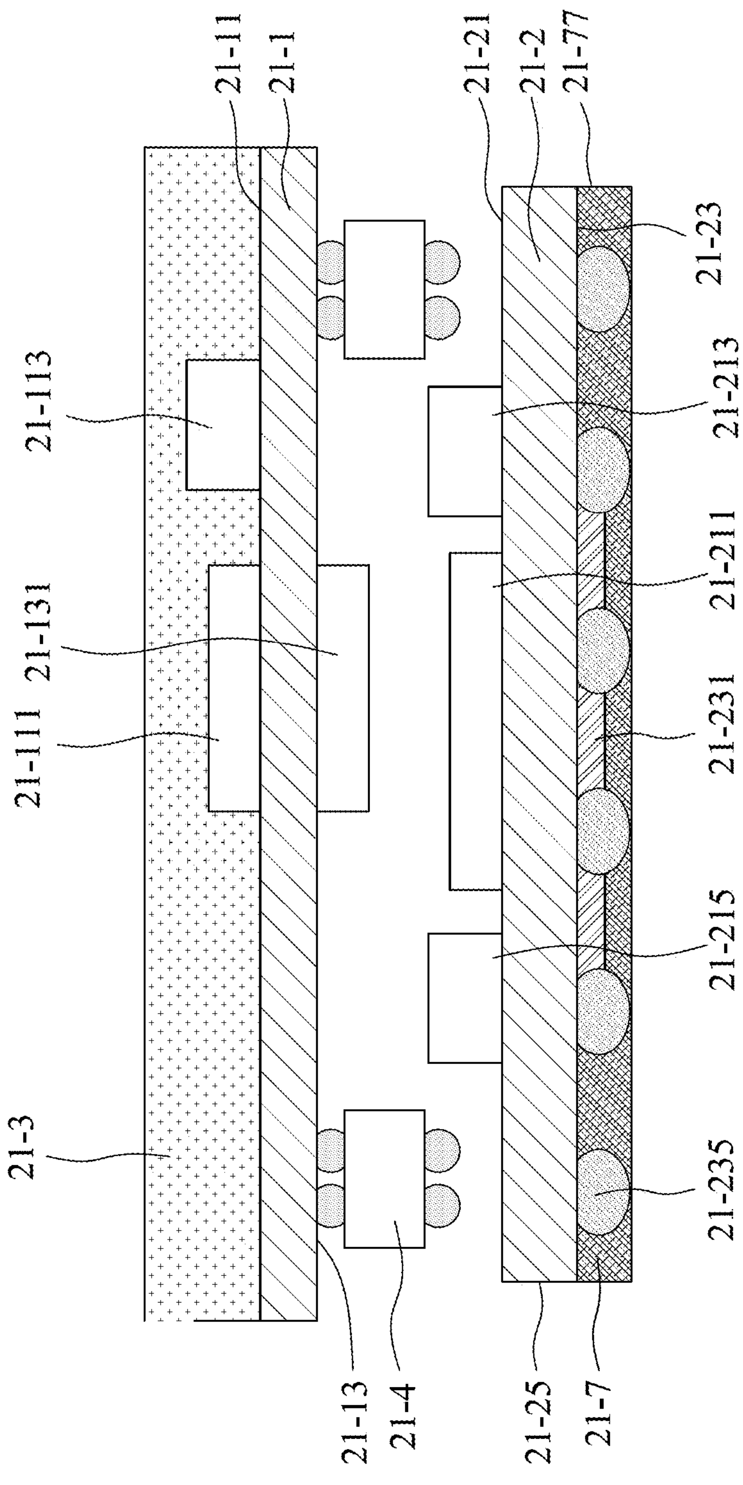

Referring to FIG. 22H, the structure obtained from FIG. 22C may be staked on the structure obtained from FIG. 22G. That is, the substrate 21-1 may be disposed over the substrate 21-2. The surface 21-13 of the substrate 21-1 may face the surface 21-21 of the substrate 21-2. The interposer 21-4 may be arranged between the substrate 21-1 and the substrate 21-2. The substrate 21-1 may be electrically connected to the substrate 21-2 through the interposer 21-4. Since the interposer 21-4 may be disposed on the substrate 21-2 and support the substrate 21-1, the electronic component 21-131 disposed on the surface 21-13 of the substrate 21-1 and the electronic component 21-211 disposed on the surface 21-21 of the substrate 21-2 may be spaced apart from by a distance.

Figure 22I:
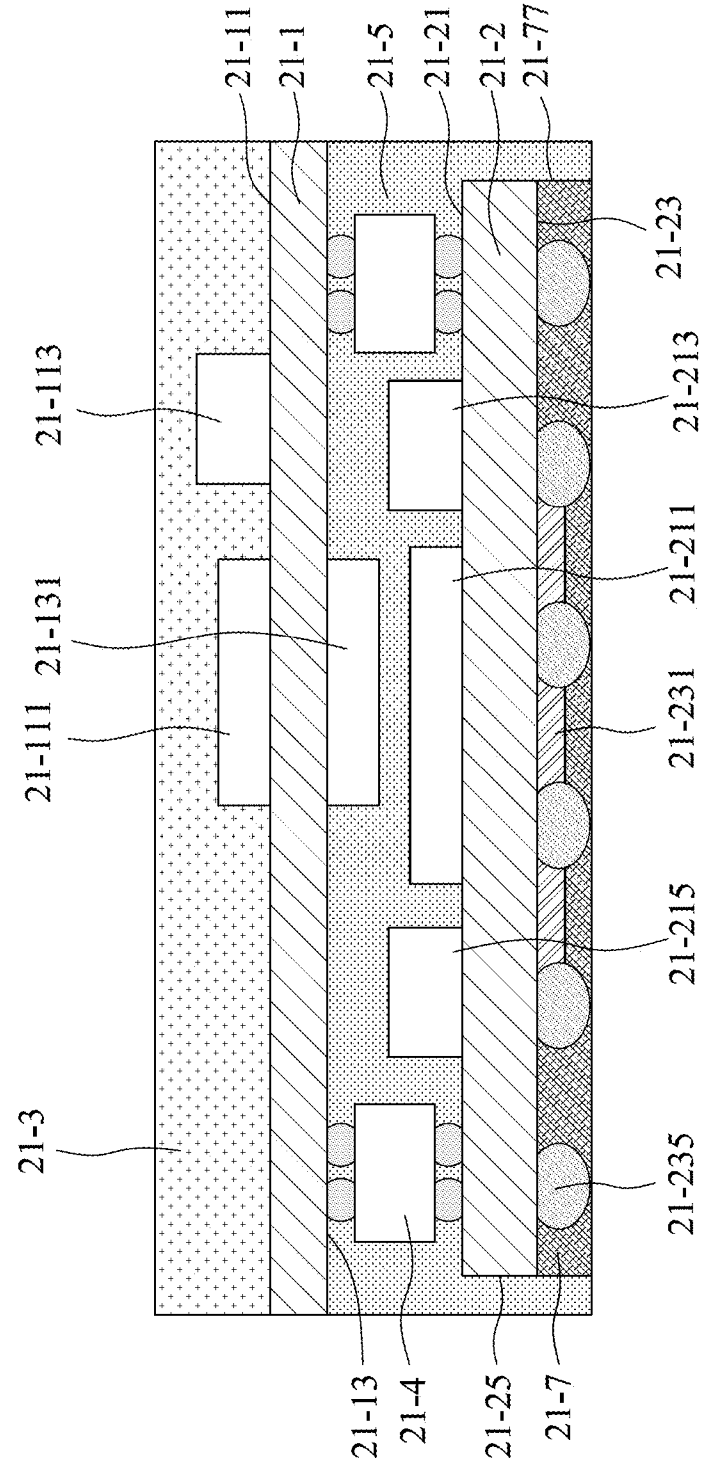

Referring to FIG. 22I, the encapsulant 21-5 is provided. The encapsulant 21-5 may cover the surface 21-21 of the substrate 21-2, the surface 21-13 of the substrate 21-1, the electronic component 21-131, the electronic components 21-211, 21-213, 21-215 and the interposers 21-4. The encapsulant 21-5 may cover the lateral surface 21-25 of the substrate 21-2 and the lateral surface 21-77 of the encapsulant 21-7.

Figure 22J:
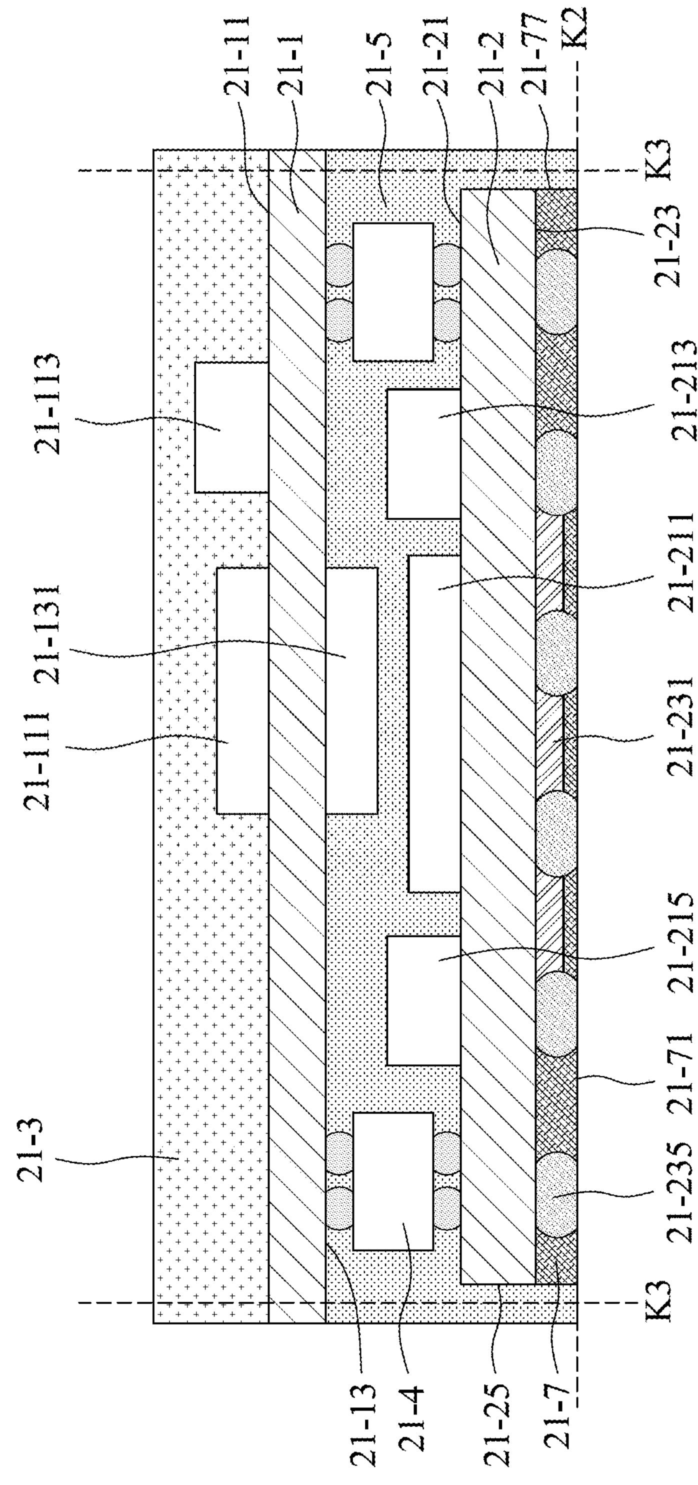

Referring to FIG. 22J, a grinding process is conducted to cut along the imaginary line "K2" through the encapsulant 21-7 and the electrical connections 21-235. After the grinding process, the electrical connections 21-235 may be exposed from the lower surface 21-71 of the encapsulant 21-7. Further, a singulation process is conducted to cut along the imaginary line "K3" through the substrate 21-1 and the encapsulants 21-3 and 21-5, and thus forming the semiconductor device package structure 21 as shown in FIG. 21.

Figure 23:
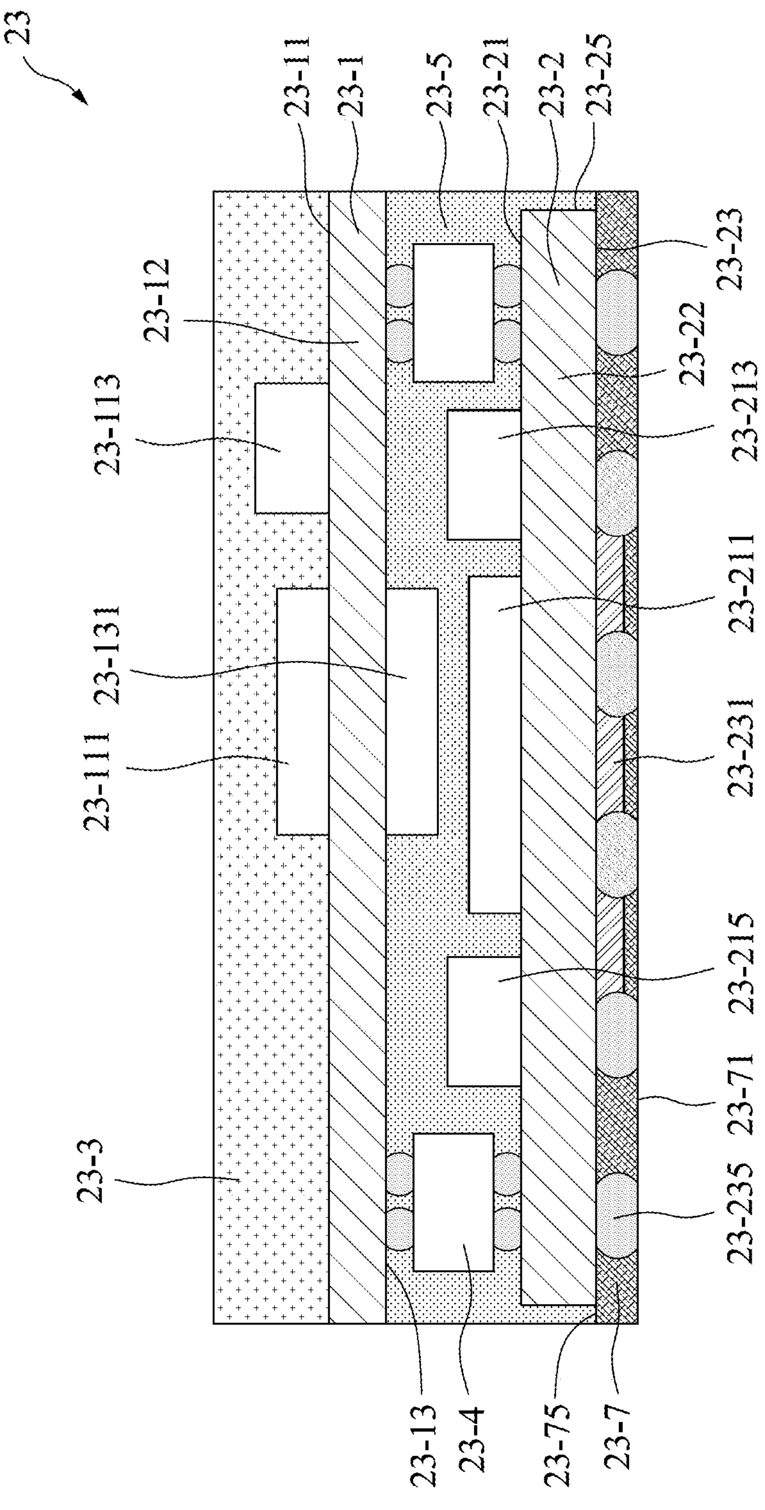
FIG. 23 is a cross-sectional view of a semiconductor device package in accordance with an embodiment of the instant disclosure.

FIG. 23 is a cross-sectional view of a semiconductor device package 23 in accordance with some embodiments of the present disclosure. As shown in FIG. 23, the semiconductor device package 23 may be a three-dimensional (3D) stacked semiconductor device package. The semiconductor device package 23 may include substrates 23-1, 23-2, electronic components 23-111, 23-113, 23-131, 23-211, 23-213, 23-215 and 23-231, encapsulants 23-3, 23-5, 23-7, interposers 23-4 and electrical connections 23-235. The substrate 23-1 may be a coreless substrate and may include traces, pads or interconnections for electrical connection. The substrate 23-2 may be a core substrate or a core-less substrate and may include traces, pads or interconnections for electrical connection. Further, the substrate 23-1 may disposed over and/or above the substrate 23-2.

Referring to FIG. 23, the substrate 23-1 has a surface 23-11 (e.g., an upper surface) and a surface 23-13 (e.g., a lower surface). The electronic components 23-111, 23-113 may be disposed or mounted on the surface 23-11 of the substrate 23-1. The electronic components 23-111, 23-113 may be a die, an active device, a passive device, and/or other electronic devices. In some embodiments of the present disclosure, the electronic components 23-111, 23-113 electrically connects the substrate 23-1 via electrical connections. In some embodiments of the present disclosure, the electronic component 23-111 may include a flash memory device. Further, the electronic component 23-131 may be disposed or mounted on the surface 23-13 of the substrate 23-1. The electronic component 23-131 may be a die, an active device, a passive device, and/or other electronic devices. In some embodiments of the present disclosure, the electronic component 23-131 electrically connects the substrate 23-1 via electrical connections. In some embodiments of the present disclosure, the electronic component 23-131 may include a flash memory device. In some embodiments of the present disclosure, a thickness of the substrate 23-2 is substantially greater than a thickness of the substrate 23-1. In some embodiments of the present disclosure, a thickness a dielectric layer 23-22 of the substrate 23-2 is substantially greater than a thickness of a dielectric layer 23-12 of the substrate 23-1. In some embodiments of the present disclosure, a cross-sectional width of the substrate 23-1 is greater than a cross-sectional width of the substrate 23-2. In some embodiments of the present disclosure, a hardness of the substrate 23-2 is substantially greater than a hardness of the substrate 23-1.

The substrate 23-2 has a surface 23-21 (e.g., an upper surface) and a surface 23-23 (e.g., a lower surface). The electronic components 23-211, 23-213, 23-215 may be disposed or mounted on the surface 23-21 of the substrate 23-2. The electronic components 23-211, 23-213, 23-215 may be a die, an active device, a passive device, and/or other electronic devices. In some embodiments of the present disclosure, the electronic components 23-211, 23-213, 23-215 electrically connects the substrate 23-2 via electrical connections. Further, the electronic component 23-231 may be disposed or mounted on the surface 23-23 of the substrate 23-2. The electronic component 23-231 may be a die, an active device, a passive device, and/or other electronic devices. In some embodiments of the present disclosure, the electronic component 23-231 electrically connects the substrate 23-2 via electrical connections. In some embodiments of the present disclosure, a thickness of the electronic components 23-231 is the thinnest among other components in the semiconductor device package 23. Moreover, a plurality of the electrical connections 23-235 are disposed or mounted on the surface 23-23 of the substrate 23-2. In some embodiments of the present disclosure, the electrical connection 23-235 includes a reflowable material. In some embodiments of the present disclosure, the electrical connection 23-235 includes solder material. The electrical connection 23-235 may include a solder ball. The electrical connection 23-235 may include a conductive pillar, post, or substrate interposer.

The interposers 23-4 may be disposed or mounted on the surface 23-13 of the substrate 23-1 and the surface 23-21 of the substrate 23-2. That is, the interposer 23-4 may be arranged between the substrate 23-1 and the substrate 23-2, and thus the interposer 23-4 may define a space between the substrate 23-1 and 23-2. In some embodiments of the present disclosure, an amount of the electronic components within the space between the substrate 23-1 and the substrate 23-2 and/or defined by the interposer 23-4, such as the electronic components, 23-131, 23-211, 23-213, 23-215, is greater than an amount of the electronic components outside of the space between the substrate 23-1 and the substrate 23-2 and/or defined by the interposer 23-4, such as the electronic components, 23-111, 23-113, 23-231. In some embodiments of the present disclosure, a distance between the adjacent electronic components within the space between the substrate 23-1 and the substrate 23-2 and/or defined by the interposer 23-4, such as the electronic components, 23-131, 23-211, 23-213, 23-215, is smaller than a distance between the adjacent electronic components outside of the space between the substrate 23-1 and the substrate 23-2 and/or defined by the interposer 23-4, such as the electronic components, 23-111, 23-113, 23-231. In some embodiments of the present disclosure, a density of the electronic components within the space between the substrate 23-1 and the substrate 23-2 and/or defined by the interposer 23-4, such as the electronic components, 23-131, 23-211, 23-213, 23-215, is greater than a density of the electronic components outside of the space between the substrate 23-1 and the substrate 23-2 and/or defined by the interposer 23-4, such as the electronic components, 23-111, 23-113, 23-231. Moreover, the interposer 23-4 may electrically connect the substrate 23-1 and the substrate 23-2 via electrical connections. In some embodiments of the present disclosure, such electrical connection includes a solder material. In some embodiments of the present disclosure, the interposer 23-4 includes a substrate interposer with redistribution layers and/or conductive vias.

The encapsulant 23-3 is disposed on the surface 23-11 of the substrate 23-1. The encapsulant 23-3 may cover the surface 23-11 of the substrate 23-1 and the electronic components 23-111 and 23-113 disposed on the surface 23-11 of the substrate 23-1. The encapsulant 23-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 23-3 may include a molding underfill (MUF) or a capillary underfill (CUF).

As above-mentioned, the substrate 23-1 may be a coreless substrate, and thus the substrate 23-1 may have a relatively thin thickness and/or a relatively weak stiffness. Therefore, when the electronic components, such as the electronic components, 23-111, 23-113, 23-131, are mounted on the substrate 23-1, the total weight of the electronic components may cause the substrate 23-1 to collapse. That is, the substrate 23-1 may be bended or recessed toward the substrate 23-2 due to the weights of the electronic components 23-111, 23-113, 23-131, and the electronic component 23-131 on the surface 23-13 of the substrate 23-1 may collide with the electronic component 23-211 on the surface of the substrate 23-2 and under the electronic component 23-131. The encapsulant 23-3 may be a reinforcement structure which is configured to improve the strength of the substrate 23-1 such that the substrate 23-1 is strong enough to support the electronic components 23-111, 23-113, 23-131 mounted thereon. Given the above, the encapsulant 23-3 may be configured to prevent the substrate 23-1 from collapsing and being bended or recessed toward the substrate 23-2. That is, the encapsulant 23-3 is configured to define a space between the electronic component 23-131 on the surface 23-13 of the substrate 23-1 and the electronic component 23-211 on the surface 23-21 of the substrate 23-2, and thus the electronic component 23-131 and the electronic component 23-211 may be maintained to be spaced apart from each other by a distance. In some embodiments of the present disclosure, the encapsulant 23-3 is a warpage-resistant layer configured to prevent the warpage of the substrate 23-1.

The encapsulant 23-5 may cover the surface 23-21 of the substrate 23-2, the electronic components 23-211, 23-213, 23-215 disposed on the surface 23-21 of the substrate 23-2, the surface 23-13 of the substrate 23-1, the electronic component 23-131 disposed on the surface 23-13 of the substrate 23-1 and the interposers 23-4. The encapsulant 23-5 may cover a lateral surface 23-25 of the substrate 23-2. The encapsulant 23-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 23-5 may include a molding underfill (MUF) or a capillary underfill (CUF).

The encapsulant 23-7 is disposed on the surface 23-23 of the substrate 23-2. The encapsulant 23-7 may cover the surface 23-23 of the substrate 23-2 and the electronic component 23-231 and the electrical connections 23-235 disposed on the surface 23-23 of the substrate 23-2. The encapsulant 23-7 may have a lower surface 23-71 covering the electronic component 23-231. In some embodiments of the present disclosure, a lower surface of the electronic component 23-231 is exposed from the lower surface 23-71 of the encapsulant 23-7. The electrical connections 23-235 may be exposed from the lower surface 23-71 of the encapsulant 23-7. The encapsulant 23-7 may have an upper surface 23-75 which is covered by the encapsulant 23-5. The encapsulant 23-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 23-7 may include a molding underfill (MUF) or a capillary underfill (CUF). In some embodiments of the present disclosure, a thickness of the encapsulant 23-7 is the thinnest among other encapsulants 23-3, 23-5 in the semiconductor device package 23.

In some embodiments of the present disclosure, the material of the encapsulant 23-3 is substantially identical to the material of the encapsulant 23-5, and/or the material of the encapsulant 23-5 is substantially identical to the material of the encapsulant 23-7, and/or the material of the encapsulant 23-3 is substantially identical to the material of the encapsulant 23-7. In some embodiments of the present disclosure, the material of the encapsulant 23-3 is different from the material of the encapsulant 23-5, and/or the material of the encapsulant 23-5 is different from the material of the encapsulant 23-7, and/or the material of the encapsulant 23-3 is different from the material of the encapsulant 23-7. In some embodiments of the present disclosure, the CTE (coefficient of thermal expansion) of the substrate 23-1 is substantially equal to the CTE of the encapsulant 23-3. In some embodiments of the present disclosure, the CTE of the encapsulant 23-5 is substantially equal to or smaller than the CTE of the encapsulant 23-7. In some embodiments of the present disclosure, the difference between the CTE of substrate 23-1 and the CTE of the encapsulant 23-7 is less than the difference between the CTE of substrate 23-1 and the CTE of the encapsulant 23-5 or the difference between the CTE of encapsulant 23-5 and the CTE of the encapsulant 23-7.

In some embodiments of the present disclosure, the substrate 23-1 is the same as, or similar to, the substrate 1-1 as shown in FIGS. 1B and 1C. That is, the substrate 23-1 may include the interconnection which may have the via tapered from the surface 23-11 toward the surface 23-13 or tapered from the surface 23-13 toward the surface 23-11. In some embodiments of the present disclosure, the substrate 23-1 is the same as, or similar to, the substrate 1-1 as shown in FIG. 1D. That is, the substrate 23-1 may include dielectric layers as shown in FIG. 1D.

FIG. 24A, FIG. 24B, FIG. 24C, FIG. 24D, FIG. 24E, FIG. 24F, FIG. 24G, FIG. 24H, FIG. 24I, FIG. 24J, FIG. 24K and FIG. 24L illustrate a method of manufacturing a semiconductor device package 23 in accordance with another embodiment of the instant disclosure.

Figures 24A, 24B:
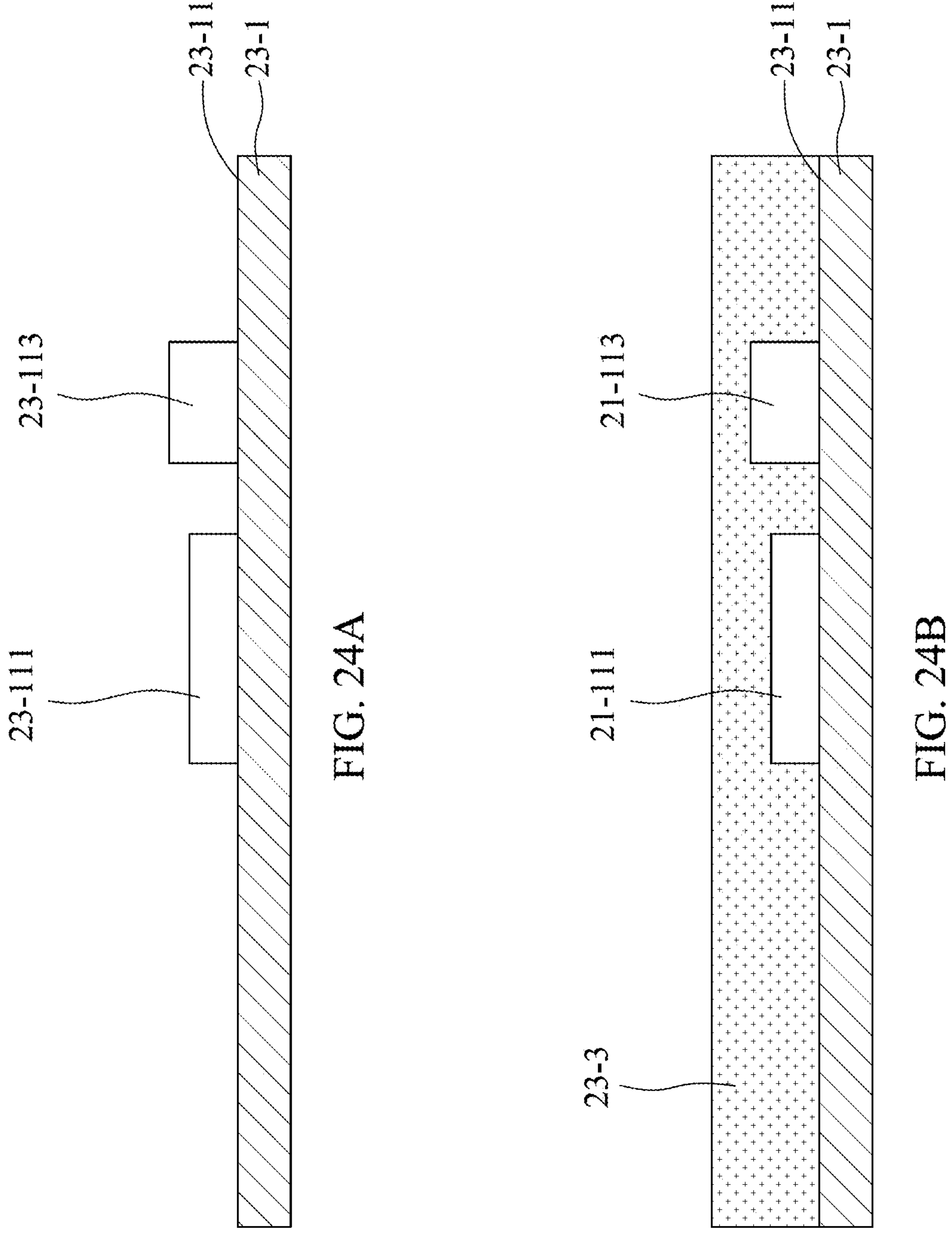
FIG. 24A, FIG. 24B, FIG. 24C, FIG. 24D, FIG. 24E, FIG. 24F, FIG. 24G, FIG. 24H, FIG. 24I, FIG. 24J, FIG. 24K and FIG. 24L illustrate a method of manufacturing a semiconductor device package in accordance with another embodiment of the instant disclosure.

Referring to FIG. 24A, the substrate 23-1 with the electronic components 23-111, 23-113 is provided. The electronic elements 23-111 and 23-113 may be disposed or mounted on the surface 23-11 of the substrate 23-1 and electrically connected to the interconnection of the substrate 23-1.

Referring to FIG. 24B, the encapsulant 23-3 is provided. The encapsulant 23-3 may be formed on the surface 23-11 of the substrate 23-1. The encapsulant 23-3 may cover the surface 23-11 of the substrate 23-1 and the electronic components 23-111, 23-113.

Figures 24C, 24D:
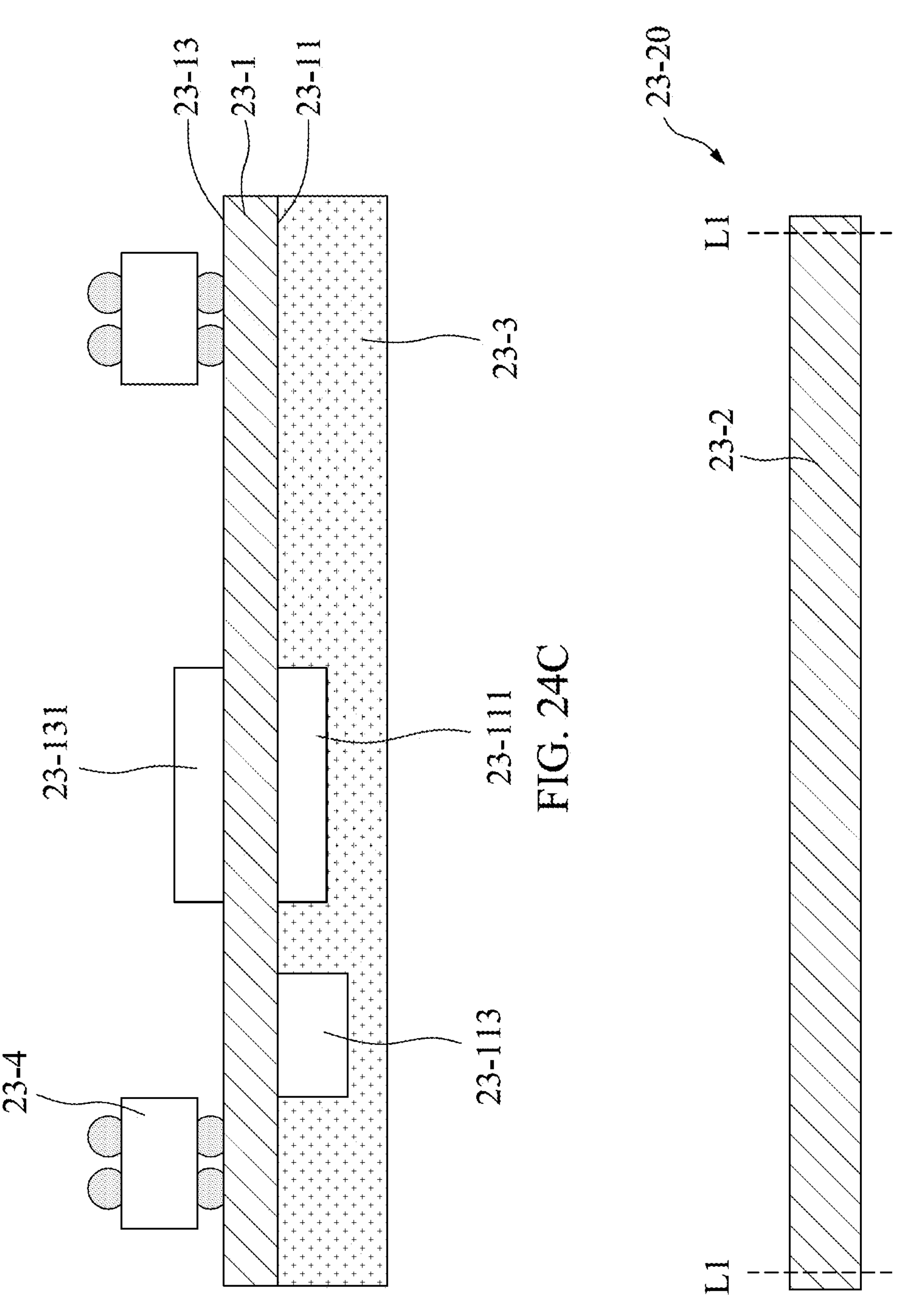

Referring to FIG. 24C, the structure obtained from FIG. 24B may be reversed upside down. The interposers 23-4 and the electronic component 23-131 may be disposed or mounted on the surface 23-13 of the substrate 23-1 and electrically connected to the interconnection of the substrate 23-1.

Referring to FIG. 24D a strip 23-20 is provided and a singulation process is conducted to cut along the imaginary line "L1" through the strip 23-20, and thus forming the substrate 23-2 as shown in FIG. 23.

Figure 24E:
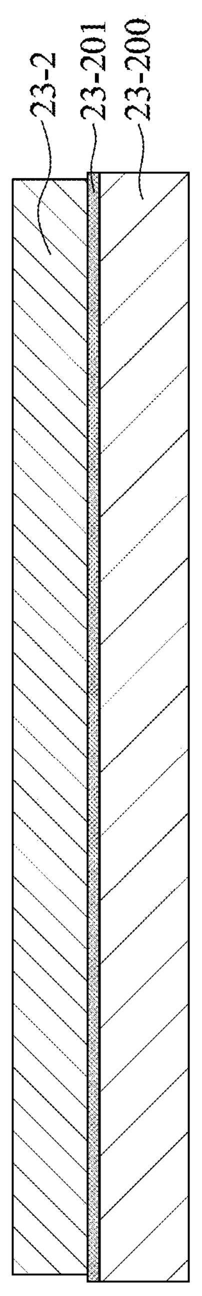

Referring to FIG. 24E, the substrate 23-2 may be arranged on a carrier 23-200 through a tape 23-201. That is, the tape 23-201 may be between the substrate 23-2 and the carrier 23-200.

Figure 24F:
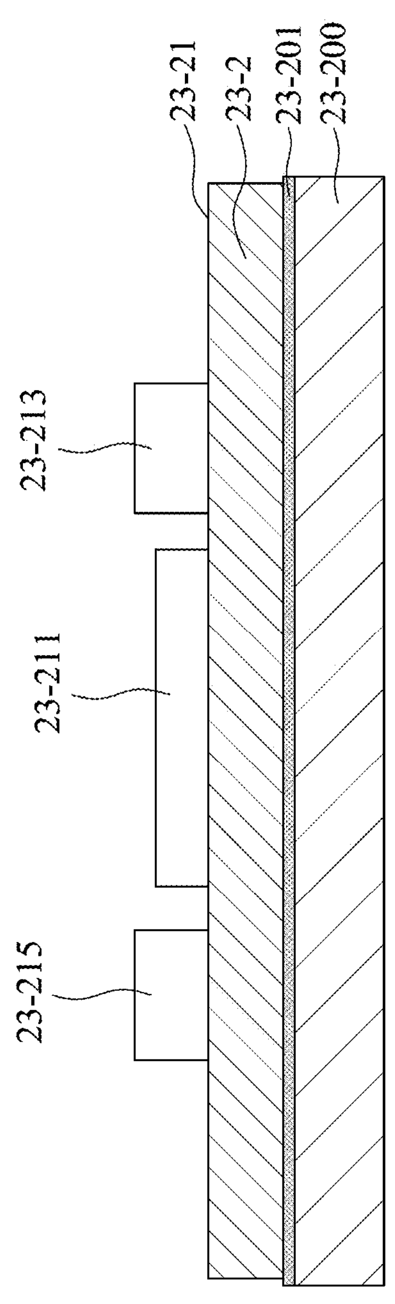

Referring to FIG. 24F, the electronic components 23-211, 23-213, 23-215 may be disposed or mounted on the surface 23-21 of the substrate 23-2 and electrically connected to the interconnection of the substrate 23-2.

Figure 24G:
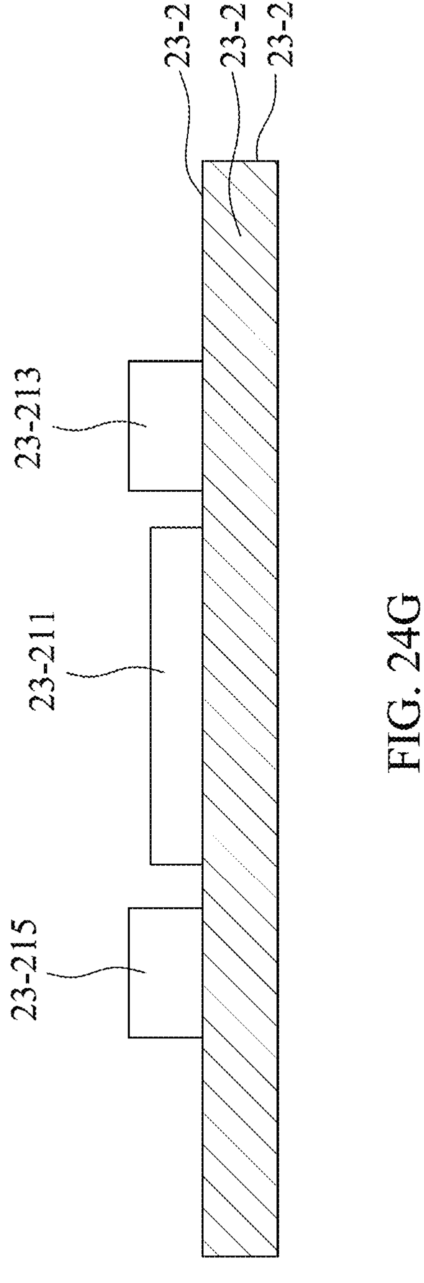

Referring to FIG. 24G, the carrier 23-200 and the tape 23-201 are removed (i.e., de-carrier).

Figure 24H:
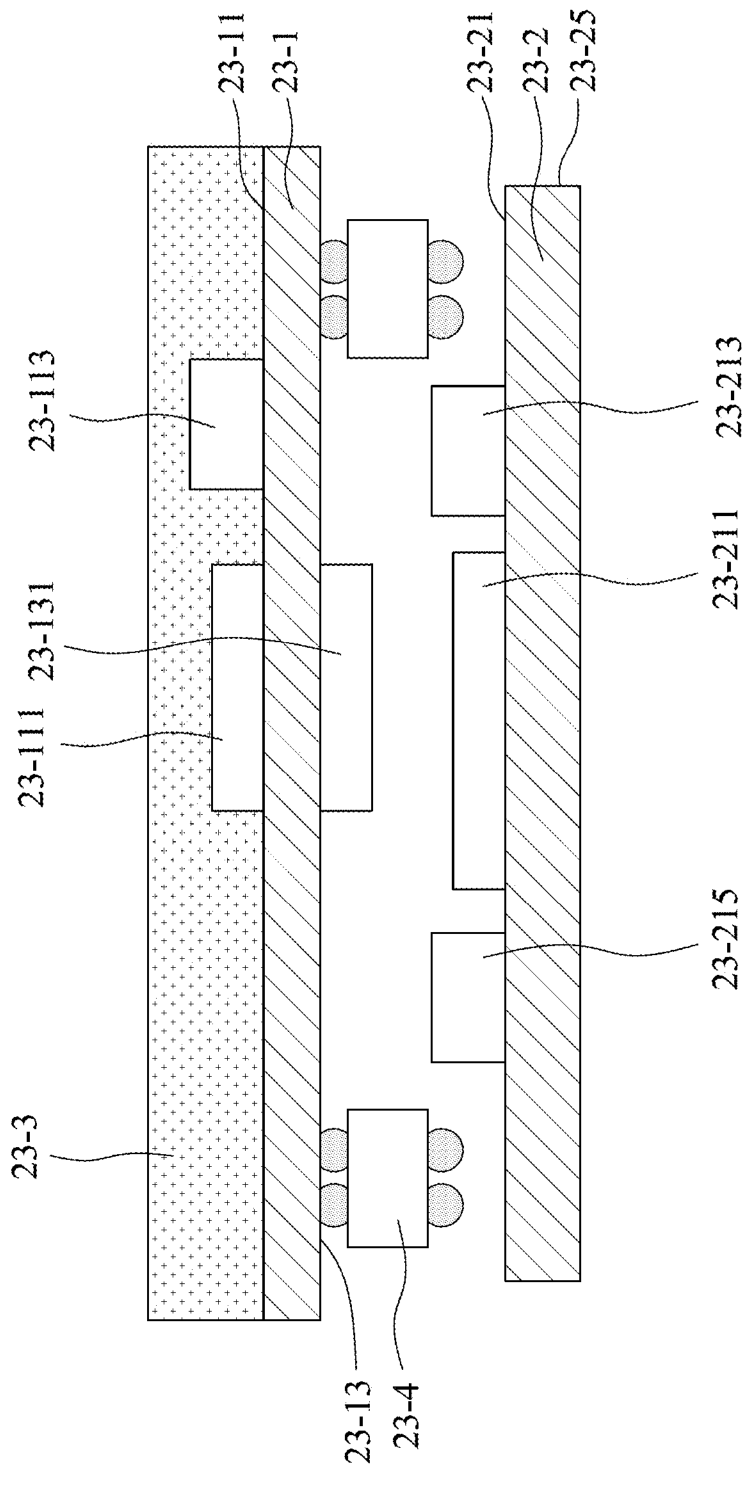

Referring to FIG. 24H, the structure obtained from FIG. 24C may be staked on the structure obtained from FIG. 24G. That is, the substrate 23-1 may be disposed over the substrate 23-2. The surface 23-13 of the substrate 23-1 may face the surface 23-21 of the substrate 23-2. The interposer 23-4 may be arranged between the substrate 23-1 and the substrate 23-2. The substrate 23-1 may be electrically connected to the substrate 23-2 through the interposer 23-4. Since the interposer 23-4 may be disposed on the substrate 23-2 and support the substrate 23-1, the electronic component 23-131 disposed on the surface 23-13 of the substrate 23-1 and the electronic component 23-211 disposed on the surface 23-21 of the substrate 23-2 may be spaced apart from by a distance.

Figure 24I:
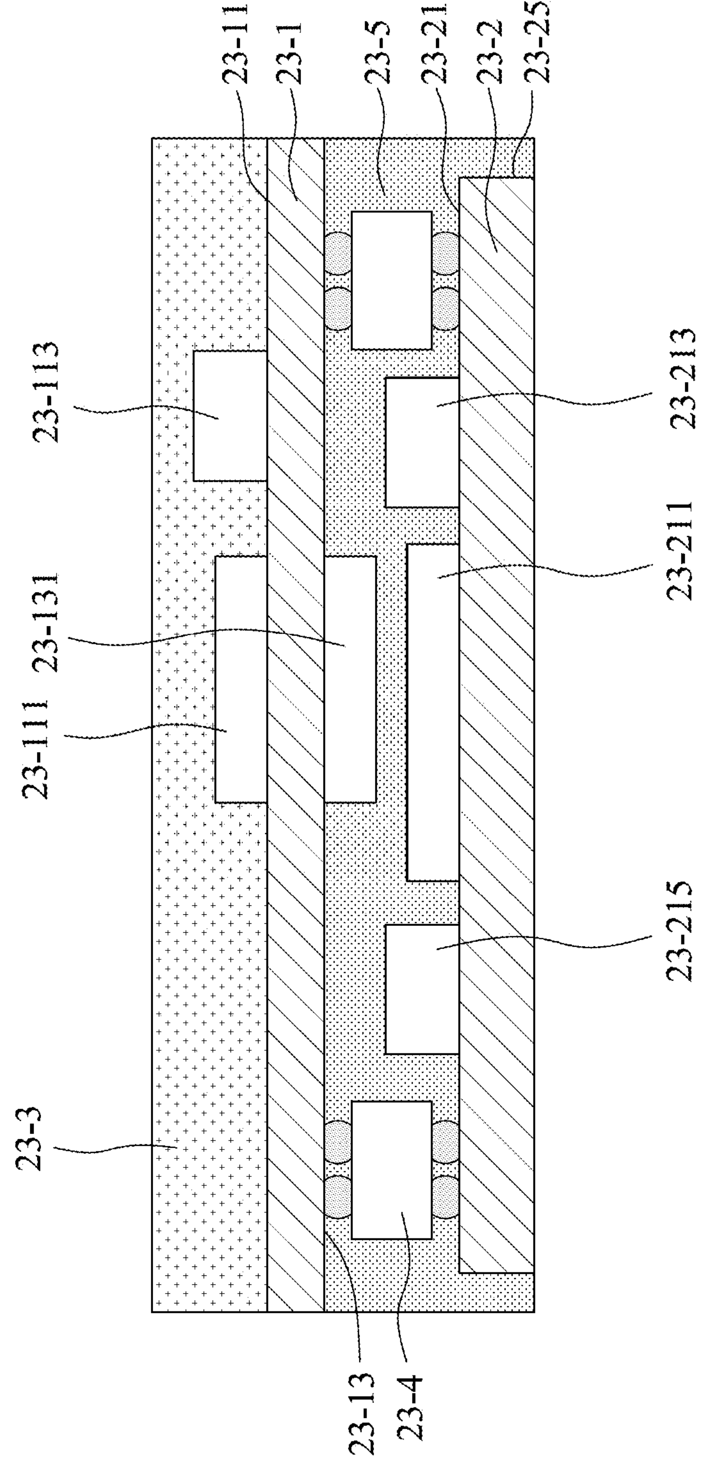

Referring to FIG. 24I, the encapsulant 23-5 is provided. The encapsulant 23-5 may cover the surface 23-21 of the substrate 23-2, the surface 23-13 of the substrate 23-1, the electronic component 23-131, the electronic components 23-211, 23-213, 23-215 and the interposers 23-4. The encapsulant 23-5 may cover the lateral surface 23-25 of the substrate 23-2.

Figure 24J:
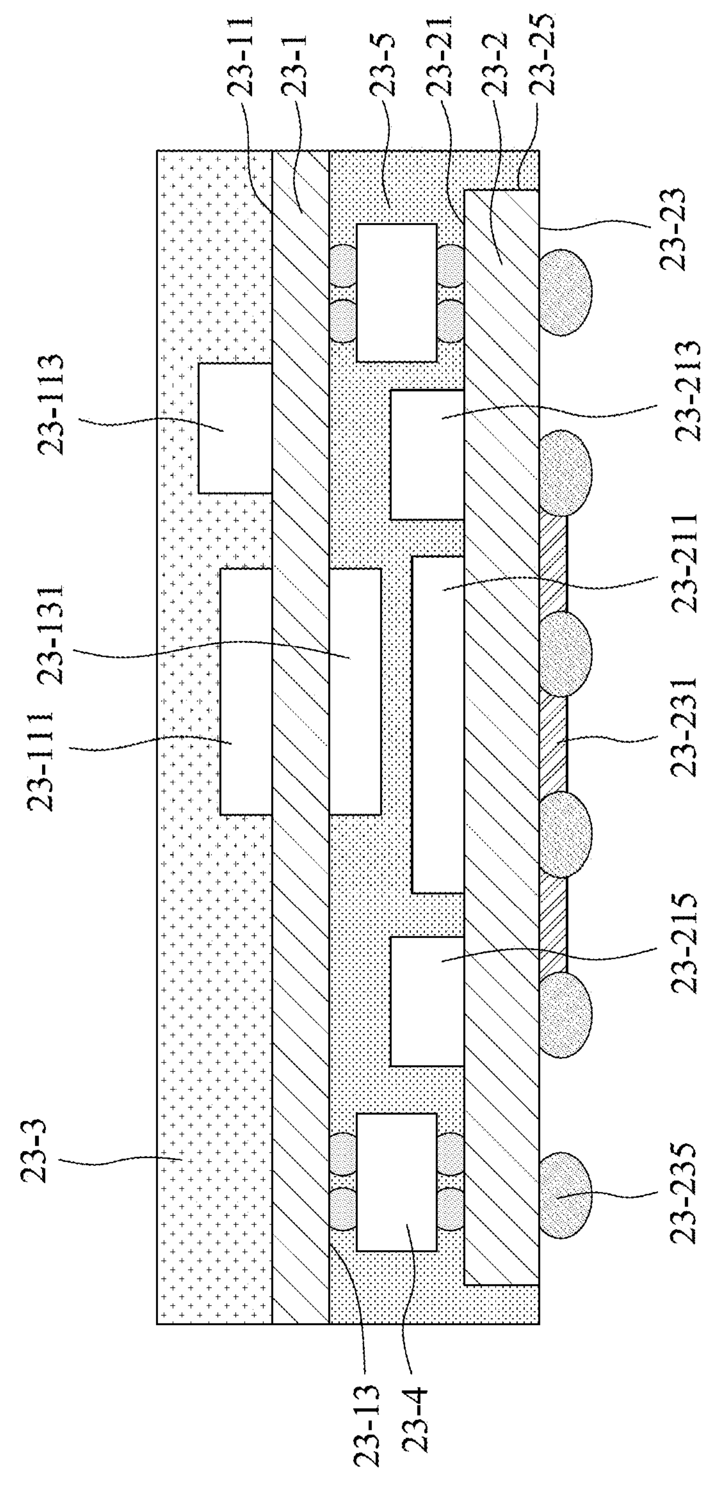

Referring to FIG. 24J, the electronic component 23-231 and the electrical connections 23-235 may be disposed or mounted on the surface 23-23 of the substrate 23-2 and electrically connected to the interconnection of the substrate 23-2.

Figure 24K:
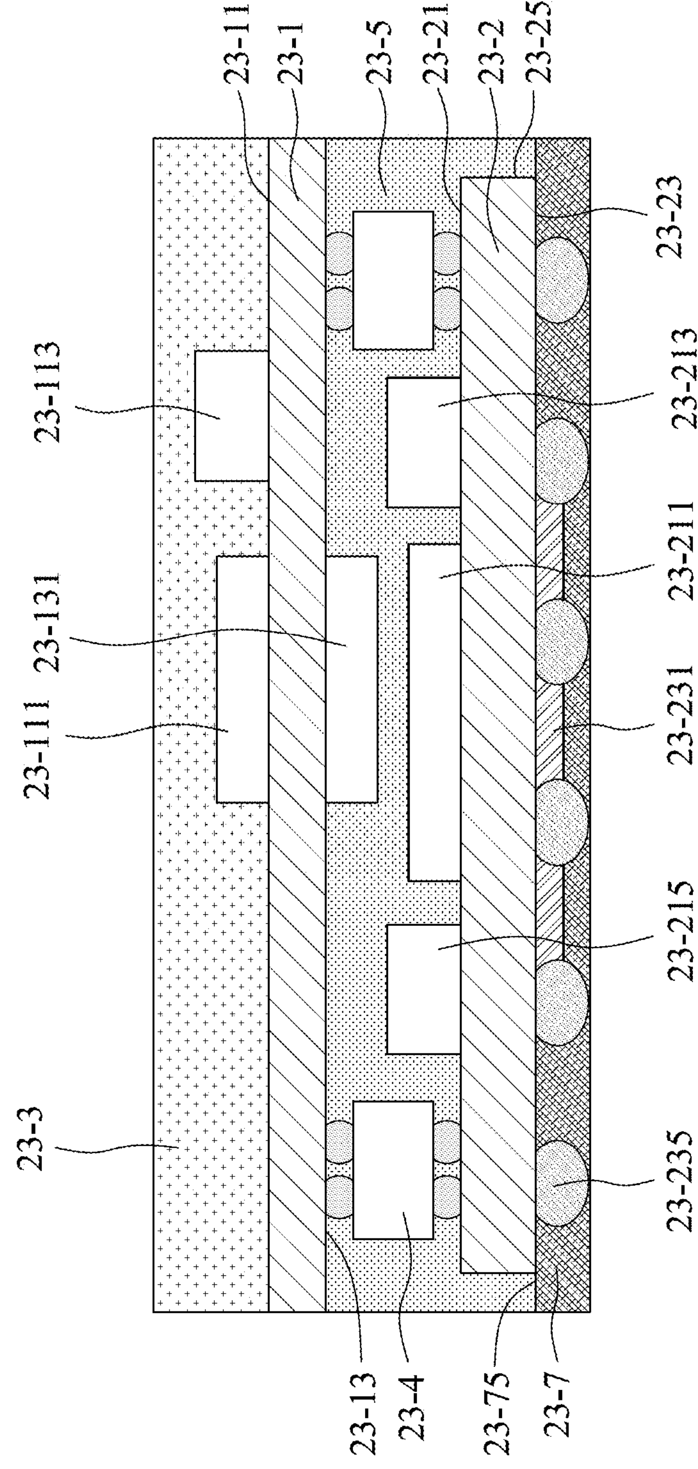

Referring to FIG. 24K, the encapsulant 23-7 is provided. The encapsulant 23-7 may be formed on the surface 23-23 of the substrate 23-2. The encapsulant 23-7 may cover the surface 23-23 of the substrate 23-2, the electronic component 23-231 and the electrical connections 23-235. The upper surface 23-75 of the encapsulant 23-7 is covered by the encapsulant 23-5.

Figure 24L:
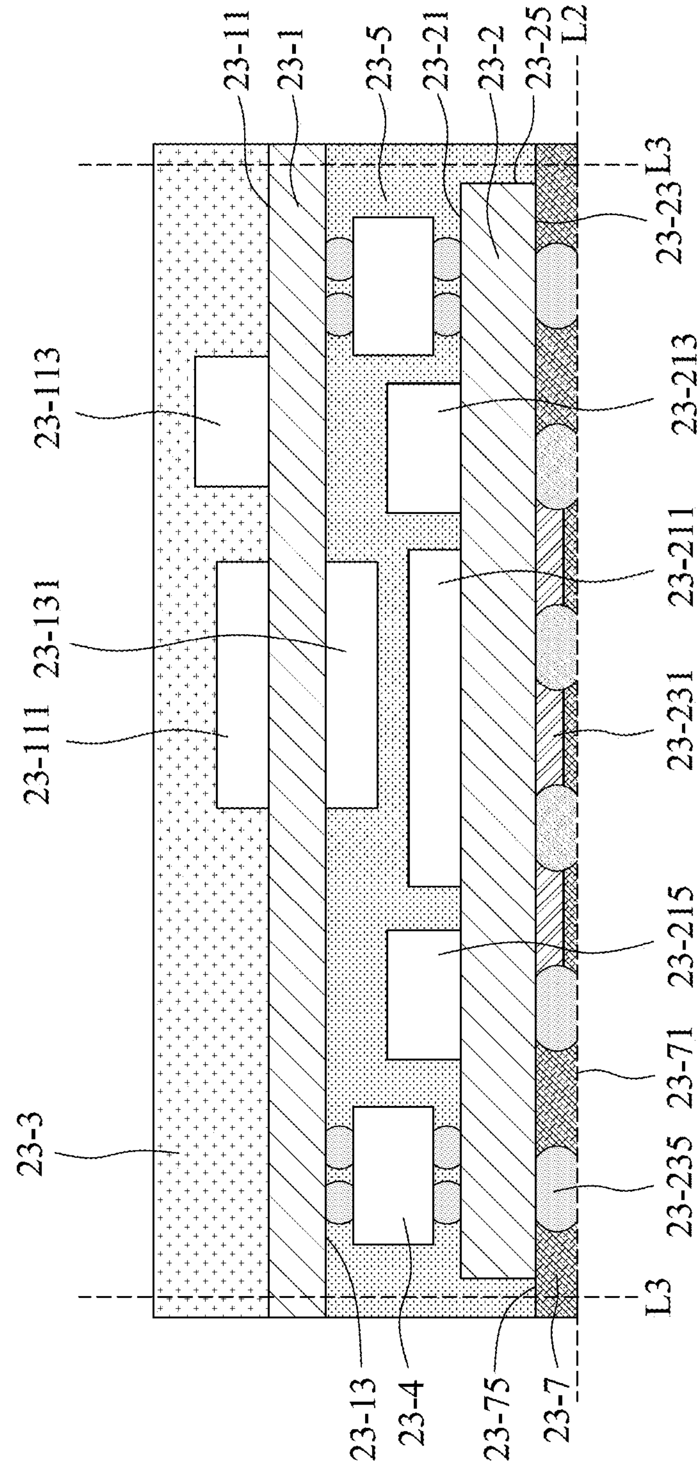

Referring to FIG. 24L, a grinding process is conducted to cut along the imaginary line "L2" through the encapsulant 23-7 and the electrical connections 23-235. After the grinding process, the electrical connections 23-235 may be exposed from the lower surface 23-71 of the encapsulant 23-7. Further, a singulation process is conducted to cut along the imaginary line "L3" through the substrate 23-1 and the encapsulants 23-3, 23-5 and 23-7, and thus forming the semiconductor device package structure 23 as shown in FIG. 23.

Figure 25:
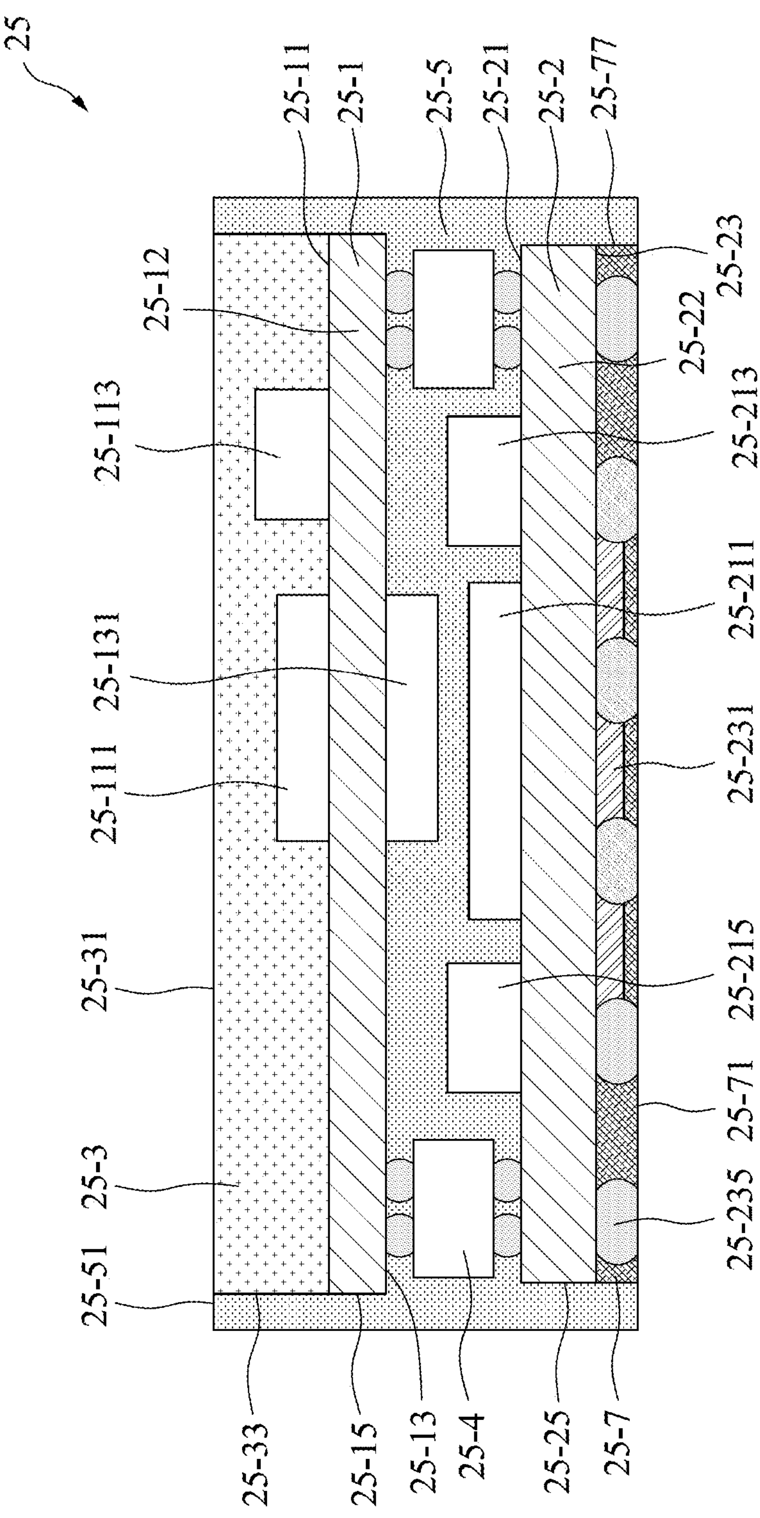
FIG. 25 is a cross-sectional view of a semiconductor device package in accordance with an embodiment of the instant disclosure.

FIG. 25 is a cross-sectional view of a semiconductor device package 25 in accordance with some embodiments of the present disclosure. As shown in FIG. 25, the semiconductor device package 25 may be a three-dimensional (3D) stacked semiconductor device package. The semiconductor device package 25 may include substrates 25-1, 25-2, electronic components 25-111, 25-113, 25-131, 25-211, 25-213, 25-215 and 25-231, encapsulants 25-3, 25-5, 25-7, interposers 25-4 and electrical connections 25-235. The substrate 25-1 may be a coreless substrate and may include traces, pads or interconnections for electrical connection. The substrate 25-2 may be a core substrate or a core-less substrate and may include traces, pads or interconnections for electrical connection. Further, the substrate 25-1 may disposed over and/or above the substrate 25-2.

Referring to FIG. 25, the substrate 25-1 has a surface 25-11 (e.g., an upper surface) and a surface 25-13 (e.g., a lower surface). The electronic components 25-111, 25-113 may be disposed or mounted on the surface 25-11 of the substrate 25-1. The electronic components 25-111, 25-113 may be a die, an active device, a passive device, and/or other electronic devices. In some embodiments of the present disclosure, the electronic components 25-111, 25-113 electrically connects the substrate 25-1 via electrical connections. In some embodiments of the present disclosure, the electronic component 25-111 may include a flash memory device. Further, the electronic component 25-131 may be disposed or mounted on the surface 25-13 of the substrate 25-1. The electronic component 25-131 may be a die, an active device, a passive device, and/or other electronic devices. In some embodiments of the present disclosure, the electronic component 25-131 electrically connects the substrate 25-1 via electrical connections. In some embodiments of the present disclosure, the electronic component 25-131 may include a flash memory device. In some embodiments of the present disclosure, a thickness of the substrate 25-2 is substantially greater than a thickness of the substrate 25-1. In some embodiments of the present disclosure, a thickness a dielectric layer 25-22 of the substrate 25-2 is substantially greater than a thickness of a dielectric layer 25-12 of the substrate 25-1. In some embodiments of the present disclosure, a cross-sectional width of the substrate 25-1 is greater than a cross-sectional width of the substrate 25-2. In some embodiments of the present disclosure, a hardness of the substrate 25-2 is substantially greater than a hardness of the substrate 25-1.

The substrate 25-2 has a surface 25-21 (e.g., an upper surface) and a surface 25-23 (e.g., a lower surface). The electronic components 25-211, 25-213, 25-215 may be disposed or mounted on the surface 25-21 of the substrate 25-2. The electronic components 25-211, 25-213, 25-215 may be a die, an active device, a passive device, and/or other electronic devices. In some embodiments of the present disclosure, the electronic components 25-211, 25-213, 25-215 electrically connects the substrate 25-2 via electrical connections. Further, the electronic component 25-231 may be disposed or mounted on the surface 25-23 of the substrate 25-2. The electronic component 25-231 may be a die, an active device, a passive device, and/or other electronic devices. In some embodiments of the present disclosure, the electronic component 25-231 electrically connects the substrate 25-2 via electrical connections. In some embodiments of the present disclosure, a thickness of the electronic components 25-231 is the thinnest among other components in the semiconductor device package 25. Moreover, a plurality of the electrical connections 25-235 are disposed or mounted on the surface 25-23 of the substrate 25-2. In some embodiments of the present disclosure, the electrical connection 25-235 includes a reflowable material. In some embodiments of the present disclosure, the electrical connection 25-235 includes solder material. The electrical connection 25-235 may include a solder ball. The electrical connection 25-235 may include a conductive pillar, post, or substrate interposer.

The interposers 25-4 may be disposed or mounted on the surface 25-13 of the substrate 25-1 and the surface 25-21 of the substrate 25-2. That is, the interposer 25-4 may be arranged between the substrate 25-1 and the substrate 25-2, and thus the interposer 25-4 may define a space between the substrate 25-1 and 25-2. In some embodiments of the present disclosure, an amount of the electronic components within the space between the substrate 25-1 and the substrate 25-2 and/or defined by the interposer 25-4, such as the electronic components, 25-131, 25-211, 25-213, 25-215, is greater than an amount of the electronic components outside of the space between the substrate 25-1 and the substrate 25-2 and/or defined by the interposer 25-4, such as the electronic components, 25-111, 25-113, 25-231. In some embodiments of the present disclosure, a distance between the adjacent electronic components within the space between the substrate 25-1 and the substrate 25-2 and/or defined by the interposer 25-4, such as the electronic components, 25-131, 25-211, 25-213, 25-215, is smaller than a distance between the adjacent electronic components outside of the space between the substrate 25-1 and the substrate 25-2 and/or defined by the interposer 25-4, such as the electronic components, 25-111, 25-113, 25-231. In some embodiments of the present disclosure, a density of the electronic components within the space between the substrate 25-1 and the substrate 25-2 and/or defined by the interposer 25-4, such as the electronic components, 25-131, 25-211, 25-213, 25-215, is greater than a density of the electronic components outside of the space between the substrate 25-1 and the substrate 25-2 and/or defined by the interposer 25-4, such as the electronic components, 25-111, 25-113, 25-231. Moreover, the interposer 25-4 may electrically connect the substrate 25-1 and the substrate 25-2 via electrical connections. In some embodiments of the present disclosure, such electrical connection includes a solder material. In some embodiments of the present disclosure, the interposer 25-4 includes a substrate interposer with redistribution layers and/or conductive vias.

The encapsulant 25-3 is disposed on the surface 25-11 of the substrate 25-1. The encapsulant 25-3 may cover the surface 25-11 of the substrate 25-1 and the electronic components 25-111 and 25-113 disposed on the surface 25-11 of the substrate 25-1. The encapsulant 25-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 25-3 may include a molding underfill (MUF) or a capillary underfill (CUF).

As above-mentioned, the substrate 25-1 may be a coreless substrate, and thus the substrate 25-1 may have a relatively thin thickness and/or a relatively weak stiffness. Therefore, when the electronic components, such as the electronic components, 25-111, 25-113, 25-131, are mounted on the substrate 25-1, the total weight of the electronic components may cause the substrate 25-1 to collapse. That is, the substrate 25-1 may be bended or recessed toward the substrate 25-2 due to the weights of the electronic components 25-111, 25-113, 25-131, and the electronic component 25-131 on the surface 25-13 of the substrate 25-1 may collide with the electronic component 25-211 on the surface of the substrate 25-2 and under the electronic component 25-131. The encapsulant 25-3 may be a reinforcement structure which is configured to improve the strength of the substrate 25-1 such that the substrate 25-1 is strong enough to support the electronic components 25-111, 25-113, 25-131 mounted thereon. Given the above, the encapsulant 25-3 may be configured to prevent the substrate 25-1 from collapsing and being bended or recessed toward the substrate 25-2. That is, the encapsulant 25-3 is configured to define a space between the electronic component 25-131 on the surface 25-13 of the substrate 25-1 and the electronic component 25-211 on the surface 25-21 of the substrate 25-2, and thus the electronic component 25-131 and the electronic component 25-211 may be maintained to be spaced apart from each other by a distance. In some embodiments of the present disclosure, the encapsulant 25-3 is a warpage-resistant layer configured to prevent the warpage of the substrate 25-1.

The encapsulant 25-5 may cover the surface 25-21 of the substrate 25-2, the electronic components 25-211, 25-213, 25-215 disposed on the surface 25-21 of the substrate 25-2, the surface 25-13 of the substrate 25-1, the electronic component 25-131 disposed on the surface 25-13 of the substrate 25-1 and the interposers 25-4. The encapsulant 25-5 may cover a lateral surface 25-15 of the substrate 25-1. The encapsulant 25-5 may cover a lateral surface 25-25 of the substrate 25-2. The encapsulant 25-5 may cover a lateral surface 25-33 of the encapsulant 25-3. In some embodiments of the present disclosure, an upper surface 25-51 of the encapsulant 25-5 is coplanar with an upper surface 25-31 of the encapsulant 25-3. In some embodiments of the present disclosure, the encapsulant 25-5 exposes the upper surface 25-31 of the encapsulant 25-3. The encapsulant 25-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 25-5 may include a molding underfill (MUF) or a capillary underfill (CUF).

The encapsulant 25-7 is disposed on the surface 25-23 of the substrate 25-2. The encapsulant 25-7 may cover the surface 25-23 of the substrate 25-2 and the electronic component 25-231 and the electrical connections 25-235 disposed on the surface 25-23 of the substrate 25-2. The encapsulant 25-7 may have a lower surface 25-71 covering the electronic component 25-231. In some embodiments of the present disclosure, a lower surface of the electronic component 25-231 is exposed from the lower surface 25-71 of the encapsulant 25-7. The electrical connections 25-235 may be exposed from the lower surface 25-71 of the encapsulant 25-7. The encapsulant 25-7 may have a lateral surface 25-77 which is covered by the encapsulant 25-5. The encapsulant 25-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 25-7 may include a molding underfill (MUF) or a capillary underfill (CUF). In some embodiments of the present disclosure, a thickness of the encapsulant 25-7 is the thinnest among other encapsulants 25-3, 25-5 in the semiconductor device package 25.

In some embodiments of the present disclosure, the material of the encapsulant 25-3 is substantially identical to the material of the encapsulant 25-5, and/or the material of the encapsulant 25-5 is substantially identical to the material of the encapsulant 25-7, and/or the material of the encapsulant 25-3 is substantially identical to the material of the encapsulant 25-7. In some embodiments of the present disclosure, the material of the encapsulant 25-3 is different from the material of the encapsulant 25-5, and/or the material of the encapsulant 25-5 is different from the material of the encapsulant 25-7, and/or the material of the encapsulant 25-3 is different from the material of the encapsulant 25-7. In some embodiments of the present disclosure, the CTE (coefficient of thermal expansion) of the substrate 25-1 is substantially equal to the CTE of the encapsulant 25-3. In some embodiments of the present disclosure, the CTE of the encapsulant 25-5 is substantially equal to or smaller than the CTE of the encapsulant 25-7. In some embodiments of the present disclosure, the difference between the CTE of substrate 25-1 and the CTE of the encapsulant 25-7 is less than the difference between the CTE of substrate 25-1 and the CTE of the encapsulant 25-5 or the difference between the CTE of encapsulant 25-5 and the CTE of the encapsulant 25-7.

In some embodiments of the present disclosure, the substrate 25-1 is the same as, or similar to, the substrate 1-1 as shown in FIGS. 1B and 1C. That is, the substrate 25-1 may include the interconnection which may have the via tapered from the surface 25-11 toward the surface 25-13 or tapered from the surface 25-13 toward the surface 25-11. In some embodiments of the present disclosure, the substrate 25-1 is the same as, or similar to, the substrate 1-1 as shown in FIG. 1D. That is, the substrate 25-1 may include dielectric layers as shown in FIG. 1D.

FIG. 26A, FIG. 26B, FIG. 26C, FIG. 26D, FIG. 26E, FIG. 26F, FIG. 26G, FIG. 26H, FIG. 26I, FIG. 26J and FIG. 26K illustrate a method of manufacturing a semiconductor device package in accordance with another embodiment of the instant disclosure.

Figure 26A:
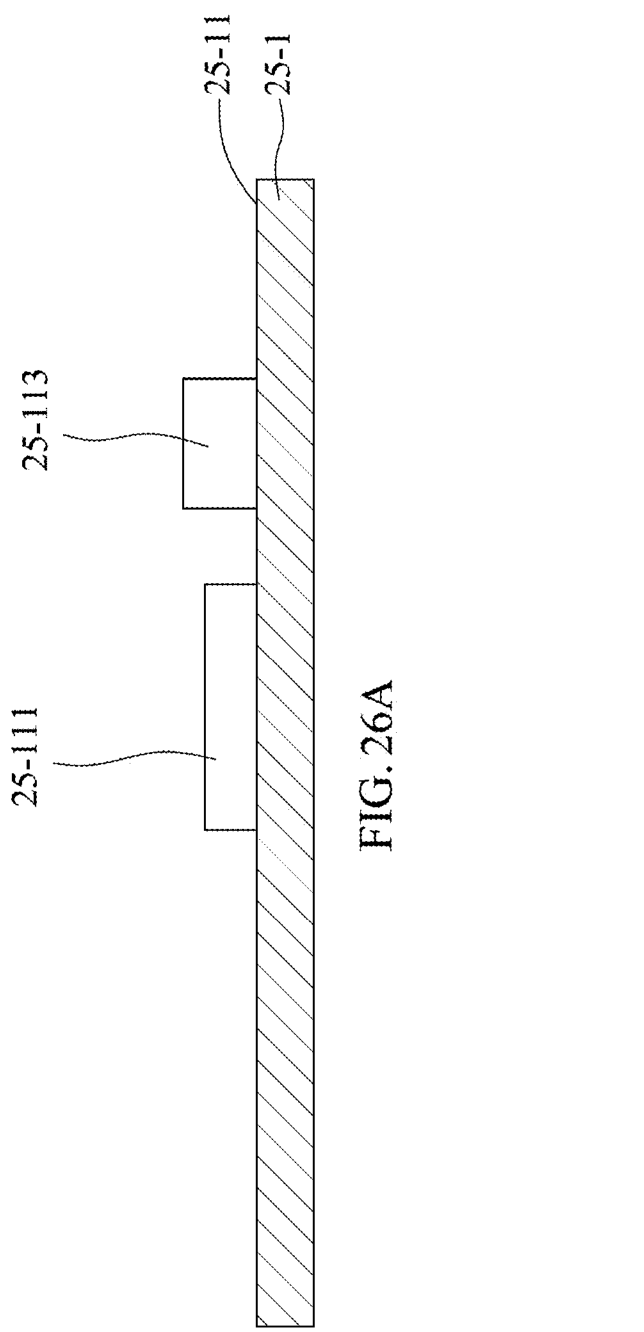
FIG. 26A, FIG. 26B, FIG. 26C, FIG. 26D, FIG. 26E, FIG. 26F, FIG. 26G, FIG. 26H, FIG. 26I, FIG. 26J and FIG. 26K illustrate a method of manufacturing a semiconductor device package in accordance with another embodiment of the instant disclosure.

Referring to FIG. 26A, the substrate 25-1 with the electronic components 25-111, 25-113 is provided. The electronic elements 25-111 and 25-113 may be disposed or mounted on the surface 25-11 of the substrate 25-1 and electrically connected to the interconnection of the substrate 25-1.

Figure 26B:
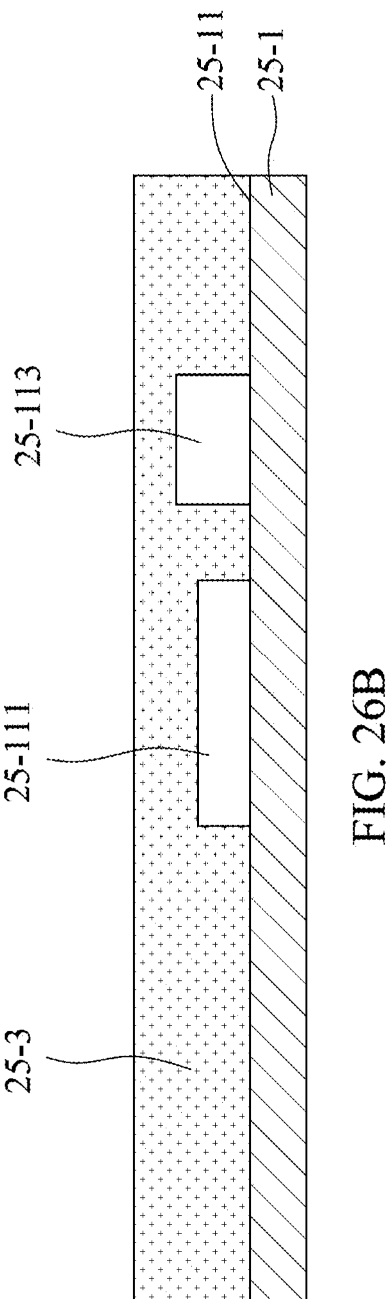

Referring to FIG. 26B, the encapsulant 25-3 is provided. The encapsulant 25-3 may be formed on the surface 25-11 of the substrate 25-1. The encapsulant 25-3 may cover the surface 25-11 of the substrate 25-1 and the electronic components 25-111, 25-113.

Figures 26C, 26D:
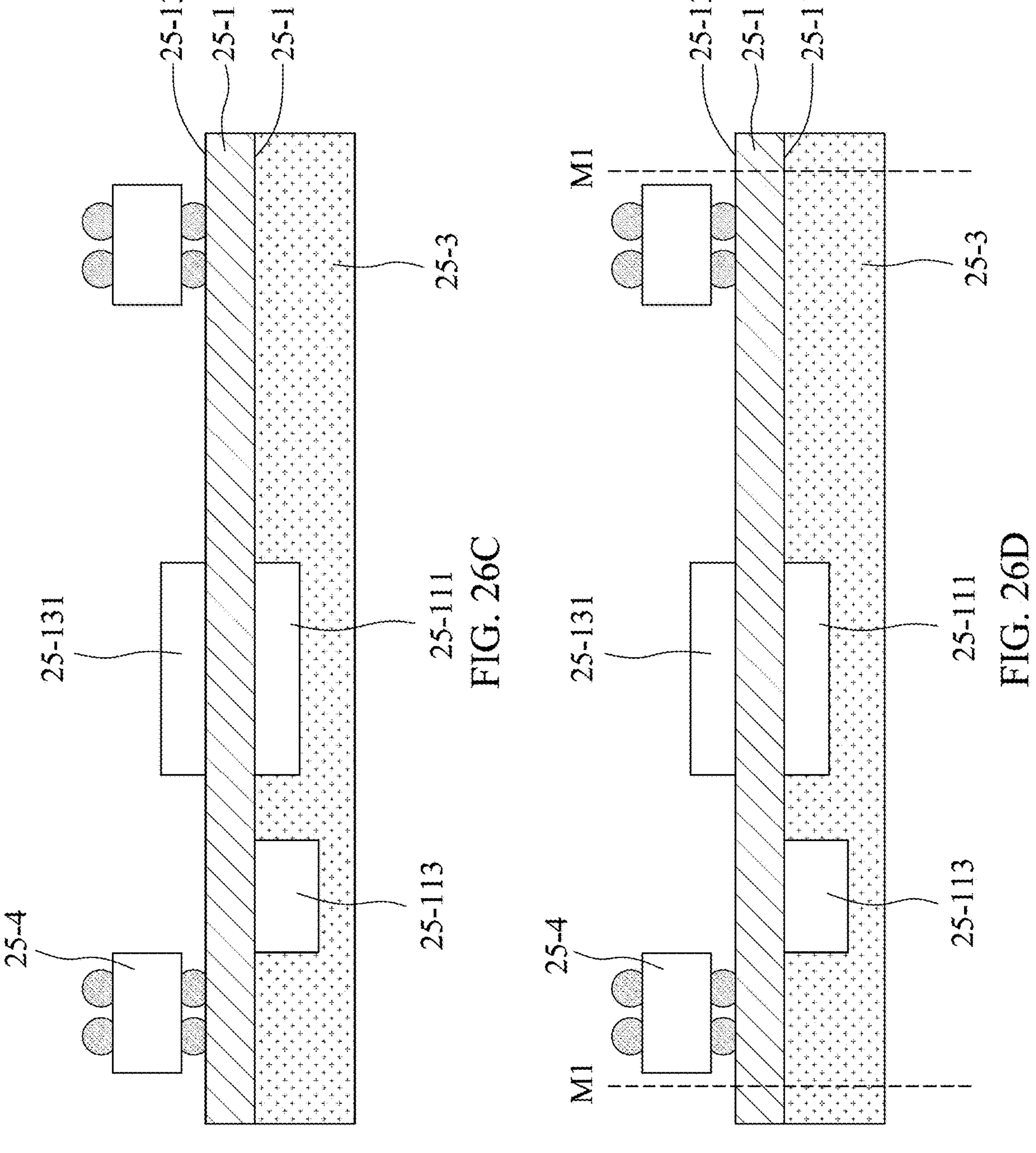

Referring to FIG. 26C, the structure obtained from FIG. 26B may be reversed upside down. The interposers 25-4 and the electronic component 25-131 may be disposed or mounted on the surface 25-13 of the substrate 25-1 and electrically connected to the interconnection of the substrate 25-1.

Referring to FIG. 26D, a singulation process is conducted to cut along the imaginary line "M1" through the substrate 25-1 and the encapsulant 25-3.

Figure 26E:
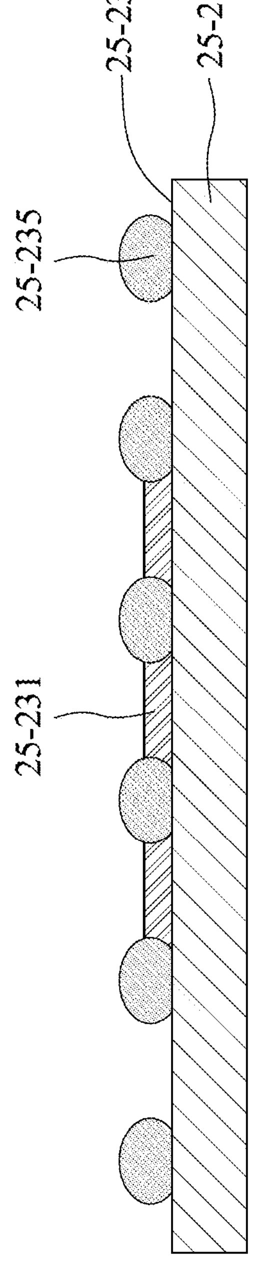

Referring to FIG. 26E, the substrate 25-2 with the electronic component 25-231 and electrical connections 25-235 is provided. The electronic element 25-231 and the electrical connections 25-235 may be disposed or mounted on the surface 25-23 of the substrate 25-2 and electrically connected to the interconnection of the substrate 25-2.

Figure 26F:
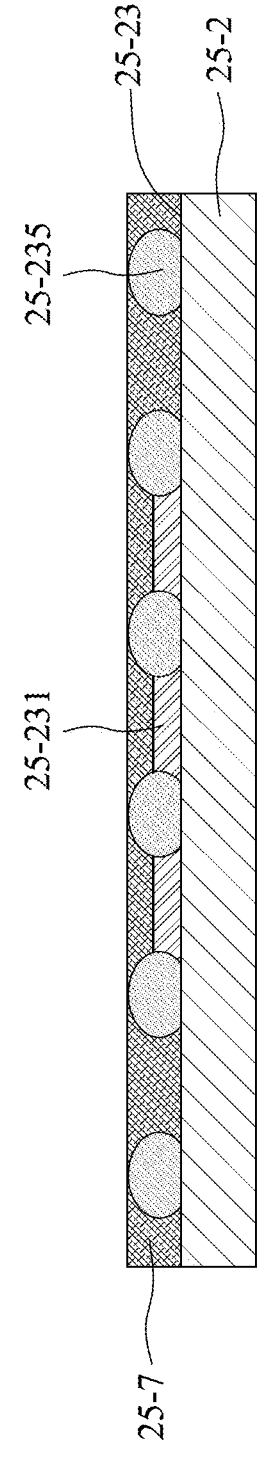

Referring to FIG. 26F, the encapsulant 25-7 is provided. The encapsulant 25-7 may be formed on the surface 25-23 of the substrate 25-2. The encapsulant 25-7 may cover the surface 25-23 of the substrate 25-2, the electronic component 25-231 and the electrical connections 25-235.

Figures 26G, 26H:
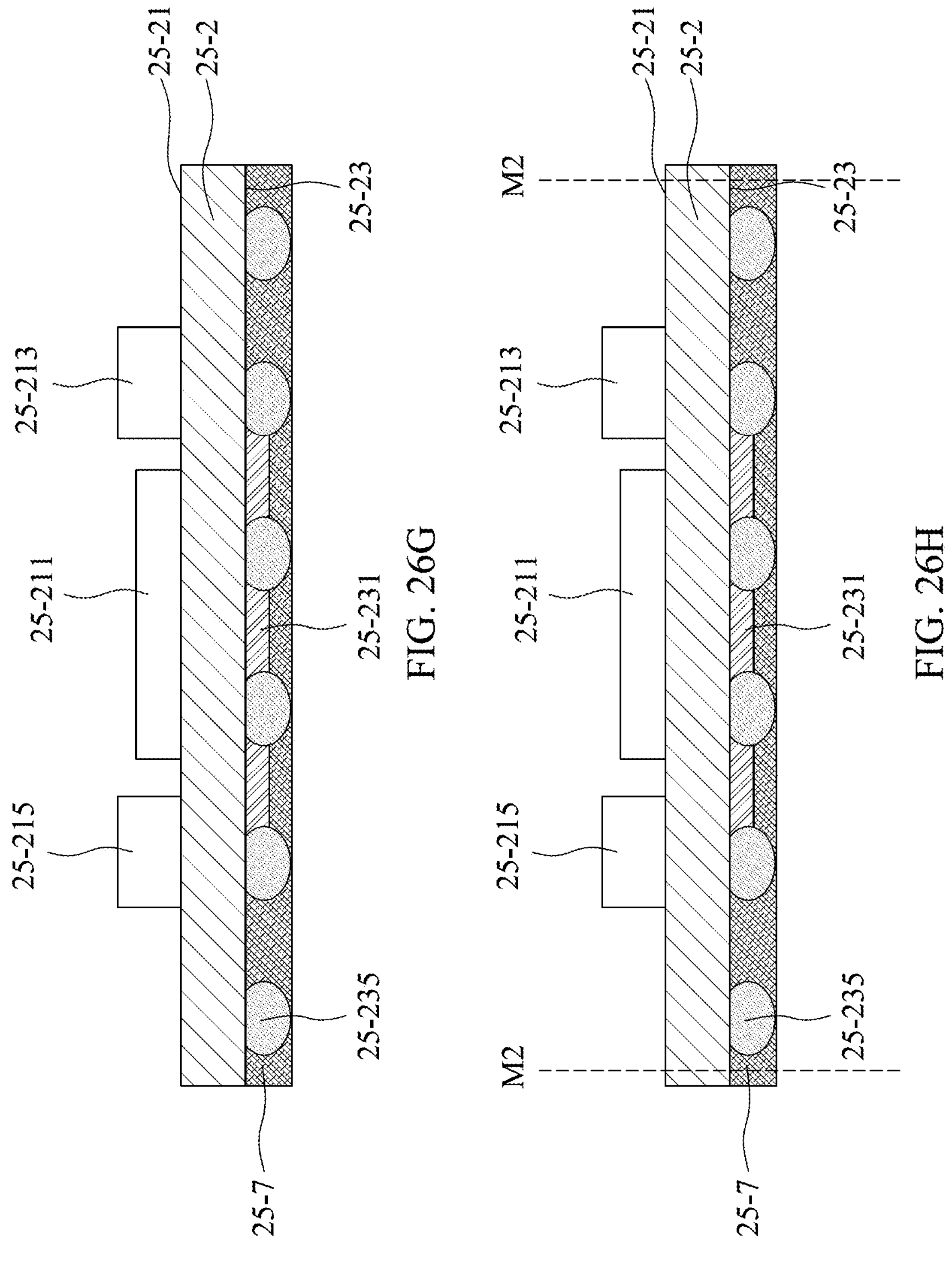

Referring to FIG. 26G, the structure obtained from FIG. 26F may be reversed upside down. The electronic elements 25-211, 25-213 and 25-215 may be disposed or mounted on the surface 25-21 of the substrate 25-2 and electrically connected to the interconnection of the substrate 25-2.

Referring to FIG. 26H, a singulation process is conducted to cut along the imaginary line "M2" through the substrate 25-2 and the encapsulant 25-7.

Figure 26I:
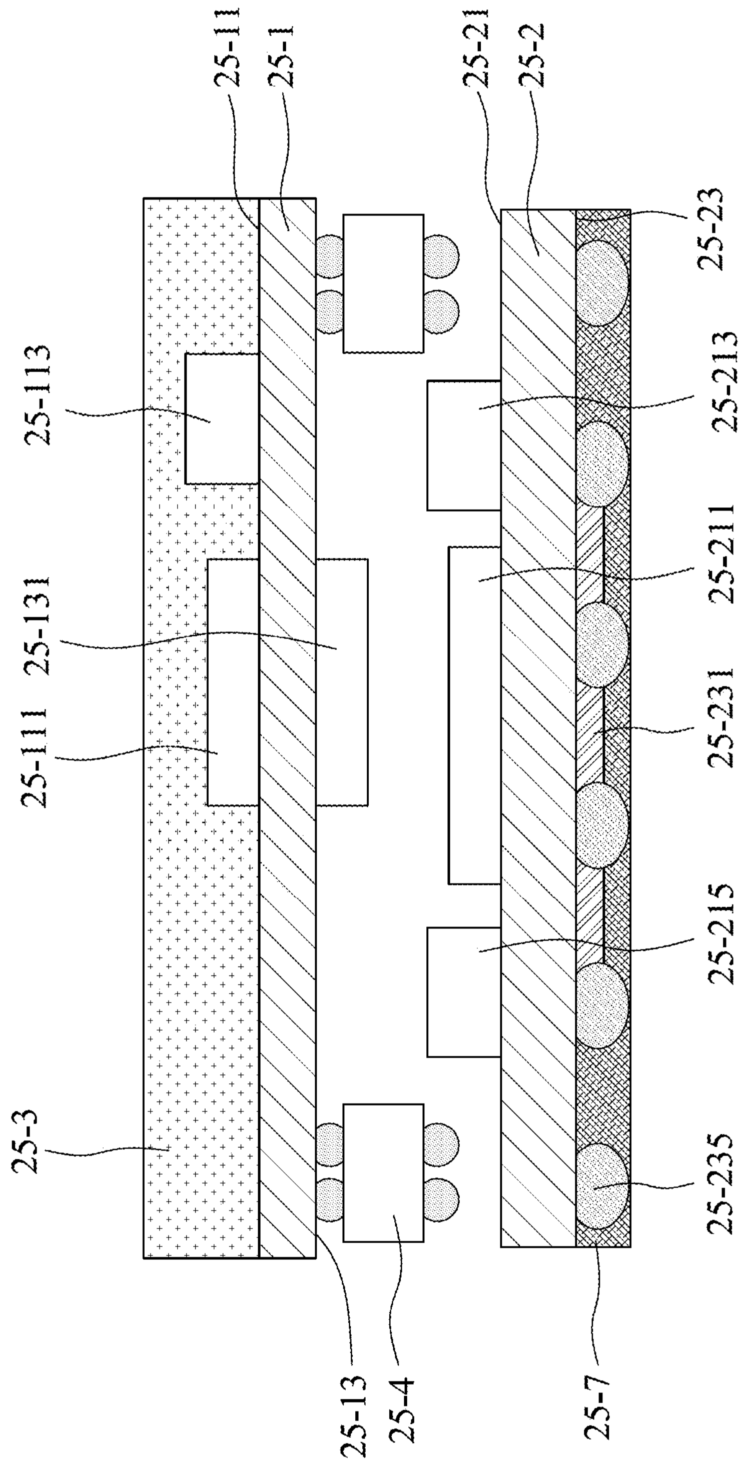

Referring to FIG. 26I, the structure obtained from FIG. 26D may be staked on the structure obtained from FIG. 26H. That is, the substrate 25-1 may be disposed over the substrate 25-2. The surface 25-13 of the substrate 25-1 may face the surface 25-21 of the substrate 25-2. The interposer 25-4 may be arranged between the substrate 25-1 and the substrate 25-2. The substrate 25-1 may be electrically connected to the substrate 25-2 through the interposer 25-4. Since the interposer 25-4 may be disposed on the substrate 25-2 and support the substrate 25-1, the electronic component 25-131 disposed on the surface 25-13 of the substrate 25-1 and the electronic component 25-211 disposed on the surface 25-21 of the substrate 25-2 may be spaced apart from by a distance.

Figure 26J:
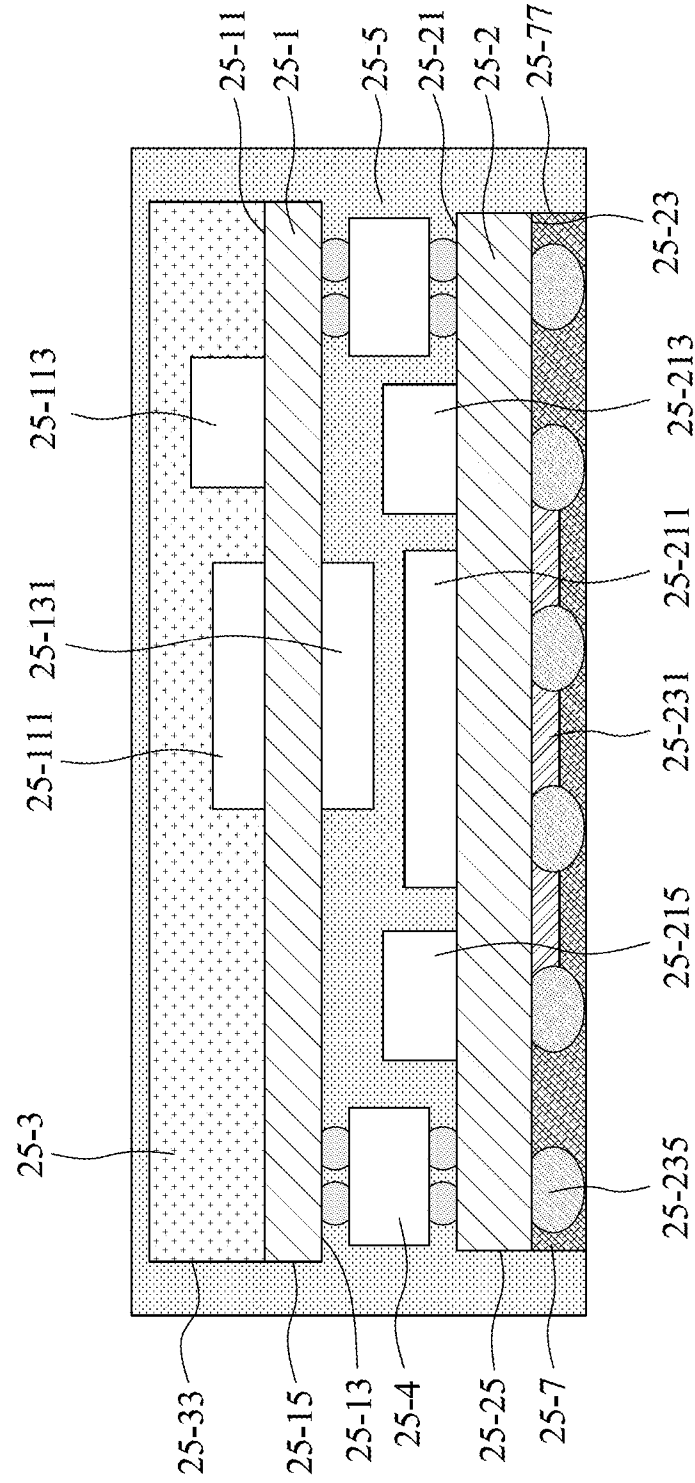

Referring to FIG. 26J, the encapsulant 25-5 is provided. The encapsulant 25-5 may cover the surface 25-21 of the substrate 25-2, the surface 25-13 of the substrate 25-1, the electronic component 25-131, the electronic components 25-211, 25-213, 25-215 and the interposers 25-4. The encapsulant 25-5 may cover the lateral surface 25-15 of the substrate 25-1, the lateral surface 25-25 of the substrate 25-2, the lateral surface 25-33 of the encapsulant 25-3 and the lateral surface 25-77 of the encapsulant 25-7.

Figure 26K:
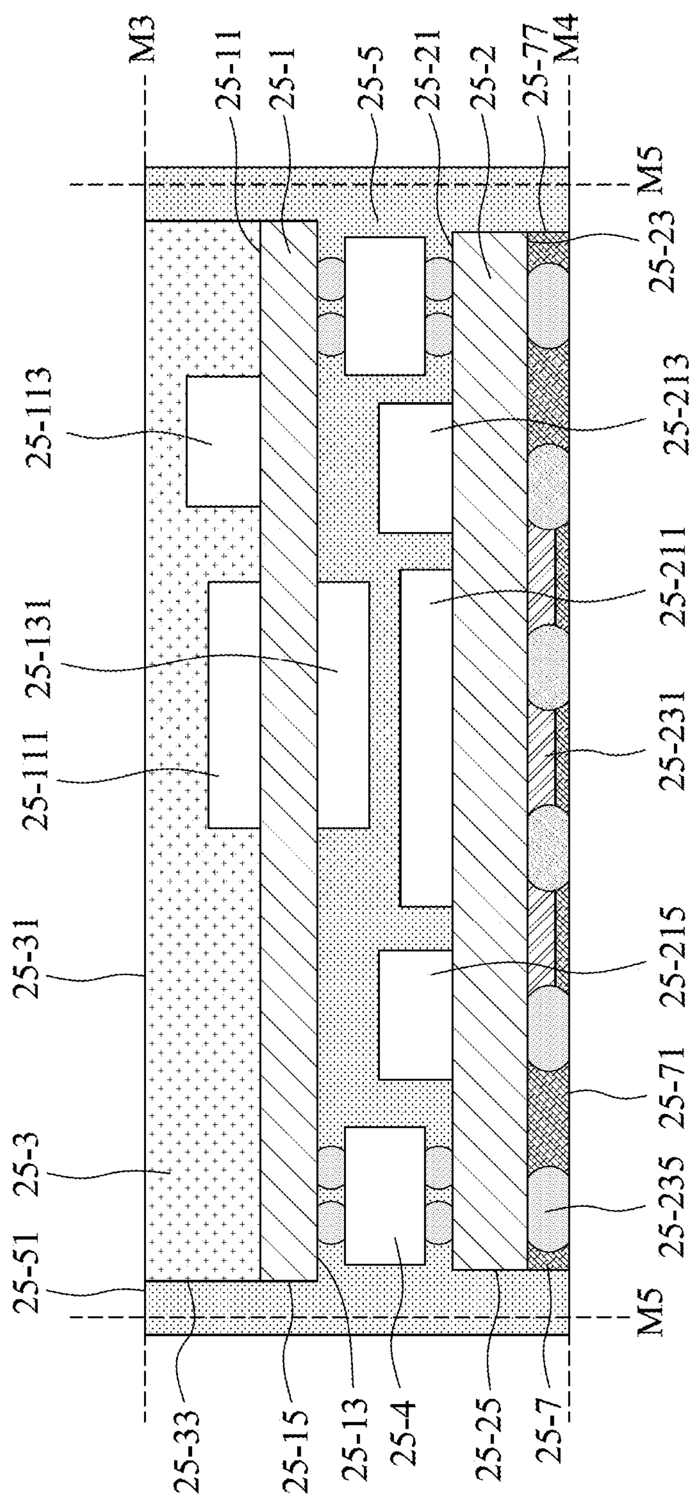

Referring to FIG. 26K, a grinding process is conducted to cut along the imaginary line "M3" through the encapsulant 25-3 and the encapsulant 25-5, and thus the upper surface 25-31 of the encapsulant 25-3 is exposed from the upper surface 25-51 of the encapsulant 25-5. Moreover, another grinding process is conducted to cut along the imaginary line "M4" through the encapsulant 25-7 and the electrical connections 25-235, and thus the electrical connections 19-235 are exposed from the lower surface 25-71 of the encapsulant 25-7. Further, a singulation process is conducted to cut along the imaginary line "M5" through the encapsulants 25-5, and thus forming the semiconductor device package structure 25 as shown in FIG. 25.

Figure 27A:
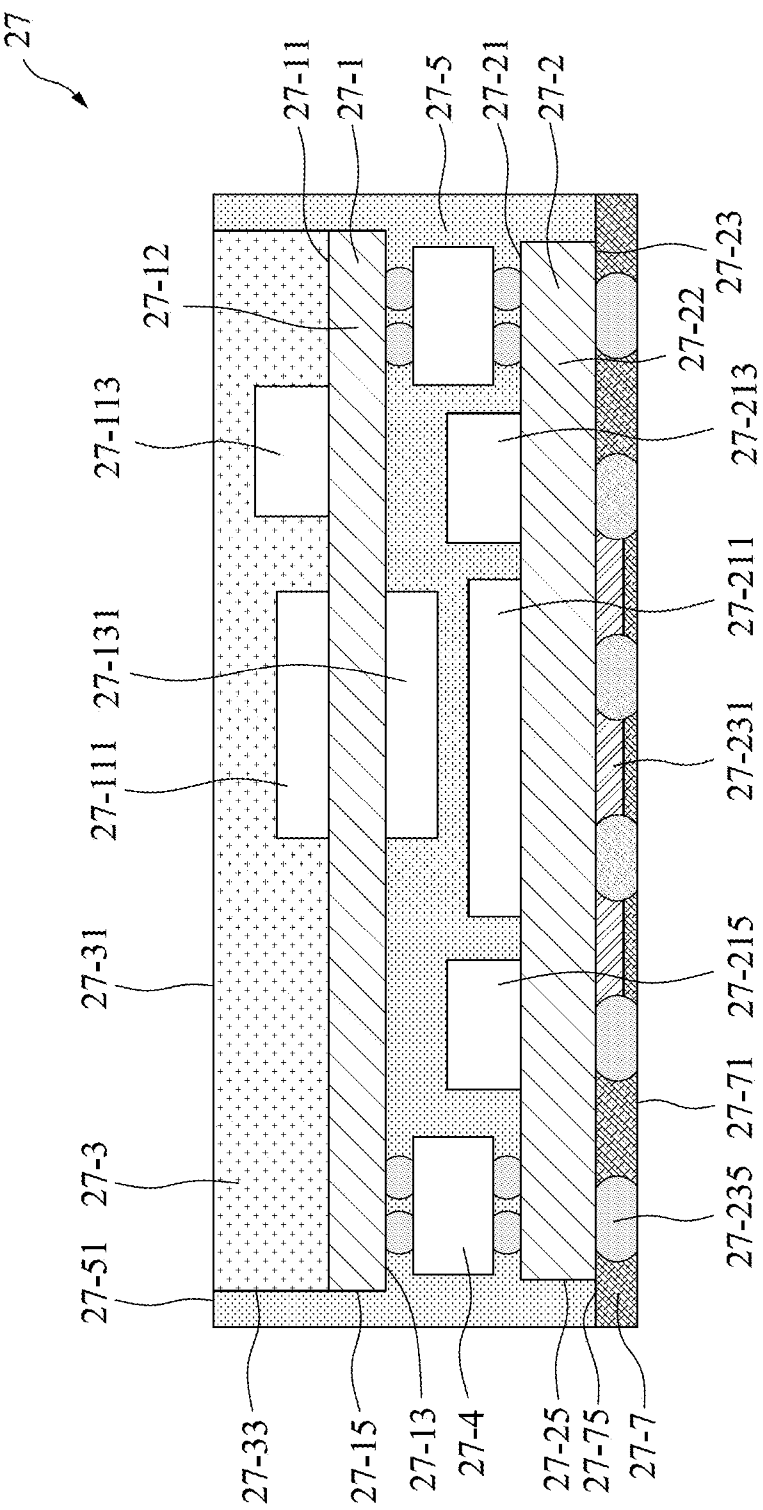
FIG. 27A is a cross-sectional view of a semiconductor device package in accordance with an embodiment of the instant disclosure.

FIG. 27A is a cross-sectional view of a semiconductor device package 27 in accordance with some embodiments of the present disclosure. As shown in FIG. 27A, the semiconductor device package 27 may be a three-dimensional (3D) stacked semiconductor device package. The semiconductor device package 27 may include substrates 27-1, 27-2, electronic components 27-111, 27-113, 27-131, 27-211, 27-213, 27-215 and 27-231, encapsulants 27-3, 27-5, 27-7, interposers 27-4 and electrical connections 27-235. The substrate 27-1 may be a coreless substrate and may include traces, pads or interconnections for electrical connection. The substrate 27-2 may be a core substrate or a core-less substrate and may include traces, pads or interconnections for electrical connection. Further, the substrate 27-1 may disposed over and/or above the substrate 27-2.

Referring to FIG. 27A, the substrate 27-1 has a surface 27-11 (e.g., an upper surface) and a surface 27-13 (e.g., a lower surface). The electronic components 27-111, 27-113 may be disposed or mounted on the surface 27-11 of the substrate 27-1. The electronic components 27-111, 27-113 may be a die, an active device, a passive device, and/or other electronic devices. In some embodiments of the present disclosure, the electronic components 27-111, 27-113 electrically connects the substrate 27-1 via electrical connections. In some embodiments of the present disclosure, the electronic component 27-111 may include a flash memory device. Further, the electronic component 27-131 may be disposed or mounted on the surface 27-13 of the substrate 27-1. The electronic component 27-131 may be a die, an active device, a passive device, and/or other electronic devices. In some embodiments of the present disclosure, the electronic component 27-131 electrically connects the substrate 27-1 via electrical connections. In some embodiments of the present disclosure, the electronic component 27-131 may include a flash memory device. In some embodiments of the present disclosure, a thickness of the substrate 27-2 is substantially greater than a thickness of the substrate 27-1. In some embodiments of the present disclosure, a thickness a dielectric layer 27-22 of the substrate 27-2 is substantially greater than a thickness of a dielectric layer 27-12 of the substrate 27-1. In some embodiments of the present disclosure, a cross-sectional width of the substrate 27-1 is greater than a cross-sectional width of the substrate 27-2. In some embodiments of the present disclosure, a hardness of the substrate 27-2 is substantially greater than a hardness of the substrate 27-1.

The substrate 27-2 has a surface 27-21 (e.g., an upper surface) and a surface 27-23 (e.g., a lower surface). The electronic components 27-211, 27-213, 27-215 may be disposed or mounted on the surface 27-21 of the substrate 27-2. The electronic components 27-211, 27-213, 27-215 may be a die, an active device, a passive device, and/or other electronic devices. In some embodiments of the present disclosure, the electronic components 27-211, 27-213, 27-215 electrically connects the substrate 27-2 via electrical connections. Further, the electronic component 27-231 may be disposed or mounted on the surface 27-23 of the substrate 27-2. The electronic component 27-231 may be a die, an active device, a passive device, and/or other electronic devices. In some embodiments of the present disclosure, the electronic component 27-231 electrically connects the substrate 27-2 via electrical connections. In some embodiments of the present disclosure, a thickness of the electronic components 27-231 is the thinnest among other components in the semiconductor device package 27. Moreover, a plurality of the electrical connections 27-235 are disposed or mounted on the surface 27-23 of the substrate 27-2. In some embodiments of the present disclosure, the electrical connection 27-235 includes a reflowable material. In some embodiments of the present disclosure, the electrical connection 27-235 includes solder material. The electrical connection 27-235 may include a solder ball. The electrical connection 27-235 may include a conductive pillar, post, or substrate interposer.

The interposers 27-4 may be disposed or mounted on the surface 27-13 of the substrate 27-1 and the surface 27-21 of the substrate 27-2. That is, the interposer 27-4 may be arranged between the substrate 27-1 and the substrate 27-2, and thus the interposer 27-4 may define a space between the substrate 27-1 and 27-2. In some embodiments of the present disclosure, an amount of the electronic components within the space between the substrate 27-1 and the substrate 27-2 and/or defined by the interposer 27-4, such as the electronic components, 27-131, 27-211, 27-213, 27-215, is greater than an amount of the electronic components outside of the space between the substrate 27-1 and the substrate 27-2 and/or defined by the interposer 27-4, such as the electronic components, 27-111, 27-113, 27-231. In some embodiments of the present disclosure, a distance between the adjacent electronic components within the space between the substrate 27-1 and the substrate 27-2 and/or defined by the interposer 27-4, such as the electronic components, 27-131, 27-211, 27-213, 27-215, is smaller than a distance between the adjacent electronic components outside of the space between the substrate 27-1 and the substrate 27-2 and/or defined by the interposer 27-4, such as the electronic components, 27-111, 27-113, 27-231. In some embodiments of the present disclosure, a density of the electronic components within the space between the substrate 27-1 and the substrate 27-2 and/or defined by the interposer 27-4, such as the electronic components, 27-131, 27-211, 27-213, 27-215, is greater than a density of the electronic components outside of the space between the substrate 27-1 and the substrate 27-2 and/or defined by the interposer 27-4, such as the electronic components, 27-111, 27-113, 27-231. Moreover, the interposer 27-4 may electrically connect the substrate 27-1 and the substrate 27-2 via electrical connections.

In some embodiments of the present disclosure, such electrical connection includes a solder material. In some embodiments of the present disclosure, the interposer 27-4 includes a substrate interposer with redistribution layers and/or conductive vias.

The encapsulant 27-3 is disposed on the surface 27-11 of the substrate 27-1. The encapsulant 27-3 may cover the surface 27-11 of the substrate 27-1 and the electronic components 27-111 and 27-113 disposed on the surface 27-11 of the substrate 27-1. The encapsulant 27-3 may include molding compounds, such as a Novolac-based resin, an epoxy-based resin, a silicone-based resin, or other another suitable encapsulant; fillers such as silicon oxide fillers, may be included in the molding compound. In addition, the encapsulant 27-3 may include a molding underfill (MUF) or a capillary underfill (CUF).

As above-mentioned, the substrate 27-1 may be a coreless substrate, and thus the substrate 27-1 may have a relatively thin thickness and/or a relatively weak stiffness. Therefore, when the electronic components, such as the electronic components, 27-111, 27-113, 27-131, are mounted on the substrate 27-1, the total weight of the electronic components may cause the substrate 27-1 to collapse. That is, the substrate 27-1 may be bended or recessed toward the substrate 27-2 due to the weights of the electronic components 27-111, 27-113, 27-131, and the electronic component 27-131 on the surface 27-13 of the substrate 27-1 may collide with the electronic component 27-211 on the surface of the substrate 27-2 and under the electronic component 27-131. The encapsulant 27-3 may be a reinforcement structure which is configured to improve the strength of the substrate 27-1 such that the substrate 27-1 is strong enough to support the electronic components 27-111, 27-113, 27-131 mounted thereon. Given the above, the encapsulant 27-3 may be configured to prevent the substrate 27-1 from collapsing and being bended or recessed toward the substrate 27-2. That is, the encapsulant 27-3 is configured to define a space between the electronic component 27-131 on the surface 27-13 of the substrate 27-1 and the electronic component 27-211 on the surface 27-21 of the substrate 27-2, and thus the electronic component 27-131 and the electronic component 27-211 may be maintained to be spaced apart from each other by a distance. In some embodiments of the present disclosure, the encapsulant 27-3 is a warpage-resistant layer configured to prevent the warpage of the substrate 27-1.

The encapsulant 27-5 may cover the surface 27-21 of the substrate 27-2, the electronic components 27-211, 27-213, 27-215 disposed on the surface 27-21 of the substrate 27-2, the surface 27-13 of the substrate 27-1, the electronic component 27-131 disposed on the surface 27-13 of the substrate 27-1 and the interposers 27-4. The encapsulant 27-5 may cover a lateral surface 27-15 of the substrate 27-1. The encapsulant 27-5 may cover a lateral surface 27-25 of the substrate 27-2. The encapsulant 27-5 may cover a lateral surface 27-33 of the encapsulant 27-3. In some embodiments of the present disclosure, an upper surface 27-51 of the encapsulant 27-5 is coplanar with an upper surface 27-31 of the encapsulant 27-3. In some embodiments of the present disclosure, the encapsulant 27-5 exposes the upper surface 27-31 of the encapsulant 27-3. The encapsulant 27-5 may include molding compounds, such as a Novolac-based resin, an epoxy-based resin, a silicone-based resin, or other another suitable encapsulant; fillers such as silicon oxide fillers, may be included in the molding compound. In addition, the encapsulant 27-5 may include a molding underfill (MUF) or a capillary underfill (CUF).

The encapsulant 27-7 is disposed on the surface 27-23 of the substrate 27-2. The encapsulant 27-7 may cover the surface 27-23 of the substrate 27-2 and the electronic component 27-231 and the electrical connections 27-235 disposed on the surface 27-23 of the substrate 27-2. The encapsulant 27-7 may have a lower surface 27-71 covering the electronic component 27-231. In some embodiments of the present disclosure, a lower surface of the electronic component 27-231 is exposed from the lower surface 27-71 of the encapsulant 27-7. The electrical connections 27-235 may be exposed from the lower surface 27-71 of the encapsulant 27-7. The encapsulant 27-7 may have an upper surface 27-75 which is covered by the encapsulant 27-5. The encapsulant 27-7 may include molding compounds, such as a Novolac-based resin, an epoxy-based resin, a silicone-based resin, or other another suitable encapsulant; fillers such as silicon oxide fillers, may be included in the molding compound. In addition, the encapsulant 27-7 may include a molding underfill (MUF) or a capillary underfill (CUF). In some embodiments of the present disclosure, a thickness of the encapsulant 27-7 is the thinnest among other encapsulants 27-3, 27-5 in the semiconductor device package 27.

In some embodiments of the present disclosure, the material of the encapsulant 27-3 is substantially identical to the material of the encapsulant 27-5, and/or the material of the encapsulant 27-5 is substantially identical to the material of the encapsulant 27-7, and/or the material of the encapsulant 27-3 is substantially identical to the material of the encapsulant 27-7. In some embodiments of the present disclosure, the material of the encapsulant 27-3 is different from the material of the encapsulant 27-5, and/or the material of the encapsulant 27-5 is different from the material of the encapsulant 27-7, and/or the material of the encapsulant 27-3 is different from the material of the encapsulant 27-7. In some embodiments of the present disclosure, the CTE (coefficient of thermal expansion) of the substrate 27-1 is substantially equal to the CTE of the encapsulant 27-3. In some embodiments of the present disclosure, the CTE of the encapsulant 27-5 is substantially equal to or smaller than the CTE of the encapsulant 27-7. In some embodiments of the present disclosure, the difference between the CTE of substrate 27-1 and the CTE of the encapsulant 27-7 is less than the difference between the CTE of substrate 27-1 and the CTE of the encapsulant 27-5 or the difference between the CTE of encapsulant 27-5 and the CTE of the encapsulant 27-7.

In some embodiments of the present disclosure, the substrate 27-1 is the same as, or similar to, the substrate 1-1 as shown in FIGS. 1B and 1C. That is, the substrate 27-1 may include the interconnection which may have the via tapered from the surface 27-11 toward the surface 27-13 or tapered from the surface 27-13 toward the surface 27-11. In some embodiments of the present disclosure, the substrate 27-1 is the same as, or similar to, the substrate 1-1 as shown in FIG. 1D. That is, the substrate 27-1 may include dielectric layers as shown in FIG. 1D.

Figure 27B:
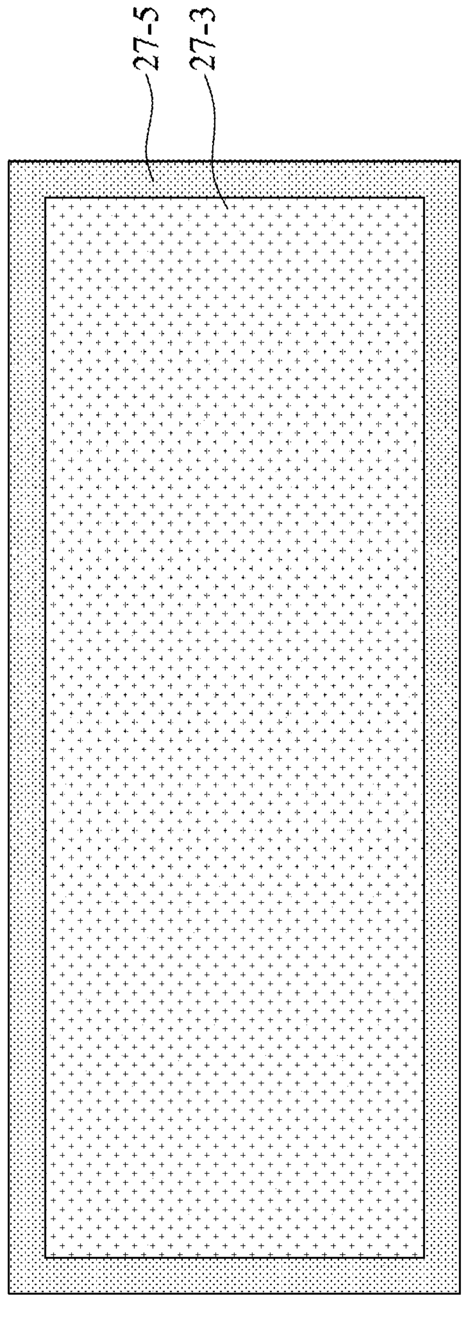
FIG. 27B is a top view of a semiconductor device package in accordance with an embodiment of the instant disclosure.

FIG. 27B is a top view of a semiconductor device package 27 in accordance with an embodiment of the instant disclosure. As shown in FIG. 28B, an area of the encapsulant 27-5 is greater than an area of the encapsulant 27-3.

FIG. 28A, FIG. 28B, FIG. 28C, FIG. 28D, FIG. 28E, FIG. 28F, FIG. 28G, FIG. 28H, FIG. 28I, FIG. 28J, FIG. 28K, FIG. 28L and FIG. 28M illustrate a method of manufacturing a semiconductor device package 27 in accordance with another embodiment of the instant disclosure.

Figure 28A:
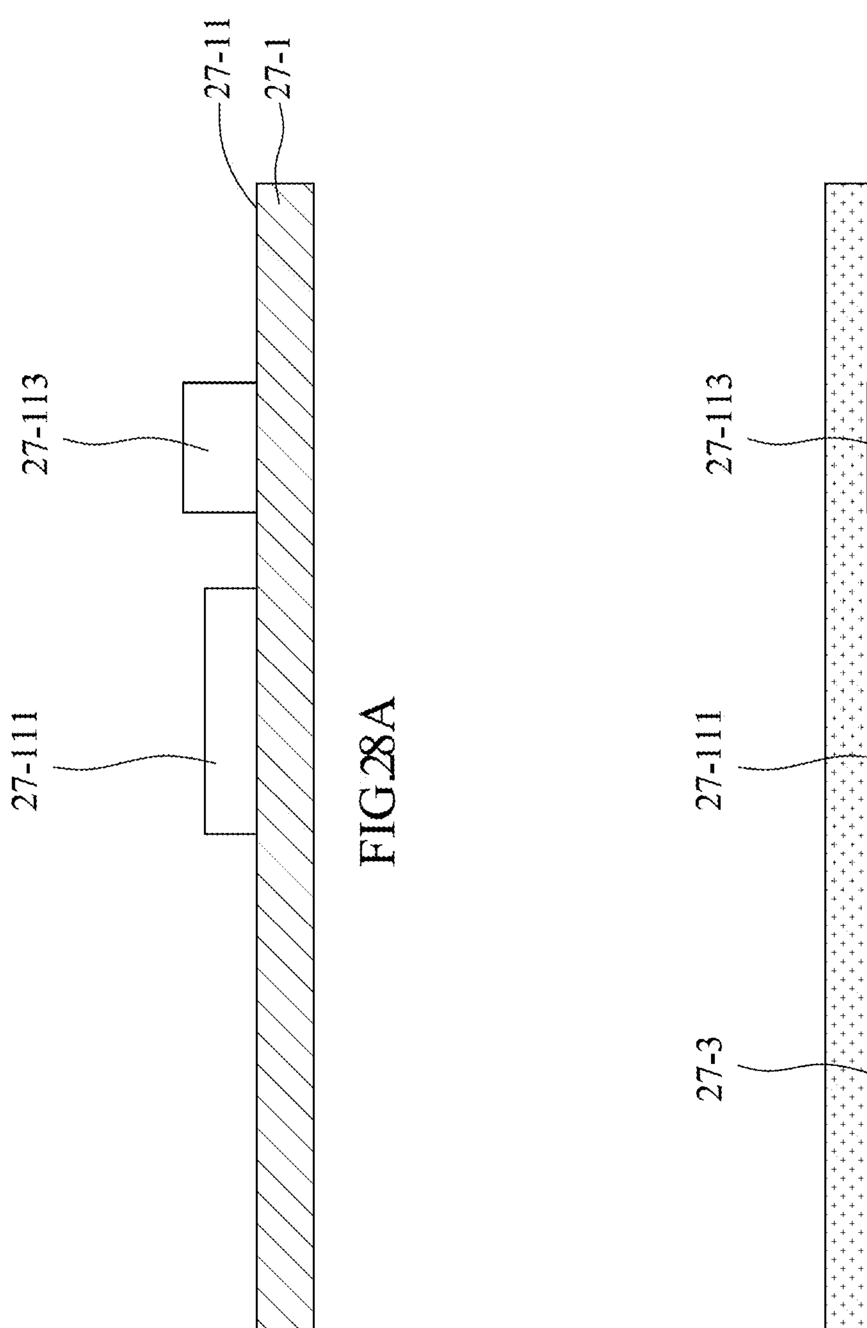
FIG. 28A, FIG. 28B, FIG. 28C, FIG. 28D, FIG. 28E, FIG. 28F, FIG. 28G, FIG. 28H, FIG. 28I, FIG. 28J, FIG. 28K, FIG. 28L and FIG. 28M illustrate a method of manufacturing a semiconductor device package in accordance with another embodiment of the instant disclosure.
Figure 28B:
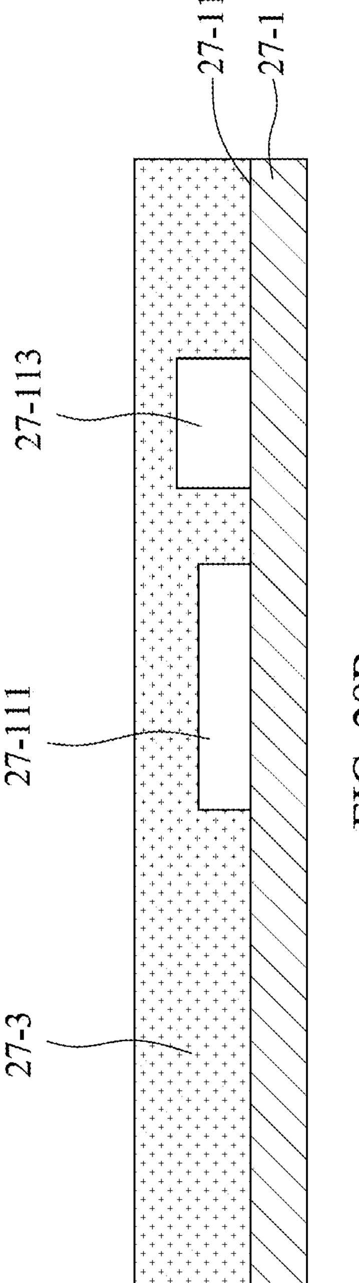

Referring to FIG. 28A, the substrate 27-1 with the electronic components 27-111, 27-113 is provided. The electronic elements 27-111 and 27-113 may be disposed or mounted on the surface 27-11 of the substrate 27-1 and electrically connected to the interconnection of the substrate 27-1.

Referring to FIG. 28B, the encapsulant 27-3 is provided. The encapsulant 27-3 may be formed on the surface 27-11 of the substrate 27-1. The encapsulant 27-3 may cover the surface 27-11 of the substrate 27-1 and the electronic components 27-111, 27-113.

Figures 28C, 28D:
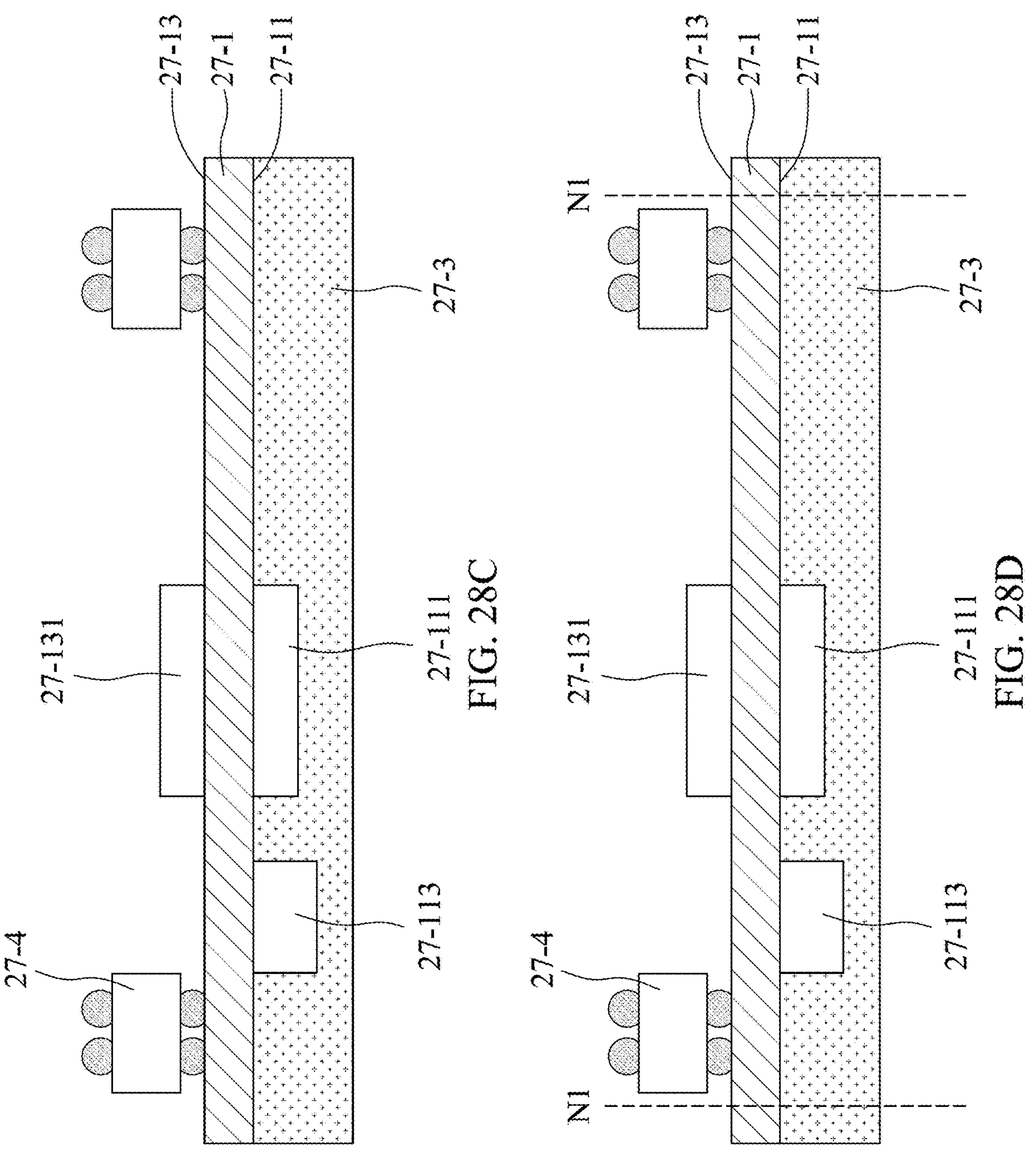

Referring to FIG. 28C, the structure obtained from FIG. 28B may be reversed upside down. The interposers 27-4 and the electronic component 27-131 may be disposed or mounted on the surface 27-13 of the substrate 27-1 and electrically connected to the interconnection of the substrate 27-1.

Referring to FIG. 28D, a singulation process is conducted to cut along the imaginary line "N1" through the substrate 27-1 and the encapsulant 27-3.

Figure 28E:
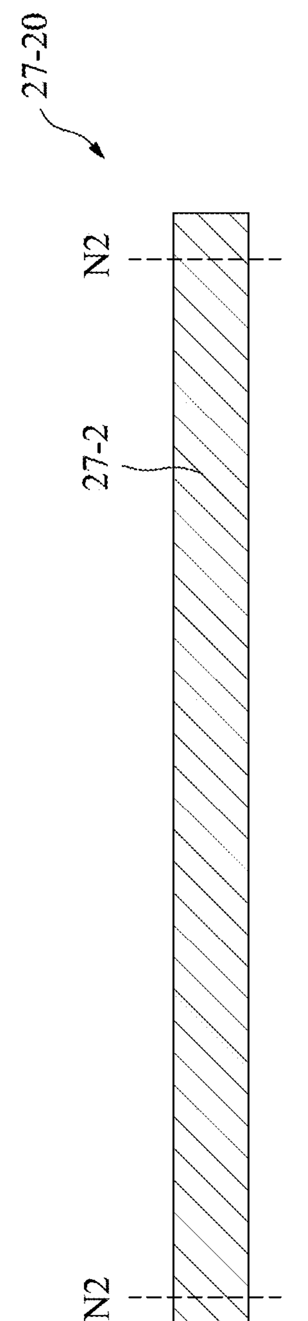

Referring to FIG. 28E, a strip 27-20 is provided and a singulation process is conducted to cut along the imaginary line "N2" through the strip 27-20, and thus forming the substrate 27-2 as shown in FIG. 23.

Figure 28F:
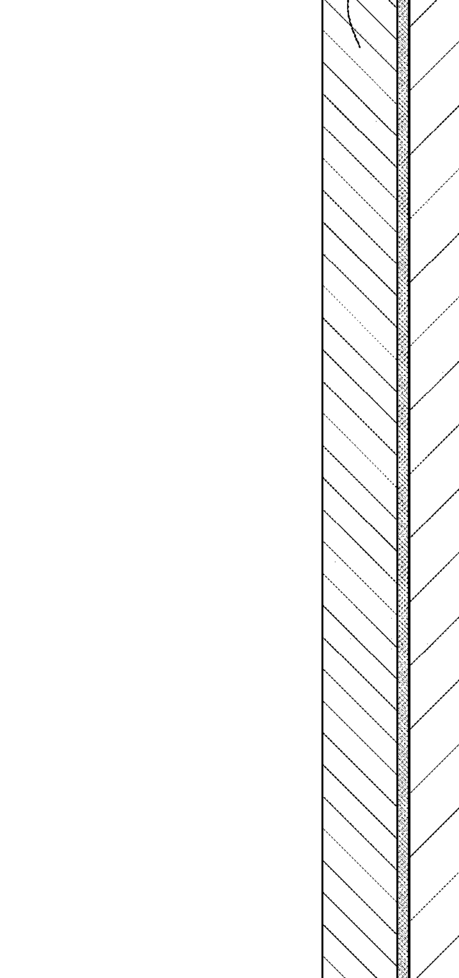

Referring to FIG. 28F, the substrate 27-2 may be arranged on a carrier 27-200 through a tape 27-201. That is, the tape 27-201 may be between the substrate 27-2 and the carrier 27-200.

Figure 28G:
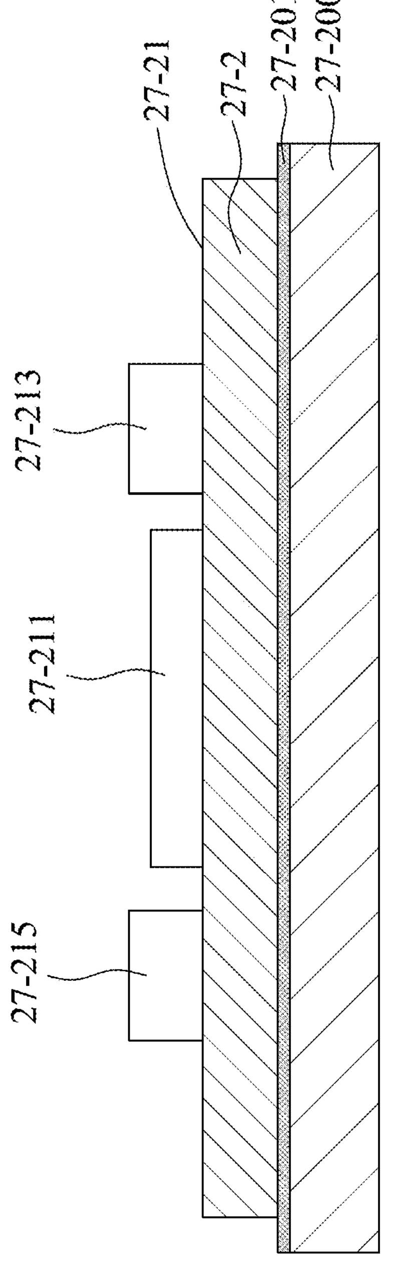
Figure 28G:

Referring to FIG. 28G, the electronic components 27-211, 27-213, 27-215 may be disposed or mounted on the surface 27-21 of the substrate 27-2 and electrically connected to the interconnection of the substrate 27-2.

Figure 28H:
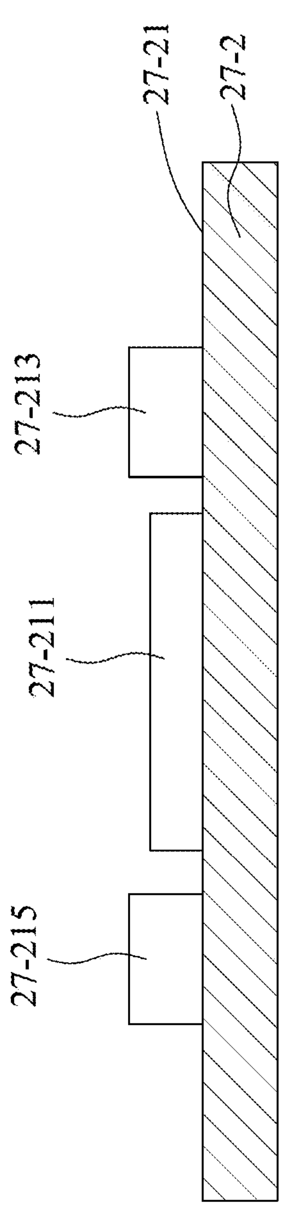

Referring to FIG. 28H, the carrier 27-200 and the tape 27-201 are removed (i.e., de-carrier).

Figure 28I:
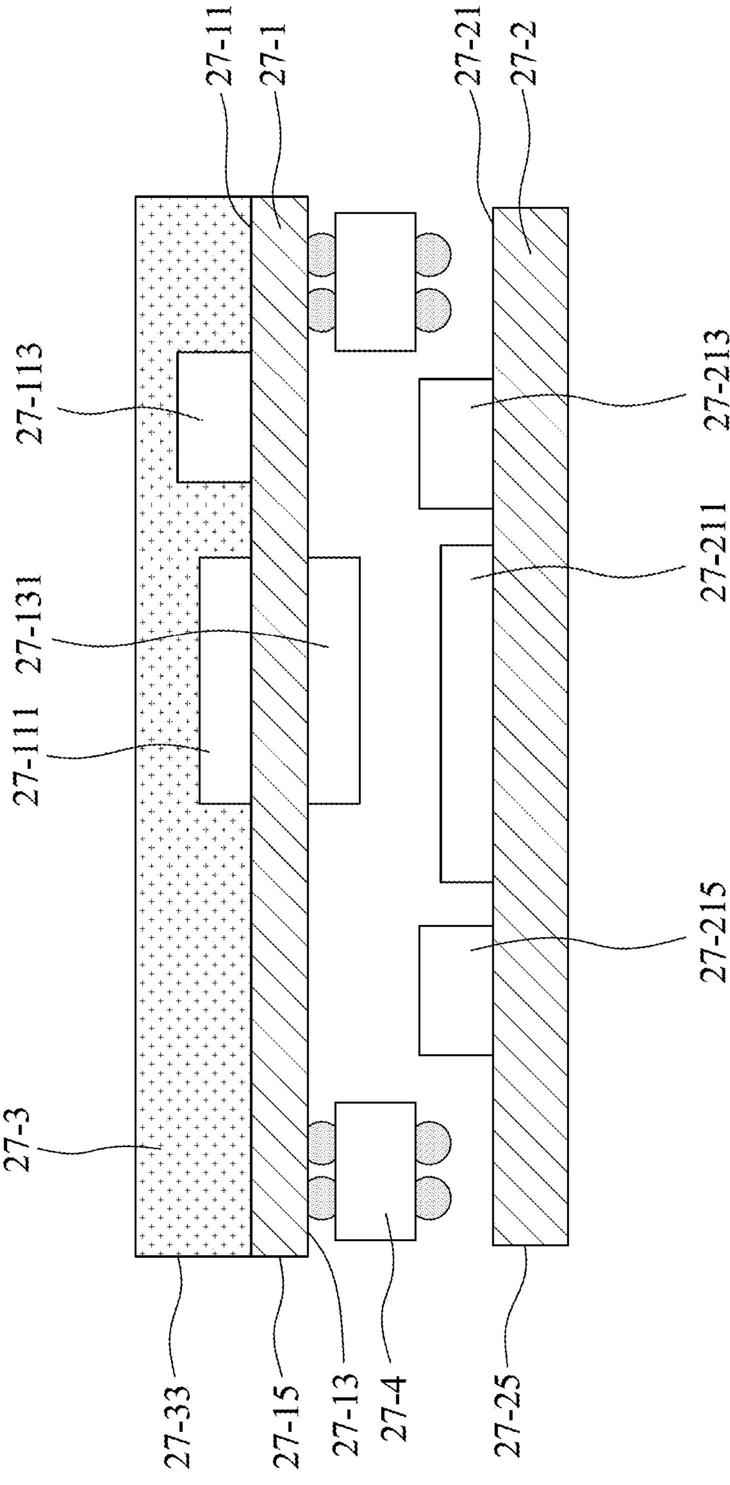

Referring to FIG. 28I, the structure obtained from FIG. 24C may be staked on the structure obtained from FIG. 24G. That is, the substrate 27-1 may be disposed over the substrate 27-2. The surface 27-13 of the substrate 27-1 may face the surface 27-21 of the substrate 27-2. The interposer 27-4 may be arranged between the substrate 27-1 and the substrate 27-2. The substrate 27-1 may be electrically connected to the substrate 27-2 through the interposer 27-4. Since the interposer 27-4 may be disposed on the substrate 27-2 and support the substrate 27-1, the electronic component 27-131 disposed on the surface 27-13 of the substrate 27-1 and the electronic component 27-211 disposed on the surface 27-21 of the substrate 27-2 may be spaced apart from by a distance.

Figure 28J:
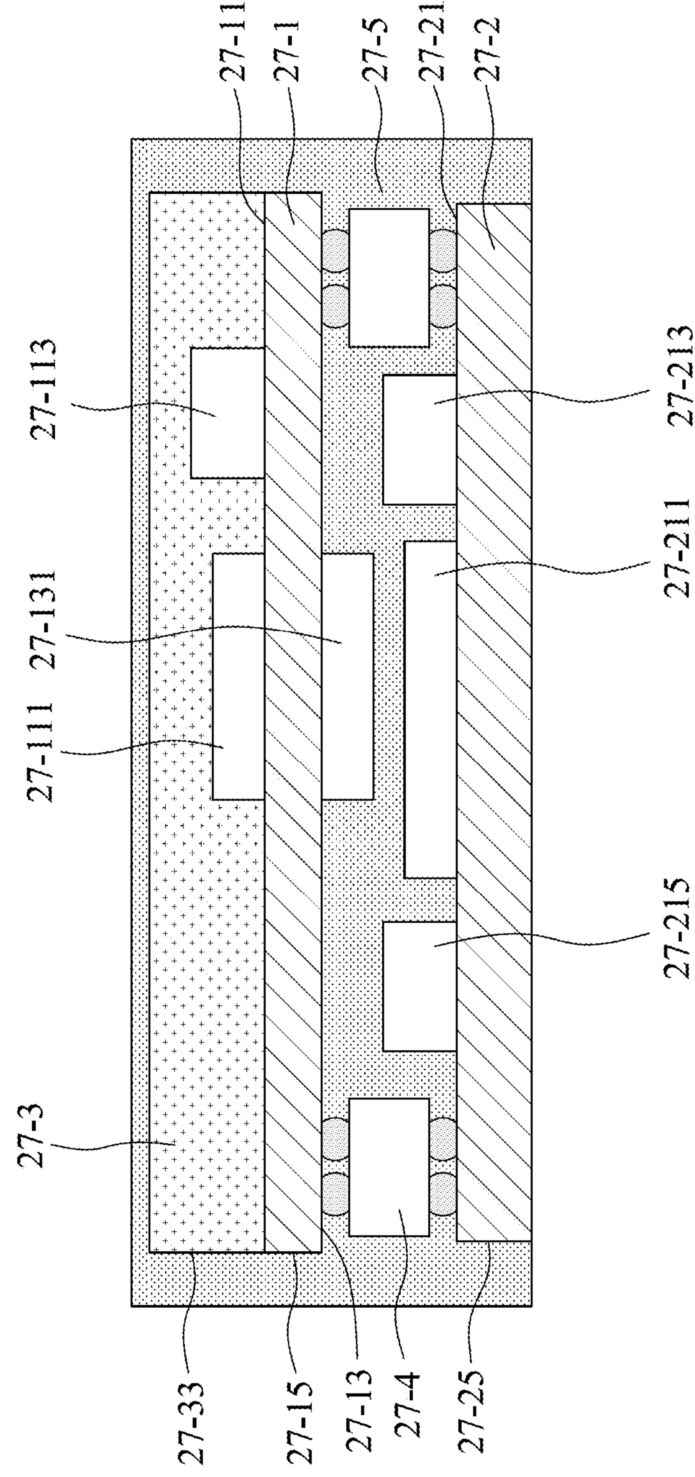

Referring to FIG. 28J, the encapsulant 27-5 is provided. The encapsulant 27-5 may cover the surface 27-21 of the substrate 27-2, the surface 27-13 of the substrate 27-1, the electronic component 27-131, the electronic components 27-211, 27-213, 27-215 and the interposers 27-4. The encapsulant 27-5 may cover the lateral surface 27-15 of the substrate 27-1, the lateral surface 27-25 of the substrate 27-2 and the lateral surface 27-33 of the encapsulant 27-3.

Figure 28K:
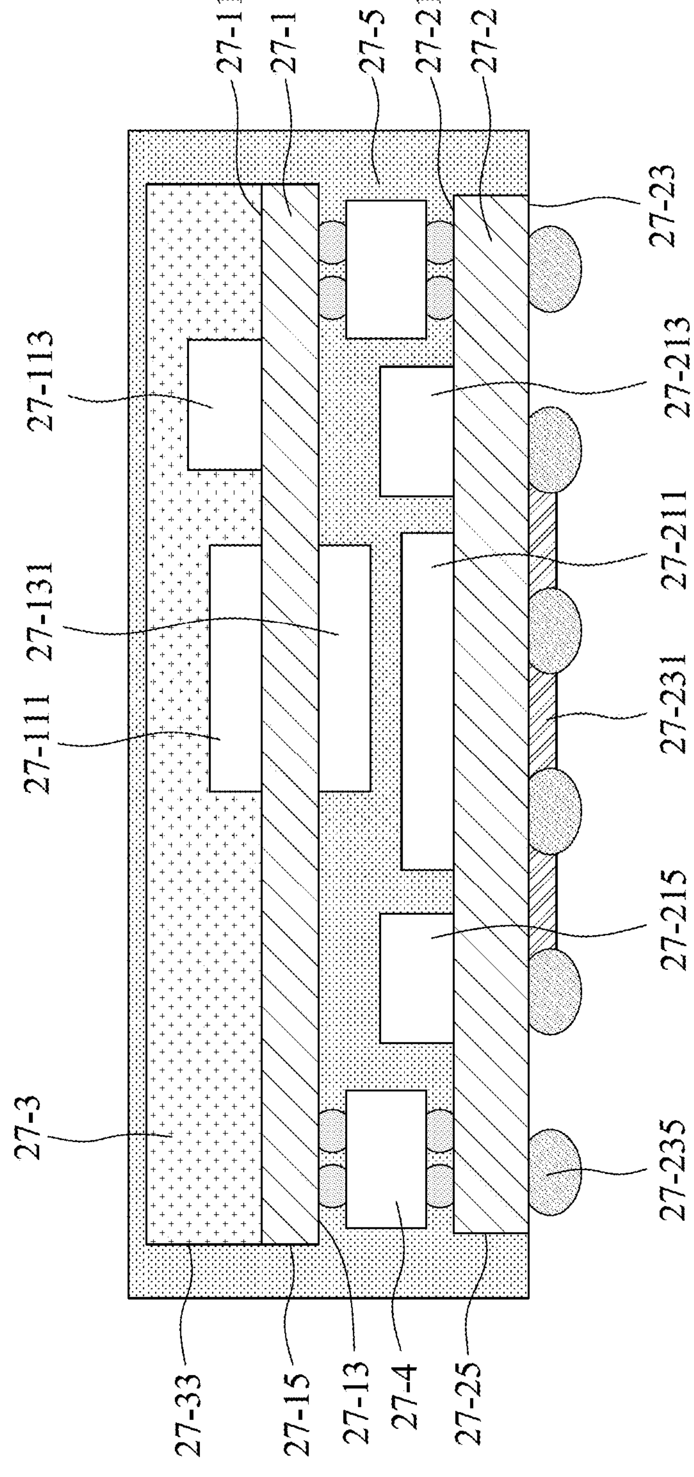

Referring to FIG. 28K, the electronic component 27-231 and the electrical connections 27-235 may be disposed or mounted on the surface 27-23 of the substrate 27-2 and electrically connected to the interconnection of the substrate 27-2.

Figure 28L:
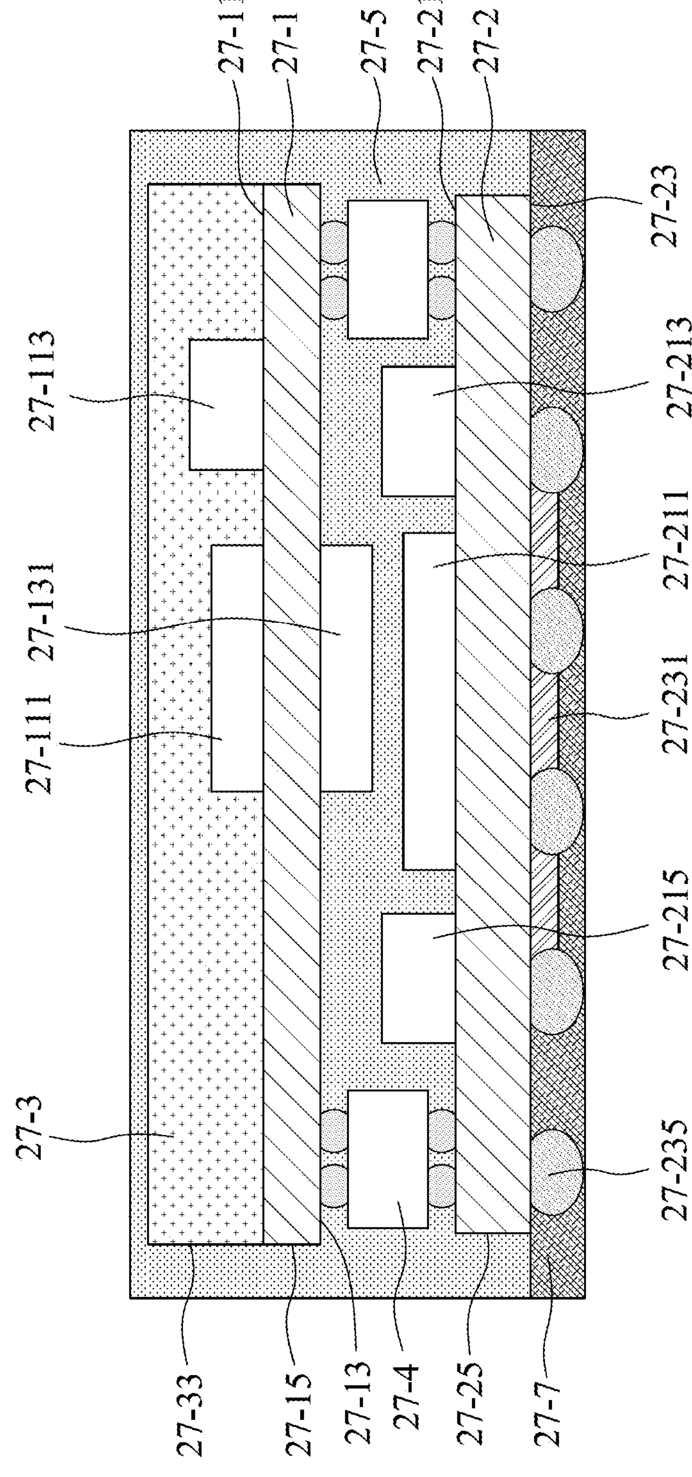

Referring to FIG. 28L, the encapsulant 27-7 is provided. The encapsulant 27-7 may be formed on the surface 27-23 of the substrate 27-2. The encapsulant 27-7 may cover the surface 27-23 of the substrate 27-2, the electronic component 27-231 and the electrical connections 27-235. The upper surface 27-75 of the encapsulant 27-7 is covered by the encapsulant 27-5.

Figure 28M:
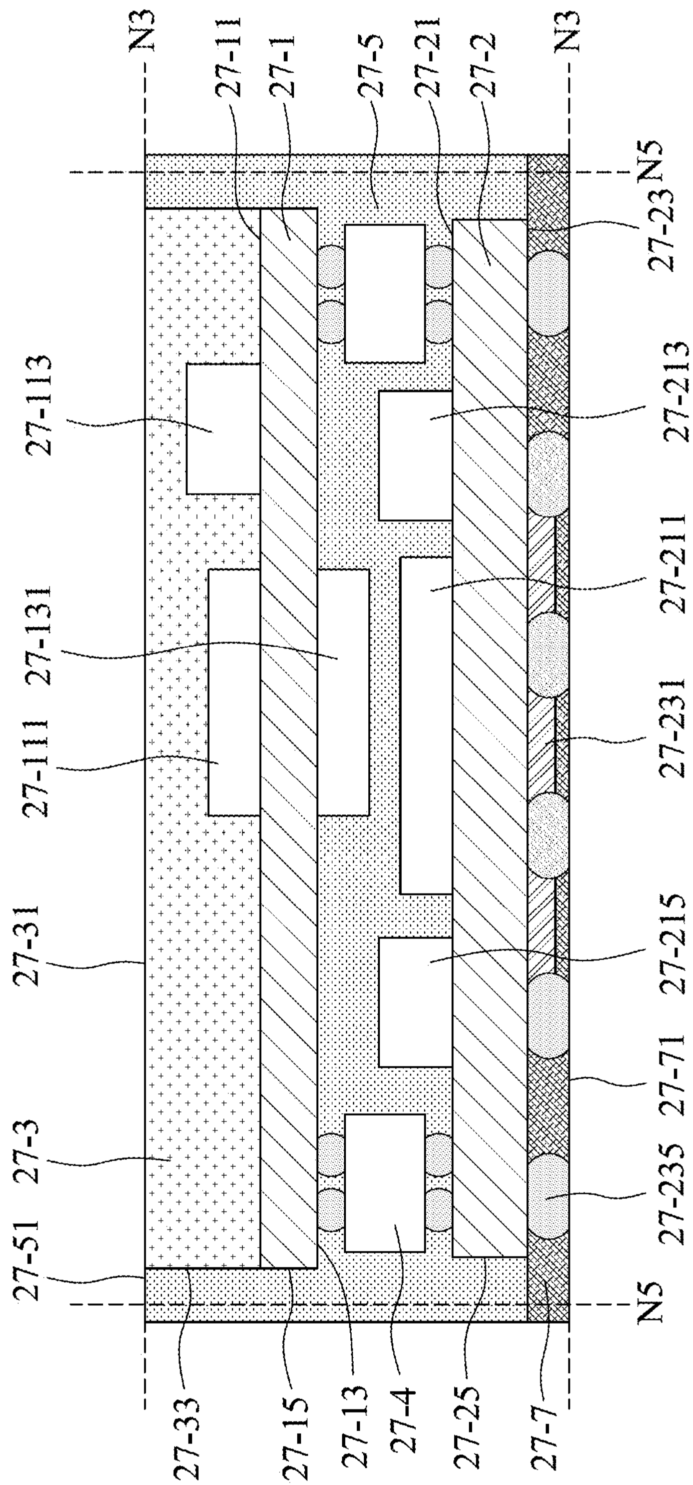

Referring to FIG. 28M, a grinding process is conducted to cut along the imaginary line "N3" through the encapsulant 27-3 and the encapsulant 27-5, and thus the upper surface 27-31 of the encapsulant 27-3 is exposed from the upper surface 27-51 of the encapsulant 27-5. Moreover, another grinding process is conducted to cut along the imaginary line "N4" through the encapsulant 27-7 and the electrical connections 27-235. After the grinding process, the electrical connections 27-235 may be exposed from the lower surface 27-71 of the encapsulant 27-7. Further, a singulation process is conducted to cut along the imaginary line "N5" through the substrate 27-1 and the encapsulants 27-3, 27-5 and 27-7, and thus forming the semiconductor device package structure 27 as shown in FIG. 27A.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to =0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device, comprising:

a first carrier;

a second carrier disposed over the first carrier; and a reinforcement connected to the second carrier and configured to prevent the second carrier from being recessed toward the first carrier;

wherein the reinforcement covers a lateral surface of the second carrier wherein the electronic device further comprises a first encapsulant covering the reinforcement and spaced apart from the lateral surface of the second carrier.

2. The electronic device of claim 1, further comprising a first electronic component connected to the first carrier, a second electronic component disposed over the first electronic component and connected to the second carrier and a third electronic component encapsulated by the reinforcement.

3. The electronic device of claim 1, wherein a hardness of the first carrier is greater than a hardness of the second carrier.

4. The electronic device of claim 1, wherein a thickness of the first carrier is greater than a thickness of the second carrier.

5. The electronic device of claim 1, wherein the second carrier comprises a plurality of conductive vias tapered toward the first carrier.

6. The electronic device of claim 1, wherein the first encapsulant covers a lateral surface of the first carrier.

7. The electronic device of claim 6, further comprising an electrical connection disposed under the first carrier; and a second encapsulant encapsulating the electrical connection.

8. The electronic device of claim 6, further comprising a fourth electronic component disposed under the first carrier, wherein the first encapsulant is disposed under the first carrier and covers the fourth electronic component.

9. The electronic device of claim 1, wherein the second carrier comprises a first dielectric layer and a second dielectric layer, and wherein the first dielectric layer is closer to the first carrier than the second dielectric layer and a thickness of the first dielectric layer is greater than a thickness of the second dielectric layer.

10. An electronic device, comprising:

a coreless substrate;

at least one electronic component mounted on the coreless substrate;

at least one support element configured to support the coreless substrate;

a reinforcement connected to the coreless substrate and configured to prevent the coreless substrate from collapsing due to a weight of the at least one electronic component; and a core substrate supporting the support element, wherein the core substrate comprises a first dielectric layer with a first thickness and the coreless substrate comprises a second dielectric layer with a second thickness, and wherein the first thickness is greater than the second thickness.

11. The electronic device of claim 10, wherein a width of the core substrate is less than a width of the coreless substrate in a cross-sectional view.

12. The electronic device of claim 11, further comprising an encapsulant covering the coreless substrate, at least one electronic component, the reinforcement and the core substrate.

* * * * *